US012727339B2

(12) United States Patent
Yamawaki et al.

(10) Patent No.: US 12,727,339 B2
(45) Date of Patent: Sep. 1, 2026

(54) DISPLAY APPARATUS AND METHOD FOR FABRICATING DISPLAY APPARATUS

(71) Applicant: SEMICONDUCTOR ENERGY LABORATORY CO., LTD., Atsugi (JP)

(72) Inventors: Hayato Yamawaki, Atsugi (JP); Sachiko Kawakami, Atsugi (JP); Eriko Aoyama, Atsugi (JP); Miki Kurihara, Isehara (JP); Yoshinobu Asami, Isehara (JP); Takahiro Fujie, Isehara (JP); Ryo Tagashira, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 393 days.

(21) Appl. No.: 18/580,254

(22) PCT Filed: Jul. 15, 2022

(86) PCT No.: PCT/IB2022/056518
§ 371 (c)(1),
(2) Date: Jan. 18, 2024

(87) PCT Pub. No.: WO2023/002316
PCT Pub. Date: Jan. 26, 2023

(65) Prior Publication Data

US 2024/0334747 A1 Oct. 3, 2024

(30) Foreign Application Priority Data

Jul. 21, 2021 (JP) ................................ 2021-120428
Aug. 19, 2021 (JP) ................................ 2021-134280
Jun. 30, 2022 (JP) ................................ 2022-105967

(51) Int. Cl.
*H10K 59/122* (2023.01)
*H10K 50/00* (2023.01)
(Continued)

(52) U.S. Cl.
CPC .......... *H10K 59/122* (2023.02); *H10K 50/11* (2023.02); *H10K 59/1201* (2023.02);
(Continued)

(58) Field of Classification Search
CPC .. H10K 59/122; H10K 50/11; H10K 59/1201; H10K 59/121; H10K 59/80515; H10K 71/12; H10K 71/233; H10K 71/40
See application file for complete search history.

(56) References Cited

U.S. PATENT DOCUMENTS

| | | | |
|---|---|---|---|
| 5,953,985 | A | 9/1999 | Kobayashi |
| 6,120,338 | A | 9/2000 | Hirano et al. |

(Continued)

FOREIGN PATENT DOCUMENTS

| | | | |
|---|---|---|---|
| CN | 108074953 | A | 5/2018 |
| CN | 111937154 | A | 11/2020 |

(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.

(Continued)

*Primary Examiner* — Christine S. Kim
*Assistant Examiner* — Tyler J Wiegand
(74) *Attorney, Agent, or Firm* — Fish & Richardson P.C.

(57) ABSTRACT

A display apparatus-including a first pixel, a second pixel adjacent to the first pixel, a first insulating layer, and a second insulating layer over the first insulating layer is provided. The first pixel includes a first pixel electrode, a first EL layer covering the first pixel electrode, a third insulating layer over the first EL layer, and a common electrode over the first EL layer. The common electrode is in contact with part of the top surface of the first EL layer. The
(Continued)

first EL layer contains a first organic compound. The amount of an organic compound that includes an oxide of the first organic compound or a partial structure of the first organic compound and is contained in the first EL layer is greater than 0 and less than or equal to 1/10 of an amount of the first organic compound contained in the first EL layer.

16 Claims, 46 Drawing Sheets

(51) Int. Cl.

| | |
|---|---|
| ***H10K 50/11*** | (2023.01) |
| ***H10K 59/00*** | (2023.01) |
| ***H10K 59/12*** | (2023.01) |
| ***H10K 59/121*** | (2023.01) |
| ***H10K 59/35*** | (2023.01) |
| ***H10K 59/80*** | (2023.01) |
| ***H10K 71/12*** | (2023.01) |
| ***H10K 71/20*** | (2023.01) |
| ***H10K 71/40*** | (2023.01) |
| ***H10K 71/60*** | (2023.01) |

(52) U.S. Cl.
CPC ..... *H10K 59/121* (2023.02); *H10K 59/80515* (2023.02); *H10K 71/12* (2023.02); *H10K 71/233* (2023.02); *H10K 71/40* (2023.02); *H10K 50/00* (2023.02); *H10K 59/00* (2023.02); *H10K 59/35* (2023.02); *H10K 59/8052* (2023.02); *H10K 71/60* (2023.02)

(56) References Cited

U.S. PATENT DOCUMENTS

| | | | | |
|---|---|---|---|---|
| 10,374,020 | B2 | 8/2019 | Kang | |
| 10,636,853 | B2 | 4/2020 | Kang | |
| 11,004,921 | B2 | 5/2021 | Kang | |
| 2002/0072139 | A1 | 6/2002 | Kashiwabara | |
| 2002/0113546 | A1 | 8/2002 | Seo et al. | |
| 2011/0148290 | A1 | 6/2011 | Oota | |
| 2012/0256204 | A1 | 10/2012 | Yoshizumi et al. | |
| 2012/0273804 | A1 | 11/2012 | Hatano | |
| 2012/0276484 | A1 | 11/2012 | Izumi et al. | |
| 2013/0084531 | A1 | 4/2013 | Hamaguchi et al. | |
| 2013/0084664 | A1 | 4/2013 | Yoshitoku et al. | |
| 2013/0084666 | A1 | 4/2013 | Oshige | |
| 2013/0280839 | A1 | 10/2013 | Sonoda et al. | |
| 2013/0295705 | A1 | 11/2013 | Sonoda et al. | |
| 2014/0004640 | A1 | 1/2014 | Hamaguchi et al. | |
| 2014/0004642 | A1 | 1/2014 | Otsuka et al. | |
| 2015/0060826 | A1 | 3/2015 | Matsumoto et al. | |
| 2015/0069360 | A1 | 3/2015 | Sato | |
| 2015/0076476 | A1 | 3/2015 | Odaka et al. | |
| 2016/0172595 | A1 | 6/2016 | Malinowski et al. | |
| 2016/0315133 | A1 | 10/2016 | Sato | |
| 2017/0141167 | A1 | 5/2017 | Naganuma | |
| 2017/0256754 | A1 | 9/2017 | Defranco et al. | |
| 2018/0138251 | A1 | 5/2018 | Kang | |
| 2018/0190908 | A1 | 7/2018 | Ke et al. | |
| 2019/0326373 | A1 | 10/2019 | Kang | |
| 2020/0057330 | A1 | 2/2020 | Yamazaki et al. | |
| 2020/0203662 | A1 | 6/2020 | Mollard et al. | |
| 2020/0227493 | A1 | 7/2020 | Kang | |
| 2021/0043705 | A1* | 2/2021 | Lim | H10K 59/122 |
| 2021/0151714 | A1 | 5/2021 | Haas et al. | |

FOREIGN PATENT DOCUMENTS

| | | | |
|---|---|---|---|
| CN | 112349752 | A | 2/2021 |
| EP | 3321988 | A | 5/2018 |
| EP | 4192219 | A | 6/2023 |
| JP | 2000-036385 | A | 2/2000 |
| JP | 2002-324673 | A | 11/2002 |
| JP | 2003-059663 | A | 2/2003 |
| JP | 2008-098106 | A | 4/2008 |
| JP | 2008-147072 | A | 6/2008 |
| JP | 2008-251270 | A | 10/2008 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-197494 | A | 11/2016 |
| JP | 2018-081903 | A | 5/2018 |
| JP | 2019-179696 | A | 10/2019 |
| JP | 2020-160305 | A | 10/2020 |
| KR | 2018-0054983 | A | 5/2018 |
| KR | 2020-0082497 | A | 7/2020 |
| KR | 2021-0017179 | A | 2/2021 |
| KR | 2021-0019675 | A | 2/2021 |
| WO | WO-2018/087625 | | 5/2018 |
| WO | WO-2019/193290 | | 10/2019 |

OTHER PUBLICATIONS

Malinowski.P et al., “High resolution photolithography for direct view active matrix organic light-emitting diode augmented reality displays”, J. Soc. Inf. Display (Journal of the Society for Information Display), Apr. 2, 2018, vol. 26, No. 3, pp. 128-136.

Malinowski.P et al., “Photolithographic patterning of organic photodetectors with a non-fluorinated photoresist system”, Organic Electronics, Jul. 12, 2014, vol. 15, No. 10, pp. 2355-2359.

Malinowski.P et al., “Multicolor 1250 ppi OLED Arrays Patterened by Photolithography”, SID Digest ’16 : SID International Symposium Digest of Technical Papers, May 22, 2016, vol. 47, No. 1, pp. 1009-1012.

Papadopoulos.N et al., “AMOLED Displays with In-Pixel Photodetector”, Liquid Crystals and Display Technology, Jul. 9, 2020, pp. 1-19.

Ke.T et al., “Technology Developments in High-Resolution FMM-free OLED and BEOL IGZO TFTs for Power-Efficient Microdisplays”, SID Digest ’21 : SID International Symposium Digest of Technical Papers, May 1, 2021, vol. 52, No. 1, pp. 127-130.

Malinowski.P et al., “Integration of additional functionalities into the frontplane of AMOLED displays”, SID Digest ’20 : SID International Symposium Digest of Technical Papers, Aug. 1, 2020, vol. 51, No. 1, pp. 646-649.

Malinowski.P et al., “Organic photolithography for displays with integrated fingerprint scanner”, SID Digest ’19 : SID International Symposium Digest of Technical Papers, May 29, 2019, vol. 50, No. 1, pp. 1007-1010.

Ke.T et al., “Island and Hole Fabrication on OLED Stack for High-Resolution Sensor in Display Application”, IDW ’20 : Proceedings of the 27th International Display Workshops, Dec. 9, 2020, vol. 27, pp. 902-905.

Gather.M et al., “Solution-Processed Full-Color Polymer-OLED Displays Fabricated by Direct Photolithography”, SID Digest ’06 : SID International Symposium Digest of Technical Papers, Jun. 1, 2006, vol. 37, No. 1, pp. 909-911.

Malinowski.P et al., “Photolithography as Enabler of AMOLED Displays Beyond 1000 ppi”, SID Digest ’17 : SID International Symposium Digest of Technical Papers, May 1, 2017, vol. 48, No. 1, pp. 623-626.

International Search Report (Application No. PCT/IB2022/056518) Dated Sep. 27, 2022.

Written Opinion (Application No. PCT/IB2022/056518) Dated Sep. 27, 2022.

* cited by examiner

DISPLAY APPARATUS AND METHOD FOR FABRICATING DISPLAY APPARATUS

CROSS REFERENCE TO RELATED APPLICATIONS

This application is a U.S. National Phase Application under 35 U.S.C. § 371 of International Application PCT/IB2022/056518, filed on Jul. 15, 2022, which is incorporated by reference and claims the benefit of foreign priority applications filed in Japan on Jul. 21, 2021, as Application No. 2021-120428, on Aug. 19, 2021, as Application No. 2021-134280, and on Jun. 30, 2022, as Application No. 2022-105967.

TECHNICAL FIELD

One embodiment of the present invention relates to a display apparatus. One embodiment of the present invention relates to a method for fabricating a display apparatus.

Note that one embodiment of the present invention is not limited to the above technical field. Examples of a technical field of one embodiment of the present invention disclosed in this specification and the like include a semiconductor device, a display apparatus, a light-emitting apparatus, a power storage device, a memory device, an electronic device, a lighting device, an input device, an input/output device, a driving method thereof, and a manufacturing method thereof. A semiconductor device refers to any device that can function by utilizing semiconductor characteristics.

BACKGROUND ART

In recent years, higher-resolution display panels have been required. Examples of devices that require high-resolution display panels include a smartphone, a tablet terminal, and a notebook computer. Furthermore, higher resolution has been required for a stationary display apparatus such as a television device or a monitor device along with an increase in definition. An example of a device required to have the highest resolution is a device for virtual reality (VR) or augmented reality (AR).

Examples of a display apparatus that can be used for a display panel include, typically, a liquid crystal display apparatus, a light-emitting apparatus including a light-emitting element such as an organic EL (Electro Luminescence) element or a light-emitting diode (LED), and electronic paper performing display by an electrophoretic method or the like.

For example, the basic structure of an organic EL element is a structure where a layer containing a light-emitting organic compound is provided between a pair of electrodes. By voltage application to this element, light emission can be obtained from the light-emitting organic compound. A display apparatus containing such an organic EL element does not need a backlight that is necessary for a liquid crystal display apparatus and the like; thus, a thin, lightweight, high-contrast, and low-power-consumption display apparatus can be achieved. Patent Document 1, for example, discloses an example of a display apparatus containing an organic EL element.

Patent Document 2 discloses a display apparatus that includes an organic EL device for VR.

REFERENCE

Patent Document

[Patent Document 1] Japanese Published Patent Application No. 2002-324673
[Patent Document 2] PCT International Publication No. 2018/087625

SUMMARY OF THE INVENTION

Problems to be Solved by the Invention

An object of one embodiment of the present invention is to provide a display apparatus with high display quality. An object of one embodiment of the present invention is to provide a highly reliable display apparatus. An object of one embodiment of the present invention is to provide a display apparatus that can easily achieve higher resolution. An object of one embodiment of the present invention is to provide a display apparatus having both high display quality and high resolution. An object of one embodiment of the present invention is to provide a display apparatus with low power consumption.

An object of one embodiment of the present invention is to provide a display apparatus having a novel structure or a method for fabricating the display apparatus. An object of one embodiment of the present invention is to provide a method for manufacturing the above-described display apparatus with high yield. An object of one embodiment of the present invention is to at least alleviate at least one of problems of the conventional technique.

Note that the description of these objects does not preclude the existence of other objects. Note that one embodiment of the present invention does not have to achieve all the objects. Note that objects other than these can be derived from the description of the specification, the drawings, the claims, and the like.

Means for Solving the Problems

One embodiment of the present invention is a display apparatus including a first pixel, a second pixel placed to be adjacent to the first pixel, a first insulating layer, and a second insulating layer over the first insulating layer. The first pixel includes a first pixel electrode, a first EL layer covering the first pixel electrode, a third insulating layer in contact with a part of a top surface of the first EL layer, and a common electrode over the first EL layer and the third insulating layer. The common electrode is in contact with another part of the top surface of the first EL layer. The first EL layer is sandwiched between the first pixel electrode and the common electrode. The first EL layer contains an organic compound OM. The amount of an organic compound that includes an oxide of the organic compound OM or a partial structure of the organic compound OM and is contained in the first EL layer is greater than 0 and less than or equal to $1/10$ of an amount of the organic compound OM contained in the first EL layer. The second pixel includes a second pixel electrode, a second EL layer covering the second pixel electrode, a fourth insulating layer in contact with a part of a top surface of the second EL layer, and the common electrode over the second EL layer and the fourth insulating layer. The first insulating layer is in contact with a top surface and a side surface of the third insulating layer, a top surface and a side surface of the fourth insulating layer, a side surface of the first EL layer, and a side surface of the second EL layer. The first insulating layer, the third insulating layer, and the fourth insulating layer each contain an inorganic material. The second insulating layer contains an organic material. A part of the second insulating layer overlaps with the first pixel electrode. Another part of the second insulating layer overlaps with the second pixel electrode. In a cross-sectional view of the display apparatus, a side surface of the second insulating layer has a tapered shape and a top surface of the second insulating layer has a convex shape. A taper angle of the tapered shape of the side surface of the second insulating layer is less than 90°. The common electrode overlaps with the second insulating layer.

In the above, in the cross-sectional view of the display apparatus, it is preferable that side surfaces of the first pixel electrode and the second pixel electrode each have a tapered shape, and a taper angle of the tapered shape of the side surface of each of the first pixel electrode and the second pixel electrode be less than 90°.

In the above, it is preferable that the first insulating layer, the third insulating layer, and the fourth insulating layer each contain aluminum oxide. In the above, it is preferable that the second insulating layer contain a photosensitive acrylic resin.

In the above, it is preferable that the top surface of the first EL layer, the top surface of the second EL layer, and the top surface of the second insulating layer each include a region in contact with the common electrode.

In the above, it is preferable that the first pixel include a common layer placed between the first EL layer and the common electrode, the second pixel include the common layer placed between the second EL layer and the common electrode, and the top surface of the first EL layer, the top surface of the second EL layer, and the top surface of the second insulating layer each include a region in contact with the common layer.

Another embodiment of the present invention is a method for fabricating a display apparatus, in which a first pixel electrode, a first EL layer covering the first pixel electrode, a first insulating layer in contact with a top surface of the first EL layer, a second pixel electrode, a second EL layer covering the second pixel electrode, and a second insulating layer in contact with a top surface of the second EL layer are formed; a third insulating layer is formed to cover the first EL layer, the first insulating layer, the second EL layer, and the second insulating layer; a photosensitive organic resin is applied onto the third insulating layer; first light exposure is performed to expose part of an organic resin to visible rays or ultraviolet rays; development is performed to remove the part of the organic resin and form a fourth insulating layer; first heat treatment is performed to make a side surface of the fourth insulating layer have a tapered shape and make a top surface of the fourth insulating layer have a convex shape; parts of the first insulating layer, the second insulating layer, and the third insulating layer are removed to expose the top surface of the first EL layer and the top surface of the second EL layer; and a common electrode is formed to cover the first EL layer, the second EL layer, and the fourth insulating layer. During a period from a time when the top surface of the first EL layer and the top surface of the second EL layer are exposed to a time when the common electrode is formed, the amount of ultraviolet rays with a wavelength less than 400 nm, to which the first EL layer and the second EL layer are exposed, is controlled to be greater than 0 mJ/cm$^2$ and less than or equal to 1000 mJ/cm$^2$, preferably less than or equal to 700 mJ/cm$^2$, further preferably less than or equal to 250 mJ/cm$^2$.

In the above, it is preferable that the first EL layer and the second EL layer be formed by a photolithography method, and a distance between the first EL layer and the second EL layer be less than or equal to 8 μm in a region.

In the above, it is preferable that aluminum oxide be deposited as the third insulating layer by an ALD method.

In the above, it is preferable that the organic resin be formed using a photosensitive acrylic resin. In the above, it is preferable that the viscosity of the organic resin be greater than or equal to 1 cP and less than or equal to 1500 cP. In the above, it is preferable that part of the organic resin be positioned over a region overlapping with the first pixel electrode or the second pixel electrode.

In the above, it is preferable that second heat treatment be performed before the first light exposure, and the second heat treatment be performed at higher than or equal to 70° C. and lower than or equal to 120° C.

In the above, it is preferable that second light exposure be performed before the first heat treatment, and the second light exposure be performed by irradiation with visible rays or ultraviolet rays at greater than 0 mJ/cm$^2$ and less than or equal to 500 mJ/cm$^2$.

In the above, it is preferable that the first heat treatment be performed at higher than or equal to 70° C. and lower than or equal to 130° C.

In the above, it is preferable that third heat treatment be performed after the first heat treatment, and the third heat treatment be performed at higher than or equal to 80° C. and lower than or equal to 100° C.

Effect of the Invention

According to one embodiment of the present invention, a display apparatus with high display quality can be provided. A highly reliable display apparatus can be provided. A display apparatus that can easily achieve higher resolution can be provided. A display apparatus with both high display quality and high resolution can be provided. A display apparatus with low power consumption can be provided.

According to one embodiment of the present invention, a display apparatus having a novel structure or a method for fabricating a display apparatus can be provided. A method for manufacturing the above-described display apparatus with high yield can be provided. According to one embodiment of the present invention, at least one of problems of the conventional technique can be at least alleviated.

Note that the description of these effects does not preclude the existence of other effects. Note that one embodiment of the present invention does not need to have all the effects. Note that effects other than these can be derived from the description of the specification, the drawings, the claims, and the like.

MODE FOR CARRYING OUT THE INVENTION

Figure 1A:
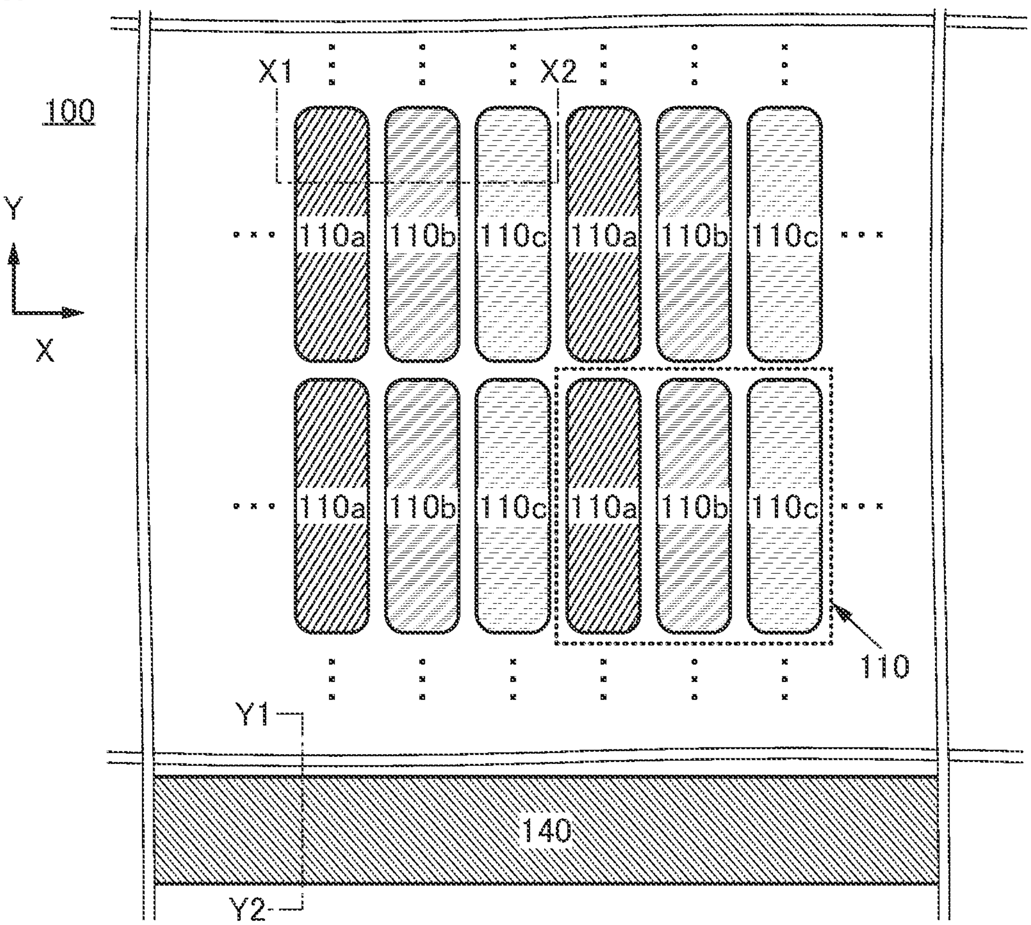
FIG. 1A is a top view illustrating an example of a display panel.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

Note that in structures of the invention described below, the same reference numerals are commonly used for the same portions or portions having similar functions in different drawings, and a repeated description thereof is omitted. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that ordinal numbers such as “first” and “second” in this specification are used in order to avoid confusion among components and do not limit the number of components. In this specification and the like, a display apparatus may be rephrased as an electronic device.

In this specification and the like, a display panel that is one embodiment of a display apparatus has a function of displaying (outputting) an image or the like on (to) a display surface. Therefore, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases. In this specification and the like, a display panel module, a display module, or a display panel is sometimes referred to as a display apparatus.

In this specification and the like, the term "film" and the term "layer" can be interchanged with each other. For example, in some cases, the term "conductive layer" and the term "insulating layer" can be interchanged with the term "conductive film" and the term "insulating film", respectively.

Note that in this specification, an EL layer is provided between a pair of electrodes of a light-emitting element and means a layer containing at least a light-emitting substance (also referred to as a light-emitting layer) or means a stacked body including a light-emitting layer.

In this specification and the like, a device fabricated using a metal mask or an FMM (fine metal mask) is sometimes referred to as a device having an MM (metal mask) structure. In this specification and the like, a device formed without using a metal mask or an FMM may be referred to as a device having a metal maskless (MML) structure.

In this specification and the like, a hole or an electron is sometimes referred to as a carrier. Specifically, a hole-injection layer or an electron-injection layer may be referred to as a carrier-injection layer, a hole-transport layer or an electron-transport layer may be referred to as a carrier-transport layer, and a hole-blocking layer or an electron-blocking layer may be referred to as a carrier-blocking layer. Note that in some cases, the above-described carrier-injection layer, carrier-transport layer, and carrier-blocking layer cannot be distinguished from each other on the basis of the cross-sectional shape, properties, or the like. Furthermore, one layer may have two or three functions of the carrier-injection layer, the carrier-transport layer, and the carrier-blocking layer in some cases.

Embodiment 1

In this embodiment, a display panel of one embodiment of the present invention is described with reference to FIG. 1 to FIG. 9.

One embodiment of the present invention is a display panel that includes a display portion capable of full-color display. The display portion includes a first subpixel and a second subpixel that emit light of different colors. The first subpixel includes a first light-emitting device that emits blue light and the second subpixel includes a second light-emitting device that emits light of a color different from the color of light emitted by the first light-emitting device. At least one kind of material is different between the first light-emitting device and the second light-emitting device; for example, the light-emitting devices contain different light-emitting materials. That is, light-emitting devices separately formed for different emission colors are used in the display panel of one embodiment of the present invention.

A structure in which light-emitting layers in light-emitting devices of different colors (e.g., blue (B), green (G), and red (R)) are separately formed or separately patterned is sometimes referred to as an SBS (Side By Side) structure. The SBS structure allows optimization of materials and structures of light-emitting devices and thus can extend freedom of choice of the materials and the structures, which makes it easy to improve the luminance and the reliability.

In the case of fabricating a display panel that includes a plurality of light-emitting devices emitting light of different colors, the light-emitting layers emitting light of different colors each need to be formed into an island shape. Note that in this specification and the like, the term "island shape" refers to a state where two or more layers formed using the same material in the same step are physically separated from each other. For example, "island-shaped light-emitting layer" means a state where the light-emitting layer and its adjacent light-emitting layer are physically separated from each other.

For example, an island-shaped light-emitting layer can be formed by a vacuum evaporation method using a metal mask (also referred to as a shadow mask). However, this method causes a deviation from the designed shape and position of an island-shaped light-emitting layer due to various influences such as the low accuracy of the metal mask, the positional deviation between the metal mask and a substrate, a warp of the metal mask, and the vapor-scattering-induced expansion of outline of the formed film; accordingly, it is difficult to achieve high resolution and a high aperture ratio. In addition, the outline of the layer may blur during vapor deposition, whereby the thickness of an end portion may be reduced. That is, the thickness of the island-shaped light-emitting layer may vary from area to area. In the case of fabricating a display panel with a large size, high definition, or high resolution, the manufacturing yield might be reduced because of low dimensional accuracy of the metal mask and deformation due to heat or the like.

In a method for fabricating a display panel of one embodiment of the present invention, a first layer (also referred to as an EL layer or part of an EL layer) including a light-emitting layer emitting light of a first color is formed over the entire surface, and then a first mask layer is formed over the first layer. Then, a first resist mask is formed over the first mask layer and the first layer and the first mask layer are processed using the first resist mask, so that the first layer is formed into an island shape. Next, in a manner similar to that for the first layer, a second layer (also referred to as an EL layer or part of an EL layer) including a light-emitting layer emitting light of a second color is formed into an island shape using a second mask layer and a second resist mask.

In the case of processing the light-emitting layer into an island shape, a structure is possible where processing is performed by a photolithography method directly on the light-emitting layer. In the case of this structure, damage to the light-emitting layer (e.g., processing damage) might significantly degrade the reliability. In view of the above, in fabrication of the display panel of one embodiment of the present invention, a mask layer or the like is preferably formed over a layer positioned above the light-emitting layer (e.g., a carrier-transport layer or a carrier-injection layer, specifically, an electron-transport layer or an electron-injection layer), followed by the processing of the light-emitting layer into an island shape. Such a method can provide a highly reliable display panel. Note that the mask layer is also referred to as a sacrificial layer in some cases.

In the case where the light-emitting layer is processed into an island shape, a layer positioned below the light-emitting layer (e.g., a carrier-injection layer or a carrier-transport layer, specifically a hole-injection layer, a hole-transport layer, or the like) is preferably processed into an island shape with the same pattern as the light-emitting layer. Processing a layer positioned below the light-emitting layer into an island shape with the same pattern as the light-emitting layer can reduce a leakage current (sometimes referred to as a horizontal-direction leakage current, a horizontal leakage current, or a lateral leakage current) that might be generated between adjacent subpixels. For example, in the case where a hole-injection layer is shared by adjacent subpixels, a horizontal leakage current would be generated because of the hole-injection layer. In contrast, in the display apparatus of one embodiment of the present invention, the hole-injection layer can be processed into an island shape with the same pattern as the light-emitting layer; hence, a horizontal leakage current between adjacent subpixels is not substantially generated or a horizontal leakage current can be extremely small.

As described above, the island-shaped EL layers fabricated in the method for fabricating a display panel of one embodiment of the present invention are not formed not by using a metal mask having a fine pattern but formed by processing an EL layer formed over the entire surface. Accordingly, a high-resolution display panel or a display panel with a high aperture ratio, which has been difficult to achieve, can be achieved. Moreover, EL layers can be formed separately for the respective colors, enabling the display panel to perform extremely clear display with high contrast and high display quality. In addition, the mask layers provided over the EL layers can reduce damage to the EL layers during the fabrication process of the display panel, increasing the reliability of light-emitting devices.

It is difficult to set the distance between adjacent light-emitting devices to less than 10 μm with a formation method using a metal mask, for example; however, the method using photolithography according to one embodiment of the present invention can shorten the distance between adjacent light-emitting devices, adjacent EL layers, or adjacent pixel electrodes to less than 10 μm, less than or equal to 5 μm, less than or equal to 3 μm, less than or equal to 2 μm, less than or equal to 1.5 μm, less than or equal to 1 μm, or even less than or equal to 0.5 μm, for example, in a process over a glass substrate. Using a light exposure apparatus for LSI can further shorten the distance between adjacent light-emitting devices, adjacent EL layers, or adjacent pixel electrodes to less than or equal to 500 nm, less than or equal to 200 nm, less than or equal to 100 nm, or even less than or equal to 50 nm, for example, in a process over a Si wafer. Accordingly, the area of a non-light-emitting region that could exist between two light-emitting devices can be significantly reduced, and the aperture ratio can be close to 100%. For example, in the display apparatus of one embodiment of the present invention, the aperture ratio higher than or equal to 40%, higher than or equal to 50%, higher than or equal to 60%, higher than or equal to 70%, higher than or equal to 80%, or higher than or equal to 90% and lower than 100% can be achieved.

Increasing the aperture ratio of the display apparatus can improve the reliability of the display apparatus. Specifically, with reference to the lifetime of a display apparatus including an organic EL device and having an aperture ratio of 10%, a display apparatus having an aperture ratio of 20% (that is, two times the aperture ratio of the reference) has a lifetime approximately 3.25 times as long as that of the reference, and a display apparatus having an aperture ratio of 40% (that is, four times the aperture ratio of the reference) has a lifetime approximately 10.6 times as long as that of the reference. Thus, the density of current flowing to the organic EL device can be reduced with increasing aperture ratio, and accordingly the lifetime of the display apparatus can be increased. The display apparatus of one embodiment of the present invention can have a higher aperture ratio and thus can have higher display quality. Furthermore, the display apparatus of one embodiment of the present invention has excellent effect that the reliability (especially the lifetime) can be significantly improved with increasing aperture ratio.

In addition, a pattern of the EL layer itself can be made much smaller than that in the case of using a metal mask. For example, in the case of using a metal mask for forming EL layers separately, a variation in the thickness of the pattern occurs between the center and the edge of the pattern, which causes a reduction in an effective area that can be used as a light-emitting region with respect to the entire pattern area. In contrast, in the above fabricating method, a film deposited to have a uniform thickness is processed, so that island-shaped EL layers can be formed to have a uniform thickness. Accordingly, even in a fine pattern, almost the whole area can be used as a light-emitting region. Consequently, a display panel having both high resolution and a high aperture ratio can be fabricated.

In addition, in a method for fabricating a display panel of one embodiment of the present invention, it is preferable that a layer including a light-emitting layer (that can be referred to as an EL layer or part of an EL layer) be formed over the entire surface, and then a mask layer be formed over the EL layer. Next, preferably, a resist mask is formed over the mask layer, and the EL layer and the mask layer are processed using the resist mask, whereby an island-shaped EL layer is formed.

Provision of a mask layer over an EL layer can reduce damage to the EL layer in the fabrication process of the display panel and increase the reliability of the light-emitting device.

Here, each of the first layer and the second layer includes at least a light-emitting layer and preferably is composed of a plurality of layers. Specifically, each of the first layer and the second layer preferably includes one or more layers over the light-emitting layer. A layer between the light-emitting layer and the mask layer can inhibit the light-emitting layer from being exposed on the outermost surface in the fabrication process of the display panel and can reduce damage to the light-emitting layer. Thus, the reliability of the light-emitting device can be increased. Thus, each of the first layer and the second layer preferably includes the light-emitting layer and a carrier-transport layer (an electron-transport layer or a hole-transport layer) over the light-emitting layer.

Note that it is not necessary to form all layers included in EL layers separately between light-emitting devices that exhibit different colors, and some layers of the EL layers can be formed in the same step. Examples of the layers in the EL layer include a light-emitting layer, carrier-injection layers (a hole-injection layer and an electron-injection layer), carrier-transport layers (a hole-transport layer and an electron-transport layer), and carrier-blocking layers (a hole-blocking layer and an electron-blocking layer). In the method for fabricating a display panel of one embodiment of the present invention, after some layers included in the EL layer are formed into an island shape separately for the respective colors, the mask layer is removed at least partly, and then the other layers (sometimes referred to as common layers) included in the EL layers and a common electrode (also referred to as an upper electrode) are each formed (as a single film) so as to be shared by the light-emitting devices of different colors. For example, a carrier-injection layer and the common electrode can be formed so as to be shared by the light-emitting devices of different colors.

Meanwhile, the carrier-injection layer often has relatively high conductivity in the EL layer. Therefore, when the carrier-injection layer is in contact with a side surface of any layer of the EL layer formed into an island shape or a side surface of the pixel electrode, the light-emitting device might be short-circuited. Note that also in the case where the carrier-injection layer is provided in an island shape and the common electrode is formed to be shared by the light-emitting devices of different colors, the light-emitting device might be short-circuited when the common electrode is in contact with the side surface of the EL layer or the side surface of the pixel electrode.

In view of the above, the display panel of one embodiment of the present invention includes an insulating layer covering at least a side surface of an island-shaped light-emitting layer. The insulating layer may cover part of a top surface of the island-shaped light-emitting layer. Note that the side surface of the island-shaped light-emitting layer here refers to the plane that is not parallel to the substrate (or the surface where the light-emitting layer is formed) among the interfaces between the island-shaped light-emitting layer and other layers. The side surface is not necessarily a flat plane or a curved plane in an exactly mathematical perspective.

This can inhibit at least one layer in the island-shaped EL layer and the pixel electrode from being in contact with the carrier-injection layer or the common electrode. Hence, a short circuit of the light-emitting device is inhibited, and the reliability of the light-emitting device can be increased.

The insulating layer preferably has a function of a barrier insulating layer against at least one of water and oxygen. Alternatively, the insulating layer preferably has a function of inhibiting diffusion of at least one of water and oxygen. Alternatively, the insulating layer preferably has a function of capturing or fixing (also referred to as gettering) at least one of water and oxygen.

Note that in this specification and the like, a barrier insulating layer refers to an insulating layer having a barrier property. A barrier property in this specification and the like refers to a function of inhibiting diffusion of a particular substance (also referred to as having low permeability). Alternatively, a barrier property refers to a function of capturing or fixing (also referred to as gettering) a particular substance.

With the use of an insulating layer having a function of the barrier insulating layer or a gettering function, entry of impurities (typically, at least one of water and oxygen) that might diffuse into the light-emitting devices from the outside can be inhibited. With this structure, a highly reliable light-emitting device and a highly reliable display panel can be provided.

The display panel of one embodiment of the present invention includes a pixel electrode functioning as an anode, a hole-injection layer, a hole-transport layer, a light-emitting layer, an electron-transport layer, an electron-injection layer, and a common electrode functioning as a cathode. The hole-injection layer, the hole-transport layer, the light-emitting layer, and the electron-transport layer each have an island shape and are provided over the pixel electrode in this order. An insulating layer is provided so as to cover each of the side surfaces of the hole-injection layer, the hole-transport layer, the light-emitting layer, and the electron-transport layer. The electron-injection layer is provided over the electron-transport layer, and the common electrode is provided over the electron-injection layer.

Alternatively, the display panel of one embodiment of the present invention includes a pixel electrode functioning as a cathode; an island-shaped electron-injection layer, an island-shaped electron-transport layer, an island-shaped light-emitting layer, and an island-shaped hole-transport layer that are provided in this order over the pixel electrode; an insulating layer provided to cover the side surfaces of the electron-injection layer, the electron-transport layer, the light-emitting layer, and the hole-transport layer; a hole-injection layer provided over the hole-transport layer; and a common electrode that is provided over the hole-injection layer and functions as an anode.

The hole-injection layer, the electron-injection layer, or the like often has relatively high conductivity in the EL layer. Since the side surfaces of these layers are covered with the insulating layer in the display panel of one embodiment of the present invention, these layers can be inhibited from being in contact with the common electrode or the like. Consequently, a short circuit of the light-emitting device can be inhibited, and the reliability of the light-emitting device can be increased.

The insulating layer covering the side surface of the island-shaped EL layer may have a single-layer structure or a stacked-layer structure.

When an insulating layer is formed to have a single-layer structure using an inorganic material, for example, the insulating layer can be used as a protective insulating layer for the EL layer. This can increase the reliability of the display panel. It is preferable that the protective insulating layer also cover part of the top surface of the EL layer. In the case of such a structure, the mask layer is formed to remain between the top surface of the EL layer and the protective insulating layer in some cases. The mask layer is preferably an insulating layer formed using an inorganic material like the above protective insulating film.

In the case where an insulating layer having a stacked-layer structure is used, a first layer of the insulating layer is preferably formed using an inorganic insulating material because it is formed in contact with the EL layer. In particular, the first layer is preferably formed by an atomic layer deposition (ALD) method, which causes less deposition damage. Alternatively, an inorganic insulating layer is preferably formed by a sputtering method, a chemical vapor deposition (CVD) method, or a plasma-enhanced chemical vapor deposition (PECVD) method, which has higher deposition rate than an ALD method. In this case, a highly reliable display panel can be fabricated with high productivity. A second layer of the insulating layer is preferably formed using an organic material to fill a depressed portion formed by the first layer of the insulating layer.

For example, an aluminum oxide film formed by an ALD method can be used as the first layer of the insulating layer, and an organic resin film can be used as the second layer of the insulating layer. It is preferable to use a photosensitive acrylic resin as the organic resin, for example.

In the case where the side surface of the EL layer and the organic resin film are in direct contact with each other, the EL layer might be damaged by an organic solvent or the like that might be contained in the organic resin film. The use of an inorganic insulating film such as an aluminum oxide film formed by an ALD method as the first layer of the insulating layer enables a structure where the organic resin film and the side surface of the EL layer are not in direct contact with each other. Thus, the EL layer can be inhibited from being dissolved by the organic solvent, for example.

In a cross-sectional view of the display apparatus, the side surface of the second layer of the insulating layer preferably has a tapered shape with a taper angle θ1. The taper angle θ1 is an angle formed by the side surface of the second layer of the insulating layer and the substrate surface. The taper angle θ1 is less than 90°, preferably less than or equal to 60°, and further preferably less than or equal to 45°.

In this specification and the like, a tapered shape indicates a shape in which at least part of the side surface of the component is inclined to a substrate surface. For example, a tapered shape preferably includes a region where the angle between the inclined side surface and the substrate surface (such an angle is also referred to as a taper angle) is less than 90°. Note that the side surface of the component and the substrate surface are not necessarily completely flat and may be substantially flat with a slight curvature or substantially flat with slight unevenness.

Such a forward tapered shape of the end portion of the side surface of the second layer of the insulating layer can prevent disconnection, local thinning, or the like from occurring in the common layer and the common electrode which are provided over the end portion of the side surface of the second layer of the insulating layer, leading to film formation with good coverage. The common layer and the common electrode can have improved in-plane uniformity in this manner, whereby the display apparatus can have improved display quality.

The top surface of the second layer of the insulating layer preferably has a convex shape in a cross-sectional view of the display apparatus. The top surface of the second layer of the insulating layer preferably has a convex shape that bulges gradually toward the center. When the second layer of the insulating layer has such a shape, the common layer and the common electrode can be formed with good coverage.

It is preferable that one end portion of the second layer of the insulating layer overlap with a first pixel electrode and the other end portion of the second layer of the insulating layer overlap with a second pixel electrode. Such a structure enables the end portion of the second layer of the insulating layer to be formed over a substantially flat region of the EL layer. This makes it relatively easy to process the second layer of the insulating layer into a tapered shape.

In the display panel of one embodiment of the present invention, an insulating layer covering an end portion of the pixel electrode does not need to be provided between the pixel electrode and the EL layer, so that the interval between adjacent light-emitting devices can be extremely short. As a result, higher resolution or higher definition of the display panel can be achieved. In addition, a mask for forming the insulating layer is not needed, reducing the manufacturing cost of the display panel.

Furthermore, light emitted from the EL layer can be extracted efficiently with a structure where an insulating layer covering the end portion of the pixel electrode is not provided between the pixel electrode and the EL layer, i.e., a structure where an insulating layer is not provided between the pixel electrode and the EL layer. Therefore, the display panel of one embodiment of the present invention can significantly reduce the viewing angle dependence. A reduction in the viewing angle dependence leads to an increase in visibility of an image on the display panel. For example, in the display panel of one embodiment of the present invention, the viewing angle (the maximum angle with a certain contrast ratio maintained when the screen is seen from an oblique direction) can be greater than or equal to 100° and less than 180°, preferably greater than or equal to 150° and less than or equal to 170°. Note that the viewing angle refers to that in both the vertical direction and the horizontal direction.

[Structure Example of Display Panel]

FIG. 1 to FIG. 3 illustrate a display panel of one embodiment of the present invention.

FIG. 1A is a top view of a display panel 100. The display panel 100 includes a display portion in which a plurality of pixels 110 are arranged, and a connection portion 140 outside the display portion. A plurality of subpixels are arranged in a matrix in the display portion. FIG. 1A illustrates subpixels arranged in two rows and six columns, which form pixels in two rows and two columns. The connection portion 140 can also be referred to as a cathode contact portion.

The pixel 110 illustrated in FIG. 1A employs stripe arrangement. The pixel 110 illustrated in FIG. 1A is composed of three subpixels 110*a*, 110*b*, and 110*c*. The subpixels 110*a*, 110*b*, and 110*c* include light-emitting devices that emit light of different colors. As the subpixels 110*a*, 110*b*, and 110*c*, subpixels of three colors of red (R), green (G), and blue (B) or subpixels of three colors of yellow (Y), cyan (C), and magenta (M) can be given, for example. The number of types of subpixels is not limited to three, and may be four or more. As four subpixels, subpixels of four colors of R, G, B, and white (W), subpixels of four colors of R, G, B, and Y, and four subpixels of R, G, B, and infrared light (IR) can be given, for example.

In this specification and the like, the row direction and the column direction are sometimes referred to as the X direction and the Y direction, respectively. The X direction and the Y direction intersect with each other and are, for example, orthogonal to each other (see FIG. 1A).

FIG. 1A illustrates an example where subpixels of different colors are arranged in the X direction and subpixels of the same color are arranged in the Y direction.

Although FIG. 1A illustrates an example where the connection portion 140 is positioned on the lower side of the display portion in the top view, one embodiment of the present invention is not particularly limited. The connection portion 140 only needs to be provided on at least one of the upper side, the right side, the left side, and the lower side of the display portion in the top view, and may be provided to surround the four sides of the display portion. The top surface shape of the connection portion 140 can be a belt-like shape, an L shape, a U shape, a frame-like shape, or the like. The number of the connection portions 140 can be one or more.

Figure 1B:
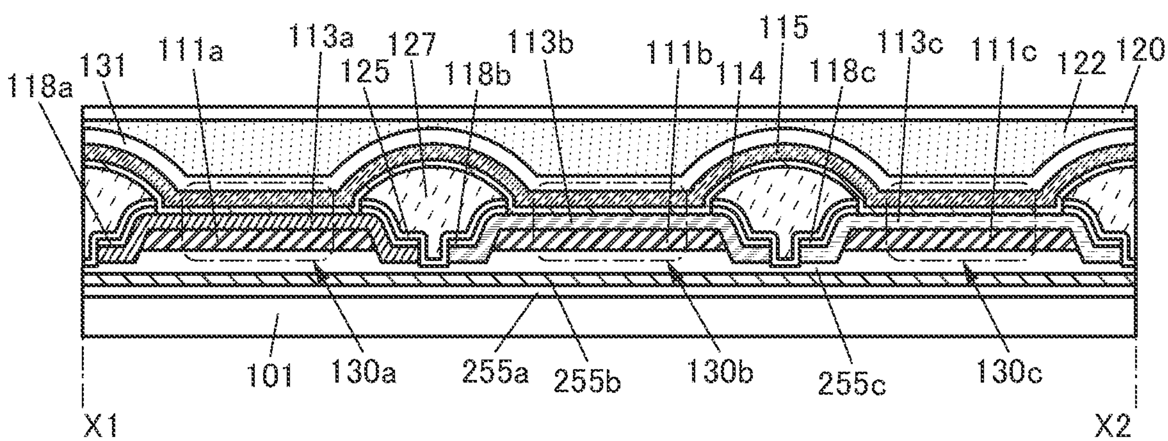
FIG. 1B is a cross-sectional view illustrating the example of a display panel.
Figure 3A:
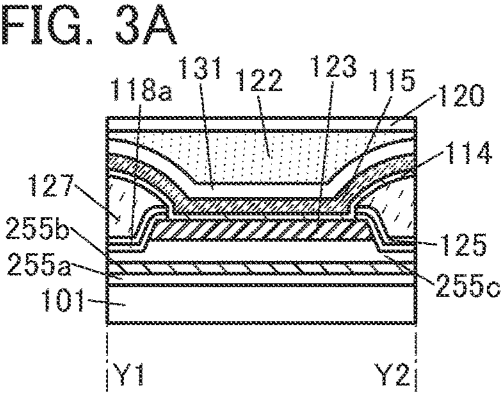
FIG. 3A to FIG. 3D are cross-sectional views illustrating examples of a display panel.
Figure 3B:
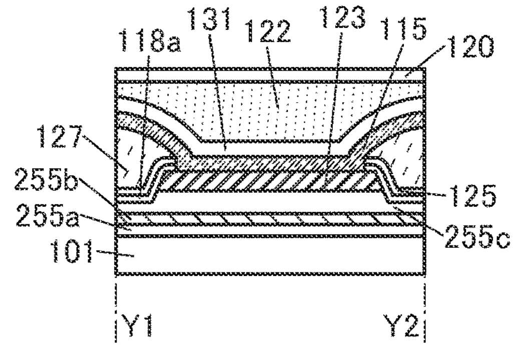
Figure 3C:
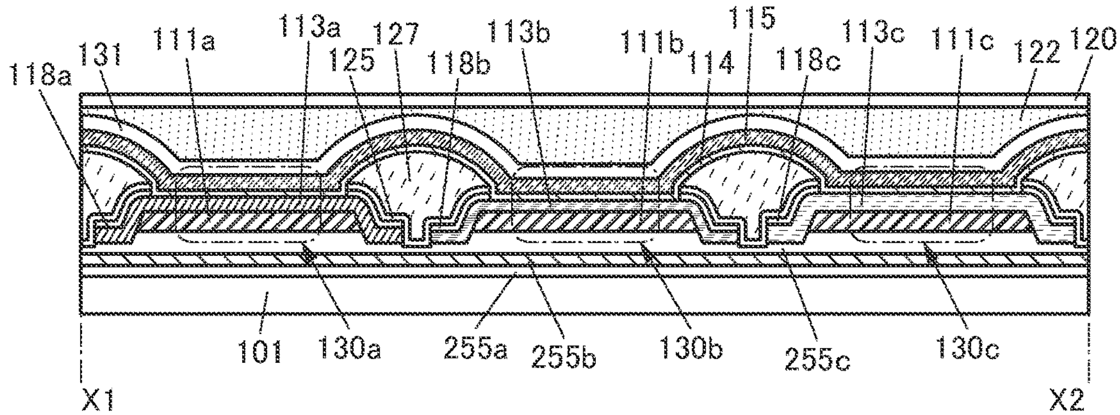

FIG. 1B and FIG. 3C are each a cross-sectional view along the dashed-dotted line X1-X2 in FIG. 1A. FIG. 3A and FIG. 3B are each a cross-sectional view along the dashed-dotted line Y1-Y2 in FIG. 1A.

As illustrated in FIG. 1B, in the display panel 100, an insulating layer is provided over a layer 101 including transistors, light-emitting devices 130*a*, 130*b*, and 130*c* are provided over the insulating layer, and a protective layer 131 is provided to cover these light-emitting devices. A substrate 120 is attached to the protective layer 131 with a resin layer 122. In a region between adjacent light-emitting devices, an insulating layer 125 and an insulating layer 127 over the insulating layer 125 are provided.

Although FIG. 1B and the like illustrate a plurality of cross sections of the insulating layer 125 and the insulating layer 127, the insulating layer 125 and the insulating layer 127 are each a continuous layer when the display panel 100 is seen from above. In other words, the display panel 100 can have a structure including one insulating layer 125 and one insulating layer 127, for example. Note that the display panel 100 may include a plurality of insulating layers 125 which are separated from each other and a plurality of insulating layers 127 which are separated from each other.

The display panel of one embodiment of the present invention can have any of the following structures: a top-emission structure in which light is emitted in a direction opposite to the substrate where the light-emitting devices are formed, a bottom-emission structure in which light is emitted toward the substrate where the light-emitting devices are formed, and a dual-emission structure in which light is emitted toward both surfaces.

The layer 101 including transistors can have a stacked-layer structure in which a plurality of transistors are provided over a substrate and an insulating layer is provided to cover these transistors, for example. The insulating layer over the transistors may have a single-layer structure or a stacked-layer structure. In FIG. 1B and the like, an insulating layer 255*a*, an insulating layer 255*b* over the insulating layer 255*a*, and an insulating layer 255*c* over the insulating layer 255*b* are illustrated as the insulating layer over the transistors. These insulating layers may have a depressed portion between adjacent light-emitting devices. In the example illustrated in FIG. 1B and the like, the insulating layer 255*c* has a depressed portion.

As each of the insulating layer 255*a*, the insulating layer 255*b*, and the insulating layer 255*c*, any of a variety of inorganic insulating films such as an oxide insulating film, a nitride insulating film, an oxynitride insulating film, and a nitride oxide insulating film can be suitably used. As each of the insulating layer 255*a* and the insulating layer 255*c*, an oxide insulating film or an oxynitride insulating film, such as a silicon oxide film, a silicon oxynitride film, or an aluminum oxide film, is preferably used. As the insulating layer 255*b*, a nitride insulating film or a nitride oxide insulating film, such as a silicon nitride film or a silicon nitride oxide film, is preferably used. Specifically, it is preferable that a silicon oxide film be used as each of the insulating layer 255*a* and the insulating layer 255*c* and a silicon nitride film be used as the insulating layer 255*b*. The insulating layer 255*b* preferably has a function of an etching protective film.

Note that in this specification and the like, oxynitride refers to a material that contains more oxygen than nitrogen in its composition, and nitride oxide refers to a material that contains more nitrogen than oxygen in its composition. For example, silicon oxynitride refers to a material that contains more oxygen than nitrogen in its composition, and silicon nitride oxide refers to a material that contains more nitrogen than oxygen in its composition.

Structure examples of the layer 101 including transistors will be described in Embodiment 3 and Embodiment 4.

The light-emitting devices 130*a*, 130*b*, and 130*c* emit light of different colors. Preferably, the light-emitting devices 130*a*, 130*b*, and 130*c* emit light of three colors, red (R), green (G), and blue (B), for example.

As the light-emitting devices 130*a*, 130*b*, and 130*c*, an EL device such as an OLED (Organic Light Emitting Diode) or a QLED (Quantum-dot Light Emitting Diode) is preferably used. Examples of a light-emitting substance contained in the EL device include a substance that exhibits fluorescence (a fluorescent material), a substance that exhibits phosphorescence (a phosphorescent material), an inorganic compound (e.g., a quantum dot material), and a substance that exhibits thermally activated delayed fluorescence (a thermally activated delayed fluorescent (TADF) material). As the TADF material, a material in which the singlet and triplet excited states are in thermal equilibrium may be used. Since such a TADF material has a short emission lifetime (excitation lifetime), it can inhibit a reduction in the emission efficiency of a light-emitting device in a high-luminance region.

The light-emitting device includes an EL layer between a pair of electrodes. The EL layer includes at least a light-emitting layer. In this specification and the like, one of the pair of electrodes is referred to as a pixel electrode and the other is referred to as a common electrode in some cases.

One of the pair of electrodes of the light-emitting device functions as an anode, and the other electrode functions as a cathode. The case where the pixel electrode functions as an anode and the common electrode functions as a cathode will be described below as an example in some cases.

The end portions of the pixel electrode 111*a*, the pixel electrode 111*b*, and the pixel electrode 111*c* each preferably have a tapered shape. Specifically, the end portions of the pixel electrode 111*a*, the pixel electrode 111*b*, and the pixel electrode 111*c* each preferably have a tapered shape with a taper angle less than 90°. When the end portions of these pixel electrodes have a tapered shape, a first layer 113*a*, a second layer 113*b*, and a third layer 113*c* provided along the side surfaces of the pixel electrodes also have a tapered shape. When the side surface of the pixel electrode has a tapered shape, coverage with the EL layer provided along the side surface of the pixel electrode can be improved. Furthermore, when the side surface of the pixel electrode has a tapered shape, a material (also referred to as dust or particles) in the fabrication step is easily removed by processing such as cleaning, which is preferable.

The light-emitting device 130*a* includes the pixel electrode 111*a* over the insulating layer 255*c*, the island-shaped first layer 113*a* over the pixel electrode 111*a*, a common layer 114 over the island-shaped first layer 113*a*, and a common electrode 115 over the common layer 114. In the light-emitting device 130*a*, the first layer 113*a* and the common layer 114 can be collectively referred to as an EL layer.

The light-emitting device 130*b* includes the pixel electrode 111*b* over the insulating layer 255*c*, the island-shaped second layer 113*b* over the pixel electrode 111*b*, the common layer 114 over the island-shaped second layer 113*b*, and the common electrode 115 over the common layer 114. In the light-emitting device 130*b*, the second layer 113*b* and the common layer 114 can be collectively referred to as an EL layer.

The light-emitting device 130*c* includes the pixel electrode 111*c* over the insulating layer 255*c*, the island-shaped third layer 113*c* over the pixel electrode 111*c*, the common layer 114 over the island-shaped third layer 113*c*, and the common electrode 115 over the common layer 114. In the light-emitting device 130*c*, the third layer 113*c* and the common layer 114 can be collectively referred to as an EL layer.

There is no particular limitation on the structure of the light-emitting device of this embodiment, and the light-emitting device can have a single structure or a tandem structure.

In this embodiment, in the EL layers included in the light-emitting devices, the island-shaped layers provided in the light-emitting devices are referred to as the first layer 113*a*, the second layer 113*b*, and the third layer 113*c*, and the layer shared by the plurality of light-emitting devices is referred to as the common layer 114. In this specification and the like, only the first layer 113*a*, the second layer 113*b*, and the third layer 113*c* are sometimes referred to as EL layers, in which case the common layer 114 is not included in the EL layer.

The first layer 113*a*, the second layer 113*b*, and the third layer 113*c* each include at least a light-emitting layer. Preferably, the first layer 113*a* includes a light-emitting layer emitting red light, the second layer 113*b* includes a light-emitting layer emitting green light, and the third layer 113*c* includes a light-emitting layer emitting blue light, for example.

The first layer 113*a*, the second layer 113*b*, and the third layer 113*c* may each include one or more of a hole-injection layer, a hole-transport layer, a hole-blocking layer, a charge-generation layer, an electron-blocking layer, an electron-transport layer, and an electron-injection layer.

The first layer 113a, the second layer 113b, and the third layer 113c may each include a hole-injection layer, a hole-transport layer, a light-emitting layer, and an electron-transport layer, for example. In addition, an electron-blocking layer may be provided between the hole-transport layer and the light-emitting layer. Furthermore, an electron-injection layer may be provided over the electron-transport layer.

The first layer 113a, the second layer 113b, and the third layer 113c may each include an electron-injection layer, an electron-transport layer, a light-emitting layer, and a hole-transport layer in this order, for example. In addition, a hole-blocking layer may be provided between the electron-transport layer and the light-emitting layer. Furthermore, a hole-injection layer may be provided over the hole-transport layer.

The first layer 113a, the second layer 113b, and the third layer 113c each preferably include a light-emitting layer and a carrier-transport layer (an electron-transport layer or a hole-transport layer) over the light-emitting layer. Since the surfaces of the first layer 113a, the second layer 113b, and the third layer 113c are exposed in the fabrication process of the display panel, providing the carrier-transport layer over the light-emitting layer inhibits the light-emitting layer from being exposed on the outermost surface, so that damage to the light-emitting layer can be reduced. Thus, the reliability of the light-emitting device can be increased.

The first layer 113a, the second layer 113b, and the third layer 113c each include a first light-emitting unit, a charge-generation layer, and a second light-emitting unit, for example. Preferably, the first layer 113a includes two or more light-emitting units that emit red light, the second layer 113b includes two or more light-emitting units that emit green light, and the third layer 113c includes two or more light-emitting units that emit blue light, for example.

The second light-emitting unit preferably includes a light-emitting layer and a carrier-transport layer (an electron-transport layer or a hole-transport layer) over the light-emitting layer. Since the surface of the second light-emitting unit is exposed in the fabrication process of the display panel, providing the carrier-transport layer over the light-emitting layer inhibits the light-emitting layer from being exposed on the outermost surface, so that damage to the light-emitting layer can be reduced. Thus, the reliability of the light-emitting device can be increased.

The common layer 114 includes, for example, an electron-injection layer or a hole-injection layer. Alternatively, the common layer 114 may be a stack of an electron-transport layer and an electron-injection layer, and may be a stack of a hole-transport layer and a hole-injection layer. The common layer 114 is shared by the light-emitting devices 130a, 130b, and 130c.

The common electrode 115 is shared by the light-emitting devices 130a, 130b, and 130c. The common electrode 115 shared by the plurality of light-emitting devices is electrically connected to a conductive layer 123 provided in the connection portion 140 (see FIG. 3A and FIG. 3B). As the conductive layer 123, a conductive layer formed using the same material in the same step as the pixel electrodes 111a, 111b, and 111c is preferably used.

Note that FIG. 3A illustrates an example in which the common layer 114 is provided over the conductive layer 123 and the conductive layer 123 and the common electrode 115 are electrically connected to each other through the common layer 114. The common layer 114 is not necessarily provided in the connection portion 140. In FIG. 3B, the conductive layer 123 and the common electrode 115 are directly connected to each other. For example, by using a mask for specifying a film formation area (also referred to as an area mask or a rough metal mask to be distinguished from a fine metal mask), the common layer 114 and the common electrode 115 can be formed in different regions.

The protective layer 131 is preferably provided over the light-emitting devices 130a, 130b, and 130c. Providing the protective layer 131 can improve the reliability of the light-emitting devices. The protective layer 131 may have a single-layer structure or a stacked-layer structure of two or more layers.

There is no limitation on the conductivity of the protective layer 131. For the protective layer 131, at least one kind of an insulating film, a semiconductor film, and a conductive film can be used.

The protective layer 131 including an inorganic film can inhibit deterioration of the light-emitting devices by preventing oxidation of the common electrode 115 and inhibiting entry of impurities (e.g., moisture and oxygen) into the light-emitting devices, for example; thus, the reliability of the display panel can be improved.

For the protective layer 131, an inorganic insulating film such as an oxide insulating film, a nitride insulating film, an oxynitride insulating film, or a nitride oxide insulating film can be used, for example. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, the protective layer 131 preferably includes a nitride insulating film or a nitride oxide insulating film, and further preferably includes a nitride insulating film.

For the protective layer 131, an inorganic film containing an In—Sn oxide (also referred to as ITO), an In—Zn oxide, a Ga—Zn oxide, an Al—Zn oxide, an indium gallium zinc oxide (In—Ga—Zn oxide, also referred to as IGZO), or the like can also be used. The inorganic film preferably has high resistance, specifically, higher resistance than the common electrode 115. The inorganic film may further contain nitrogen.

When light emitted from the light-emitting device is extracted through the protective layer 131, the protective layer 131 preferably has a high property of transmitting visible light. For example, ITO, IGZO, and aluminum oxide are preferable because they are inorganic materials having a high property of transmitting visible light.

The protective layer 131 can have, for example, a stacked-layer structure of an aluminum oxide film and a silicon nitride film over the aluminum oxide film, or a stacked-layer structure of an aluminum oxide film and an IGZO film over the aluminum oxide film. Such a stacked-layer structure can inhibit entry of impurities (such as water and oxygen) into the EL layer.

Furthermore, the protective layer 131 may include an organic film. For example, the protective layer 131 may include both an organic film and an inorganic film. Examples of an organic material that can be used for the protective layer 131 include organic insulating materials that can be used for the insulating layer 127 described later.

The protective layer 131 may have a stacked-layer structure of two layers which are formed by different deposition methods. Specifically, the first layer of the protective layer 131 may be formed by an ALD method and the second layer of the protective layer 131 may be formed by a sputtering method.

In FIG. 1B and the like, an insulating layer covering an end portion of the top surface of the pixel electrode 111*a* is not provided between the pixel electrode 111*a* and the first layer 113*a*. An insulating layer covering an end portion of the top surface of the pixel electrode 111*b* is not provided between the pixel electrode 111*b* and the second layer 113*b*. Thus, the distance between adjacent light-emitting devices can be extremely short. Accordingly, the display panel can have high resolution or high definition.

In FIG. 1B and the like, a mask layer 118*a* is positioned over the first layer 113*a* included in the light-emitting device 130*a*, a mask layer 118*b* is positioned over the second layer 113*b* included in the light-emitting device 130*b*, and a mask layer 118*c* is positioned over the third layer 113*c* included in the light-emitting device 130*c*. The mask layer 118*a* is a remaining portion of the mask layer provided in contact with the top surface of the first layer 113*a* when the first layer 113*a* is processed. Similarly, the mask layer 118*b* and the mask layer 118*c* are remaining portions of the mask layers provided when the second layer 113*b* and the third layer 113*c* are formed, respectively. Thus, the mask layer used to protect the EL layer in fabrication of the EL layer may partly remain in the display panel of one embodiment of the present invention. For any two or all of the mask layer 118*a* to the mask layer 118*c*, the same or different materials may be used. Note that the mask layer 118*a*, the mask layer 118*b*, and the mask layer 118*c* are hereinafter collectively referred as a mask layer 118 in some cases.

In FIG. 1B, one end portion of the mask layer 118*a* is aligned or substantially aligned with the end portion of the first layer 113*a*, and the other end portion of the mask layer 118*a* is positioned over the first layer 113*a*. Here, the other end portion of the mask layer 118*a* preferably overlaps with the first layer 113*a* and the pixel electrode 111*a*. In that case, the other end portion of the mask layer 118*a* is likely to be formed over a substantially flat surface of the first layer 113*a*. The same applies to the mask layer 118*b* and the mask layer 118*c*. The mask layer 118 remains between, for example, the EL layer processed into an island shape (the first layer 113*a*, the second layer 113*b*, or the third layer 113*c*) and the insulating layer 125.

As the mask layer 118, one or more kinds of a metal film, an alloy film, a metal oxide film, a semiconductor film, an organic insulating film, and an inorganic insulating film can be used, for example. As the mask layer, any of a variety of inorganic insulating films that can be used as the protective layer 131 can be used. For example, an inorganic insulating material such as aluminum oxide, hafnium oxide, or silicon oxide can be used.

As illustrated in FIG. 1B, the insulating layer 125 and the insulating layer 127 preferably cover part of the top surface of the EL layer (the first layer 113*a*, the second layer 113*b*, or the third layer 113*c*) processed into an island shape. When one or both of the insulating layer 125 and the insulating layer 127 cover not only the side surface but also the top surface of the EL layer (the first layer 113*a*, the second layer 113*b*, or the third layer 113*c*) processed into an island shape, peeling of the EL layer can further be prevented and the reliability of the light-emitting device can be increased. The fabrication yield of the light-emitting device can also be increased. In the example illustrated in FIG. 1B, a stacked-layer structure of the first layer 113*a*, the mask layer 118*a*, the insulating layer 125, and the insulating layer 127 is positioned over the end portion of the pixel electrode 111*a*. Similarly, a stacked-layer structure of the second layer 113*b*, the mask layer 118*b*, the insulating layer 125, and the insulating layer 127 is positioned over the end portion of the pixel electrode 111*b*; a stacked-layer structure of the third layer 113*c*, the mask layer 118*c*, the insulating layer 125, and the insulating layer 127 is positioned over the end portion of the pixel electrode 111*c*.

FIG. 1B and the like illustrate an example where the end portion of the first layer 113*a* is positioned outward from the end portion of the pixel electrode 111*a*. Note that although the pixel electrode 111*a* and the first layer 113*a* are given as an example, the following description applies to the pixel electrode 111*b* and the second layer 113*b*, and the pixel electrode 111*c* and the third layer 113*c*.

In FIG. 1B and the like, the first layer 113*a* is formed to cover the end portion of the pixel electrode 111*a*. Such a structure can increase the aperture ratio compared with the structure in which the end portion of the island-shaped EL layer is positioned inward from the end portion of the pixel electrode.

Covering the side surface of the pixel electrode with the EL layer inhibits contact between the pixel electrode and the common electrode 115, thereby inhibiting a short circuit of the light-emitting device. Furthermore, the distance between the light-emitting region (i.e., the region overlapping with the pixel electrode) in the EL layer and the end portion of the EL layer can be increased; therefore, the reliability can be improved.

The side surfaces of the first layer 113*a*, the second layer 113*b*, and the third layer 113*c* are covered with the insulating layer 127 and the insulating layer 125. The top surfaces of the first layer 113*a*, the second layer 113*b*, and the third layer 113*c* are partly covered with the insulating layer 127, the insulating layer 125, and the mask layer 118. Thus, the common layer 114 (or the common electrode 115) can be inhibited from being in contact with the side surfaces of the pixel electrode 111*a*, the pixel electrode 111*b*, and the pixel electrode 111*c*, the first layer 113*a*, the second layer 113*b*, and the third layer 113*c*, whereby a short circuit of the light-emitting device can be inhibited. Thus, the reliability of the light-emitting device can be increased.

The insulating layer 125 preferably covers at least one of the side surfaces of the island-shaped EL layers, and further preferably covers both of the side surfaces of the island-shaped EL layers. The insulating layer 125 can be in contact with the side surfaces of the island-shaped EL layers.

In FIG. 1B and the like, the end portion of the pixel electrode 111*a* is covered with the first layer 113*a* and the insulating layer 125 is in contact with the side surface of the first layer 113*a*. Similarly, the end portion of the pixel electrode 111*b* is covered with the second layer 113*b*, the end portion of the pixel electrode 111*c* is covered with the third layer 113*c*, and the insulating layer 125 is in contact with the side surface of the second layer 113*b* and the side surface of the third layer 113*c*.

The insulating layer 127 is provided over the insulating layer 125 to fill a depressed portion formed in the insulating layer 125. The insulating layer 127 can overlap with the side surfaces and parts of the top surfaces of the first layer 113*a*, the second layer 113*b*, and the third layer 113*c* with the insulating layer 125 therebetween.

The insulating layer 125 and the insulating layer 127 can fill a gap between adjacent island-shaped layers; hence, extreme unevenness of the formation surface of the layers (e.g., the carrier-injection layer and the common electrode) provided over the island-shaped layers can be reduced, and the formation surface can be made flatter. Thus, the coverage with the carrier-injection layer, the common electrode, and the like can be increased and disconnection of the common electrode can be prevented.

The common layer 114 and the common electrode 115 are provided over the first layer 113*a*, the second layer 113*b*, the third layer 113*c*, the mask layer 118, the insulating layer 125, and the insulating layer 127. At the stage before the insulating layer 125 and the insulating layer 127 are provided, a level difference due to a region where the pixel electrode and the EL layer are provided and a region where the pixel electrode and the EL layer are not provided (a region between the light-emitting devices) is caused. The display panel of one embodiment of the present invention can eliminate the level difference by including the insulating layer 125 and the insulating layer 127, whereby the coverage with the common layer 114 and the common electrode 115 can be improved. Consequently, it is possible to inhibit a connection defect due to disconnection. Alternatively, it is possible to inhibit an increase in electric resistance due to local thinning of the common electrode 115 caused by the level difference.

In order to improve the flatness of the formation surfaces of the common layer 114 and the common electrode 115, the top surface of the insulating layer 125 and the top surface of the insulating layer 127 are each preferably level or substantially level with the top surface at the end portion of at least one of the first layer 113*a*, the second layer 113*b*, and the third layer 113*c*. The top surface of the insulating layer 127 preferably has higher flatness, but may include a projection portion, a convex surface, a concave surface, or a depressed portion. For example, the top surface of the insulating layer 127 preferably has a smooth convex shape with high flatness.

The insulating layer 125 can be provided in contact with the island-shaped EL layers. Thus, peeling of the island-shaped EL layers can be prevented. Close contact between the insulating layer and the EL layer brings about the insulating layer's effect of fixing or bonding the adjacent island-shaped EL layers to each other. Thus, the reliability of the light-emitting device can be increased. In addition, the fabrication yield of the light-emitting device can be increased.

The insulating layer 125 includes a region in contact with the side surface of the island-shaped EL layer and functions as a protective insulating layer of the island-shaped EL layer. Providing the insulating layer 125 can inhibit entry of impurities (e.g., oxygen and moisture) into the inside of the island-shaped EL layer through its side surface, resulting in a highly reliable display apparatus.

Note that in the display apparatus of one embodiment of the present invention, the insulating layer 127 is provided over the insulating layer 125 to fill the depressed portion formed in the insulating layer 125. Moreover, the insulating layer 127 is provided between the island-shaped EL layers. In other words, the display apparatus of one embodiment of the present invention employs a process in which an island-shaped EL layer is formed and then the insulating layer 127 is formed to overlap with the end portion of the island-shaped EL layer (hereinafter referred to as a process 1). As a process different from the process 1, there is a process in which a pixel electrode is formed in an island shape, an insulating film (also referred to as a bank or a structure body) that covers an end portion of the pixel electrode is formed, and then an island-shaped EL layer is formed over the pixel electrode and the insulating film (hereinafter referred to as a process 2).

The process 1 is preferable to the process 2 because an allowable range of the process can be widened. Specifically, the process 1 has a wider allowable range with respect to alignment accuracy between different patterning steps than the process 2 and can provide display apparatuses with few variations. Since the method for fabricating the display apparatus of one embodiment of the present invention is based on the process 1, a display apparatus with few variations and high display quality can be provided.

Next, examples of materials and formation methods of the insulating layer 125 and the insulating layer 127 are described.

The insulating layer 125 can be an insulating layer containing an inorganic material. As the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. Aluminum oxide is particularly preferable because it has high selectivity with the EL layer in etching and has a function of protecting the EL layer in forming the insulating layer 127 which is to be described later. In particular, when an inorganic insulating film such as an aluminum oxide film, a hafnium oxide film, or a silicon oxide film formed by an ALD method is used as the insulating layer 125, the insulating layer 125 having few pinholes and an excellent function of protecting the EL layer can be formed. The insulating layer 125 may have a stacked-layer structure of a film formed by an ALD method and a film formed by a sputtering method. For example, the insulating layer 125 may have a stacked-layer structure of an aluminum oxide film formed by an ALD method and a silicon nitride film formed by a sputtering method.

The insulating layer 125 preferably has a function of a barrier insulating layer against at least one of water and oxygen. Alternatively, the insulating layer 125 preferably has a function of inhibiting diffusion of at least one of water and oxygen. Alternatively, the insulating layer 125 preferably has a function of capturing or fixing (also referred to as gettering) at least one of water and oxygen.

When the insulating layer 125 has a function of a barrier insulating layer or a gettering function, entry of impurities (typically, at least one of water and oxygen) that might diffuse into the light-emitting devices from the outside can be inhibited. With this structure, a highly reliable light-emitting device and a highly reliable display panel can be provided.

The insulating layer 125 preferably has a low impurity concentration. In this case, deterioration of the EL layer due to entry of impurities from the insulating layer 125 into the EL layer can be inhibited. In addition, when having a low impurity concentration, the insulating layer 125 can have a high barrier property against at least one of water and oxygen. For example, the insulating layer 125 preferably has one of a sufficiently low hydrogen concentration and a sufficiently low carbon concentration, desirably has both of them.

Examples of the formation method of the insulating layer 125 include a sputtering method, a CVD method, a pulsed laser deposition (PLD) method, and an ALD method. The insulating layer 125 is preferably formed by an ALD method achieving good coverage.

When the substrate temperature in forming the insulating layer 125 is increased, the formed insulating layer 125, even with a small thickness, can have a low impurity concentration and a high barrier property against at least one of water and oxygen. Therefore, the substrate temperature is preferably higher than or equal to 60° C., more preferably higher than or equal to 80° C., further preferably higher than or equal to 100° C., still further preferably higher than or equal to 120° C. Meanwhile, the insulating layer 125 is formed after formation of an island-shaped EL layer, and thus is preferably formed at a temperature lower than the upper temperature limit of the EL layer. Therefore, the substrate temperature is preferably lower than or equal to 200° C., more preferably lower than or equal to 180° C., further preferably lower than or equal to 160° C., still further preferably lower than or equal to 150° C., yet still further preferably lower than or equal to 140° C.

Examples of indicators of the upper temperature limit include the glass transition point, the softening point, the melting point, the thermal decomposition temperature, and the 5% weight loss temperature. The upper temperature limit of the EL layer can be, for example, any of the above temperatures, preferably the lowest temperature thereof.

As the insulating layer 125, an insulating film is preferably formed to have a thickness greater than or equal to 3 nm, greater than or equal to 5 nm, or greater than or equal to 10 nm and less than or equal to 200 nm, less than or equal to 150 nm, less than or equal to 100 nm, or less than or equal to 50 nm.

The insulating layer 127 provided over the insulating layer 125 has a planarization function for extreme unevenness on the insulating layer 125 formed between adjacent light-emitting devices. In other words, the insulating layer 127 brings an effect of improving the flatness of a formation surface of the common electrode 115.

As the insulating layer 127, an insulating layer containing an organic material can be suitably used. As the organic material, a photosensitive organic resin is preferably used; for example, a photosensitive acrylic resin may be used. The viscosity of the material for the insulating layer 127 is greater than or equal to 1 cP and less than or equal to 1500 cP, and is preferably greater than or equal to 1 cP and less than or equal to 12 cP. By setting the viscosity of the material for the insulating layer 127 in the above range, the insulating layer 127 having a tapered shape, which is to be described later, can be formed relatively easily. Note that in this specification and the like, an acrylic resin refers to not only a polymethacrylic acid ester or a methacrylic resin, but also all the acrylic polymer in a broad sense in some cases.

Note that the organic material usable for the insulating layer 127 is not limited to the above-described materials as long as the side surface of the insulating layer 127 has a tapered shape as described later. For example, the insulating layer 127 can be formed using an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like in some cases. Alternatively, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin can be used for the insulating layer 127 in some cases. As the photosensitive resin, a photoresist can be used in some cases. As the photosensitive resin, a positive material or a negative material can be used in some cases.

The insulating layer 127 may be formed using a material absorbing visible light. When the insulating layer 127 absorbs light emitted from the light-emitting device, leakage of light (stray light) from the light-emitting device to an adjacent light-emitting device through the insulating layer 127 can be inhibited. Thus, the display quality of the display panel can be improved. Since the display quality of the display panel can be improved without using a polarizing plate, the weight and thickness of the display panel can be reduced.

Examples of the material absorbing visible light include a material containing a pigment of black or any other color, a material containing a dye, a light-absorbing resin material (e.g., polyimide), and a resin material that can be used for color filters (a color filter material). It is particularly preferable to use a resin material obtained by stacking or mixing color filter materials of two or three or more colors to enhance the effect of blocking visible light. In particular, mixing color filter materials of three or more colors enables the formation of a black or nearly black resin layer.

For example, the insulating layer 127 can be formed by a wet film-formation method such as spin coating, dipping, spray coating, ink-jetting, dispensing, screen printing, offset printing, doctor knife coating, slit coating, roll coating, curtain coating, or knife coating. Specifically, an organic insulating film that is to be the insulating layer 127 is preferably formed by spin coating. The insulating layer 127 is formed at a temperature lower than the upper temperature limit of the EL layer. The typical substrate temperature in formation of the insulating layer 127 is lower than or equal to 200° C., preferably lower than or equal to 180° C., further preferably lower than or equal to 160° C., still further preferably lower than or equal to 150° C., yet still further preferably lower than or equal to 140° C.

Figure 2A:
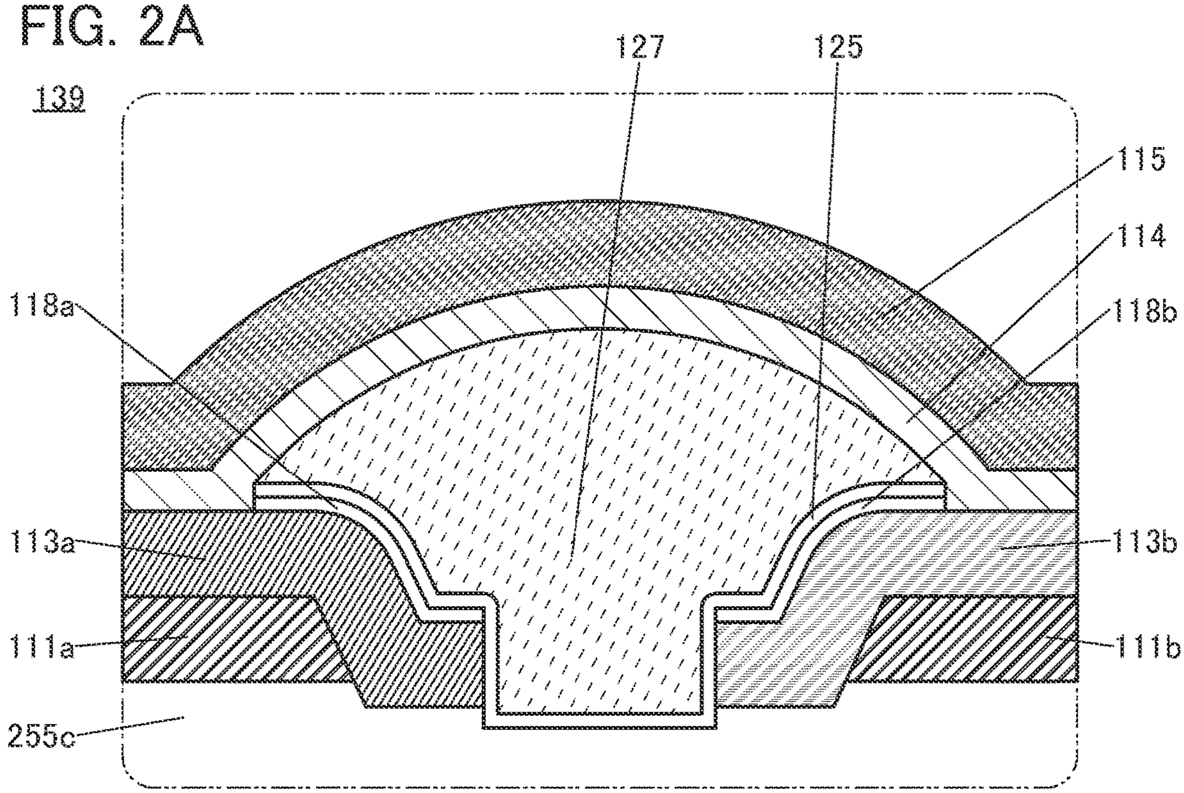
FIG. 2A and FIG. 2B are cross-sectional views illustrating an example of a display panel.
Figure 2B:
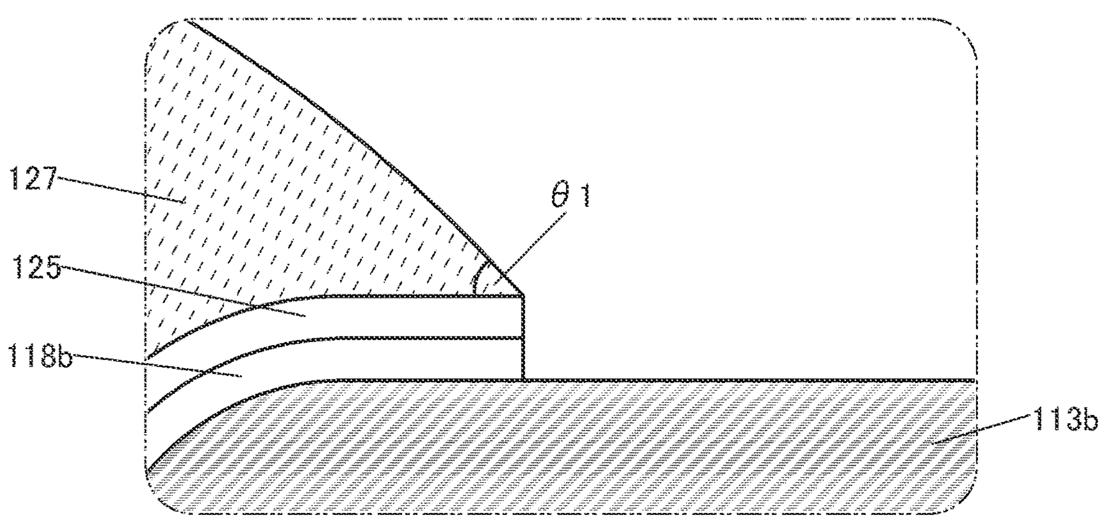

Here, a structure of the insulating layer 127 and the vicinity thereof will be described with reference to FIG. 2A and FIG. 2B. FIG. 2A is an enlarged cross-sectional view of a region 139 including the insulating layer 127 between the light-emitting device 130*a* and the light-emitting device 130*b* and the vicinity of the insulating layer 127. The description made below using the insulating layer 127 between the light-emitting device 130*a* and the light-emitting device 130*b* as an example applies to the insulating layer 127 between the light-emitting device 130*b* and the light-emitting device 130*c*, the insulating layer 127 between the light-emitting device 130*c* and the light-emitting device 130*a*, and the like. FIG. 2B is an enlarged view of the vicinity of an end portion of the insulating layer 127 over the second layer 113*b* illustrated in FIG. 2A. The description made below sometimes using the end portion of the insulating layer 127 over the second layer 113*b* as an example applies to an end portion of the insulating layer 127 over the first layer 113*a* and an end portion of the insulating layer 127 over the third layer 113*c*.

As illustrated in FIG. 2A, the first layer 113*a* is provided to cover the pixel electrode 111*a* and the second layer 113*b* is provided to cover the pixel electrode 111*b* in the region 139. The mask layer 118*a* is provided in contact with part of the top surface of the first layer 113*a*, and the mask layer 118*b* is provided in contact with part of the top surface of the second layer 113*b*. The insulating layer 125 is provided in contact with the top surface and the side surface of the mask layer 118*a*, the side surface of the first layer 113*a*, the top surface of the insulating layer 255*c*, the top surface and the side surface of the mask layer 118*b*, and the side surface of the second layer 113*b*. The insulating layer 127 is provided in contact with the top surface of the insulating layer 125. The common layer 114 is provided to cover the first layer 113*a*, the mask layer 118*a*, the second layer 113*b*, the mask layer 118*b*, the insulating layer 125, and the insulating layer 127, and the common electrode 115 is provided over the common layer 114.

In a cross-sectional view of the display apparatus, the side surface of the insulating layer 127 preferably has a tapered shape with the taper angle θ1 as illustrated in FIG. 2B. The taper angle θ1 is an angle formed by the side surface of the insulating layer 127 and the substrate surface. Note that the taper angle θ1 is not limited to the angle with the substrate surface, and may be an angle formed by the side surface of the insulating layer 127 and the top surface of the flat portion of the insulating layer 125, the top surface of the flat portion of the second layer 113*b*, the top surface of the flat portion of the pixel electrode 111*b*, or the like.

The taper angle θ1 of the insulating layer 127 is less than 90°, preferably less than or equal to 60°, and further preferably less than or equal to 45°. Such a forward tapered shape of the end portion of the side surface of the insulating layer 127 can prevent disconnection, local thinning, or the like from occurring in the common layer 114 and the common electrode 115 which are provided over the end portion of the side surface of the insulating layer 127, leading to film formation with good coverage. The common layer 114 and the common electrode 115 can have improved in-plane uniformity in this manner, whereby the display apparatus can have improved display quality.

As illustrated in FIG. 2A, the top surface of the insulating layer 127 preferably has a convex shape in a cross-sectional view of the display apparatus. The top surface of the insulating layer 127 preferably has a convex shape that bulges gradually toward the center. The insulating layer 127 preferably has a shape such that the projecting portion at the center portion of the top surface is connected smoothly to the tapered portion of the end portion of the side surface. When the insulating layer 127 has such a shape, the common layer 114 and the common electrode 115 can be formed with good coverage over the whole the insulating layer 127.

As illustrated in FIG. 2A, it is preferable that one end portion of the insulating layer 127 overlap with the pixel electrode 111*a* and that the other end portion of the insulating layer 127 overlap with the pixel electrode 111*b*. With such a structure, the end portion of the insulating layer 127 can be formed over a substantially flat region of the first layer 113*a* (the second layer 113*b*). This makes it relatively easy to process the tapered shape of the insulating layer 127 as described above.

By providing the insulating layer 127 and the like in the region 139 in the above manner, a disconnected portion and a locally thinned portion can be prevented from being formed in the common layer 114 and the common electrode 115 from a substantially flat region in the first layer 113*a* to a substantially flat region in the second layer 113*b*. Thus, between the light-emitting devices, a connection defect caused by the disconnected portion and an increase in electric resistance caused by the locally thinned portion can be inhibited from occurring in the common layer 114 and the common electrode 115. Accordingly, the display quality of the display apparatus of one embodiment of the present invention can be improved.

Figure 3D:
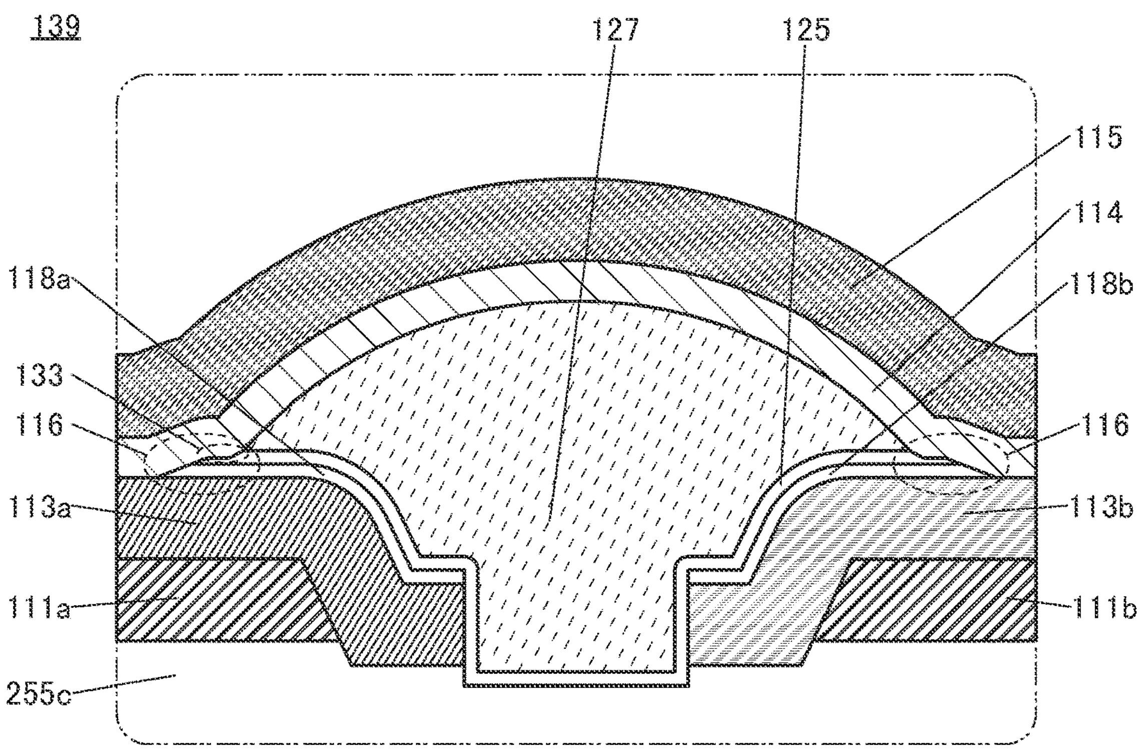

As illustrated in FIG. 3D, the mask layer 118*b* and the insulating layer 125 may each include a projecting portion 116 over the pixel electrode 111*b*. The projecting portion 116 is positioned outward from the end portion of the insulating layer 127 in a cross-sectional view of the display apparatus. In addition, the mask layer 118*a* and the insulating layer 125 may each include such a projecting portion 116 over the pixel electrode 111*a*.

Like the insulating layer 127, the projecting portion 116 preferably has a taper-shaped side surface in a cross-sectional view of the display apparatus. The taper angle of the projecting portion 116 is less than 90°, preferably less than or equal to 60°, further preferably less than or equal to 45°, still further preferably less than or equal to 20°. The taper angle of the projecting portion 116 is smaller than the taper angle θ1 of the insulating layer 127 in some cases. When the projecting portion 116 has such a forward tapered shape, the common layer 114 and the common electrode 115, which are formed over the projecting portion 116, can be formed with good coverage without occurrence of disconnection or the like.

The insulating layer 125 in the projecting portion 116 sometimes has a region (hereinafter referred to as a depression portion 133) with a thickness smaller than that of the insulating layer 125 in another portion (e.g., a portion overlapping with the insulating layer 127). Depending on the thickness of the insulating layer 125, for example, the insulating layer 125 in the projecting portion 116 disappears and the depression portion 133 is formed to reach the mask layer 118*a* or the mask layer 118*b* in some cases.

Although the thicknesses of the first layer 113*a* to the third layer 113*c* are equal in FIG. 1B and the like, the present invention is not limited thereto. The first layer 113*a* to the third layer 113*c* may have different thicknesses as illustrated in FIG. 3C. The thicknesses may be set in accordance with the optical path lengths that intensify light emitted by the first layer 113*a* to the third layer 113*c*. This achieves a microcavity structure, so that the color purity in each light-emitting device can be increased.

For example, when the third layer 113*c* emits light with the longest wavelength and the second layer 113*b* emits light with the shortest wavelength, the third layer 113*c* can have the largest thickness and the second layer 113*b* can have the smallest thickness. Note that without limitation to this, the thicknesses of the EL layers can be adjusted in consideration of the wavelengths of light emitted by the light-emitting elements, the optical characteristics of the layers included in the light-emitting elements, the electrical characteristics of the light-emitting elements, and the like.

In the display panel of this embodiment, the distance between the light-emitting devices can be short. Specifically, the distance between the light-emitting devices, the distance between the EL layers, or the distance between the pixel electrodes can be less than 10 μm, less than or equal to 8 μm, less than or equal to 5 μm, less than or equal to 3 μm, less than or equal to 2 μm, less than or equal to 1 μm, less than or equal to 500 nm, less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm. In other words, the display panel of this embodiment includes a region where a distance between two adjacent island-shaped EL layers is less than or equal to 1 μm, preferably less than or equal to 0.5 μm (500 nm), further preferably less than or equal to 100 nm. A light-blocking layer may be provided on the surface of the substrate 120 on the resin layer 122 side. Any of a variety of optical members can be arranged on the outer surface of the substrate 120. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, an impact-absorbing layer, or the like may be provided as a surface protective layer on the outer surface of the substrate 120. For example, a glass layer or a silica layer ($SiO_x$ layer) is preferably provided as the surface protective layer to inhibit the surface contamination and generation of a scratch. The surface protective layer may be formed using DLC (diamond like carbon), aluminum oxide ($AlO_x$), a polyester-based material, a polycarbonate-based material, or the like. For the surface protective layer, a material having high visible-light transmittance is preferably used. The surface protective layer is preferably formed using a material with high hardness.

For the substrate 120, glass, quartz, ceramic, sapphire, a resin, a metal, an alloy, a semiconductor, or the like can be used. The substrate on the side from which light from the light-emitting device is extracted is formed using a material that transmits the light. When the substrate 120 is formed using a flexible material, the flexibility of the display panel can be increased. Furthermore, a polarizing plate may be used as the substrate 120.

For the substrate 120, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used as the substrate 120.

In the case where a circularly polarizing plate overlaps with the display panel, a highly optically isotropic substrate is preferably used as the substrate included in the display panel. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the films having high optical isotropy include a triacetyl cellulose (TAC, also referred to as cellulose triacetate) film, a cycloolefin polymer (COP) film, a cycloolefin copolymer (COC) film, and an acrylic resin film.

In the case where a film is used for the substrate and the film absorbs water, the shape of a display panel might be changed, e.g., creases might be generated. Thus, for the substrate, a film with a low water absorption rate is preferably used. For example, the water absorption rate of the film is preferably lower than or equal to 1%, further preferably lower than or equal to 0.1%, still further preferably lower than or equal to 0.01%.

For the resin layer 122, a variety of curable adhesives such as a photocurable adhesive like an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferable. A two-component-mixture-type resin may be used. An adhesive sheet or the like may be used.

Figure 4A:
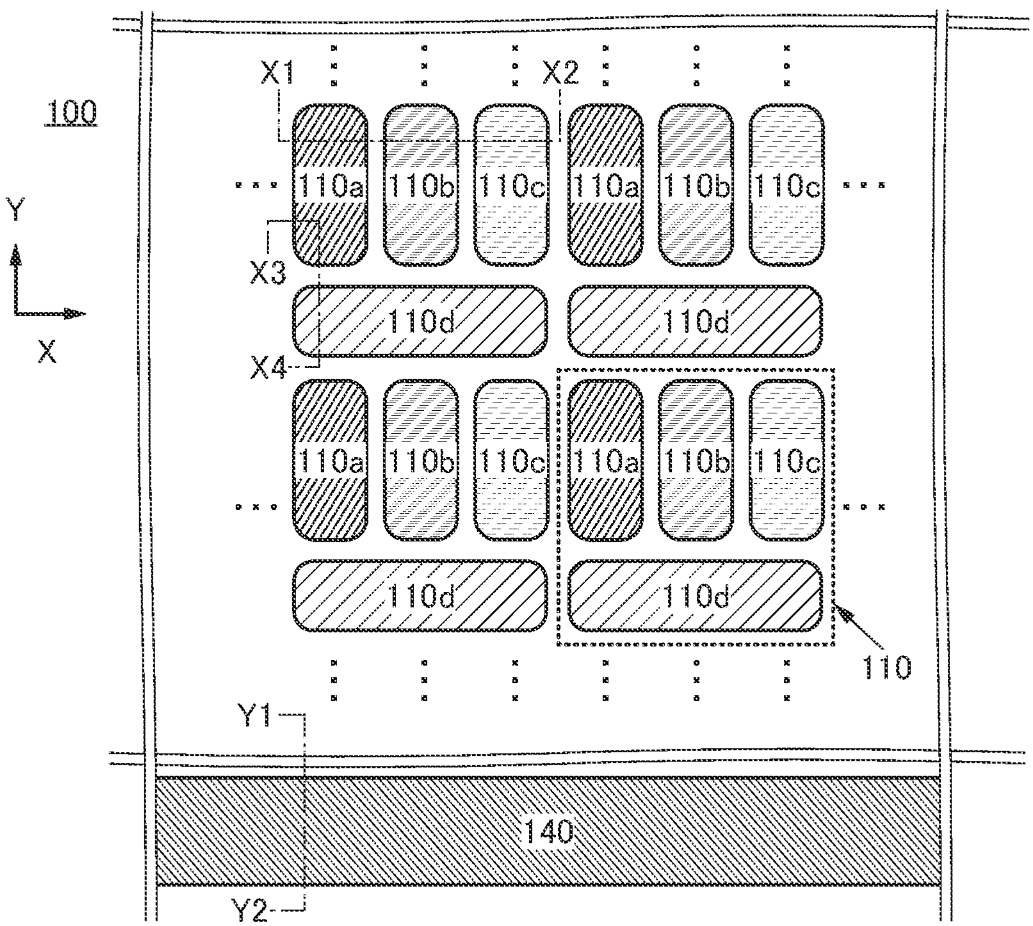
FIG. 4A is a top view illustrating an example of a display panel.

As illustrated in FIG. 4A, the pixel can include four types of subpixels.

FIG. 4A shows a top view of the display panel 100. The display panel 100 includes a display portion in which the plurality of pixels 110 are arranged in a matrix, and the connection portion 140 outside the display portion.

The pixel 110 illustrated in FIG. 4A is composed of four types of subpixels 110*a*, 110*b*, 110*c*, and 110*d*.

The subpixels 110*a*, 110*b*, 110*c*, and 110*d* can include light-emitting devices that emit light of different colors. As the subpixels 110*a*, 110*b*, 110*c*, and 110*d*, subpixels of four colors of R, G, B, and W, subpixels of four colors of R, G, B, and Y, and four subpixels of R, G, B, and IR can be given, for example.

The display panel of one embodiment of the present invention may include a light-receiving device in the pixel.

Three of the four subpixels included in the pixel 110 illustrated in FIG. 4A may each include a light-emitting device and the other one may include a light-receiving device.

For example, a pn or pin photodiode can be used as the light-receiving device. The light-receiving device functions as a photoelectric conversion device (also referred to as a photoelectric conversion element) that detects light entering the light-receiving device and generates charge. The amount of charge generated from the light-receiving device depends on the amount of light entering the light-receiving device.

It is particularly preferable to use an organic photodiode including a layer containing an organic compound, as the light-receiving device. An organic photodiode, which is easily made thin, lightweight, and large in area and has a high degree of freedom for shape and design, can be used in a variety of display panels.

In one embodiment of the present invention, organic EL devices are used as the light-emitting devices, and organic photodiodes are used as the light-receiving devices. The organic EL device and the organic photodiode can be formed over the same substrate. Thus, the organic photodiode can be incorporated in the display panel including the organic EL device.

The light-receiving device includes at least an active layer functioning as a photoelectric conversion layer between a pair of electrodes. In this specification and the like, one of the pair of electrodes may be referred to as a pixel electrode and the other may be referred to as a common electrode.

One of the pair of electrodes of the light-receiving device functions as an anode, and the other electrode functions as a cathode. Hereinafter, the case where the pixel electrode functions as an anode and the common electrode functions as a cathode is described as an example. When the light-receiving device is driven by application of reverse bias between the pixel electrode and the common electrode, light entering the light-receiving device can be detected and charge can be generated and extracted as current. Alternatively, the pixel electrode may function as a cathode and the common electrode may function as an anode.

A fabrication method similar to that of the light-emitting device can be employed for the light-receiving device. An island-shaped active layer (also referred to as a photoelectric conversion layer) included in the light-receiving device is formed by processing a film that is to be the active layer and formed on the entire surface, not with a pattern of a metal mask; thus, the island-shaped active layer can be formed to have a uniform thickness. In addition, a mask layer provided over the active layer can reduce damage to the active layer in the fabrication process of the display panel, increasing the reliability of the light-receiving device.

Figure 4B:
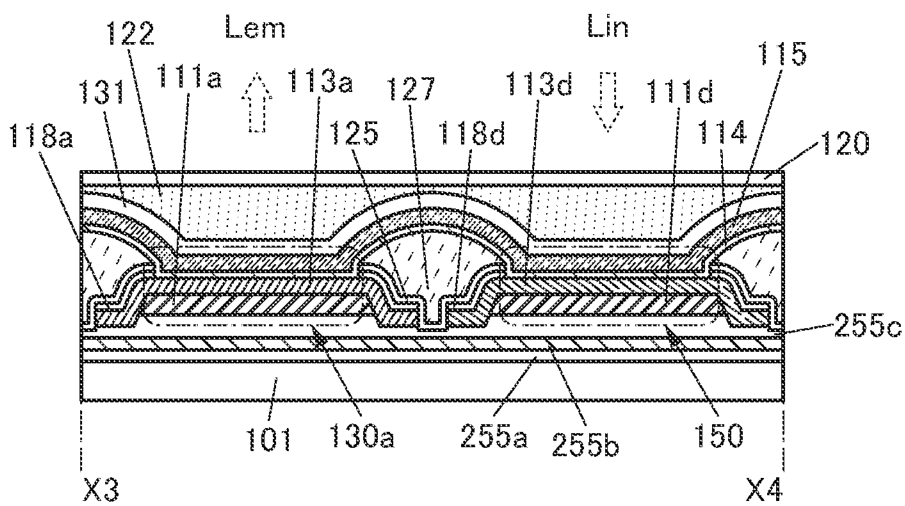
FIG. 4B is a cross-sectional view illustrating the example of a display panel.

FIG. 4B is a cross-sectional view along the dashed-dotted line X3-X4 in FIG. 4A. See FIG. 1B for a cross-sectional view along the dashed-dotted line X1-X2 in FIG. 4A, and see FIG. 3A or FIG. 3B for a cross-sectional view along the dashed-dotted line Y1-Y2 in FIG. 4A.

As illustrated in FIG. 4B, in the display panel 100, an insulating layer is provided over the layer 101 including transistors, the light-emitting device 130*a* and the light-receiving device 150 are provided over the insulating layer, and the protective layer 131 is provided to cover the light-emitting device and the light-receiving device. The substrate 120 is attached with the resin layer 122. In a region between the light-emitting device and the light-receiving device adjacent to each other, the insulating layer 125 and the insulating layer 127 over the insulating layer 125 are provided.

In the example illustrated in FIG. 4B, light from the light-emitting device 130*a* is emitted to the substrate 120 side, and light is incident on the light-receiving device 150 from the substrate 120 side (see light Lem and light Lin).

The structure of the light-emitting device 130*a* is as described above.

The light-receiving device 150 includes a pixel electrode 111*d* over the insulating layer 255*c*, a fourth layer 113*d* over the pixel electrode 111*d*, the common layer 114 over the fourth layer 113*d*, and the common electrode 115 over the common layer 114. The fourth layer 113*d* includes at least an active layer.

The fourth layer 113*d* is provided in the light-receiving device 150, not in the light-emitting devices. The common layer 114 is a continuous layer shared by the light-emitting devices and the light-receiving devices.

Here, a layer shared by the light-receiving device and the light-emitting device may have different functions in the light-emitting device and the light-receiving device. In this specification, the name of a component is based on its function in the light-emitting device in some cases. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. A layer shared by the light-receiving device and the light-emitting device may have the same function in both the light-emitting device and the light-receiving device. The hole-transport layer functions as a hole-transport layer in both the light-emitting device and the light-receiving device, and the electron-transport layer functions as an electron-transport layer in both the light-emitting device and the light-receiving device.

The mask layer 118*a* is positioned between the first layer 113*a* and the insulating layer 125, and a mask layer 118*d* is positioned between the fourth layer 113*d* and the insulating layer 125. The mask layer 118*a* is a remaining portion of the mask layer provided over the first layer 113*a* when the first layer 113*a* is processed. The mask layer 118*d* is a remaining portion of the mask layer provided in contact with the top surface of the fourth layer 113*d* including the active layer when the fourth layer 113*d* is processed. The mask layer 118*a* and the mask layer 118*d* may contain the same material or different materials.

The display panel whose pixel includes the light-emitting device and the light-receiving device can detect the contact or approach of an object while displaying an image because the pixel has a light-receiving function. For example, all the subpixels included in the display panel can display an image; alternatively, some of the subpixels can emit light as a light source, and the other subpixels can display an image.

In the display panel of one embodiment of the present invention, the light-emitting devices are arranged in a matrix in the display portion, and an image can be displayed on the display portion. Furthermore, the light-receiving devices are arranged in a matrix in the display portion, and the display portion has one or both of an image capturing function and a sensing function in addition to an image displaying function. The display portion can be used as an image sensor or a touch sensor. That is, by detecting light with the display portion, an image can be captured or the approach or contact of an object (e.g., a finger, a hand, or a pen) can be detected. Furthermore, in the display panel of one embodiment of the present invention, the light-emitting devices can be used as a light source of the sensor. Accordingly, a light-receiving portion and a light source do not need to be provided separately from the display panel; hence, the number of components of an electronic device can be reduced. For example, a fingerprint authentication device, a capacitive touch panel for scroll operation, or the like is not necessarily provided separately from the electronic device. Thus, with the use of the display panel of one embodiment of the present invention, the electronic device can be provided with reduced manufacturing cost.

In the display panel of one embodiment of the present invention, when an object reflects (or scatters) light emitted from the light-emitting device included in the display portion, the light-receiving device can detect the reflected light (or scattered light); thus, image capturing or touch detection is possible even in a dark place.

In the case where the light-receiving device is used as an image sensor, the display panel can capture an image with the use of the light-receiving device. For example, the display panel of this embodiment can be used as a scanner.

For example, data on biological information such as a fingerprint or a palm print can be obtained with the use of the image sensor. That is, a biometric authentication sensor can be incorporated in the display panel. When the display panel incorporates a biometric authentication sensor, the number of components of an electronic device can be reduced as compared with the case where a biometric authentication sensor is provided separately from the display panel; thus, the size and weight of the electronic device can be reduced.

In the case where the light-receiving device is used as the touch sensor, the display panel can detect the approach or contact of an object with the use of the light-receiving device.

The display panel of one embodiment of the present invention can have one or both of an image capturing function and a sensing function in addition to an image displaying function. Thus, the display panel of one embodiment of the present invention can be regarded as being highly compatible with the function other than the display function.

Next, materials that can be used for the light-emitting device will be described.

A conductive film transmitting visible light is used for the electrode through which light is extracted, which is either the pixel electrode or the common electrode. A conductive film reflecting visible light is preferably used for the electrode through which light is not extracted. In the case where a display panel includes a light-emitting device emitting infrared light, a conductive film transmitting visible light and infrared light is used for the electrode through which light is extracted, and a conductive film reflecting visible light and infrared light is preferably used for the electrode through which light is not extracted.

A conductive film transmitting visible light may be used also for an electrode through which light is not extracted. In that case, this electrode is preferably provided between a reflective layer and the EL layer. In other words, light emitted by the EL layer may be reflected by the reflective layer to be extracted from the display panel.

As a material that forms the pair of electrodes (the pixel electrode and the common electrode) of the light-emitting device, a metal, an alloy, an electrically conductive compound, a mixture thereof, and the like can be used as appropriate. Specific examples include indium tin oxide (In—Sn oxide, also referred to as ITO), In—Si—Sn oxide (also referred to as ITSO), indium zinc oxide (In—Zn oxide), In—W—Zn oxide, an alloy containing aluminum (an aluminum alloy) such as an alloy of aluminum, nickel, and lanthanum (Al—Ni—La), and an alloy of silver, palladium, and copper (Ag—Pd—Cu, also referred to as APC). In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use an element belonging to Group 1 or Group 2 in the periodic table, which is not described above (e.g., lithium (Li), cesium (Cs), calcium (Ca), or strontium (Sr)), a rare earth metal such as curopium (Eu) or ytterbium (Yb), an alloy containing an appropriate combination of any of these elements, graphene, or the like.

The light-emitting device preferably employs a microcavity structure. Therefore, one of the pair of electrodes of the light-emitting device preferably includes an electrode having properties of transmitting and reflecting visible light (a semi-transmissive and semi-reflective electrode), and the other preferably includes an electrode having a property of reflecting visible light (a reflective electrode). When the light-emitting device has a microcavity structure, light obtained from the light-emitting layer can be resonated between the electrodes, whereby light emitted from the light-emitting device can be intensified.

The semi-transmissive and semi-reflective electrode can have a stacked-layer structure of a reflective electrode and an electrode having a property of transmitting visible light (also referred to as a transparent electrode).

The transparent electrode has a light transmittance higher than or equal to 40%. For example, an electrode having a visible light (light with wavelengths greater than or equal to 400 nm and less than 750 nm) transmittance higher than or equal to 40% is preferably used in the light-emitting device. The visible light reflectance of the semi-transmissive and semi-reflective electrode is higher than or equal to 10% and lower than or equal to 95%, preferably higher than or equal to 30% and lower than or equal to 80%. The visible light reflectance of the reflective electrode is higher than or equal to 40% and lower than or equal to 100%, preferably higher than or equal to 70% and lower than or equal to 100%. These electrodes preferably have a resistivity lower than or equal to $1\times10^{-2}$ Ω cm.

The light-emitting layer contains a light-emitting material (also referred to as a light-emitting substance). The light-emitting layer can contain one or more kinds of light-emitting substances. As the light-emitting substance, a substance that exhibits an emission color of blue, violet, bluish violet, green, yellowish green, yellow, orange, red, or the like is used as appropriate. Alternatively, as the light-emitting substance, a substance that emits near-infrared light can also be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (in particular, an iridium complex) having a 4H-triazole skeleton, a 1H-triazole skeleton, an imidazole skeleton, a pyrimidine skeleton, a pyrazine skeleton, or a pyridine skeleton; an organometallic complex (in particular, an iridium complex) having a phenylpyridine derivative including an electron-withdrawing group as a ligand; a platinum complex; and a rare earth metal complex.

The light-emitting layer may contain one or more kinds of organic compounds (e.g., a host material and an assist material) in addition to the light-emitting substance (a guest material). As one or more kinds of organic compounds, one or both of the hole-transport material and the electron-transport material can be used. Alternatively, as one or more kinds of organic compounds, a bipolar material or a TADF material may be used.

The light-emitting layer preferably contains, for example, a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected to form an exciplex that exhibits light emission whose wavelength overlaps with the wavelength of the lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

In addition to the light-emitting layer, the first layer 113*a*, the second layer 113*b*, and the third layer 113*c* may further include layers containing a substance with a high hole-injection property, a substance with a high hole-transport property, a hole-blocking material, a substance with a high electron-transport property, a substance with a high electron-injection property, an electron-blocking material, a substance with a bipolar property (also referred to as a substance with a high electron-transport property and a high hole-transport property), and the like.

Either a low molecular compound or a high molecular compound can be used in the light-emitting device, and an inorganic compound may also be included. Each layer included in the light-emitting device can be formed by a method such as an evaporation method (including a vacuum evaporation method), a transfer method, a printing method, an inkjet method, or a coating method.

For example, the first layer 113*a*, the second layer 113*b*, and the third layer 113*c* may each include one or more of a hole-injection layer, a hole-transport layer, a hole-blocking layer, an electron-blocking layer, an electron-transport layer, and an electron-injection layer.

The common layer 114 can include one or more of a hole-injection layer, a hole-transport layer, a hole-blocking layer, an electron-blocking layer, an electron-transport layer, and an electron-injection layer. For example, a carrier-injection layer (a hole-injection layer or an electron-injection layer) may be formed as the common layer 114. Note that the light-emitting device does not necessarily include the common layer 114.

The first layer 113*a*, the second layer 113*b*, and the third layer 113*c* each preferably include a light-emitting layer and a carrier-transport layer over the light-emitting layer. Accordingly, the light-emitting layer is inhibited from being exposed on the outermost surface in the fabrication process of the display panel 100, so that damage to the light-emitting layer can be reduced. Thus, the reliability of the light-emitting device can be increased.

A hole-injection layer is a layer injecting holes from an anode to a hole-transport layer, and a layer containing a material with a high hole-injection property. Examples of the material with a high hole-injection property include an aromatic amine compound and a composite material containing a hole-transport material and an acceptor material (electron-accepting material).

A hole-transport layer is a layer transporting holes, which are injected from an anode by a hole-injection layer, to a light-emitting layer. The hole-transport layer is a layer containing a hole-transport material. As the hole-transport material, a substance having a hole mobility higher than or equal to 10-6 $cm^2/Vs$ is preferable. Note that other substances can also be used as long as the substances have a hole-transport property higher than an electron-transport property. As the hole-transport material, a material with a high hole-transport property, such as a x-electron rich heteroaromatic compound (e.g., a carbazole derivative, a thiophene derivative, or a furan derivative) or an aromatic amine (a compound having an aromatic amine skeleton), is preferable.

An electron-transport layer is a layer transporting electrons, which are injected from a cathode by an electron-injection layer, to a light-emitting layer. The electron-transport layer is a layer containing an electron-transport material. As the electron-transport material, a substance having an electron mobility higher than or equal to $1\times10^{-6}$ $cm^2/Vs$ is preferable. Note that other substances can also be used as long as the substances have an electron-transport property higher than a hole-transport property. As the electron-transport material, it is possible to use a material with a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a x-electron deficient heteroaromatic compound such as a nitrogen-containing heteroaromatic compound.

An electron-injection layer is a layer injecting electrons from a cathode to an electron-transport layer, and a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The electron-injection layer can be formed using an alkali metal, an alkaline earth metal, or a compound thereof, such as lithium, cesium, ytterbium, lithium fluoride (LiF), cesium fluoride (CsF), calcium fluoride ($CaF_x$, where x is a given number), 8-(quinolinolato) lithium (abbreviation: Liq), 2-(2-pyridyl) phenolatolithium (abbreviation: LiPP), 2-(2-pyridyl)-3-pyridinolato lithium (abbreviation: LiPPy), 4-phenyl-2-(2-pyridyl) phenolatolithium (abbreviation: LiPPP), lithium oxide ($LiO_x$), or cesium carbonate, for example. In addition, the electron-injection layer may have a stacked-layer structure of two or more layers. In the stacked-layer structure, for example, lithium fluoride can be used for the first layer and ytterbium can be used for the second layer.

Alternatively, the electron-injection layer may be formed using an electron-transport material. For example, a compound having an unshared electron pair and an electron deficient heteroaromatic ring can be used as the electron-transport material. Specifically, a compound having at least one of a pyridine ring, a diazine ring (a pyrimidine ring, a pyrazine ring, and a pyridazine ring), and a triazine ring can be used.

Note that the lowest unoccupied molecular orbital (LUMO) level of the organic compound having an unshared electron pair is preferably higher than or equal to −3.6 eV and lower than or equal to −2.3 eV. In general, the highest occupied molecular orbital (HOMO) level and the LUMO level of an organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), 2,2'-(1,3-phenylene)bis(9-phenyl-1,10-phenanthroline) (abbreviation: mPPhen2P), xdiquinoxalino [2,3-α: 2',3'-c]phenazine (abbreviation: HATNA), 2,4,6-tris [3'-(pyridin-3-yl) biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

In the case of fabricating a tandem light-emitting device, a charge-generation layer (also referred to as an intermediate layer) is provided between two light-emitting units. The intermediate layer has a function of injecting electrons into one of the two light-emitting units and injecting holes to the other when voltage is applied between the pair of electrodes.

For the charge-generation layer, for example, a material that can be used for the electron-injection layer, such as lithium, can be suitably used. For the charge-generation layer, for example, a material that can be used for the hole-injection layer can be suitably used. For the charge-generation layer, a layer containing a hole-transport material and an acceptor material (electron-accepting material) can be used. For the charge-generation layer, a layer containing an electron-transport material and a donor material can be used. Forming such a charge-generation layer can inhibit an increase in the driving voltage in the case of stacking light-emitting units.

As illustrated in FIG. 1B and FIG. 2A, the mask layer 118*a* is provided in contact with a part of the top surface of the first layer 113*a*. The common electrode 115 is provided in contact with another part of the top surface of the first layer 113*a*. In addition, the first layer 113*a* is sandwiched between the pixel electrode 111*a* and the common electrode 115.

The first layer 113*a* contains the organic compound OM. For example, the organic compound OM can be used for the light-emitting layer or the electron-transport layer of the first layer 113*a*.

As described above, various organic compounds can be used for the first layer 113*a* of the light-emitting device. For example, an anthracene derivative can be used as the organic compound OM. An anthracene derivative is a compound that is chemically stable when it is in an environment not in contact with oxygen. However, when an anthracene derivative is irradiated with light in the presence of oxygen, oxygen is bonded to an anthracene skeleton, so that the anthracene derivative changes into another compound. As a result, the characteristics of the light-emitting device change.

The original organic compound OM contained in the first layer 113*a* is preferably an organic compound that is less likely to change in quality. Moreover, a fabrication method that is less likely to change the quality of the original organic compound OM in the fabrication process of the light-emitting device is preferable. For example, it is preferable to use a method in which a light-emitting device is fabricated in an environment where the air is blocked with the use of an insulating film inhibiting a contact with oxygen in the air and where the light-light-emitting device is not exposed to ultraviolet rays. As a result of inhibiting a change in quality of the organic compound OM, in particular, the amount of oxide of the organic compound OM, which is contained in the first layer 113*a*, is greater than 0 and less than or equal to 1/10, preferably less than or equal to 1/100, further preferably less than or equal to 1/1000 of the amount of the organic compound OM contained in the first layer 113*a*. Note that the oxide of the organic compound OM is an organic compound in which one or two oxygen atoms are bonded mainly to the organic compound OM, and its molecular weight is a number obtained by adding 16 or 32 to that of the organic compound OM mainly. Furthermore, as a result of inhibiting a change in quality of the organic compound OM, in particular, the amount of an organic compound with a partial structure of the organic compound OM, which is contained in the first layer 113*a*, is greater than 0 and less than or equal to 1/10, preferably less than or equal to 1/100, further preferably less than or equal to 1/1000 of the amount of the organic compound OM contained in the first layer 113*a*. Note that the organic compound with a partial structure of the organic compound OM is an organic compound that is mainly generated when a hetero ring included in the organic compound OM is opened, and its molecular weight is smaller than that of the organic compound OM and is almost the same as a molecular weight obtained when a hetero ring is cleaved and a proton is added.

Note that, for example, liquid chromatography mass spectrometry can be used for quantifying the organic compound OM and the oxide of the organic compound OM or the organic compound with a partial structure of the organic compound OM.

[Example of Method for Fabricating Display Panel]

Next, an example of a method for fabricating the display panel 100 illustrated in FIG. 1A and the like is described with reference to FIG. 5 to FIG. 9. FIG. 5A to FIG. 9C each illustrate a cross-sectional view along the dashed-dotted line X1-X2 and a cross-sectional view along the dashed-dotted line Y1-Y2 in FIG. 1A side by side.

Thin films included in the display panel (e.g., insulating films, semiconductor films, and conductive films) can be formed by a sputtering method, a chemical vapor deposition (CVD) method, a vacuum evaporation method, a pulsed laser deposition (PLD) method, an ALD method, or the like. Examples of a CVD method include a plasma-enhanced chemical vapor deposition (PECVD: Plasma Enhanced CVD) method and a thermal CVD method. As an example of the thermal CVD method, a metal organic chemical vapor deposition (MOCVD) method can be given. Alternatively, thin films included in the display panel (e.g., insulating films, semiconductor films, and conductive films) can be formed by a method such as spin coating, dipping, spray coating, ink-jetting, dispensing, screen printing, or offset printing, or with a doctor knife, a slit coater, a roll coater, a curtain coater, or a knife coater.

Specifically, for fabrication of the light-emitting device, a vacuum process such as an evaporation method and a solution process such as a spin coating method or an inkjet method can be used. Examples of an evaporation method include physical vapor deposition methods (PVD methods) such as a sputtering method, an ion plating method, an ion beam evaporation method, a molecular beam evaporation method, and a vacuum evaporation method, and a chemical vapor deposition method (CVD method). Specifically, the functional layers (e.g., the hole-injection layer, the hole-transport layer, the light-emitting layer, the electron-transport layer, and the electron-injection layer) included in the EL layer can be formed by an evaporation method (e.g., a vacuum evaporation method), a coating method (e.g., a dip coating method, a die coating method, a bar coating method, a spin coating method, or a spray coating method), a printing method (e.g., an ink-jet method, a screen printing (stencil) method, an offset printing (planography) method, a flexography (relief printing) method, a gravure printing method, or a micro-contact printing method), or the like.

Thin films included in the display panel can be processed by a photolithography method or the like. Alternatively, thin films may be processed by a nanoimprinting method, a sandblasting method, a lift-off method, or the like. Alternatively, island-shaped thin films may be directly formed by a film formation method using a shielding mask such as a metal mask.

There are the following two typical examples of a photolithography method. In one of the methods, a resist mask is formed over a thin film that is to be processed, the thin film is processed by etching or the like, and then the resist mask is removed. In the other method, a photosensitive thin film is formed and then processed into a desired shape by light exposure and development.

As the light used for light exposure in the photolithography method, for example, an i-line (with a wavelength of 365 nm), a g-line (with a wavelength of 436 nm), an h-line (with a wavelength of 405 nm), or combined light of any of them can be used. Alternatively, ultraviolet rays, KrF laser light, ArF laser light, or the like can be used. In addition, light exposure may be performed by liquid immersion exposure technique. As the light used for the light exposure, extreme ultraviolet (EUV) light or X-rays may be used. Furthermore, instead of the light used for the light exposure, an electron beam can also be used. It is preferable to use extreme ultraviolet light, X-rays, or an electron beam because they can perform extremely fine processing. Note that in the case of performing exposure by scanning of a beam such as an electron beam, a photomask is unnecessary.

For etching of thin films, a dry etching method, a wet etching method, a sandblasting method, or the like can be used.

Figures 5A, 5B, 5C:
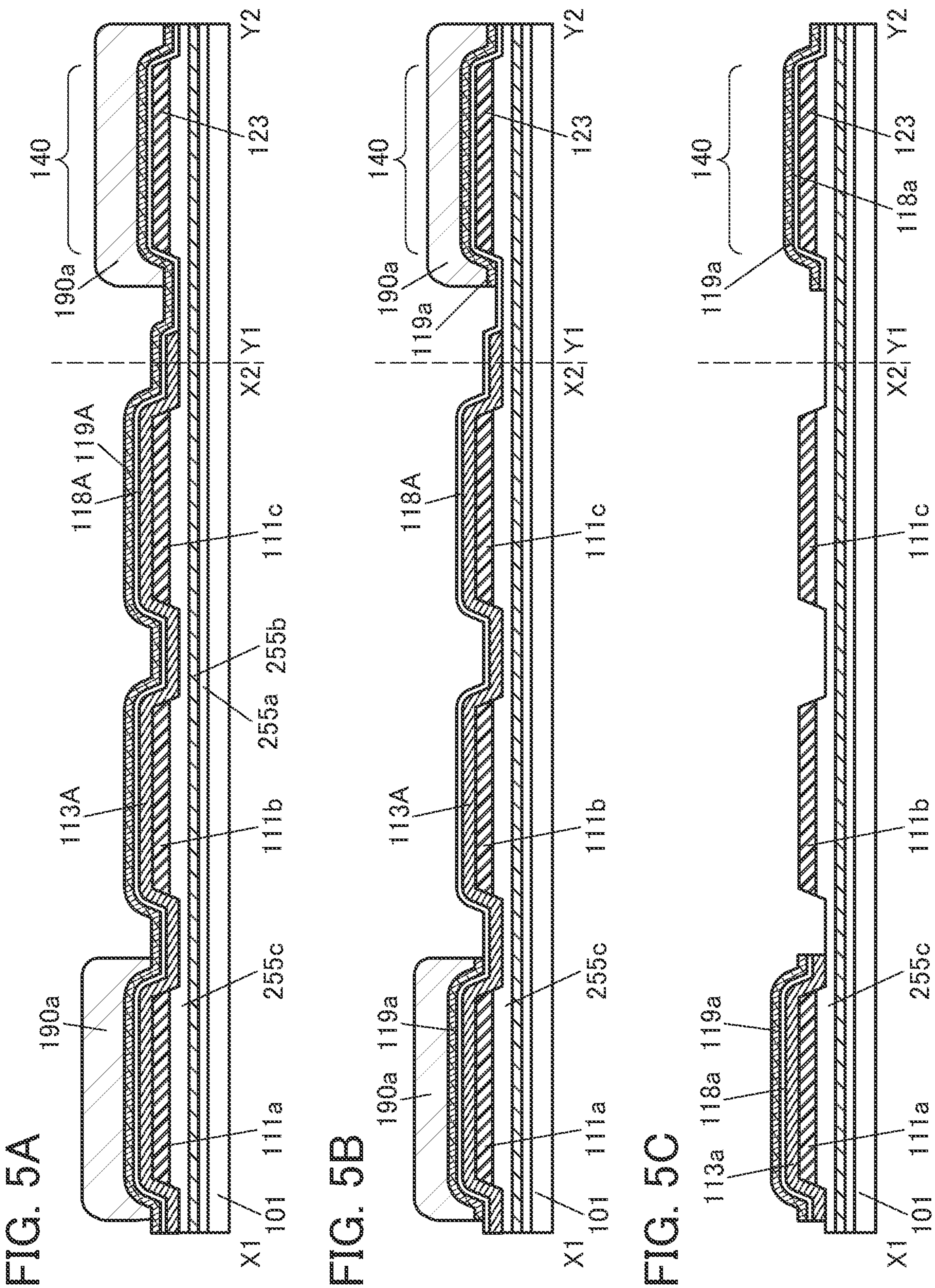
FIG. 5A to FIG. 5C are cross-sectional views illustrating an example of a method for fabricating a display panel.

First, as illustrated in FIG. 5A, the insulating layer 255*a*, the insulating layer 255*b*, and the insulating layer 255*c* are formed in this order over the layer 101 including transistors. The above-described structure that can be employed for the insulating layers 255*a*, 255*b*, and 255*c* can be employed for the insulating layers 255*a*, 255*b*, and 255*c*.

Next, as illustrated in FIG. 5A, the pixel electrodes 111*a*, 111*b*, and 111*c* and the conductive layer 123 are formed over the insulating layer 255*c*, a first layer 113A is formed over the pixel electrodes 111*a*, 111*b*, and 111*c*, a first mask layer 118A is formed over the first layer 113A, and a second mask layer 119A is formed over the first mask layer 118A.

As illustrated in FIG. 5A, in the cross-sectional view along Y1-Y2, an end portion of the first layer 113A on the connection portion 140 side is positioned inward from an end portion of the first mask layer 118A. For example, by using a mask for specifying a film formation area (also referred to as an area mask or a rough metal mask to be distinguished from a fine metal mask), the first layer 113A can be formed in a region different from a region where the first mask layer 118A and the second mask layer 119A are formed. In one embodiment of the present invention, the light-emitting device is formed using a resist mask; by using a combination of a resist mask and an area mask as described above, the light-emitting device can be fabricated through a relatively simple process.

The above-described structure that can be employed for the pixel electrode can be employed for the pixel electrodes 111*a*, 111*b*, and 111*c*. The pixel electrodes 111*a*, 111*b*, and 111*c* can be formed by a sputtering method or a vacuum evaporation method, for example.

The pixel electrodes 111*a*, 111*b*, and 111*c* each preferably have a tapered shape. This can improve the coverage with the layers formed over the pixel electrodes 111*a*, 111*b*, and 111*c* and improve the fabrication yield of the light-emitting devices.

The first layer 113A is a layer to be the first layer 113*a* later. Therefore, the first layer 113A can have the above-described structure that can be employed for the first layer 113*a*. The first layer 113A can be formed by an evaporation method (including a vacuum evaporation method), a transfer method, a printing method, an inkjet method, a coating method, or the like. The first layer 113A is preferably formed by an evaporation method. A premix material may be used in the deposition by an evaporation method. Note that in this specification and the like, a premix material is a composite material in which a plurality of materials are combined or mixed in advance.

As the first mask layer 118A and the second mask layer 119A, a film that is highly resistant to the process conditions for the first layer 113A, a second layer 113B and a third layer 113C that are to be formed later, and the like, specifically, a film having high etching selectivity with EL layers is used.

The first mask layer 118A and the second mask layer 119A can be formed by a sputtering method, an ALD method (a thermal ALD method or a PEALD method), a CVD method, or a vacuum evaporation method, for example. The first mask layer 118A, which is formed over and in contact with the EL layer, is preferably formed by a formation method that causes less damage to the EL layer than a formation method for the second mask layer 119A. For example, the first mask layer 118A is preferably formed by an ALD method or a vacuum evaporation method rather than a sputtering method. The first mask layer 118A and the second mask layer 119A are formed at a temperature lower than the upper temperature limit of the EL layer. The typical substrate temperatures in formation of the first mask layer 118A and the second mask layer 119A are each lower than or equal to 200° C., preferably lower than or equal to 150° C., further preferably lower than or equal to 120° C., still further preferably lower than or equal to 100° C., yet still further preferably lower than or equal to 80° C.

The first mask layer 118A and the second mask layer 119A are preferably films that can be removed by a wet etching method. Using a wet etching method can reduce damage to the first layer 113A in processing the first mask layer 118A and the second mask layer 119A, compared to the case of using a dry etching method.

A film having high etching selectivity with the second mask layer 119A is preferably used as the first mask layer 118A.

In the method for fabricating a display panel of this embodiment, it is desirable that the layers (e.g., the hole-injection layer, the hole-transport layer, the light-emitting layer, and the electron-transport layer) included in the EL layer not be easily processed in the step of processing the mask layers, and that the mask layers not be easily processed in the steps of processing the layers included in the EL layer. The materials and the processing method for the mask layers and the processing method for the EL layer are preferably selected in consideration of the above.

Although this embodiment describes an example where the mask layer is formed to have a two-layer structure of the first mask layer and the second mask layer, the mask layer may have a single-layer structure or a stacked-layer structure of three or more layers.

As the first mask layer 118A and the second mask layer 119A, it is preferable to use an inorganic film such as a metal film, an alloy film, a metal oxide film, a semiconductor film, or an inorganic insulating film, for example.

For each of the first mask layer 118A and the second mask layer 119A, it is possible to use a metal material such as gold, silver, platinum, magnesium, nickel, tungsten, chromium, molybdenum, iron, cobalt, copper, palladium, titanium, aluminum, yttrium, zirconium, or tantalum or an alloy material containing any of the metal materials, for example. It is particularly preferable to use a low-melting-point material such as aluminum or silver. The use of a metal material capable of blocking ultraviolet light for one or both of the first mask layer 118A and the second mask layer 119A is preferable, in which case the EL layer can be inhibited from being irradiated with ultraviolet light and deteriorating.

For each of the first mask layer 118A and the second mask layer 119A, a metal oxide such as In—Ga—Zn oxide can be used. As the first mask layer 118A or the second mask layer 119A, an In—Ga—Zn oxide film can be formed by a sputtering method, for example. Furthermore, indium oxide, In—Zn oxide, In—Sn oxide, indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like can be used. Alternatively, indium tin oxide containing silicon or the like can also be used.

In addition, in place of gallium described above, the element M (M is one or more kinds selected from aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be used. In particular, M is preferably one or both of aluminum and yttrium.

As each of the first mask layer 118A and the second mask layer 119A, any of a variety of inorganic insulating films that can be used as the protective layer 131 can be used. In particular, an oxide insulating film is preferable because its adhesion to the EL layer is higher than that of a nitride insulating film. For example, an inorganic insulating material such as aluminum oxide, hafnium oxide, or silicon oxide can be used for each of the first mask layer 118A and the second mask layer 119A. As the first mask layer 118A or the second mask layer 119A, an aluminum oxide film can be formed by an ALD method, for example. The use of an ALD method is preferable, in which case damage to a base (in particular, the EL layer or the like) can be reduced. For example, an inorganic insulating film (e.g., an aluminum oxide film) formed by an ALD method can be used as the first mask layer 118A, and an inorganic film (e.g., an In—Ga—Zn oxide film, an aluminum film, or a tungsten film) formed by a sputtering method can be used as the second mask layer 119A.

Note that the same inorganic insulating film can be used for both the first mask layer 118A and the insulating layer 125 that is to be formed later. For example, an aluminum oxide film formed by an ALD method can be used for both the first mask layer 118A and the insulating layer 125. For the first mask layer 118A and the insulating layer 125, the same deposition condition may be used. For example, when the first mask layer 118A is formed under conditions similar to those for the insulating layer 125, the first mask layer 118A can be an insulating layer having a high barrier property against at least one of water and oxygen. Without limitation to this, different deposition conditions may be used for the first mask layer 118A and the insulating layer 125.

A material that can be dissolved using a solvent not damaging at least a film positioned in the uppermost portion of the first layer 113A may be used for one or both of the first mask layer 118A and the second mask layer 119A. Specifically, a material that will be dissolved in water or alcohol can be suitably used. In forming a film of such a material, it is preferable to apply the material dissolved in a solvent such as water or alcohol by a wet film formation method and then perform heat treatment for evaporating the solvent. At this time, the heat treatment is preferably performed in a reduced-pressure atmosphere, in which case the solvent can be removed at a low temperature in a short time and thermal damage to the EL layer can be reduced accordingly.

The first mask layer 118A and the second mask layer 119A may each be formed by a wet film formation method such as spin coating, dipping, spray coating, ink-jetting, dispensing, screen printing, offset printing, a doctor knife method, slit coating, roll coating, curtain coating, or knife coating.

The first mask layer 118A and the second mask layer 119A may each be formed using an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin.

Next, a resist mask **190*a* is formed over the second mask layer 119A as illustrated in FIG. 5**A. The resist mask can be formed by application of a photosensitive resin (photoresist), light exposure, and development.

The resist mask may be formed using either a positive resist material or a negative resist material.

The resist mask **190*a* is provided at a position overlapping with the pixel electrode 111*a*. One island-shaped pattern is preferably provided for one subpixel 110*a* as the resist mask 190*a*. Alternatively, one band-like pattern for a plurality of subpixels 110*a* aligned in one column (aligned in the Y direction in FIG. 1A) may be formed as the resist mask 190*a***.

Here, when the resist mask **190*a* is formed such that an end portion of the resist mask 190*a* is positioned outward from an end portion of the pixel electrode 111*a*, an end portion of the first layer 113*a* to be formed later can be provided outward from the end portion of the pixel electrode 111*a***.

Note that the resist mask **190*a* is preferably provided also at a position overlapping with the connection portion 140. This can inhibit the conductive layer 123** from being damaged in the fabrication process of the display panel.

Then, as illustrated in FIG. 5B, part of the second mask layer 119A is removed using the resist masks **190*a*, so that the mask layer 119*a* is formed. The mask layer 119*a* remains over the pixel electrode 111*a* and the conductive layer 123**.

In etching the second mask layer 119A, an etching condition with high selectivity is preferably employed so that the first mask layer 118A is not removed by the etching. Since the EL layer is not exposed in processing the second mask layer 119A, the range of choices of the processing method is wider than that for processing the first mask layer 118A. Specifically, deterioration of the EL layer can be further inhibited even when a gas containing oxygen is used as an etching gas in processing the second mask layer 119A.

After that, the resist mask **190*a* is removed. The resist mask 190*a* can be removed by ashing using oxygen plasma, for example. Alternatively, an oxygen gas and any of $CF_4$, $C_4F_8$, $SF_6$, $CHF_3$, $Cl_2$, $H_2O$, $BCl_3$, and a noble gas (also referred to as rare gas) such as He may be used. Alternatively, the resist masks 190*a* may be removed by wet etching. At this time, the first mask layer 118A is positioned on the outermost surface and the first layer 113A is not exposed; thus, the first layer 113A can be inhibited from being damaged in the step of removing the resist masks 190*a*. In addition, the range of choices of the method for removing the resist mask 190*a*** can be widened.

Next, as illustrated in FIG. 5C, part of the first mask layer 118A is removed using the mask layer **119*a* as a mask (also referred to as a hard mask), so that the mask layer 118*a*** is formed.

The first mask layer 118A and the second mask layer 119A can each be processed by a wet etching method or a dry etching method. The first mask layer 118A and the second mask layer 119A are preferably processed by anisotropic etching.

Using a wet etching method can reduce damage to the first layer 113A in processing the first mask layer 118A and the second mask layer 119A, as compared to the case of using a dry etching method. In the case of using a wet etching method, it is preferable to use a developer, an aqueous solution of tetramethylammonium hydroxide (TMAH), dilute hydrofluoric acid, oxalic acid, phosphoric acid, acetic acid, nitric acid, a chemical solution containing a mixed solution of any of these acids, or the like, for example.

In the case of using a dry etching method, deterioration of the first layer 113A can be inhibited by not using a gas containing oxygen as the etching gas. In the case of using a dry etching method, it is preferable to use a gas containing $CF_4$, $C_4F_8$, $SF_6$, $CHF_3$, $Cl_2$, $H_2O$, or $BCl_3$ or a noble gas (also referred to as a rare gas) such as He as the etching gas, for example.

For example, when an aluminum oxide film formed by an ALD method is used as the first mask layer 118A, the first mask layer 118A can be processed by a dry etching method using $CHF_3$ and He. In the case where an In—Ga—Zn oxide film formed by a sputtering method is used as the second mask layer 119A, the second mask layer 119A can be processed by a wet etching method using diluted phosphoric acid. Alternatively, the second mask layer 119A may be processed by a dry etching method using $CH_4$ and Ar. Alternatively, the second mask layer 119A can be processed by a wet etching method using diluted phosphoric acid. In the case where a tungsten film formed by a sputtering method is used as the second mask layer 119A, the second mask layer 119A can be processed by a dry etching method using a combination of $CF_4$ and $O_2$, using a combination of $CF_6$ and $O_2$, a combination of $CF_4$, $Cl_2$, and $O_2$, or a combination of $CF_6$, $Cl_2$, and $O_2$.

Next, as illustrated in FIG. 5C, part of the first layer 113A is removed by etching treatment using the mask layer 119*a* and the mask layer 118*a* as hard masks, so that the first layer 113*a* is formed.

Thus, as illustrated in FIG. 5C, a stacked-layer structure of the first layer 113*a*, the mask layer 118*a*, and the mask layer 119*a* remains over the pixel electrode 111*a*. In the region corresponding to the connection portion 140, a stacked-layer structure of the mask layer 118*a* and the mask layer 119*a* remains over the conductive layer 123.

FIG. 5C illustrates an example where the end portion of the first layer 113*a* is positioned outward from the end portion of the pixel electrode 111*a*. Such a structure can increase the aperture ratio of the pixel. Although not illustrated in FIG. 5C, a depressed portion is sometimes formed by the etching treatment in a region of the insulating layer 255*c* not overlapping with the first layer 113*a*.

The first layer 113*a* covers the top surface and the side surface of the pixel electrode 111*a* and thus, the subsequent steps can be performed without exposure of the pixel electrode 111*a*. When the end portion of the pixel electrode 111*a* is exposed, corrosion might occur in the etching step or the like. A product generated by corrosion of the pixel electrode 111*a* might be unstable; for example, the product might be dissolved in a solution in wet etching and might be diffused in an atmosphere in dry etching. The product dissolved in a solution or scattered in an atmosphere might be attached to a surface to be processed, the side surface of the first layer 113*a*, and the like, which adversely affects the characteristics of the light-emitting device or forms a leakage path between the light-emitting devices in some cases. In a region where the end portion of the pixel electrode 111*a* is exposed, adhesion between layers in contact with each other might be lowered, which might be likely to cause peeling of the first layer 113*a* or the pixel electrode 111*a*.

Thus, with the structure in which the first layer 113*a* covers the top surface and the side surface of the pixel electrode 111*a*, for example, the yield of the light-emitting device can be improved and display quality of the light-emitting device can be improved.

Note that part of the first layer 113A may be removed using the resist mask 190*a*. Then, the resist mask 190*a* may be removed.

The first layer 113A is preferably processed by anisotropic etching. Anisotropic dry etching is particularly preferable. Alternatively, wet etching may be used.

In the case of using a dry etching method, deterioration of the first layer 113A can be inhibited by not using a gas containing oxygen as the etching gas.

Alternatively, a gas containing oxygen may be used as the etching gas. When the etching gas contains oxygen, the etching rate can be increased. Therefore, the etching can be performed under a low-power condition while an adequately high etching rate is maintained. Thus, damage to the first layer 113A can be inhibited. Furthermore, a defect such as attachment of a reaction product generated in the etching can be inhibited.

In the case of using a dry etching method, it is preferable to use a gas containing at least one kind of $H_2$, $CF_4$, $C_4F_8$, $SF_6$, $CHF_3$, $Cl_2$, $H_2O$, $BCl_3$, and a noble gas (also referred to as a rare gas) such as He and Ar as the etching gas, for example. Alternatively, a gas containing oxygen and at least one kind of the above is preferably used as the etching gas. Alternatively, an oxygen gas may be used as the etching gas. Specifically, for example, a gas containing $H_2$ and Ar or a gas containing $CF_4$ and He can be used as the etching gas. As another example, a gas containing $CF_4$, He, and oxygen can be used as the etching gas.

Through the above steps, regions of the first layer 113A, the first mask layer 118A, and the second mask layer 119A that do not overlap with the resist mask 190*a* can be removed.

Figures 6A, 6B, 6C:
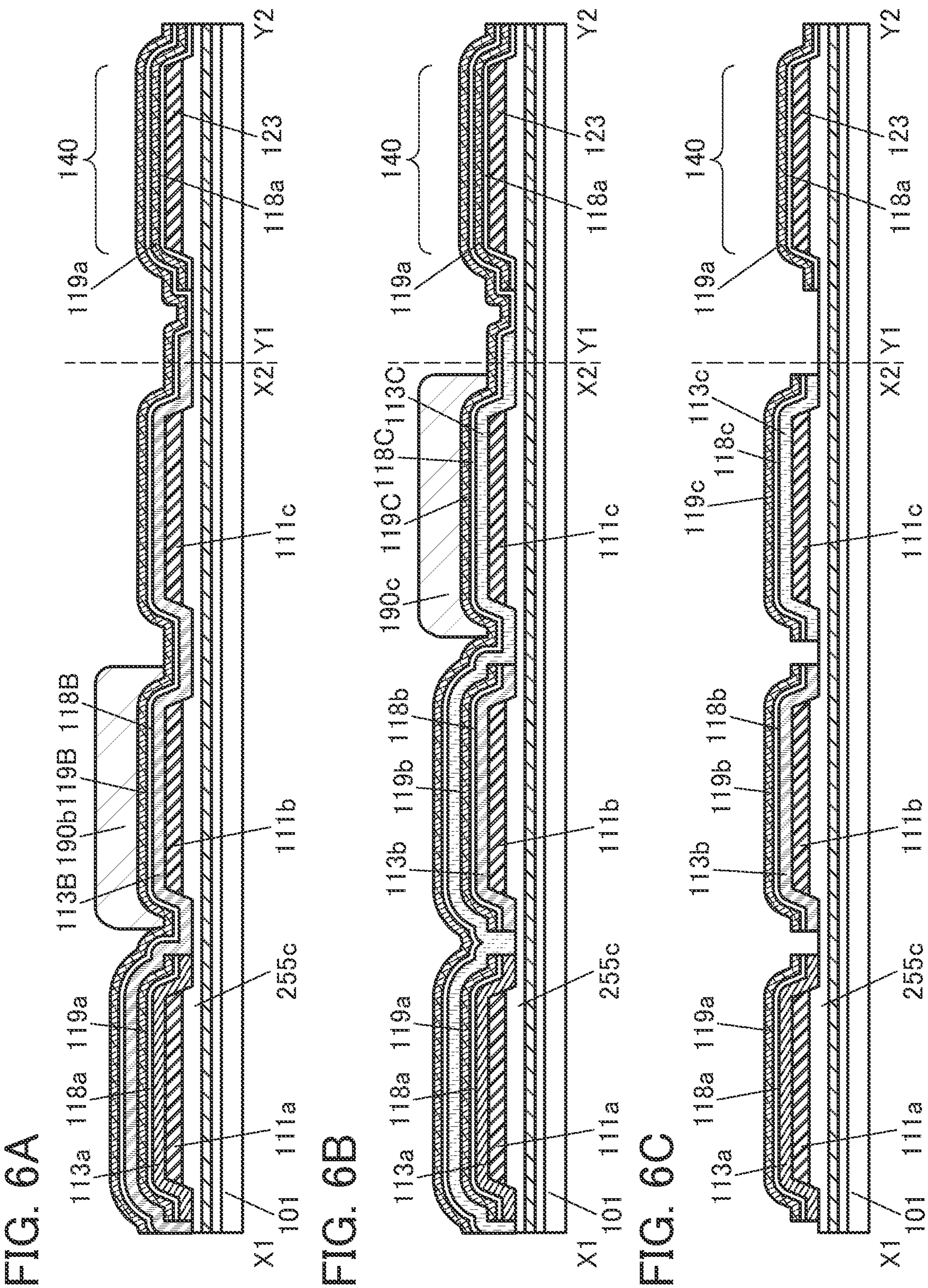
FIG. 6A to FIG. 6C are cross-sectional views illustrating the example of a method for fabricating a display panel.

Then, as illustrated in FIG. 6A, the second layer 113B is formed over the mask layer 119*a*, the pixel electrode 111*b*, and the pixel electrode 111*c*, a first mask layer 118B is formed over the second layer 113B, and a second mask layer 119B is formed over the first mask layer 118B.

As illustrated in FIG. 6A, in the cross-sectional view along Y1-Y2, the end portion of the second layer 113B on the connection portion 140 side is positioned inward from an end portion of the first mask layer 118B.

The second layer 113B is a layer to be the second layer 113*b* later. The second layer 113*b* emits light of a color different from that of light emitted by the first layer 113*a*. Structures, materials, and the like that can be used for the second layer 113*b* are similar to those for the first layer 113*a*. The second layer 113B can be formed by a method similar to that for the first layer 113A.

The first mask layer 118B can be formed using a material that can be used for the first mask layer 118A. The second mask layer 119B can be formed using a material that can be used for the second mask layer 119A.

Next, a resist mask 190*b* is formed over the second mask layer 119B as illustrated in FIG. 6A.

The resist mask 190*b* is provided at a position overlapping with the pixel electrode 111*b*. The resist mask 190*b* may be provided also at a position overlapping with the region to be the connection portion 140 later.

Next, steps similar to those described with reference to FIG. 5B and FIG. 5C are performed to remove regions of the second layer 113B, the first mask layer 118B, and the second mask layer 119B which do not overlap with the resist mask 190*b*.

Accordingly, as illustrated in FIG. 6B, a stacked-layer structure of the second layer 113*b*, the mask layer 118*b*, and the mask layer 119*b* remains over the pixel electrode 111*b*. In the region corresponding to the connection portion 140, a stacked-layer structure of the mask layer 118*a* and the mask layer 119*a* remains over the conductive layer 123.

Next, as illustrated in FIG. 6B, the third layer 113C is formed over the mask layer 119*a*, the mask layer 119*b*, and the pixel electrode 111*c*, a first mask layer 118C is formed over the third layer 113C, and a second mask layer 119C is formed over the first mask layer 118C.

As illustrated in FIG. 6B, in the cross-sectional view along Y1-Y2, an end portion of the third layer 113C on the connection portion 140 side is positioned inward from an end portion of the first mask layer 118C.

The third layer 113C is a layer to be the third layer 113*c* later. The third layer 113*c* emits light of a color different from those of light emitted by the first layer 113*a* and the second layer 113*b*. Structures, materials, and the like that can be used for the third layer 113*c* are similar to those for the first layer 113*a*. The third layer 113C can be formed by a method similar to that for the first layer 113A.

The first mask layer 118C can be formed using a material that can be used for the first mask layer 118A. The second mask layer 119C can be formed using a material that can be used for the second mask layer 119A.

Next, a resist mask 190*c* is formed over the second mask layer 119C as illustrated in FIG. 6B.

The resist mask 190*c* is provided at a position overlapping with the pixel electrode 111*c*. The resist mask 190*c* may be provided also at a position overlapping with the region to be the connection portion 140 later.

Next, steps similar to those described with reference to FIG. 5B and FIG. 5C are performed to remove regions of the third layer 113C, the first mask layer 118C, and the second mask layer 119C which do not overlap with the resist mask 190*c*.

Accordingly, as illustrated in FIG. 6C, a stacked-layer structure of the third layer 113*c*, the mask layer 118*c*, and the mask layer 119*c* remains over the pixel electrode 111*c*. In the region corresponding to the connection portion 140, a stacked-layer structure of the mask layer 118*a* and the mask layer 119*a* remains over the conductive layer 123.

Note that the side surfaces of the first layer 113*a*, the second layer 113*b*, and the third layer 113*c* are preferably perpendicular or substantially perpendicular to their formation surfaces. For example, the angle formed by the formation surfaces and these side surfaces is preferably greater than or equal to 60° and less than or equal to 90°.

By processing the EL layers by a photolithography method as described above, the distance between pixels can be shortened to less than or equal to 8 μm, less than or equal to 5 μm, less than or equal to 3 μm, less than or equal to 2 μm, or less than or equal to 1 μm. Here, the distance between pixels can be specified, for example, by the distance between facing end portions of two adjacent layers among the first layer 113*a*, the second layer 113*b*, and the third layer 113*c*. When the distance between pixels is shortened in this manner, a display apparatus with high resolution and a high aperture ratio can be provided.

Figure 7A:
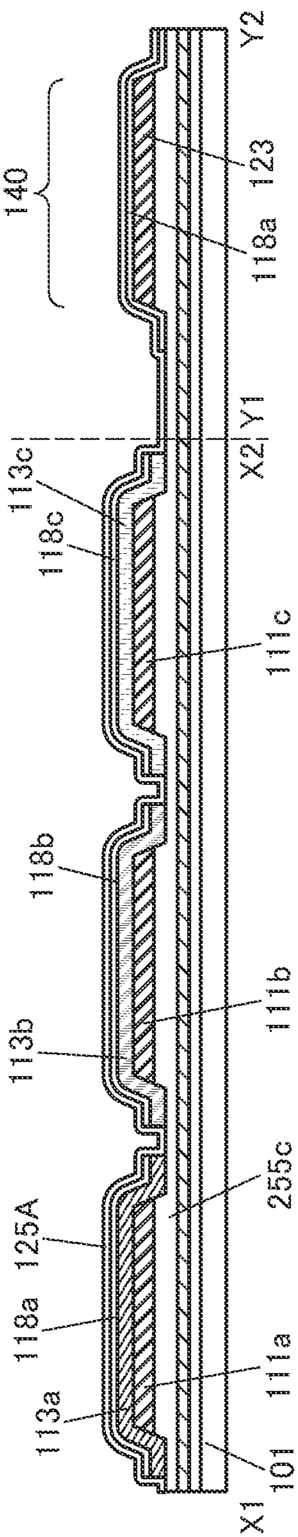
FIG. 7A to FIG. 7C are cross-sectional views illustrating the example of a method for fabricating a display panel.

Subsequently, the mask layers 119*a*, 119*b*, and 119*c* are removed as illustrated in FIG. 7A. As a result, the mask layer 118*a* is exposed over the pixel electrode 111*a*, the mask layer 118*b* is exposed over the pixel electrode 111*b*, the mask layer 118*c* is exposed over the pixel electrode 111*c*, and the mask layer 118*a* is exposed over the conductive layer 123.

A step of forming an insulating film 125A may be performed without the removal of the mask layers 119*a*, 119*b*, and 119*c*.

The step of removing the mask layers can be performed by a method similar to that for the step of processing the mask layers. In particular, using a wet etching method can reduce damage to the first layer 113*a*, the second layer 113*b*, and the third layer 113*c* in removing the mask layers, as compared to the case of using a dry etching method.

The mask layers may be removed by being dissolved in a solvent such as water or alcohol. Examples of alcohol include ethyl alcohol, methyl alcohol, isopropyl alcohol (IPA), and glycerin. After the mask layers are removed, drying treatment may be performed to remove water contained in the EL layer and water adsorbed onto the surface of the EL layer. For example, heat treatment in an inert gas atmosphere or a reduced-pressure atmosphere can be performed. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 120° C. Employing a reduced-pressure atmosphere is preferable, in which case drying at a lower temperature is possible.

Next, as illustrated in FIG. 7A, the insulating film 125A is formed to cover the first layer 113*a*, the second layer 113*b*, the third layer 113*c*, and the mask layers 118*a*, 118*b*, and 118*c*.

The insulating film 125A is a layer to be the insulating layer 125 later. Thus, the insulating film 125A can be formed using a material that can be used for the insulating layer 125. The thickness of the insulating film 125A is preferably greater than or equal to 3 nm, greater than or equal to 5 nm, or greater than or equal to 10 nm and less than or equal to 200 nm, less than or equal to 150 nm, less than or equal to 100 nm, or less than or equal to 50 nm.

The insulating film 125A, which is formed in contact with the side surface of the EL layer, is preferably formed by a formation method that causes less damage to the EL layer. In addition, the insulating film 125A is formed at a temperature lower than the upper temperature limit of the EL layer. The typical substrate temperature in formation of each of the insulating film 125A and the insulating layer 127 is lower than or equal to 200° C., preferably lower than or equal to 180° C., further preferably lower than or equal to 160° C., still further preferably lower than or equal to 150° C., yet still further preferably lower than or equal to 140° C.

As the insulating film 125A, for example, an aluminum oxide film is preferably formed by an ALD method. The use of an ALD method is preferable, in which case deposition damage can be reduced and a film with good coverage can be formed. Here, the insulating film 125A can be formed using a material and a method similar to those for the mask layers 118*a*, 118*b*, and 118*c*. In that case, the boundaries between the insulating film 125A and the mask layers 118*a*, 118*b*, and 118*c* are sometimes unclear.

Figure 7B:
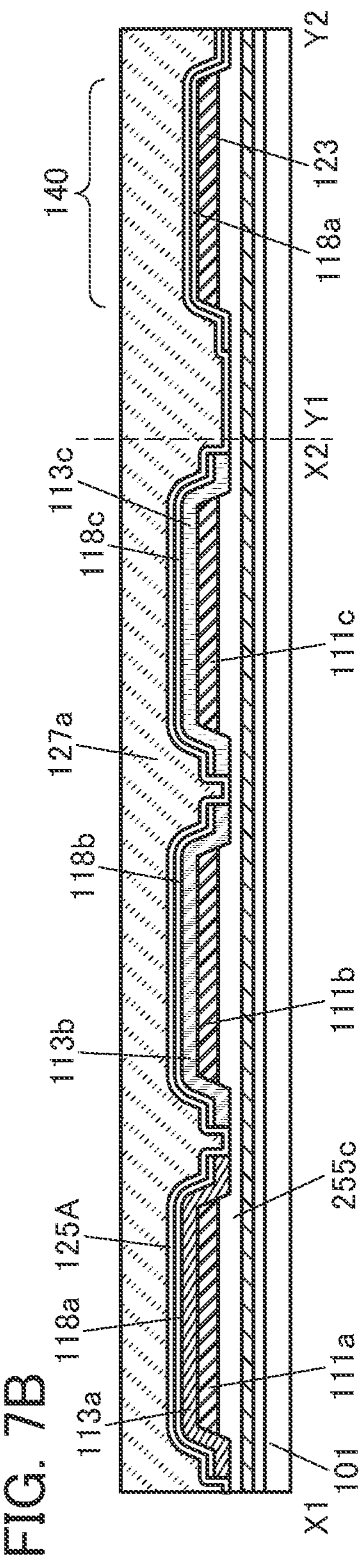

Next, as illustrated in FIG. 7B, an insulating layer 127*a* is applied onto the insulating film 125A.

The insulating layer 127*a* is a film to be the insulating layer 127 later, and the insulating layer 127*a* can be formed using any of the above-described organic materials. As the organic material, a photosensitive organic resin is preferably used; for example, a photosensitive acrylic resin may be used. The viscosity of the insulating layer 127*a* is greater than or equal to 1 cP and less than or equal to 1500 cP, preferably greater than or equal to 1 cP and less than or equal to 12 cP. By setting the viscosity of the insulating layer 127*a* in the above range, the insulating layer 127 having a tapered shape as illustrated in FIG. 2A and the like can be formed relatively easily.

There is no particular limitation on the method for forming the insulating layer 127*a*; for example, the film can be formed by a wet film-formation method such as spin coating, dipping, spray coating, ink-jetting, dispensing, screen printing, offset printing, a doctor knife method, slit coating, roll coating, curtain coating, or knife coating. Specifically, the organic insulating film to be the insulating layer 127*a* is preferably formed by spin coating.

After the application of the insulating layer 127*a*, heat treatment is preferably performed. The heat treatment is formed at a temperature lower than the upper temperature limit of the EL layer. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 120° C. Accordingly, a solvent contained in the insulating layer 127*a* can be removed.

Figure 7C:
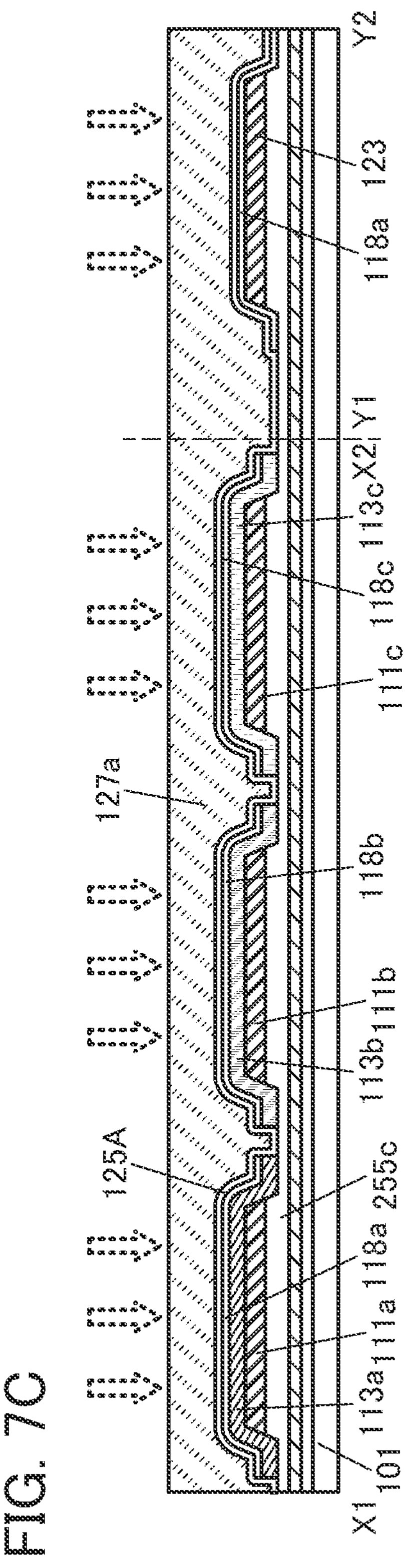

Next, as illustrated in FIG. 7C, light exposure is performed so that part of the insulating layer 127*a* is exposed to visible rays or ultraviolet rays. Here, in the case where a positive acrylic resin is used for the insulating layer 127*a*, a region where the insulating layer 127 is not formed in a later step is irradiated with visible rays or ultraviolet rays using a mask. The insulating layer 127 is formed in a region between any two of the pixel electrodes 111*a*, 111*b*, and 111*c*; thus, as illustrated in FIG. 7C, irradiation with visible rays or ultraviolet rays is performed using a mask above the pixel electrode 111*a*, the pixel electrode 111*b*, and the pixel electrode 111*c*.

In the case where visible rays are used for light exposure, the visible rays preferably include the i-line (wavelength: 365 nm). Furthermore, visible rays including the g-line (wavelength: 436 nm), the h-line (wavelength: 405 nm), or the like may be used.

Although FIG. 7C illustrates an example where a positive photosensitive organic resin is used for the insulating layer 127*a* and a region where the insulating layer 127 is not formed is irradiated with visible rays or ultraviolet rays, the present invention is not limited thereto. For example, a negative photosensitive organic resin may be used for the insulating layer 127*a*. In this case, a region where the insulating layer 127 is formed is irradiated with visible rays or ultraviolet rays.

Figures 8A, 8B, 8C:
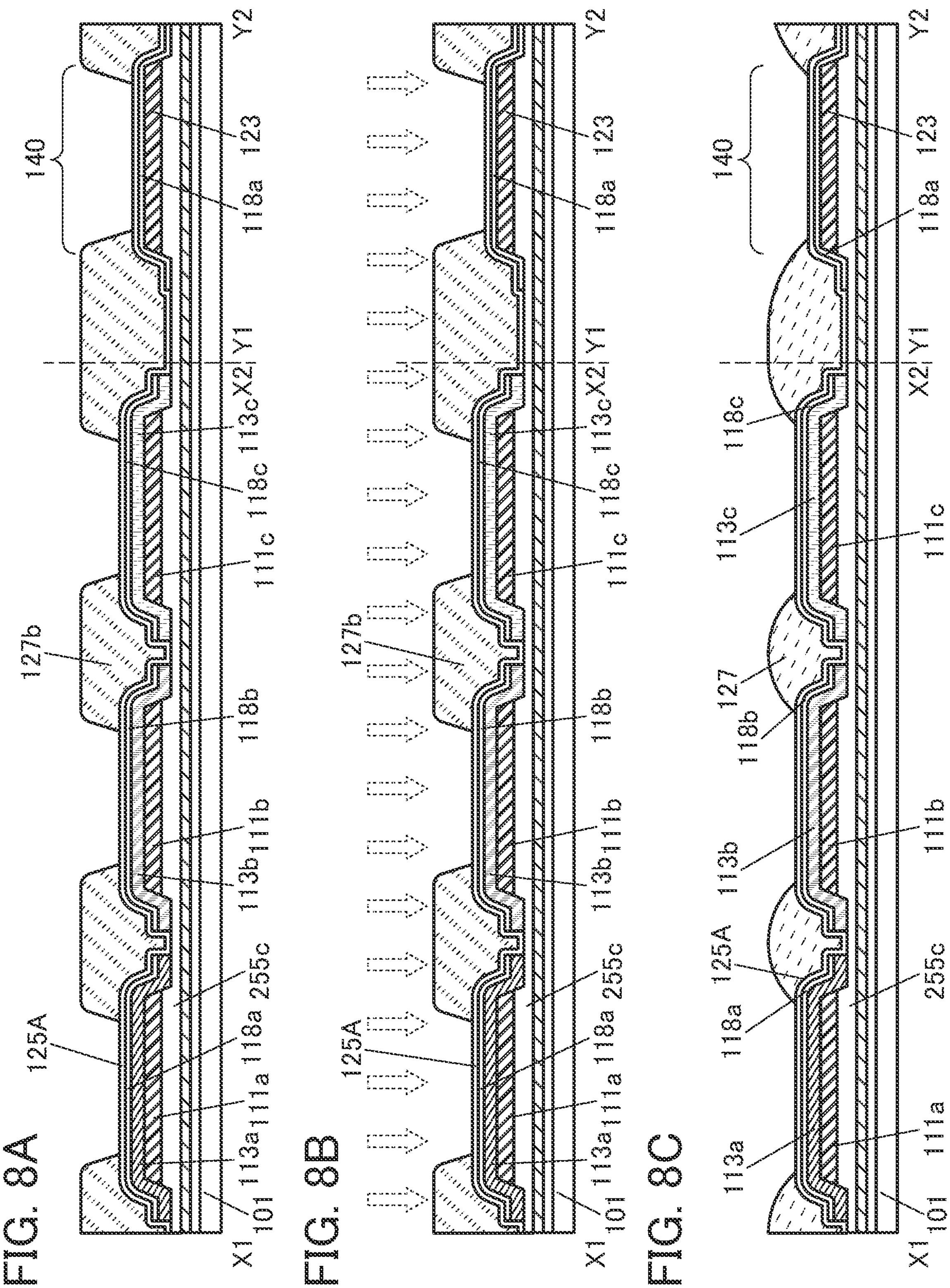
FIG. 8A to FIG. 8C are cross-sectional views illustrating the example of a method for fabricating a display panel.

Next, the region of the insulating layer 127*a* exposed to light is removed by development as illustrated in FIG. 8A, so that an insulating layer 127*b* is formed. The insulating layer 127*b* is formed in a region between any two of the pixel electrodes 111*a*, 111*b*, and 111*c*. In the case where an acrylic resin is used for the insulating layer 127*a*, an alkaline solution is preferably used as a developer, and for example, an aqueous solution of tetramethylammonium hydroxide (TMAH) can be used.

Then, as illustrated in FIG. 8B, light exposure is preferably performed on the entire substrate so that the insulating layer 127*b* is irradiated with visible rays or ultraviolet light. The energy density for the light exposure is greater than 0 $mJ/cm^2$ and less than or equal to 800 $mJ/cm^2$, preferably greater than 0 $mJ/cm^2$ and less than or equal to 500 $mJ/cm^2$. Performing such light exposure after development can improve the transparency of the insulating layer 127*b* in some cases. In addition, it is sometimes possible to lower the substrate temperature required for heat treatment in a later step for changing the shape of the insulating layer 127*b* into a tapered shape.

Next, as illustrated in FIG. 8C, the heat treatment is performed so that the insulating layer 127*b* can be changed into an insulating layer 127 having a taper-shaped side surface. The heat treatment is formed at a temperature lower than the upper temperature limit of the EL layer. The substrate temperature at the time of the heat treatment is higher than or equal to 50° C. and lower than or equal to 200° C., preferably higher than or equal to 60° C. and lower than or equal to 150° C., further preferably higher than or equal to 70° C. and lower than or equal to 130° C. The substrate temperature in the heat treatment of this step is preferably higher than that in the heat treatment after the application of the insulating layer 127. Accordingly, adhesion between the insulating layer 127 and the insulating film 125A can be improved, and corrosion resistance of the insulating layer 127 can also be increased.

In a cross-sectional view of the display apparatus, the insulating layer 127 preferably has a taper-shaped side surface with the taper angle θ1, like the insulating layer 127 illustrated in FIG. 2A. The top surface of the insulating layer 127 preferably has a convex shape in a cross-sectional view of the display apparatus.

Here, the insulating layer 127 is preferably shrunk such that one end portion of the insulating layer 127 overlaps with the pixel electrode 111*a* and the other end portion of the insulating layer 127 overlaps with the pixel electrode 111*b*. Note that the pixel electrodes 111*a*, 111*b*, and 111*c* can be selected as appropriate in accordance with the position of the insulating layer 127. With such a structure, the end portion of the insulating layer 127 can be formed over a substantially flat region of the first layer 113*a* (the second layer 113*b*). Thus, the tapered shape of the insulating layer 127 is relatively easy to process as described above.

Note that the light exposure shown in FIG. 8B is not necessarily performed in the case where the insulating layer 127 can be processed to have a tapered shape only by the heat treatment shown in FIG. 8C.

It is preferable that heat treatment be further performed after the insulating layer 127 is processed into a tapered shape. The heat treatment can remove water contained in the EL layer, water adsorbed onto the surface of the EL layer, and the like. For example, heat treatment in an inert gas atmosphere or a reduced-pressure atmosphere can be performed. The heat treatment can be performed at a substrate temperature higher than or equal to 80° C. and lower than or equal to 230° C., preferably higher than or equal to 80° C. and lower than or equal to 200° C., further preferably higher than or equal to 80° C. and lower than or equal to 130° C., still further preferably higher than or equal to 80° C. and lower than or equal to 100° C. A reduced-pressure atmosphere is preferably employed, in which case dehydration at a lower temperature is possible. Note that the temperature range of the heat treatment is preferably set as appropriate in consideration of the upper temperature limit of the EL layer. In consideration of the upper temperature limit of the EL layer, temperatures from 80° C. to 100° C. are particularly preferable in the above temperature range.

Etching may be performed so that the surface level of the insulating layer 127 is adjusted. The insulating layer 127 may be processed by ashing using oxygen plasma, for example.

Figure 9A:
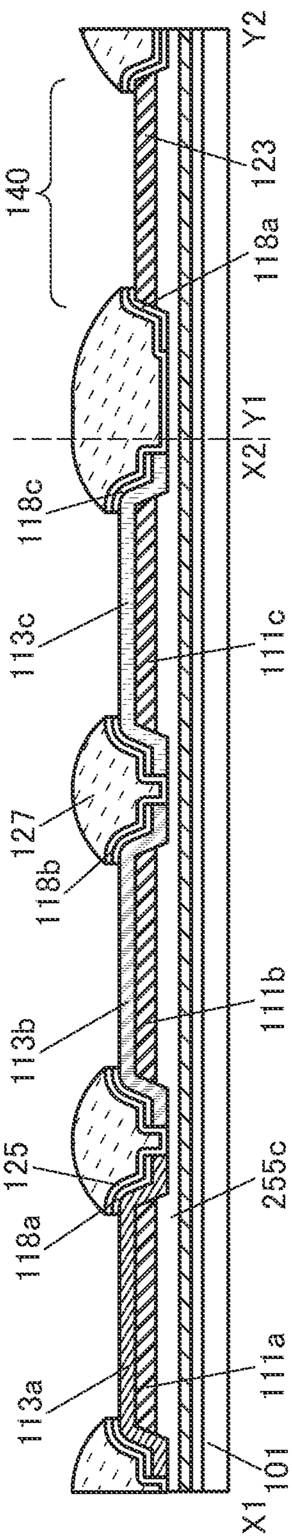
FIG. 9A to FIG. 9C are cross-sectional views illustrating the example of a method for fabricating a display panel.

Then, as illustrated in FIG. 9A, the insulating film 125A and the mask layers 118*a*, 118*b*, and 118*c* are removed at least partly to expose the first layer 113*a*, the second layer 113*b*, the third layer 113*c*, and the conductive layer 123.

The mask layers 118*a*, 118*b*, and 118*c* may be removed in a step that is different from or the same as a step of removing the insulating film 125A. The mask layers 118*a*, 118*b*, and 118*c* and the insulating film 125A are preferably films that are formed using the same material, for example, in which case they can be removed in the same step. For the mask layers 118*a*, 118*b*, and 118*c* and the insulating film 125A, insulating films are preferably formed by an ALD method, and aluminum oxide films are further preferably formed by an ALD method, for example.

Note that until the mask layer 118*a* is removed, the mask layer 118*a* is in contact with the top surface of the first layer 113*a* and protects the first layer 113*a* from damage during the processing steps. Until the mask layer 118*b* is removed, the mask layer 118*b* is in contact with the top surface of the second layer 113*b* and protects the second layer 113*b* from damage during the processing steps. Until the mask layer 118*c* is removed, the mask layer 118*c* is in contact with the top surface of the third layer 113*c* and protects the third layer 113*c* from damage during the processing steps.

For example, the mask layer 118*a* blocks the air and inhibits a change in quality of the first layer 113*a* due to atmospheric components. Furthermore, the mask layer 118*a* attenuates ultraviolet light applied during the processing steps and inhibits a change in quality of the first layer 113*a* due to the ultraviolet light. In addition, the mask layer 118*a* blocks plasma applied during the processing steps and inhibits a change in quality of the first layer 113*a* due to the plasma. Moreover, the mask layer 118*a* blocks a chemical solution or a gas used in the processing steps and inhibits a change in quality of the first layer 113*a* due to components contained in the chemical solution or the gas.

For example, the organic compound contained in the first layer 113*a* reacts with oxygen contained in the air in some cases. In particular, light irradiation brings the organic compound into an excited state and promotes the reaction of the organic compound with oxygen contained in the air. Specifically, when an anthracene derivative, which is often used for a light-emitting layer or an electron-transport layer, is irradiated with light in the present of oxygen, oxygen is sometimes bonded to an anthracene skeleton.

Figure 36:
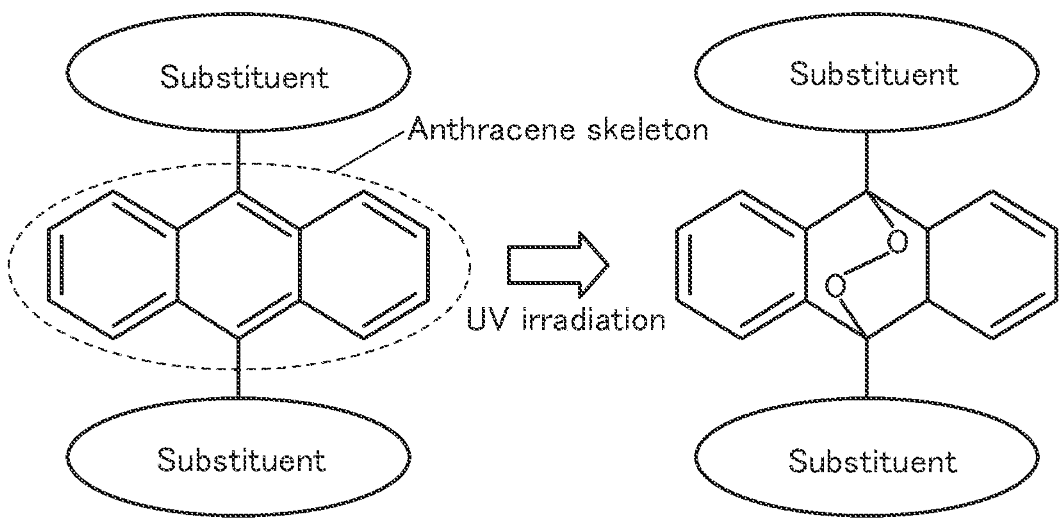
FIG. 36 is a conceptual diagram of the case where oxygen is bonded to an anthracene skeleton.

Here, the case where oxygen is bonded to an anthracene skeleton is described with reference to FIG. 36. FIG. 36 is a conceptual diagram of the case where oxygen is bonded to an anthracene skeleton. As illustrated in FIG. 36, when a molecular structure in which substituents are bonded to the 9-position and 10-position of an anthracene skeleton is irradiated with light (irradiated with ultraviolet (UV) light in FIG. 36), it can be considered that part of carbon constituting the anthracene skeleton is bonded to oxygen that can exist in the air, and two oxygen atoms are linked in the middle ring, which is most likely to react among the three fused rings in the anthracene skeleton.

Since the mask layer 118*a* prevents the anthracene derivative contained in the light-emitting layer or the electron-transport layer from being contact with the air until the mask layer 118*a* is removed, the mask layer 118*a* has an effect of inhibiting such a reaction and protecting the first layer 113*a*. Although the first layer 113*a* functions as a protective layer preventing a contact between the anthracene derivative and the air in the above-described example, one embodiment of the present invention is not limited thereto. For example, the insulating film 125A may have a function similar to that of the first layer 113*a*.

As illustrated in FIG. 9A, a region of the insulating film 125A which overlaps with the insulating layer 127 remains as the insulating layer 125. Regions of the mask layers 118*a*, 118*b*, and 118*c* which overlap with the insulating layer 127 remain.

The insulating layer 125 (and the insulating layer 127) is (are) provided to cover the side surfaces and parts of the top surfaces of the pixel electrodes 111*a*, 111*b*, and 111*c*, the first layer 113*a*, the second layer 113*b*, and the third layer 113*c*. This inhibits the side surfaces of these layers from being in contact with a film to be formed later, thereby inhibiting a short circuit of the light-emitting device. In addition, damage to the first layer 113*a*, the second layer 113*b*, and the third layer 113*c* in later steps can be inhibited.

The step of removing the mask layers can be performed by a method similar to that for the step of processing the mask layers. For the mask layers 118*a*, 118*b*, and 118*c*, a method similar to the method usable in the step of removing the mask layers 119*a*, 119*b*, and 119*c* can be used. In addition, the step of removing the insulating film 125A can also be performed by a method similar to that for the step of removing the mask layers.

Figure 9B:
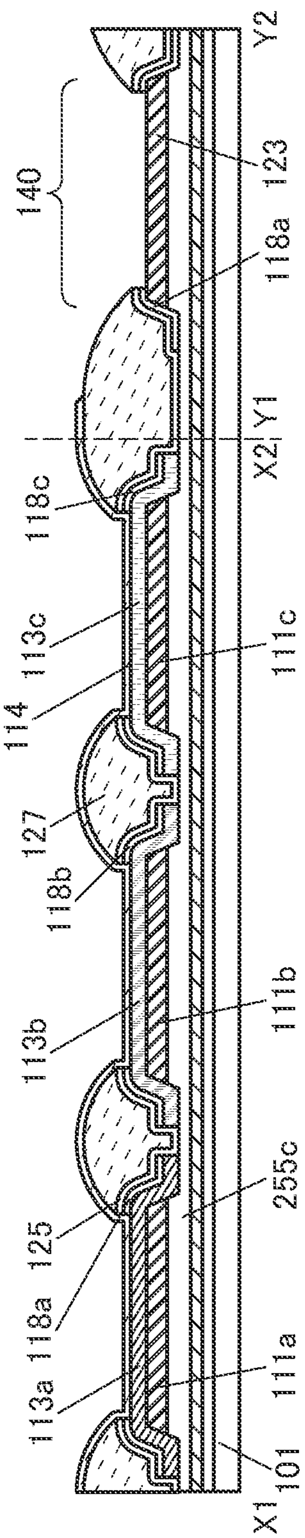

Then, as illustrated in FIG. 9B, the common layer 114 is formed to cover the insulating layer 125, the insulating layer 127, the mask layers 118, the first layer 113*a*, the second layer 113*b*, and the third layer 113*c*.

In FIG. 9B, the cross-sectional view along Y1-Y2 shows the example where the common layer 114 is not provided in the connection portion 140. As illustrated in FIG. 9B, an end portion of the common layer 114 on the connection portion 140 side is preferably positioned inward from the connection portion 140. In forming the common layer 114, for example, a mask for specifying the film formation area (also referred to as an area mask or a rough metal mask) is preferably used.

The common layer 114 may be provided in the connection portion 140 depending on the level of the conductivity of the common layer 114. With such a structure, it is possible to form the connection portion 140 having the structure illustrated in FIG. 3A where the conductive layer 123 is electrically connected to the common electrode 115 through the common layer 114.

Materials that can be used for the common layer 114 are as described above. The common layer 114 can be formed by an evaporation method (including a vacuum evaporation method), a transfer method, a printing method, an inkjet method, a coating method, or the like. The common layer 114 may be formed using a premix material.

The common layer 114 is provided to cover the top surfaces of the first layer 113*a*, the second layer 113*b*, and the third layer 113*c* and the top surface and the side surface of the insulating layer 127. Here, in the case where the common layer 114 has high conductivity, a short circuit of the light-emitting device might be caused when the common layer 114 is in contact with any of the side surfaces of the pixel electrodes 111*a*, 111*b*, and 111*c*, the first layer 113*a*, the second layer 113*b*, and the third layer 113*c*. In the display panel of one embodiment of the present invention, however, the insulating layers 125 and 127 cover the side surfaces of the first layer 113*a*, the second layer 113*b*, and the third layer 113*c* and the first layer 113*a*, the second layer 113*b*, and the third layer 113*c* cover the side surfaces of the pixel electrodes 111*a*, 111*b*, and 111*c*. This inhibits the common layer 114 having high conductivity from being in contact with the side surfaces of these layers, whereby a short circuit of the light-emitting device can be inhibited. Thus, the reliability of the light-emitting device can be increased.

Since the space between the first layer 113*a* and the second layer 113*b* and the space between the second layer 113*b* and the third layer 113*c* are filled with the insulating layers 125 and 127, the formation surface of the common layer 114 has a smaller step and higher flatness than the formation surface of the case where the insulating layers 125 and 127 are not provided. This can improve the coverage with the common layer 114.

Figure 9C:
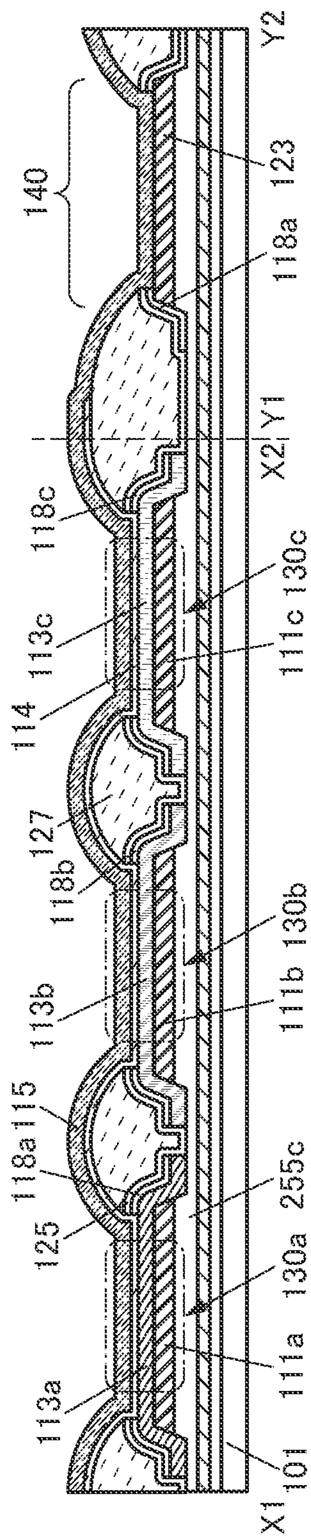

Then, the common electrode 115 is formed over the common layer 114 and the conductive layer 123 as illustrated in FIG. 9C. Accordingly, the conductive layer 123 and the common electrode 115 are in direct contact with each other to be electrically connected to each other. With such a structure, it is possible to form the connection portion 140 having the structure illustrated in FIG. 3B where the top surface of the conductive layer 123 is in contact with the common electrode 115.

A mask for specifying a film formation area (also referred to as an area mask, a rough metal mask, or the like) may be used in the formation of the common electrode 115. Alternatively, the common electrode 115 may be formed without using the mask: the common electrode 115 may be processed using a resist mask or the like after the common electrode 115 is formed.

Materials that can be used for the common electrode 115 are as described above. The common electrode 115 can be formed by a sputtering method or a vacuum evaporation method, for example. Alternatively, the common electrode 115 may be a stack of a film formed by an evaporation method and a film formed by a sputtering method.

Note that during a period from the time when the top surface of the first layer 113*a* and the top surface of the second layer 113*b* are exposed to the time when the common electrode 115 is formed, the first layer 113*a* and the second layer 113*b* are prevented from being exposed to ultraviolet rays. Preferably, for example, the fabrication proceeds in a yellow room from which light with wavelengths of 500 nm or less is removed. Specifically, the amount of ultraviolet rays with wavelengths less than 400 nm, to which the first layer 113*a* and the second layer 113*b* are exposed, is controlled to be greater than 0 $mJ/cm^2$ and less than or equal to 1000 $mJ/cm^2$, preferably less than or equal to 700 $mJ/cm^2$, further preferably less than or equal to 250 $mJ/cm^2$.

After that, the protective layer 131 is formed over the common electrode 115.

Furthermore, the substrate 120 is attached onto the protective layer 131 with the resin layer 122, whereby the display panel 100 illustrated in FIG. 1B can be fabricated.

Materials and deposition methods that can be used for the protective layer 131 are as described above. Examples of the deposition method of the protective layer 131 include a vacuum evaporation method, a sputtering method, a CVD method, and an ALD method. The protective layer 131 may have a single-layer structure or a stacked-layer structure.

In the above-described manner, the display panel 100 described above can be fabricated.

In the display panel of one embodiment of the present invention, each subpixel includes an island-shaped EL layer, which can inhibit generation of leakage current between the subpixels. Moreover, as described above, the stack structure body of the inorganic insulating layer and the organic resin film is provided between the light-emitting devices, whereby a disconnected portion and a locally thinned portion can be prevented from being formed in the common layer and the common electrode over the stack structure body. Thus, a connection defect caused by the disconnected portion and an increase in electric resistance in the thinned portion can be inhibited from occurring in the common layer and the common electrode. Accordingly, the display apparatus of one embodiment of the present invention achieves both high resolution and high display quality.

This embodiment can be combined with the other embodiments as appropriate.

Embodiment 2

In this embodiment, a display panel of one embodiment of the present invention is described with reference to FIG. 10 to FIG. 13.

[Pixel Layout]

In this embodiment, pixel layouts different from that in FIG. 1A are mainly described. There is no particular limitation on the arrangement of subpixels, and a variety of methods can be employed. Examples of the arrangement of subpixels include stripe arrangement, S-stripe arrangement, matrix arrangement, delta arrangement, Bayer arrangement, and PenTile arrangement.

Examples of a top surface shape of the subpixel include polygons such as a triangle, a tetragon (including a rectangle and a square), and a pentagon; polygons with rounded corners; an ellipse; and a circle. Here, the top surface shape of the subpixel corresponds to the top surface shape of a light-emitting region of the light-emitting device.

Figure 10A:
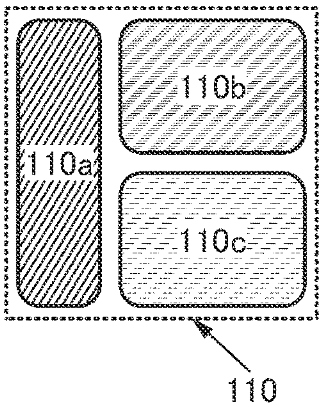
FIG. 10A to FIG. 10F are top views illustrating examples of a pixel.
Figure 12A:
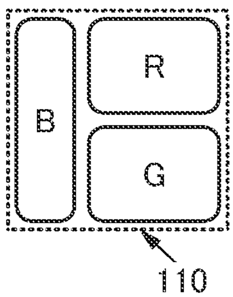
FIG. 12A to FIG. 12J are top views illustrating examples of a pixel.

The pixel 110 illustrated in FIG. 10A employs S-stripe arrangement. The pixel 110 illustrated in FIG. 10A is composed of three subpixels 110*a*, 110*b*, and 110*c*. For example, as illustrated in FIG. 12A, the subpixel 110*a* may be a blue subpixel B, the subpixel 110*b* may be a red subpixel R, and the subpixel 110*c* may be a green subpixel G.

Figure 10B:
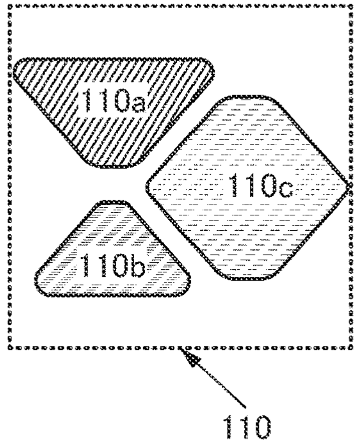
Figure 12B:
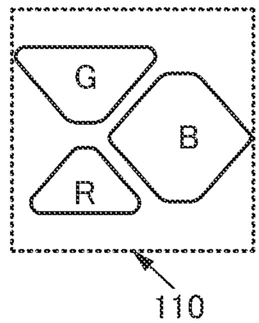

The pixel 110 illustrated in FIG. 10B includes the subpixel 110*a* whose top surface has a rough trapezoidal shape with rounded corners, the subpixel 110*b* whose top surface has a rough triangle shape with rounded corners, and the subpixel 110*c* whose top surface has a rough tetragonal or rough hexagonal shape with rounded corners. The subpixel 110*a* has a larger light-emitting area than the subpixel 110*b*. In this manner, the shapes and sizes of the subpixels can be determined independently. For example, the size of a subpixel including a light-emitting device with higher reliability can be smaller. For example, as illustrated in FIG. 12B, the subpixel 110*a* may be the green subpixel G, the subpixel 110*b* may be the red subpixel R, and the subpixel 110*c* may be the blue subpixel B.

Figure 10C:
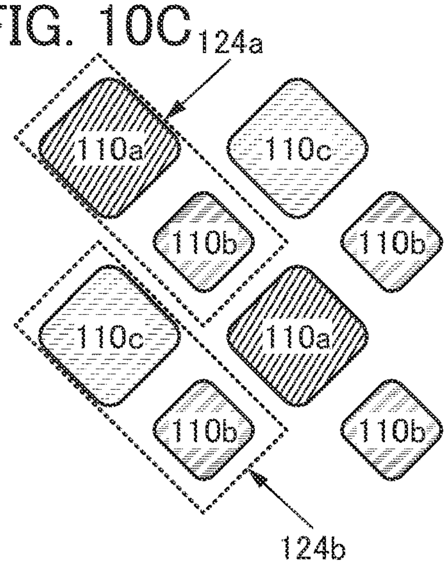
Figure 12C:
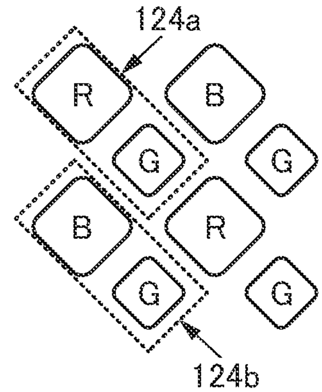

Pixels 124*a* and 124*b* illustrated in FIG. 10C employ PenTile arrangement. FIG. 10C illustrates an example in which the pixels 124*a* each including the subpixels 110*a* and 110*b* and the pixels 124*b* each including the subpixels 110*b* and 110*c* are alternately arranged. For example, as illustrated in FIG. 12C, the subpixel 110*a* may be the red subpixel R, the subpixel 110*b* may be the green subpixel G, and the subpixel 110*c* may be the blue subpixel B.

Figure 10D:
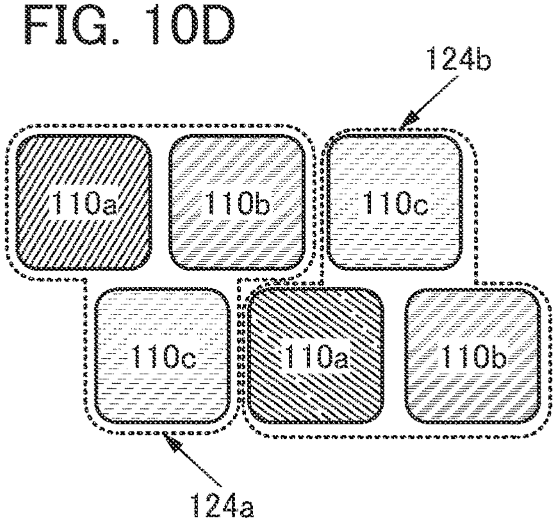
Figure 10E:
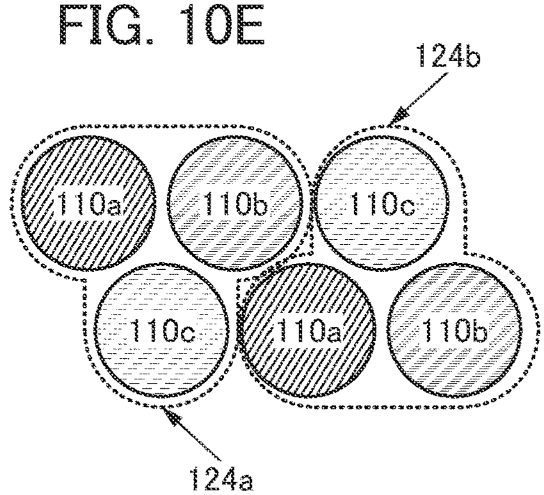
Figure 12D:
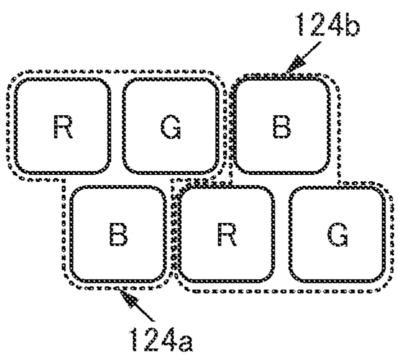

The pixels 124*a* and 124*b* illustrated in FIG. 10D and FIG. 10E employ delta arrangement. The pixel 124*a* includes two subpixels (the subpixels 110*a* and 110*b*) in the upper row (first row) and one subpixel (the subpixel 110*c*) in the lower row (second row). The pixel 124*b* includes one subpixel (the subpixel 110*c*) in the upper row (first row) and two subpixels (the subpixels 110*a* and 110*b*) in the lower row (second row). For example, as illustrated in FIG. 12D, the subpixel 110*a* may be the red subpixel R, the subpixel 110*b* may be the green subpixel G, and the subpixel 110*c* may be the blue subpixel B.

FIG. 10D illustrates an example in which the top surface of each subpixel has a rough tetragonal shape with rounded corners, and FIG. 10E illustrates an example in which the top surface of each subpixel has a circular shape.

Figure 10F:
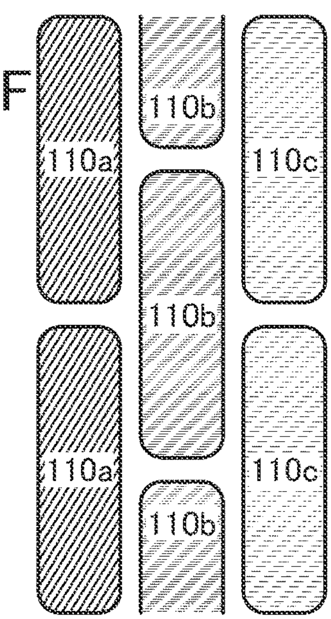
Figure 12E:
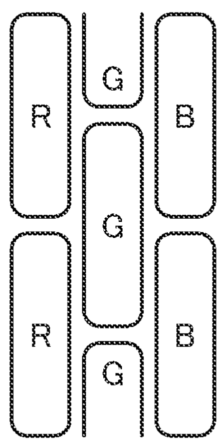

FIG. 10F illustrates an example in which subpixels of different colors are arranged in a zigzag manner. Specifically, the positions of the top sides of two subpixels arranged in the column direction (e.g., the subpixel 110*a* and the subpixel 110*b* or the subpixel 110*b* and the subpixel 110*c*) are not aligned in the top view. For example, as illustrated in FIG. 12E, the subpixel 110*a* may be the red subpixel R, the subpixel 110*b* may be the green subpixel G, and the subpixel 110*c* may be the blue subpixel B.

In a photolithography method, as a pattern to be formed by processing becomes finer, the influence of light diffraction becomes more difficult to ignore; accordingly, the fidelity in transferring a photomask pattern by light exposure is degraded, and it becomes difficult to process a resist mask into a desired shape. Thus, a pattern with rounded corners is likely to be formed even with a rectangular photomask pattern. Consequently, the top surface of a subpixel sometimes has a polygonal shape with rounded corners, an elliptical shape, a circular shape, or the like.

Furthermore, in the method for fabricating the display panel of one embodiment of the present invention, the EL layer is processed into an island shape using a resist mask. A resist film formed over the EL layer needs to be cured at a temperature lower than the upper temperature limit of the EL layer. Thus, the resist film is insufficiently cured in some cases depending on the upper temperature limit of the material of the EL layer and the curing temperature of the resist material. An insufficiently cured resist film may have a shape different from a desired shape by processing. As a result, the top surface of the EL layer sometimes has a polygonal shape with rounded corners, an elliptical shape, a circular shape, or the like. For example, when a resist mask with a square top surface is intended to be formed, a resist mask with a circular top surface may be formed, and the top surface of the EL layer may be circular.

Note that to obtain a desired top surface shape of the EL layer, a technique of correcting a mask pattern in advance so that a transferred pattern agrees with a design pattern (an OPC (Optical Proximity Correction) technique) may be used. Specifically, with the OPC technique, a pattern for correction is added to a corner portion or the like of a figure on a mask pattern.

Figure 12F:
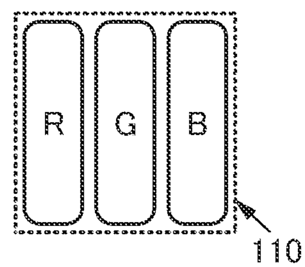
Figure 12G:
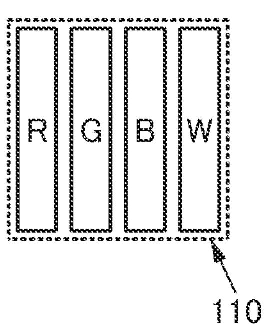
Figure 12H:
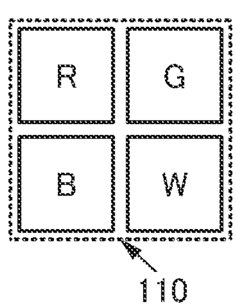
Figure 12I:
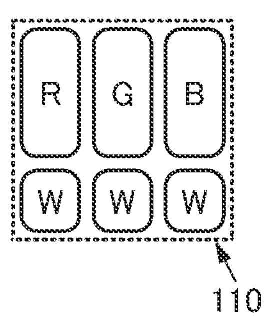
Figure 12J:
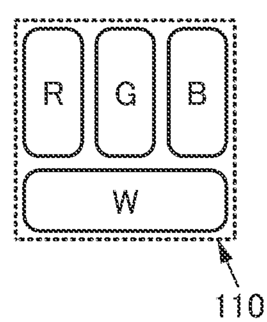

Also in the pixel 110 illustrated in FIG. 1A, which employs stripe arrangement, for example, the subpixel 110*a* can be the red subpixel R, the subpixel 110*b* can be the green subpixel G, and the subpixel 110*c* can be the blue subpixel B as illustrated in FIG. 12F.

As illustrated in FIG. 11A to FIG. 11H, the pixel can include four types of subpixels.

Figure 11A:
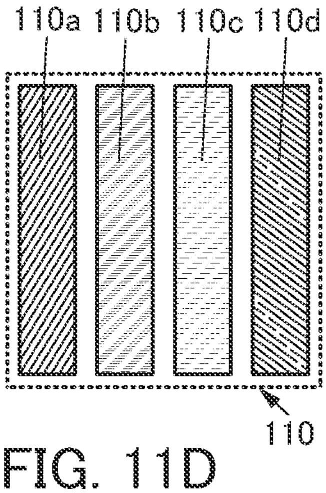
FIG. 11A to FIG. 11H are top views illustrating examples of a pixel.
Figure 11B:
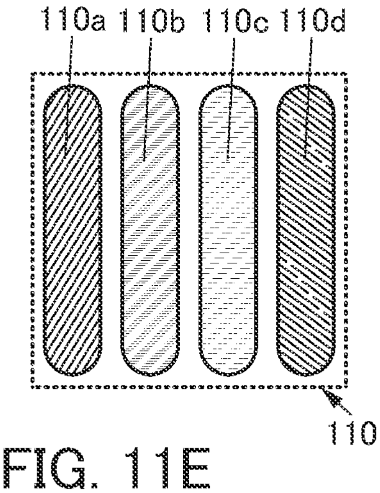
Figure 11C:
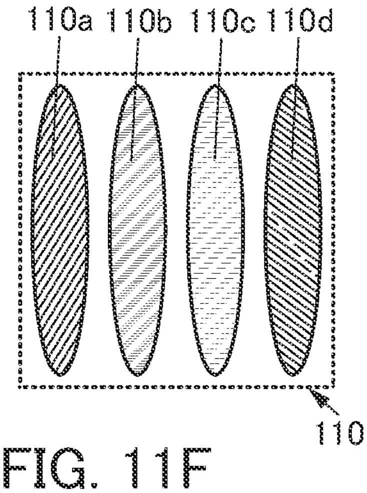

The pixels 110 illustrated in FIG. 11A to FIG. 11C employ stripe arrangement.

FIG. 11A illustrates an example in which each subpixel has a rectangular top surface shape, FIG. 11B illustrates an example in which each subpixel has a top surface shape formed by combining two half circles and a rectangle, and FIG. 11C illustrates an example in which each subpixel has an elliptical top surface shape.

Figure 11D:
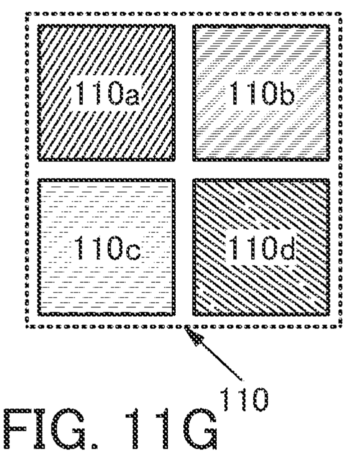
Figure 11E:
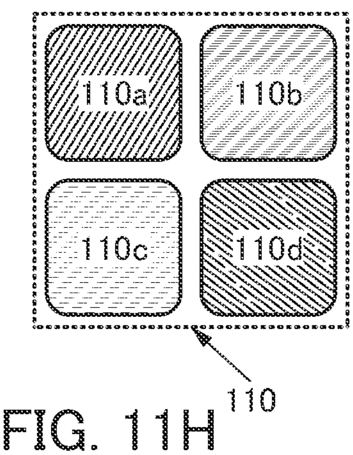
Figure 11F:
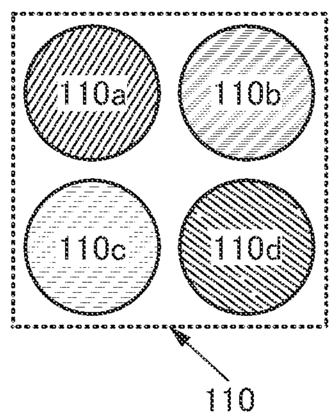

The pixels 110 illustrated in FIG. 11D to FIG. 11F employ matrix arrangement.

FIG. 11D illustrates an example in which each subpixel has a square top surface shape, FIG. 11E illustrates an example in which each subpixel has a substantially square top surface shape with rounded corners, and FIG. 11F illustrates an example in which each subpixel has a circular top surface shape.

Figure 11G:
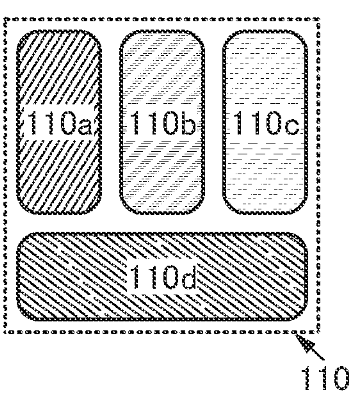
Figure 11H:
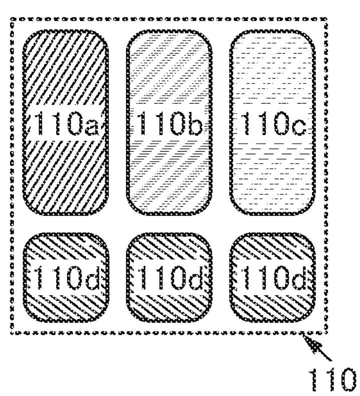

FIG. 11G and FIG. 11H each illustrate an example in which one pixel 110 is composed of two rows and three columns.

The pixel 110 illustrated in FIG. 11G includes three subpixels (the subpixels 110*a*, 110*b*, and 110*c*) in the upper row (first row) and one subpixel (the subpixel 110*d*) in the lower row (second row). In other words, the pixel 110 includes the subpixel 110*a* in the left column (first column), the subpixel 110*b* in the center column (second column), the subpixel 110*c* in the right column (third column), and the subpixel 110*d* across these three columns.

The pixel 110 illustrated in FIG. 11H includes three subpixels (the subpixels 110*a*, 110*b*, and 110*c*) in the upper row (first row) and three subpixels 110*d* in the lower row (second row). In other words, the pixel 110 includes the subpixel 110*a* and the subpixel 110*d* in the left column (first column), the subpixel 110*b* and another subpixel 110*d* in the center column (second column), and the subpixel 110*c* and another subpixel 110*d* in the right column (third column). Aligning the positions of the subpixels in the upper row and the lower row as illustrated in FIG. 11H enables dust and the like that would be produced in the manufacturing process to be removed efficiently. Thus, a display panel with high display quality can be provided.

The pixels 110 illustrated in FIG. 11A to FIG. 11H are each composed of the four subpixels 110*a*, 110*b*, 110*c*, and 110*d*. The subpixels 110*a*, 110*b*, 110*c*, and 110*d* include light-emitting devices that emit light of different colors. The subpixels 110*a*, 110*b*, 110*c*, and 110*d* can be subpixels of four colors of R, G, B, and white (W), subpixels of four colors of R, G, B, and Y, subpixels of R, G, B, and infrared light (IR), or the like. For example, the subpixels 110*a*, 110*b*, 110*c*, and 110*d* can be red, green, blue, and white subpixels, respectively, as illustrated in FIG. 12G to FIG. 12J.

The display panel of one embodiment of the present invention may include a light-receiving device in the pixel.

Three of the four subpixels included in the pixel 110 illustrated in FIG. 12G to FIG. 12J may each include a light-emitting device and the other one may include a light-receiving device.

For example, the subpixels 110*a*, 110*b*, and 110*c* may be subpixels of three colors of R, G, and B, and the subpixel 110*d* may be a subpixel including a light-receiving device.

Figure 13A:
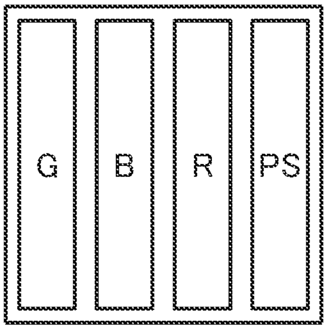
FIG. 13A to FIG. 13D are top views illustrating examples of a pixel.
Figure 13B:
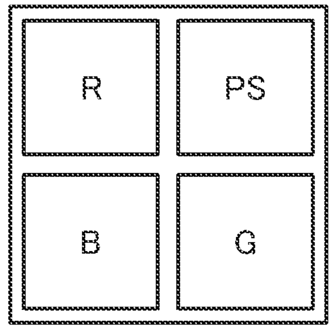

Pixels illustrated in FIG. 13A and FIG. 13B each include the subpixel G, the subpixel B, the subpixel R, and a subpixel PS. Note that the arrangement order of the subpixels is not limited to those illustrated in the drawings and can be determined as appropriate. For example, the positions of the subpixel G and the subpixel R may be interchanged with each other.

The pixel illustrated in FIG. 13A employs stripe arrangement. The pixel illustrated in FIG. 13B employs matrix arrangement.

The subpixel R includes a light-emitting device that emits red light. The subpixel G includes a light-emitting device that emits green light. The subpixel B includes a light-emitting device that emits blue light.

The subpixel PS includes a light-receiving device. There is no particular limitation on the wavelength of light detected by the subpixel PS. The subpixel PS can have a structure capable of detecting one or both of infrared light and visible light.

Figure 13C:
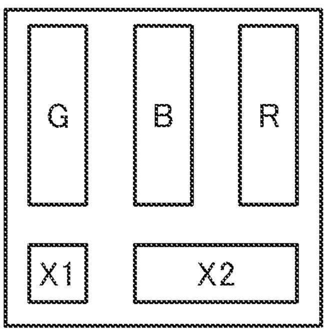
Figure 13D:
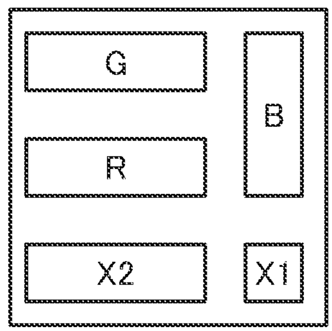

Pixels illustrated in FIG. 13C and FIG. 13D each include the subpixel G, the subpixel B, the subpixel R, a subpixel X1, and a subpixel X2. Note that the arrangement order of the subpixels is not limited to those illustrated in the drawings and can be determined as appropriate. For example, the positions of the subpixel G and the subpixel R may be interchanged with each other.

FIG. 13C illustrates an example where one pixel is provided in two rows and three columns. Three subpixels (the subpixel G, the subpixel B, and the subpixel R) are provided in the upper row (first row). In FIG. 13C, two subpixels (the subpixel X1 and the subpixel X2) are provided in the lower row (second row).

FIG. 13D illustrates an example where one pixel is composed of three rows and two columns. In FIG. 13D, the pixel includes the subpixel G in the first row, the subpixel R in the second row, and the subpixel B across these two rows. In addition, two subpixels (the subpixel X1 and the subpixel X2) are provided in the third row. In other words, the pixel illustrated in FIG. 13D includes three subpixels (the subpixel G, the subpixel R, and the subpixel X2) in the left column (first column) and two subpixels (the subpixel B and the subpixel X1) in the right column (second column).

The layout of the subpixels R, G, and B illustrated in FIG. 13C is stripe arrangement. The layout of the subpixels R, G, and B illustrated in FIG. 13D is what is called S-stripe arrangement. Thus, high display quality can be achieved.

At least one of the subpixel X1 and the subpixel X2 preferably includes the light-receiving device (it can also be said that at least one of the subpixel X1 and the subpixel X2 is preferably the subpixel PS).

Note that the pixel layout including the subpixel PS is not limited to the structures illustrated in FIG. 13A to FIG. 13D.

The subpixel X1 or the subpixel X2 can include a light-emitting device that emits infrared light (IR), for example. In this case, the subpixel PS preferably detects infrared light. For example, with one of the subpixel X1 and the subpixel X2 used as a light source, reflected light of light emitted by the light source can be detected by the other of the subpixel X1 and the subpixel X2 while an image is displayed using the subpixels R, G, and B.

A structure including a light-receiving device can be used for both the subpixel X1 and the subpixel X2. In this case, the wavelength ranges of light detected by the subpixel X1 and the subpixel X2 may be the same, different, or partially the same. For example, one of the subpixel X1 and the subpixel X2 mainly detects visible light while the other mainly detects infrared light.

The light-receiving area of the subpixel X1 is smaller than the light-receiving area of the subpixel X2. A smaller light-receiving area leads to a narrower image-capturing range, inhibits a blur in a captured image, and improves the definition. Thus, the use of the subpixel X1 enables higher-resolution or higher-definition image capturing than the use of the light-receiving device included in the subpixel X2. For example, image capturing for personal authentication with the use of a fingerprint, a palm print, the iris, the shape of a blood vessel (including the shape of a vein and the shape of an artery), a face, or the like is possible by using the subpixel X1.

The light-receiving device included in the subpixel PS preferably detects visible light, and preferably detects one or more of blue light, violet light, bluish violet light, green light, greenish yellow light, yellow light, orange light, red light, and the like. The light-receiving device included in the subpixel PS may detect infrared light.

In the case where the subpixel X2 has a structure including the light-receiving device, the subpixel X2 can be used in a touch sensor (also referred to as a direct touch sensor), a near touch sensor (also referred to as a hover sensor, a hover touch sensor, a contactless sensor, or a touchless sensor), or the like. The wavelength of light detected by the subpixel X2 can be determined as appropriate depending on the application purpose. For example, the subpixel X2 preferably detects infrared light. Thus, a touch can be detected even in a dark place.

Here, a touch sensor or a near touch sensor can detect an approach or contact of an object (e.g., a finger, a hand, or a pen).

The touch sensor can detect an object when the display panel and the object come in direct contact with each other. The near touch sensor can detect an object even when the object is not in contact with the display panel. For example, the display panel is preferably capable of detecting an object when the distance between the display panel and the object is greater than or equal to 0.1 mm and less than or equal to 300 mm, further preferably greater than or equal to 3 mm and less than or equal to 50 mm. This structure enables the display panel to be operated without direct contact of an object, that is, enables the display panel to be operated in a contactless (touchless) manner. With the above-described structure, the display panel can have a reduced risk of being dirty or damaged, or can be operated without the object directly touching a dirt (e.g., dust or a virus) attached to the display panel.

The refresh rate of the display panel of one embodiment of the present invention can be variable. For example, the refresh rate is adjusted (adjusted in the range from 1 Hz to 240 Hz, for example) in accordance with contents displayed on the display panel, whereby power consumption can be reduced. The driving frequency of the touch sensor or the near touch sensor may be changed in accordance with the refresh rate. In the case where the refresh rate of the display panel is 120 Hz, for example, the driving frequency of the touch sensor or the near touch sensor can be higher than 120 Hz (typically 240 Hz). This structure reduces power consumption and increases the response speed of the touch sensor or the near touch sensor.

Figure 13E:
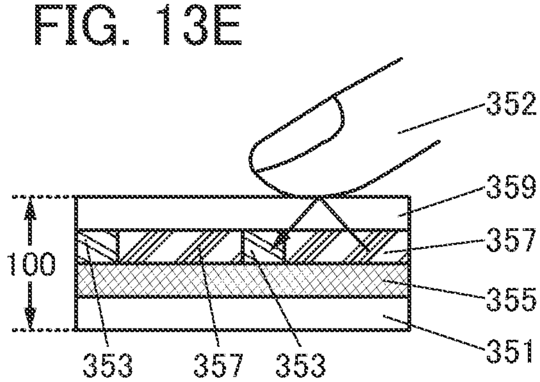
FIG. 13E to FIG. 13G are cross-sectional views illustrating examples of a display panel.
Figure 13F:
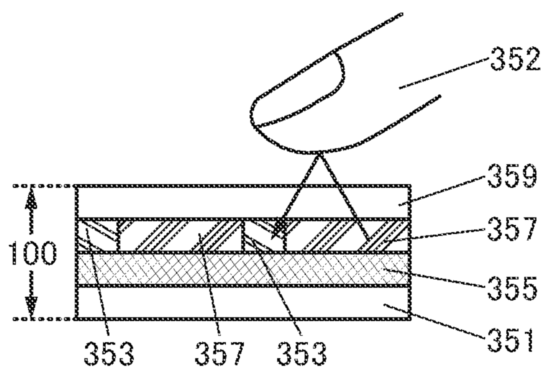
Figure 13G:
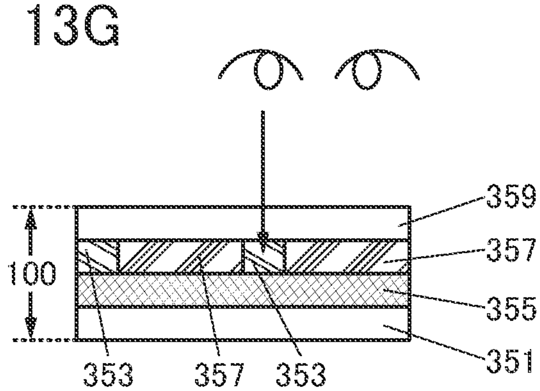

The display panel 100 illustrated in FIG. 13E to FIG. 13G includes a layer 353 including light-receiving devices, a functional layer 355, and a layer 357 including light-emitting devices, between a substrate 351 and a substrate 359.

The functional layer 355 includes a circuit for driving a light-receiving device and a circuit for driving a light-emitting device. A switch, a transistor, a capacitor, a resistor, a wiring, a terminal, and the like can be provided in the functional layer 355. Note that in the case where the light-emitting device and the light-receiving device are driven by a passive-matrix method, a structure provided with neither a switch nor a transistor may be employed.

For example, after light emitted by the light-emitting device in the layer 357 including light-emitting devices is reflected by a finger 352 that is in contact with the display panel 100 as illustrated in FIG. 13E, the light-receiving device in the layer 353 including light-receiving devices detects the reflected light. Thus, the contact of the finger 352 with the display panel 100 can be detected.

Alternatively, the display panel may have a function of detecting an object that is close to (is not in contact with) the display panel as illustrated in FIG. 13F and FIG. 13G or capturing an image of such an object. FIG. 13F illustrates an example in which a human finger is detected, and FIG. 13G illustrates an example in which information on the periphery, surface, or inside of the human eye (e.g., the number of blinks, the movement of an eyeball, and the movement of an eyelid) is detected.

In the display panel of this embodiment, an image of the periphery of an eye, the surface of the eye, or the inside (fundus or the like) of the eye of a user of a wearable device can be captured with the use of the light-receiving device. Therefore, the wearable device can have a function of detecting one or more selected from a blink, movement of an iris, and movement of an eyelid of the user.

As described above, the pixel composed of the subpixels each including the light-emitting device can employ any of a variety of layouts in the display panel of one embodiment of the present invention. The display panel of one embodiment of the present invention can have a structure in which the pixel includes both a light-emitting device and a light-receiving device.

Also in this case, any of a variety of layouts can be employed.

This embodiment can be combined with any of the other embodiments as appropriate Embodiment 3

In this embodiment, display panels of one embodiment of the present invention are described with reference to FIG. 14 to FIG. 24.

The display panel of this embodiment can be a high-resolution display panel.

Accordingly, the display panel of this embodiment can be used for display portions of information terminals (wearable devices) such as watch-type and bracelet-type information terminals and display portions of wearable devices that can be worn on a head, such as a VR device like a head-mounted display and a glasses-type AR device.

The display panel of this embodiment can be a high-definition display panel or a large-sized display panel. Accordingly, the display panel of this embodiment can be used for display portions of electronic devices such as a digital camera, a digital video camera, a digital photo frame, a mobile phone, a portable game console, a portable information terminal, and an audio reproducing device, in addition to display portions of electronic devices with a relatively large screen, such as a television device, a desktop or notebook personal computer, a monitor of a computer and the like, digital signage, and a large game machine such as a pachinko machine.

[Display Module]

Figure 14A:
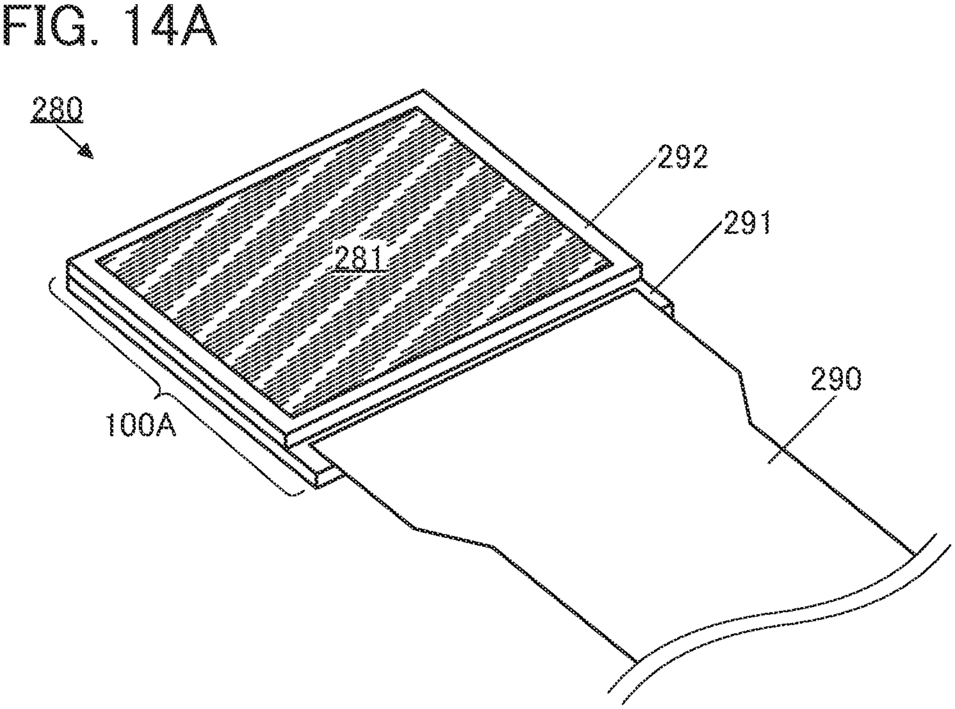
FIG. 14A and FIG. 14B are perspective views illustrating an example of a display panel.

FIG. 14A is a perspective view of a display module 280. The display module 280 includes a display panel 100A and an FPC 290. Note that the display panel included in the display module 280 is not limited to the display panel 100A and may be any of a display panel 100B to a display panel 100F to be described later.

The display module 280 includes a substrate 291 and a substrate 292. The display module 280 includes a display portion 281. The display portion 281 is a region of the display module 280 where an image is displayed, and is a region where light from pixels provided in a pixel portion 284 to be described later can be seen.

Figure 14B:
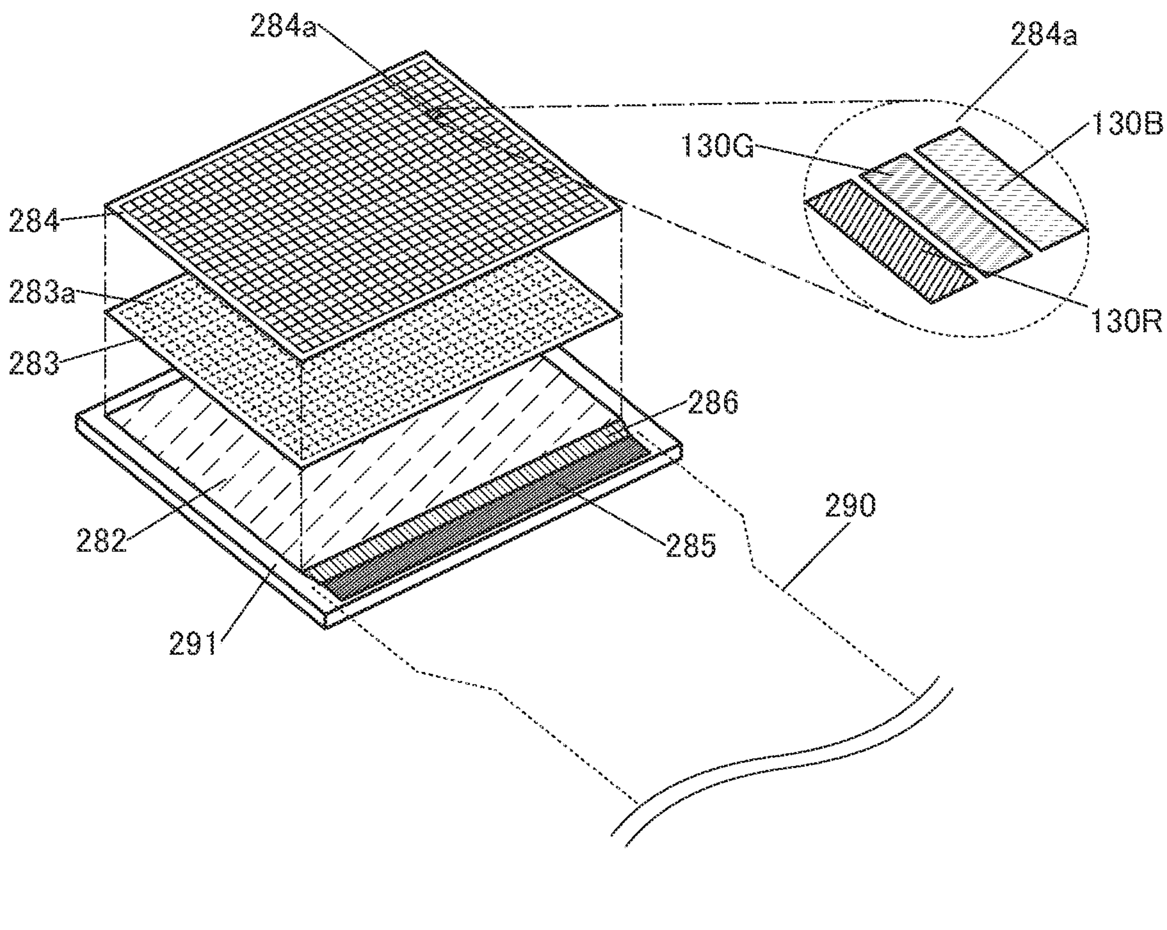

FIG. 14B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 285 to be connected to the FPC 290 is provided in a portion over the substrate 291 which does not overlap with the pixel portion 284. The terminal portion 285 and the circuit portion 282 are electrically connected to each other through a wiring portion 286 formed of a plurality of wirings.

The pixel portion 284 includes a plurality of pixels 284*a* arranged periodically. An enlarged view of one pixel 284*a* is illustrated on the right side of FIG. 14B. The pixel 284*a* includes the light-emitting device 130R that emits red light, the light-emitting device 130G that emits green light, and the light-emitting device 130B that emits blue light.

The pixel circuit portion 283 includes a plurality of pixel circuits 283*a* arranged periodically.

One pixel circuit 283*a* is a circuit controlling light emission of three light-emitting devices included in one pixel 284*a*. One pixel circuit 283*a* may be provided with three circuits for controlling light emission of the respective light-emitting devices. For example, the pixel circuit 283*a* can include at least one selection transistor, one current control transistor (driving transistor), and a capacitor for one light-emitting device. In this case, a gate signal is input to the gate of the selection transistor, and a source signal is input to the source thereof. With such a structure, an active-matrix display panel is achieved.

The circuit portion 282 includes a circuit for driving the pixel circuits 283*a* in the pixel circuit portion 283. For example, one or both of a gate line driver circuit and a source line driver circuit are preferably included. In addition, at least one of an arithmetic circuit, a memory circuit, a power supply circuit, and the like may be included.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; thus, the aperture ratio (the effective display area ratio) of the display portion 281 can be significantly high. For example, the aperture ratio of the display portion 281 can be higher than or equal to 40% and lower than 100%, preferably higher than or equal to 50% and lower than or equal to 95%, further preferably higher than or equal to 60% and lower than or equal to 95%. Furthermore, the pixels 284*a* can be arranged extremely densely and thus the display portion 281 can have an extremely high resolution. For example, the pixels 284*a* are preferably arranged in the display portion 281 with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Such a display module 280 has an extremely high resolution, and thus can be suitably used for a VR device such as a head-mounted display or a glasses-type AR device. For example, even with a structure where the display portion of the display module 280 is seen through a lens, pixels of the extremely-high-resolution display portion 281 included in the display module 280 are prevented from being perceived when the display portion is enlarged by the lens, so that display providing a high sense of immersion can be performed. Without being limited thereto, the display module 280 can be suitably used for electronic devices including a relatively small display portion. For example, the display module 280 can be favorably used for a display portion of a wearable electronic device, such as a wrist watch.

[Display Panel 100A]

Figure 15A:
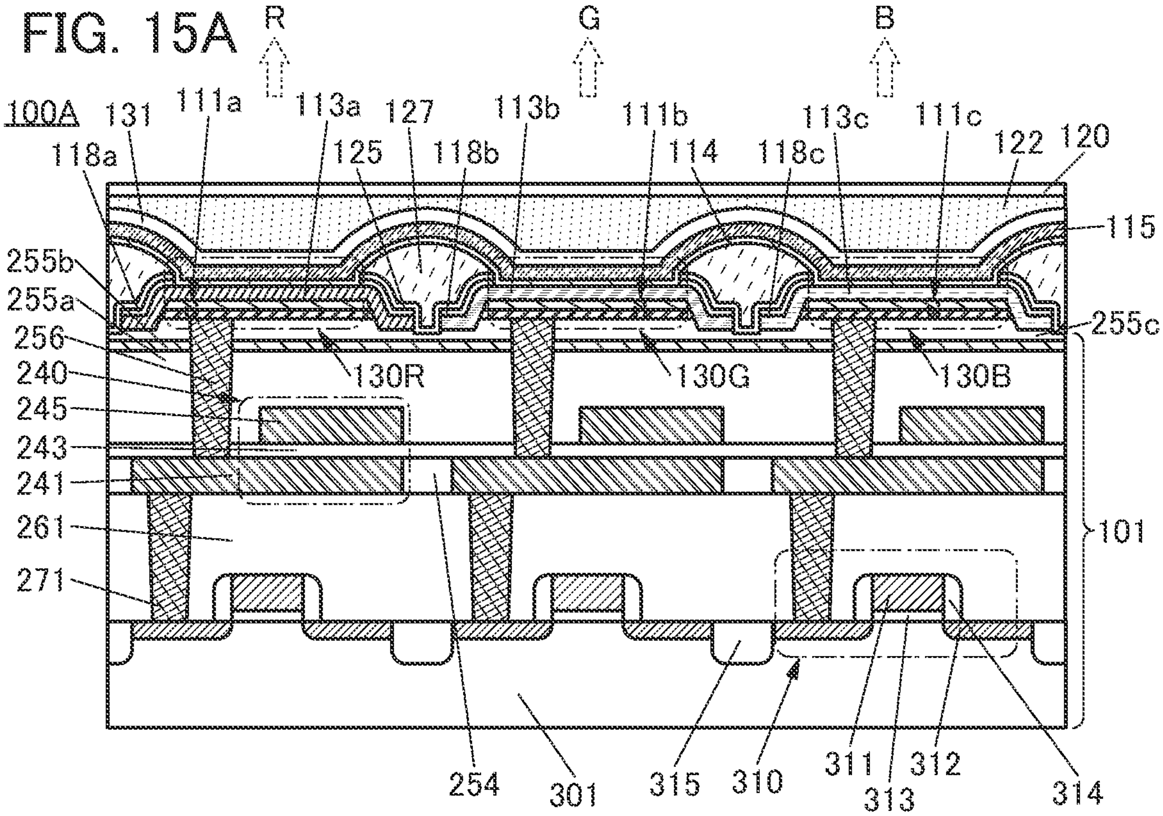
FIG. 15A and FIG. 15B are cross-sectional views illustrating examples of a display panel.

The display panel 100A illustrated in FIG. 15A includes a substrate 301, the light-emitting devices 130R, 130G and 130B, a capacitor 240, and a transistor 310.

The substrate 301 corresponds to the substrate 291 in FIG. 14A and FIG. 14B. A stacked-layer structure from the substrate 301 to the insulating layer 255*c* corresponds to the layer 101 including transistors in Embodiment 1.

The transistor 310 is a transistor including a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as one of a source and a drain.

The insulating layer 314 is provided to cover the side surface of the conductive layer 311 and functions as an insulating layer.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 positioned therebetween. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

The insulating layer 255*a* is provided to cover the capacitor 240, the insulating layer 255*b* is provided over the insulating layer 255*a*, and the insulating layer 255*c* is provided over the insulating layer 255*b*.

As each of the insulating layer 255*a*, the insulating layer 255*b*, and the insulating layer 255*c*, a variety of inorganic insulating films such as an oxide insulating film, a nitride insulating film, an oxynitride insulating film, and a nitride oxide insulating film can be suitably used. As each of the insulating layer 255*a* and the insulating layer 255*c*, an oxide insulating film or an oxynitride insulating film, such as a silicon oxide film, a silicon oxynitride film, or an aluminum oxide film, is preferably used. As the insulating layer 255*b*, a nitride insulating film or a nitride oxide insulating film, such as a silicon nitride film or a silicon nitride oxide film, is preferably used. Specifically, it is preferable that a silicon oxide film be used as each of the insulating layer 255*a* and the insulating layer 255*c* and a silicon nitride film be used as the insulating layer 255*b*. The insulating layer 255*b* preferably has a function of an etching protective film. Although this embodiment describes an example in which a depressed portion is provided in the insulating layer 255*c*, a depressed portion is not necessarily provided in the insulating layer 255*c*.

The light-emitting device 130R, the light-emitting device 130G, and the light-emitting device 130B are provided over the insulating layer 255*c*. FIG. 15A illustrates an example where the light-emitting device 130R, the light-emitting device 130G, and the light-emitting device 130B each have the stacked-layer structure illustrated in FIG. 1B.

Since the first layer 113*a*, the second layer 113*b*, and the third layer 113*c* are separated and apart from each other in the display panel 100A, generation of crosstalk between adjacent subpixels can be inhibited even when the display panel has high resolution. Accordingly, the display panel can have high resolution and high display quality.

An insulator is provided in a region between adjacent light-emitting devices. In FIG. 15A and the like, the insulating layer 125 and the insulating layer 127 over the insulating layer 125 are provided in this region.

The mask layer 118*a* is positioned over the first layer 113*a* included in the light-emitting device 130R, the mask layer 118*b* is positioned over the second layer 113*b* included in the light-emitting device 130G, and the mask layer 118*c* is positioned over the third layer 113*c* included in the light-emitting device 130B.

The pixel electrode 111*a*, the pixel electrode 111*b*, and the pixel electrode 111*c* of the light-emitting device are each electrically connected to one of the source and the drain of the transistor 310 through a plug 256 embedded in the insulating layer 255*a*, the insulating layer 255*b*, and the insulating layer 255*c*, the conductive layer 241 embedded in the insulating layer 254, and the plug 271 embedded in the insulating layer 261. The top surface of the insulating layer 255*c* and the top surface of the plug 256 are level or substantially level with each other. A variety of conductive materials can be used for the plugs. FIG. 15A and the like illustrate an example where the pixel electrode has a two-layer structure of a reflective electrode and a transparent electrode over the reflective electrode.

The protective layer 131 is provided over the light-emitting device 130R, the light-emitting device 130G, and the light-emitting device 130B. The substrate 120 is attached onto the protective layer 131 with the resin layer 122. Embodiment 1 can be referred to for the details of the light-emitting devices and the components thereover up to the substrate 120. The substrate 120 corresponds to the substrate 292 in FIG. 14A.

An insulating layer covering an end portion of the top surface of the pixel electrode 111*a* is not provided between the pixel electrode 111*a* and the first layer 113*a*. An insulating layer covering an end portion of the top surface of the pixel electrode 111*b* is not provided between the pixel electrode 111*b* and the second layer 113*b*. Thus, the distance between adjacent light-emitting devices can be extremely short. Accordingly, the display panel can have high resolution or high definition.

Although the display panel 100A includes the light-emitting devices 130R, 130G, and 130G in this example, the display panel of this embodiment may further include a light-receiving device.

Figure 15B:
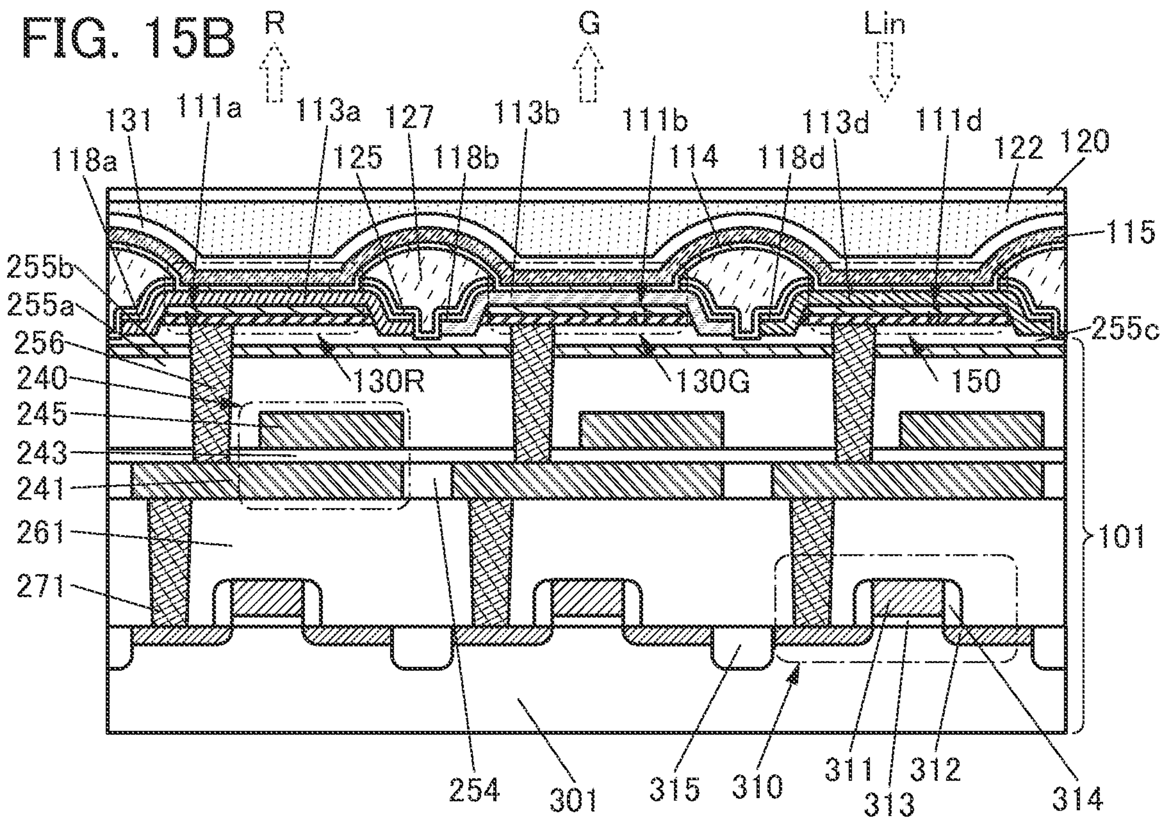

The display panel illustrated in FIG. 15B includes the light-emitting devices 130R and 130G and a light-receiving device 150. The light-receiving device 150 includes the pixel electrode 111*d*, the fourth layer 113*d*, the common layer 114, and the common electrode 115 that are stacked. Embodiment 1 can be referred to for the details of the components of the light-receiving device 150.

[Display Panel 100B]

Figure 16:
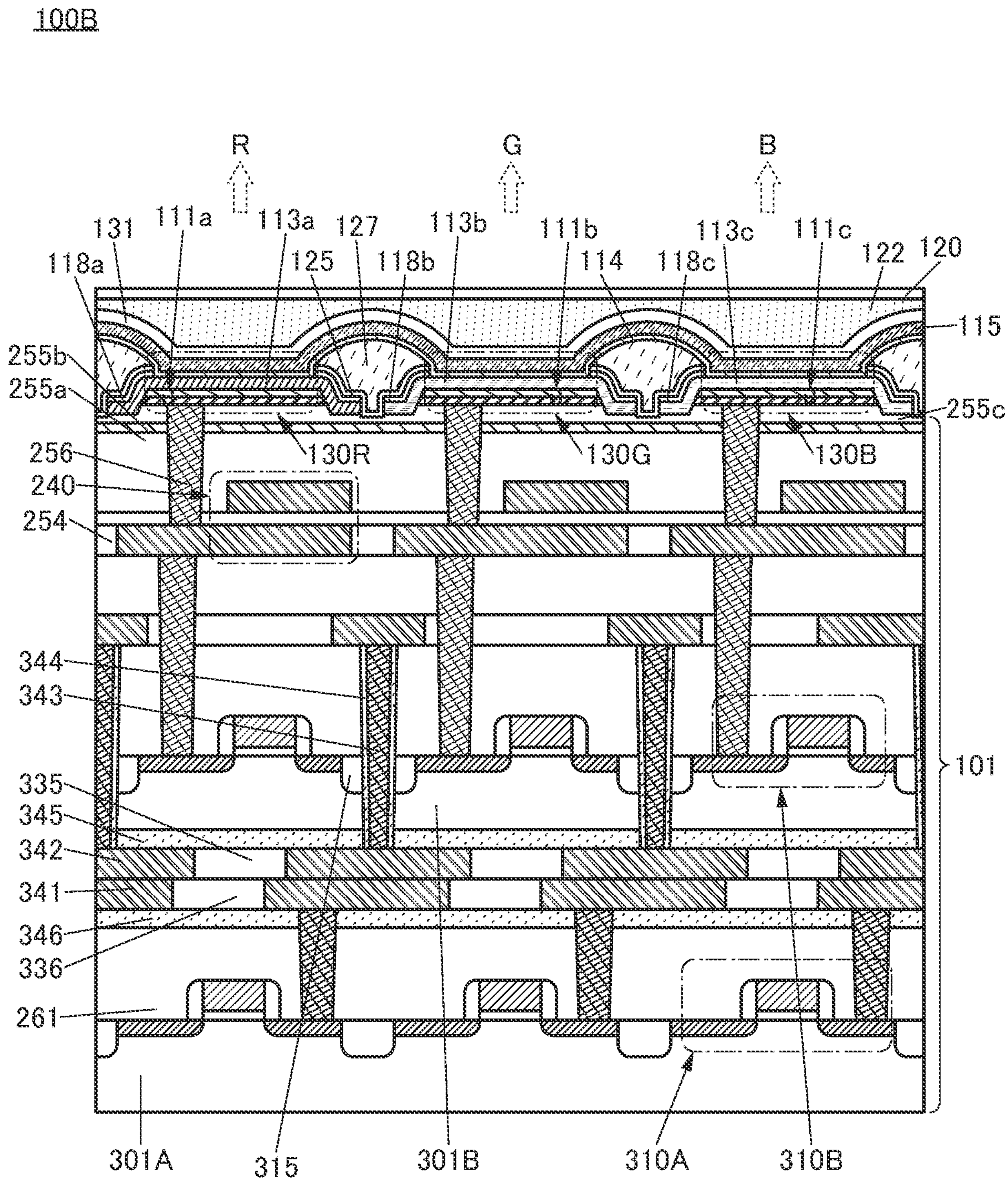
FIG. 16 is a cross-sectional view illustrating an example of a display panel.

The display panel 100B illustrated in FIG. 16 has a structure where a transistor 310A and a transistor 310B in each of which a channel is formed in a semiconductor substrate are stacked. Note that in the description of the display panel below, portions similar to those of the above-described display panel are not described in some cases.

In the display panel 100B, a substrate 301B provided with the transistor 310B, the capacitor 240, and the light-emitting devices is attached to a substrate 301A provided with the transistor 310A.

Here, an insulating layer 345 is preferably provided on the bottom surface of the substrate 301B. An insulating layer 346 is preferably provided over the insulating layer 261 provided over the substrate 301A. The insulating layers 345 and 346 are insulating layers functioning as protective layers and can inhibit diffusion of impurities into the substrate 301B and the substrate 301A. For the insulating layers 345 and 346, an inorganic insulating film that can be used for the protective layer 131 or an insulating layer 332 can be used.

The substrate 301B is provided with a plug 343 that penetrates the substrate 301B and the insulating layer 345.

An insulating layer 344 is preferably provided to cover a side surface of the plug 343. The insulating layer 344 is an insulating layer functioning as a protective layer and can inhibit diffusion of impurities into the substrate 301B. For the insulating layer 344, an inorganic insulating film that can be used for the protective layer 131 can be used.

A conductive layer 342 is provided under the insulating layer 345 on the rear surface of the substrate 301B (the surface opposite to the substrate 120). The conductive layer 342 is preferably provided to be embedded in an insulating layer 335. The bottom surfaces of the conductive layer 342 and the insulating layer 335 are preferably planarized. Here, the conductive layer 342 is electrically connected to the plug 343.

Over the substrate 301A, a conductive layer 341 is provided over the insulating layer 346. The conductive layer 341 is preferably provided to be embedded in an insulating layer 336. The top surfaces of the conductive layer 341 and the insulating layer 336 are preferably planarized. The conductive layer 341 and the conductive layer 342 are bonded to each other, whereby the substrate 301A and the substrate 301B are electrically connected to each other. Here, improving the flatness of a plane formed by the conductive layer 342 and the insulating layer 335 and a plane formed by the conductive layer 341 and the insulating layer 336 allows the conductive layer 341 and the conductive layer 342 to be attached to each other favorably.

The conductive layer 341 and the conductive layer 342 are preferably formed using the same conductive material. For example, a metal film containing an element selected from Al, Cr, Cu, Ta, Ti, Mo, and W, a metal nitride film containing the above element as a component (a titanium nitride film, a molybdenum nitride film, or a tungsten nitride film), or the like can be used. Copper is particularly preferably used for the conductive layer 341 and the conductive layer 342. In that case, it is possible to employ Cu-to-Cu (copper-to-copper) direct bonding technique (a technique for achieving electrical continuity by connecting Cu (copper) pads).

[Display Panel 100C]

Figure 17:
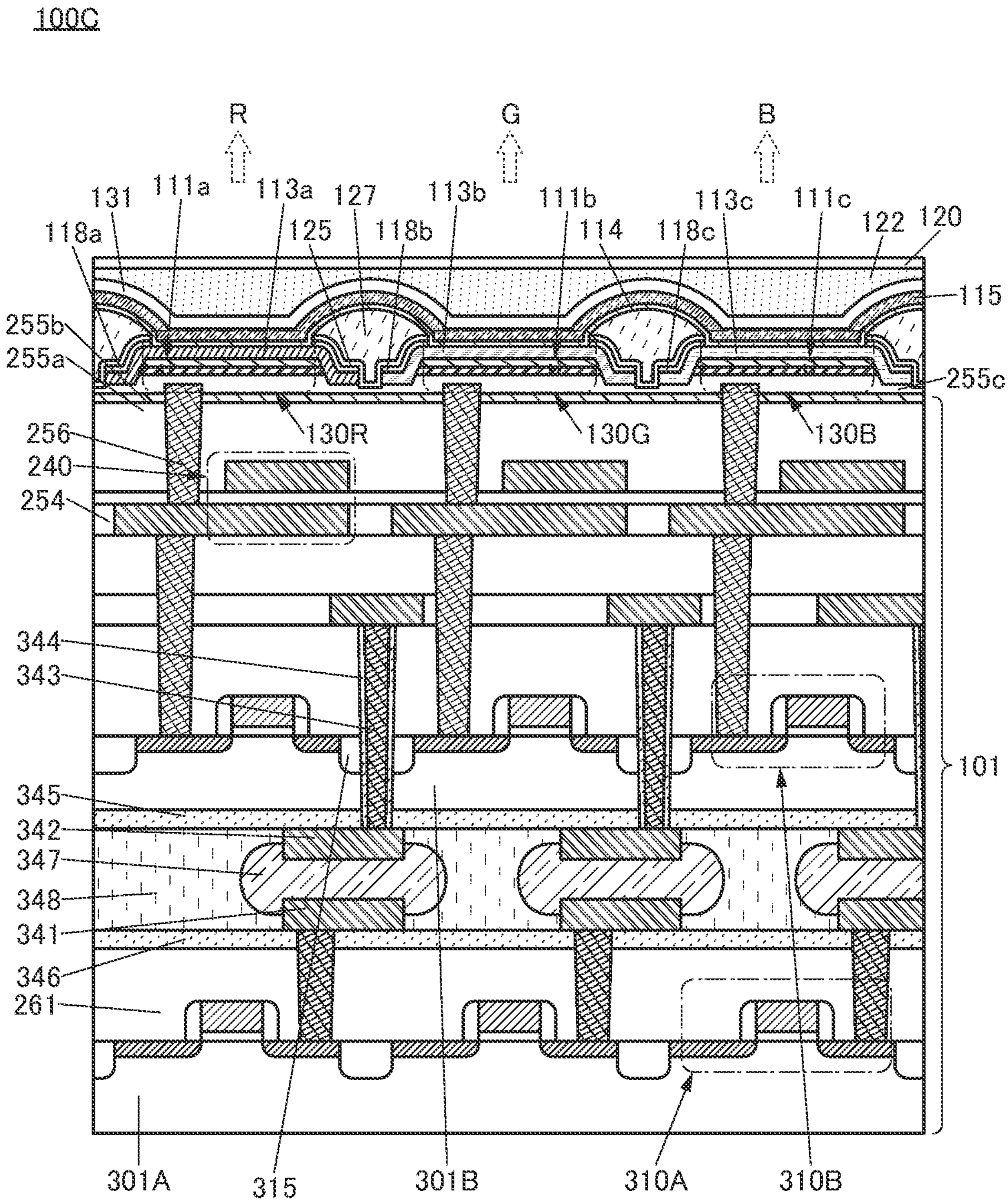
FIG. 17 is a cross-sectional view illustrating an example of a display panel.

The display panel 100C illustrated in FIG. 17 has a structure where the conductive layer 341 and the conductive layer 342 are bonded to each other through a bump 347.

As illustrated in FIG. 17, providing the bump 347 between the conductive layer 341 and the conductive layer 342 enables the conductive layer 341 and the conductive layer 342 to be electrically connected to each other. The bump 347 can be formed using a conductive material containing gold (Au), nickel (Ni), indium (In), tin (Sn), or the like, for example. As another example, solder may be used for the bump 347. An adhesive layer 348 may be provided between the insulating layer 345 and the insulating layer 346. In the case where the bump 347 is provided, the insulating layer 335 and the insulating layer 336 may be omitted.

[Display Panel 100D]

Figure 18:
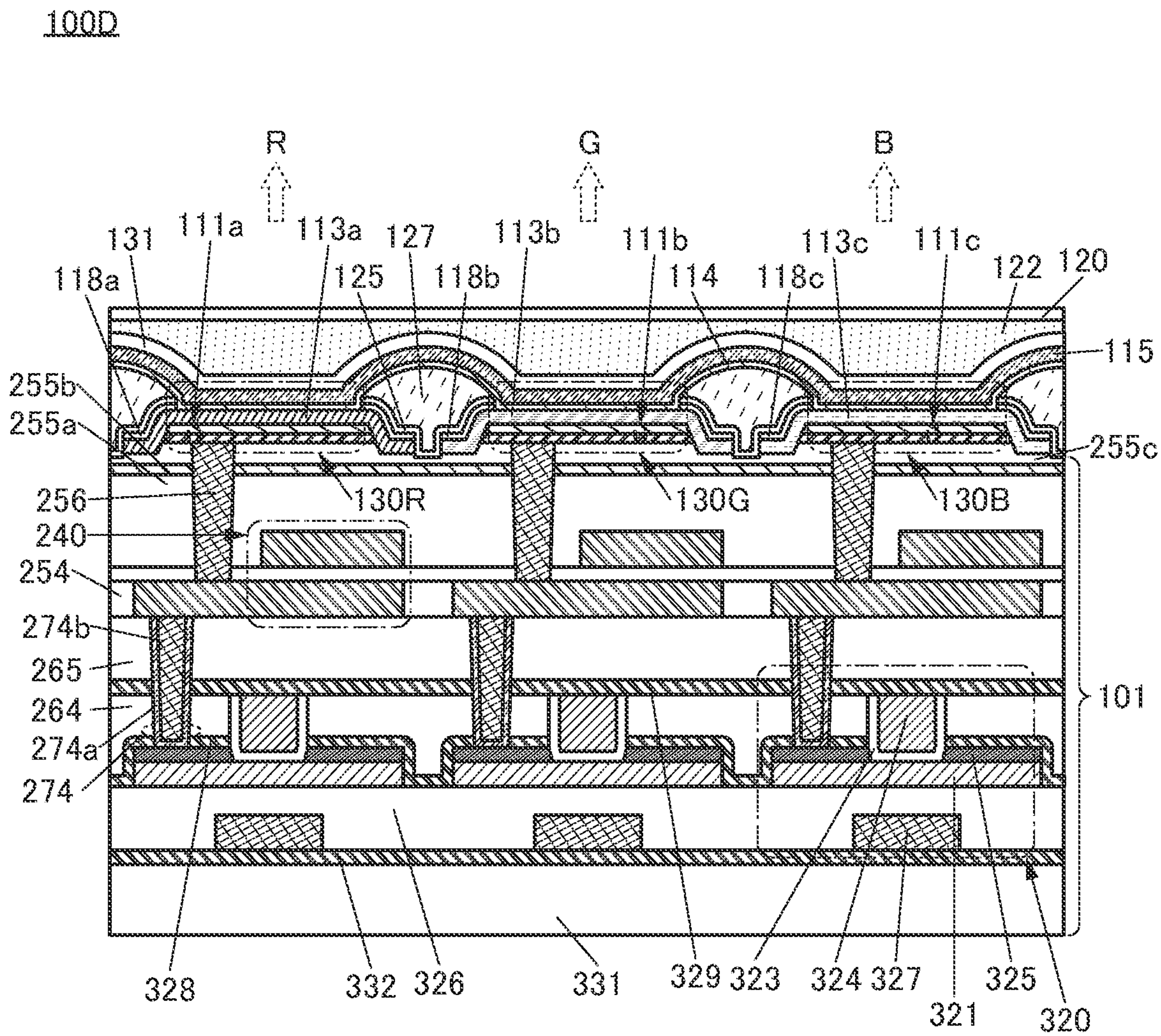
FIG. 18 is a cross-sectional view illustrating an example of a display panel.

The display panel 100D illustrated in FIG. 18 differs from the display panel 100A mainly in a structure of a transistor.

A transistor 320 is a transistor that contains a metal oxide (also referred to as an oxide semiconductor) in a semiconductor layer where a channel is formed (i.e., an OS transistor).

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIG. 14A and FIG. 14B. A stacked-layer structure from the substrate 331 to the insulating layer 255*b* corresponds to the layer 101 including transistors in Embodiment 1. As the substrate 331, an insulating substrate or a semiconductor substrate can be used.

The insulating layer 332 is provided over the substrate 331. The insulating layer 332 functions as a barrier layer that prevents diffusion of impurities such as water and hydrogen from the substrate 331 into the transistor 320 and release of oxygen from the semiconductor layer 321 to the insulating layer 332 side. As the insulating layer 332, for example, a film in which hydrogen or oxygen is less likely to diffuse than in a silicon oxide film, such as an aluminum oxide film, a hafnium oxide film, or a silicon nitride film, can be used.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. The top surface of the insulating layer 326 is preferably planarized.

The semiconductor layer 321 is provided over the insulating layer 326. The semiconductor layer 321 preferably includes a metal oxide (also referred to as an oxide semiconductor) film having semiconductor characteristics. The pair of conductive layers 325 are provided over and in contact with the semiconductor layer 321 and function as a source electrode and a drain electrode.

An insulating layer 328 is provided to cover the top and side surfaces of the pair of conductive layers 325, the side surface of the semiconductor layer 321, and the like, and an insulating layer 264 is provided over the insulating layer 328. The insulating layer 328 functions as a barrier layer that prevents diffusion of impurities such as water and hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The insulating layer 323 that is in contact with the side surfaces of the insulating layer 264, the insulating layer 328, and the conductive layer 325, and the top surface of the semiconductor layer 321, and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are subjected to planarization treatment to be level or substantially level with each other, and an insulating layer 329 and an insulating layer 265 are provided to cover these layers.

The insulating layer 264 and the insulating layer 265 each function as an interlayer insulating layer. The insulating layer 329 functions as a barrier layer that prevents diffusion of impurities such as water and hydrogen from the insulating layer 265 and the like into the transistor 320. As the insulating layer 329, an insulating film similar to the insulating layer 328 and the insulating layer 332 can be used.

A plug 274 electrically connected to one of the pair of conductive layers 325 is provided so as to be embedded in the insulating layer 265, the insulating layer 329, and the insulating layer 264. Here, the plug 274 preferably includes a conductive layer 274*a* that covers the side surface of an opening in the insulating layer 265, the insulating layer 329, the insulating layer 264, and the insulating layer 328 and part of the top surface of the conductive layer 325, and a conductive layer 274*b* in contact with the top surface of the conductive layer 274*a*. In this case, a conductive material in which hydrogen and oxygen are less likely to diffuse is preferably used for the conductive layer 274*a*.

[Display Panel 100E]

Figure 19:
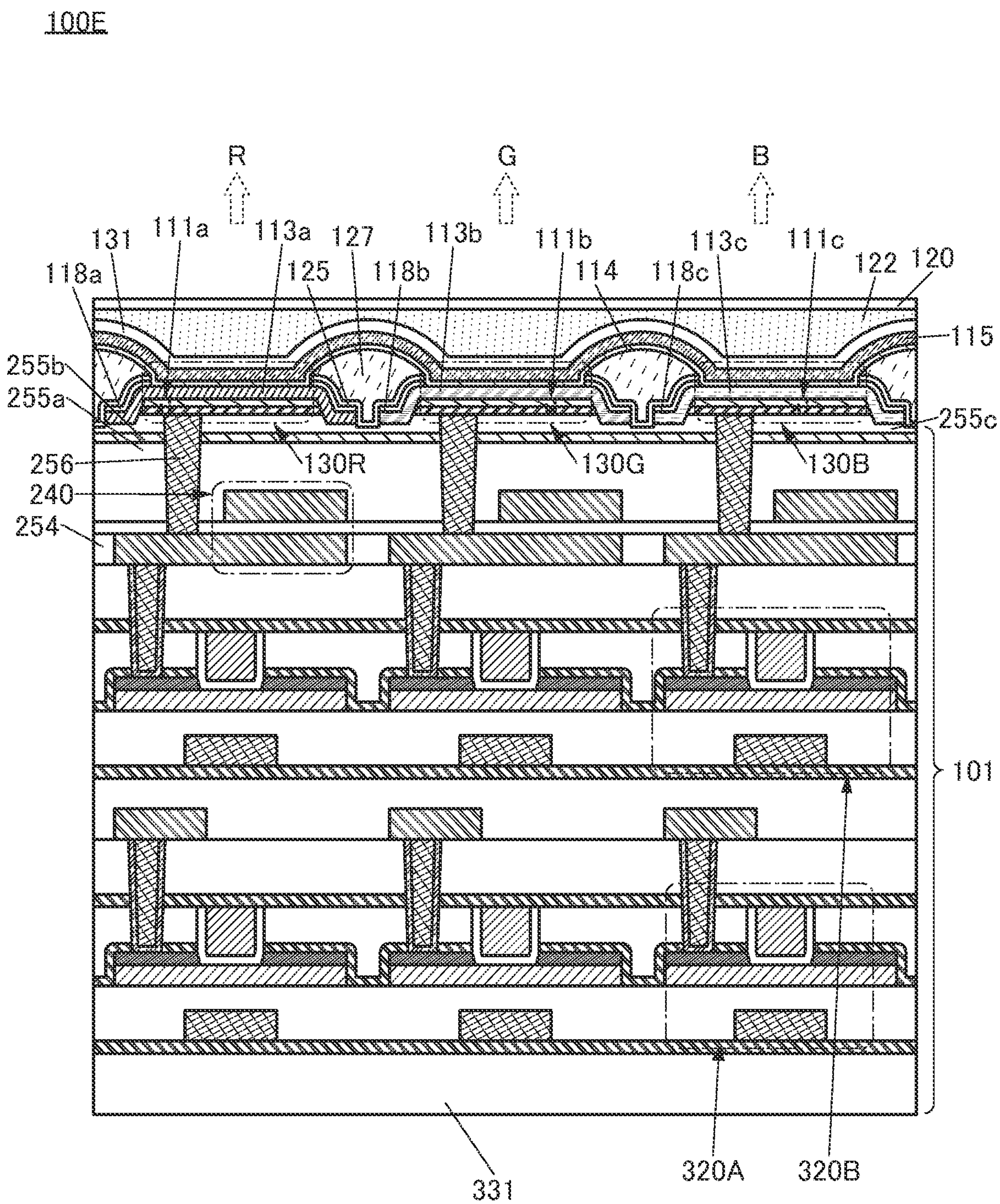
FIG. 19 is a cross-sectional view illustrating an example of a display panel.

The display panel 100E illustrated in FIG. 19 has a structure in which a transistor 320A and a transistor 320B each including an oxide semiconductor in a semiconductor where a channel is formed are stacked.

The display panel 100D can be referred to for the transistor 320A, the transistor 320B, and the components around them.

Although the structure where two transistors each including an oxide semiconductor are stacked is described, the present invention is not limited thereto. For example, three or more transistors may be stacked.

[Display Panel 100F]

Figure 20:
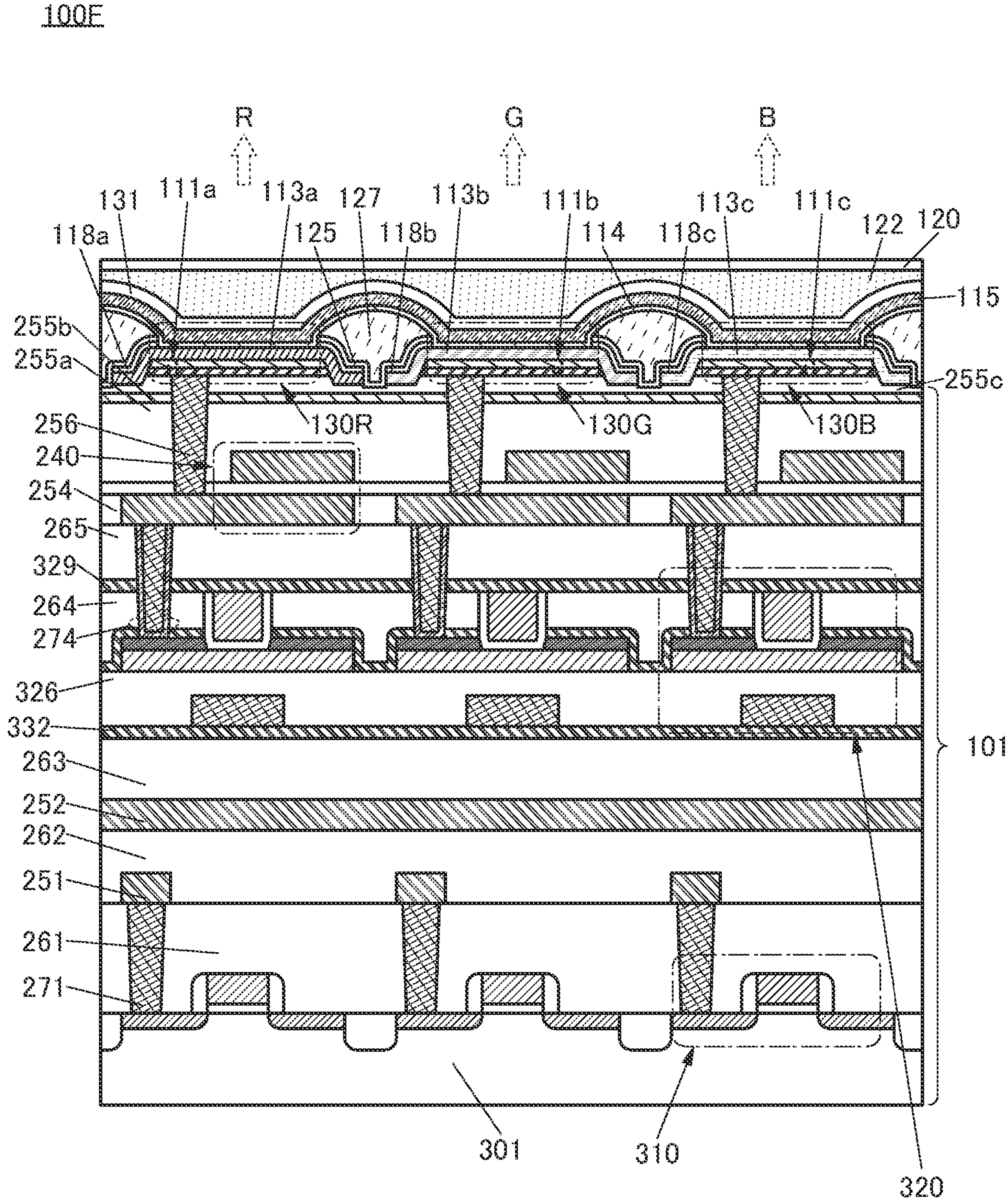
FIG. 20 is a cross-sectional view illustrating an example of a display panel.

The display panel 100F illustrated in FIG. 20 has a structure in which the transistor 310 whose channel is formed in the substrate 301 and the transistor 320 including a metal oxide in the semiconductor layer where the channel is formed are stacked.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit (a gate line driver circuit or a source line driver circuit) for driving the pixel circuit. The transistor 310 and the transistor 320 can also be used as transistors included in a variety of circuits such as an arithmetic circuit and a memory circuit.

With such a structure, not only the pixel circuit but also the driver circuit and the like can be formed directly under the light-emitting devices; thus, the display panel can be downsized as compared with the case where a driver circuit is provided around a display region.

[Display Panel 100G]

Figure 21:
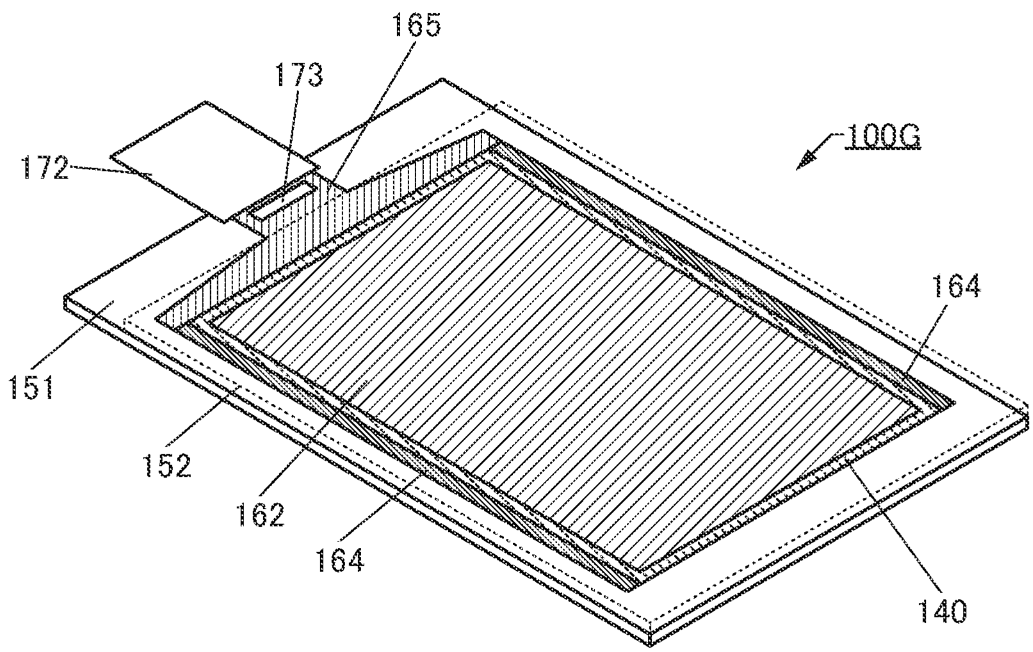
FIG. 21 is a perspective view illustrating an example of a display panel.
Figure 22A:
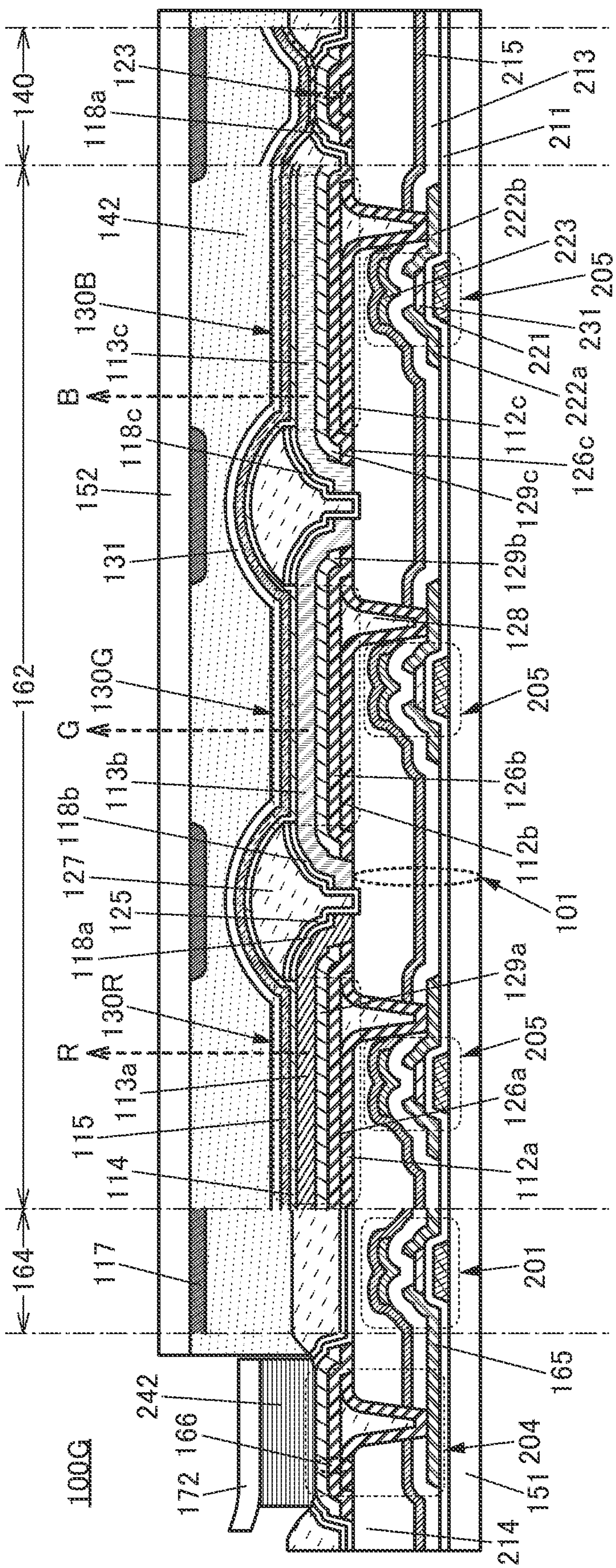
FIG. 22A is a cross-sectional view illustrating an example of a display panel.

FIG. 21 is a perspective view of the display panel 100G, and FIG. 22A is a cross-sectional view of the display panel 100G.

In the display panel 100G, a substrate 152 and a substrate 151 are attached to each other. In FIG. 21, the substrate 152 is denoted by a dashed line The display panel 100G includes a display portion 162, the connection portion 140, a circuit 164, a wiring 165, and the like. FIG. 21 illustrates an example where an IC 173 and an FPC 172 are mounted on the display panel 100G. Thus, the structure illustrated in FIG. 21 can be regarded as a display module including the display panel 100G, the IC (integrated circuit), and the FPC.

The connection portion 140 is provided outside the display portion 162. The connection portion 140 can be provided along one or more sides of the display portion 162. The number of connection portions 140 can be one or more. FIG. 21 illustrates an example where the connection portion 140 is provided to surround the four sides of the display portion. A common electrode of a light-emitting device is electrically connected to a conductive layer in the connection portion 140, so that a potential can be supplied to the common electrode.

As the circuit 164, a scan line driver circuit can be used, for example.

The wiring 165 has a function of supplying a signal and power to the display portion 162 and the circuits 164. The signal and power are input to the wiring 165 from the outside through the FPC 172 or from the IC 173.

FIG. 21 illustrates an example where the IC 173 is provided over the substrate 151 by a COG (Chip On Glass) method, a COF (Chip on Film) method, or the like. An IC including a scan line driver circuit, a signal line driver circuit, or the like can be used as the IC 173, for example. Note that the display panel 100G and the display module are not necessarily provided with an IC. The IC may be mounted on the FPC by a COF method or the like.

FIG. 22A illustrates an example of cross sections of part of a region including the FPC 172, part of the circuit 164, part of the display portion 162, part of the connection portion 140, and part of a region including an end portion of the display panel 100G.

The display panel 100G illustrated in FIG. 22A includes a transistor 201, a transistor 205, the light-emitting device 130R that emits red light, the light-emitting device 130G that emits green light, the light-emitting device 130B that emits blue light, and the like between the substrate 151 and the substrate 152.

The stacked-layer structure of each of the light-emitting devices 130R, 130G, and 130B is the same as that illustrated in FIG. 1B except for the structure of the pixel electrode. Embodiment 1 can be referred to for the details of the light-emitting devices.

Since the first layer 113*a*, the second layer 113*b*, and the third layer 113*c* are separated and apart from each other in the display panel 100G, generation of crosstalk between adjacent subpixels can be inhibited even when the display panel 100G has high resolution. Accordingly, the display panel can have high resolution and high display quality.

The light-emitting device 130R includes a conductive layer 112*a*, a conductive layer 126*a* over the conductive layer 112*a*, and a conductive layer 129*a* over the conductive layer 126*a*. All of the conductive layers 112*a*, 126*a*, and 129*a* can be referred to as pixel electrodes, or one or two of them can be referred to as pixel electrodes.

The light-emitting device 130G includes a conductive layer 112*b*, a conductive layer 126*b* over the conductive layer 112*b*, and a conductive layer 129*b* over the conductive layer 126*b*.

The light-emitting device 130B includes a conductive layer 112*c*, a conductive layer 126*c* over the conductive layer 112*c*, and a conductive layer 129*c* over the conductive layer 126*c*.

The conductive layer 112*a* is connected to the conductive layer 222*b* included in the transistor 205 through an opening provided in the insulating layer 214. The end portion of the conductive layer 126*a* is positioned outward from the end portion of the conductive layer 112*a*. The end portion of the conductive layer 126*a* and the end portion of the conductive layer 129*a* are aligned or substantially aligned with each other. For example, a conductive layer functioning as a reflective electrode can be used as the conductive layer 112*a* and the conductive layer 126*a*, and a conductive layer functioning as a transparent electrode can be used as the conductive layer 129*a*. Detailed description of the conductive layers 112*b*, 126*b*, and 129*b* of the light-emitting device 130G and the conductive layers 112*c*, 126*c*, and 129*c* of the light-emitting device 130B is omitted because these conductive layers are similar to the conductive layers 112*a*, 126*a*, and 129*a* of the light-emitting device 130R.

Depressed portions are formed in the conductive layers 112*a*, 112*b*, and 112*c* to cover the openings provided in the insulating layer 214. A layer 128 is embedded in the depressed portions.

The layer 128 has a planarization function for the depressed portions of the conductive layers 112*a*, 112*b*, and 112*c*. The conductive layers 126*a*, 126*b*, and 126*c* electrically connected to the conductive layers 112*a*, 112*b*, and 112*c*, respectively, are provided over the conductive layers 112*a*, 112*b*, and 112*c* and the layer 128. Thus, regions overlapping with the depressed portions of the conductive layers 112*a*, 112*b*, and 112*c* can also be used as the light-emitting regions, increasing the aperture ratio of the pixels.

The layer 128 may be an insulating layer or a conductive layer. Any of a variety of inorganic insulating materials, organic insulating materials, and conductive materials can be used for the layer 128 as appropriate. In particular, the layer 128 is preferably formed using an insulating material.

An insulating layer containing an organic material can be suitably used for the layer 128. For example, an acrylic resin, a polyimide resin, an epoxy resin, a polyamide resin, a polyimide-amide resin, a siloxane resin, a benzocyclobutene-based resin, a phenol resin, a precursor of any of these resins, or the like can be used for the layer 128. A photosensitive resin can also be used for the layer 128. As the photosensitive resin, a positive photosensitive material or a negative photosensitive material can be used.

When a photosensitive resin is used, the layer 128 can be formed through only light-exposure and development processes, reducing the influence of dry etching, wet etching, or the like on the surfaces of the conductive layers 112*a*, 112*b*, and 112*c*. When the layer 128 is formed using a negative photosensitive resin, the layer 128 can sometimes be formed using the same photomask (light-exposure mask) as the photomask used for forming the opening in the insulating layer 214.

The top and side surfaces of the conductive layer 126*a* and the top and side surfaces of the conductive layer 129*a* are covered with the first layer 113*a*. Similarly, the top surface and side surfaces of the conductive layer 126*b* and the top and side surfaces of the conductive layer 129*b* are covered with the second layer 113*b*. Moreover, the top and side surfaces of the conductive layer 126*c* and the top and side surfaces of the conductive layer 129*c* are covered with the third layer 113*c*. Accordingly, regions provided with the conductive layers 126*a*, 126*b*, and 126*c* can be entirely used as the light-emitting regions of the light-emitting devices 130R, 130G, and 130B, increasing the aperture ratio of the pixels.

The side surfaces of the first layer 113*a*, the second layer 113*b*, and the third layer 113*c* are covered with the insulating layers 125 and 127. The mask layer 118*a* is positioned between the first layer 113*a* and the insulating layer 125. The mask layer 118*b* is positioned between the second layer 113*b* and the insulating layer 125, and the mask layer 118*c* is positioned between the third layer 113*c* and the insulating layer 125. The common layer 114 is provided over the first layer 113*a*, the second layer 113*b*, the third layer 113*c*, and the insulating layers 125 and 127. The common electrode 115 is provided over the common layer 114. The common layer 114 and the common electrode 115 are each one continuous film shared by the plurality of light-emitting devices.

The protective layer 131 is provided over each of the light-emitting devices 130R, 130G, and 130B. The protective layer 131 covering the light-emitting devices can inhibit an impurity such as water from entering the light-emitting devices, and increase the reliability of the light-emitting devices.

The protective layer 131 and the substrate 152 are bonded to each other with an adhesive layer 142. A solid sealing structure, a hollow sealing structure, or the like can be employed to seal the light-emitting devices. In FIG. 22A, a solid sealing structure is employed in which a space between the substrate 152 and the substrate 151 is filled with the adhesive layer 142. Alternatively, a hollow sealing structure in which the space is filled with an inert gas (e.g., nitrogen or argon) may be employed. Here, the adhesive layer 142 may be provided not to overlap with the light-emitting devices. The space may be filled with a resin other than the frame-shaped adhesive layer 142 surrounding the space.

The conductive layer 123 is provided over the insulating layer 214 in the connection portion 140. An example is described in which the conductive layer 123 has a stacked-layer structure of a conductive film obtained by processing the same conductive film as the conductive layers 112*a*, 112*b*, and 112*c*; a conductive film obtained by processing the same conductive film as the conductive layers 126*a*, 126*b*, and 126*c*; and a conductive film obtained by processing the same conductive film as the conductive layers 129*a*, 129*b*, and 129*c*. The end portion of the conductive layer 123 is covered with the mask layer 118*a*, the insulating layer 125, and the insulating layer 127. The common layer 114 is provided over the conductive layer 123, and the common electrode 115 is provided over the common layer 114. The conductive layer 123 and the common electrode 115 are electrically connected to each other through the common layer 114. Note that the common layer 114 is not necessarily formed in the connection portion 140. In this case, the conductive layer 123 and the common electrode 115 are directly in contact with each other to be electrically connected to each other.

The display panel 100G has a top-emission structure. Light emitted by the light-emitting device is emitted toward the substrate 152. For the substrate 152, a material having a high property of transmitting visible light is preferably used. The pixel electrode contains a material reflecting visible light, and a counter electrode (the common electrode 115) contains a material transmitting visible light.

A stacked-layer structure from the substrate 151 to the insulating layer 214 corresponds to the layer 101 including transistors in Embodiment 1.

The transistor 201 and the transistor 205 are formed over the substrate 151. These transistors can be fabricated using the same material in the same step.

An insulating layer 211, an insulating layer 213, an insulating layer 215, and the insulating layer 214 are provided in this order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material in which impurities such as water and hydrogen are less likely to diffuse is preferably used for at least one of the insulating layers covering the transistors. This allows the insulating layer to function as a barrier layer. Such a structure can effectively inhibit diffusion of impurities into the transistors from the outside and increase the reliability of a display panel.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

An organic insulating layer is suitable as the insulating layer 214 functioning as a planarization layer. Examples of materials that can be used for the organic insulating layer include an acrylic resin, a polyimide resin, an epoxy resin, a polyamide resin, a polyimide-amide resin, a siloxane resin, a benzocyclobutene-based resin, a phenol resin, and precursors of these resins. The insulating layer 214 may have a stacked-layer structure of an organic insulating layer and an inorganic insulating layer. The uppermost layer of the insulating layer 214 preferably has a function of an etching protective layer. Accordingly, a depressed portion can be prevented from being formed in the insulating layer 214 in processing the conductive layer 112*a*, the conductive layer 126*a*, the conductive layer 129*a*, or the like. Alternatively, a depressed portion may be provided in the insulating layer 214 in processing the conductive layer 112*a*, the conductive layer 126*a*, the conductive layer 129*a*, or the like.

Each of the transistor 201 and the transistor 205 includes a conductive layer 221 functioning as a gate, the insulating layer 211 functioning as a gate insulating layer, a conductive layer 222*a* and the conductive layer 222*b* functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display panel of this embodiment. For example, a planar transistor, a staggered transistor, an inverted staggered transistor, or the like can be used. A top-gate or a bottom-gate transistor structure may be employed. Alternatively, gates may be provided above and below the semiconductor layer where a channel is formed.

The structure where the semiconductor layer where a channel is formed is provided between two gates is used for the transistor 201 and the transistor 205. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the transistors, and any of an amorphous semiconductor and a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case degradation of the transistor characteristics can be inhibited.

The semiconductor layer of the transistor preferably includes a metal oxide (also referred to as an oxide semiconductor). That is, a transistor including a metal oxide in its channel formation region (hereinafter, also referred to as an OS transistor) is preferably used for the display panel of this embodiment.

As the oxide semiconductor having crystallinity, a CAAC (c-axis aligned crystalline)-OS, an nc (nanocrystalline)-OS, and the like can be given.

Alternatively, a transistor using silicon in its channel formation region (a Si transistor) may be used. As silicon, single crystal silicon, polycrystalline silicon, amorphous silicon, and the like can be given. In particular, a transistor containing low-temperature polysilicon (LTPS) in its semiconductor layer (hereinafter also referred to as an LTPS transistor) can be used. The LTPS transistor has high field-effect mobility and favorable frequency characteristics.

With the use of Si transistors such as LTPS transistors, a circuit required to be driven at a high frequency (e.g., a source driver circuit) can be formed on the same substrate as the display portion. Thus, external circuits mounted on the display panel can be simplified, and component cost and mounting cost can be reduced.

An OS transistor has extremely higher field-effect mobility than a transistor containing amorphous silicon. In addition, the OS transistor has an extremely low leakage current between a source and a drain in an off state (hereinafter, also referred to as off-state current), and charge accumulated in a capacitor that is connected in series to the transistor can be retained for a long period. Furthermore, power consumption of the display panel can be reduced with the use of an OS transistor.

The off-state current value per micrometer of channel width of the OS transistor at room temperature can be lower than or equal to 1 aA ($1\times10^{-18}$ A), lower than or equal to 1 zA ($1\times10^{-21}$ A), or lower than or equal to 1 yA ($1\times10^{-24}$ A). Note that the off-state current value per micrometer of channel width of a Si transistor at room temperature is higher than or equal to 1 fA ($1\times10^{-15}$ A) and lower than or equal to 1 pA ($1\times10^{-12}$ A). In other words, the off-state current of an OS transistor is lower than that of a Si transistor by approximately ten orders of magnitude.

To increase the emission luminance of the light-emitting device included in the pixel circuit, the amount of current fed through the light-emitting device needs to be increased. For this, it is necessary to increase the source-drain voltage of a driving transistor included in the pixel circuit. Since an OS transistor has a higher withstand voltage between the source and the drain than a Si transistor, a high voltage can be applied between the source and the drain of the OS transistor. Accordingly, when an OS transistor is used as the driving transistor included in the pixel circuit, the amount of current flowing through the light-emitting device can be increased, so that the emission luminance of the light-emitting device can be increased.

When transistors operate in a saturation region, a change in source-drain current with respect to a change in gate-source voltage can be smaller in an OS transistor than in a Si transistor. Accordingly, when an OS transistor is used as the driving transistor in the pixel circuit, the amount of current flowing between the source and the drain can be set minutely by a change in gate-source voltage; hence, the amount of current flowing through the light-emitting device can be controlled. Accordingly, the number of gray levels in the pixel circuit can be increased.

Regarding saturation characteristics of a current flowing when transistors operate in a saturation region, even in the case where the source-drain voltage of an OS transistor increases gradually, a more stable current (saturation current) can be fed through the OS transistor than through a Si transistor. Thus, by using an OS transistor as the driving transistor, a stable current can be fed through light-emitting devices even when the current-voltage characteristics of the EL devices vary, for example. In other words, when the OS transistor operates in the saturation region, the source-drain current hardly changes with an increase in the source-drain voltage; hence, the emission luminance of the light-emitting device can be stable.

As described above, with the use of an OS transistor as a driving transistor included in the pixel circuit, it is possible to achieve "inhibition of black floating", "increase in emission luminance", "increase in the number of gray levels", "inhibition of variation in light-emitting devices", and the like.

The semiconductor layer preferably contains indium, M (M is one or more selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more selected from aluminum, gallium, yttrium, and tin.

It is particularly preferable that an oxide containing indium (In), gallium (Ga), and zinc (Zn) (also referred to as IGZO) be used for the semiconductor layer. Alternatively, it is preferable to use an oxide containing indium, tin, and zinc. Further alternatively, it is preferable to use an oxide containing indium, gallium, tin, and zinc. Alternatively, an oxide containing indium (In), aluminum (Al), and zinc (Zn) (also referred to as IAZO) is preferably used for the semiconductor layer. Alternatively, an oxide containing indium (In), aluminum (Al), gallium (Ga), and zinc (Zn) (also referred to as IAGZO) is preferably used for the semiconductor layer.

When the semiconductor layer is an In-M-Zn oxide, the atomic ratio of In is preferably higher than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=1:3:2 or a composition in the neighborhood thereof, In:M:Zn=1:3:4 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of +30% of an intended atomic ratio.

For example, when the atomic ratio is described as In:Ga:Zn=4:2:3 or a composition in the neighborhood thereof, the case is included where the atomic proportion of Ga is greater than or equal to 1 and less than or equal to 3 and the atomic proportion of Zn is greater than or equal to 2 and less than or equal to 4 with the atomic proportion of In being 4. When the atomic ratio is described as In:Ga:Zn=5:1:6 or a composition in the neighborhood thereof, the case is included where the atomic proportion of Ga is greater than 0.1 and less than or equal to 2 and the atomic proportion of Zn is greater than or equal to 5 and less than or equal to 7 with the atomic proportion of In being 5. When the atomic ratio is described as In:Ga:Zn=1:1:1 or a composition in the neighborhood thereof, the case is included where the atomic proportion of Ga is greater than 0.1 and less than or equal to 2 and the atomic proportion of Zn is greater than 0.1 and less than or equal to 2 with the atomic proportion of In being 1.

The transistor included in the circuit 164 and the transistor included in the display portion 162 may have the same structure or different structures. One structure or two or more types of structures may be employed for a plurality of transistors included in the circuit 164. Similarly, one structure or two or more types of structures may be employed for a plurality of transistors included in the display portion 162.

All of the transistors included in the display portion 162 may be OS transistors or all of the transistors included in the display portion 162 may be Si transistors; alternatively, some of the transistors included in the display portion 162 may be OS transistors and the others may be Si transistors.

For example, when both an LTPS transistor and an OS transistor are used in the display portion 162, the display panel can have low power consumption and high drive capability. Note that a structure where an LTPS transistor and an OS transistor are combined is referred to as LTPO in some cases. Note that as a more preferable example, it is preferable to use an OS transistor as a transistor or the like functioning as a switch for controlling electrical continuity between wirings and an LTPS transistor as a transistor or the like for controlling current.

For example, one of the transistors included in the display portion 162 functions as a transistor for controlling current flowing through the light-emitting device and can be referred to as a driving transistor. One of a source and a drain of the driving transistor is electrically connected to the pixel electrode of the light-emitting device. An LTPS transistor is preferably used as the driving transistor. Accordingly, the amount of current flowing through the light-emitting device can be increased in the pixel circuit.

Another transistor included in the display portion 162 functions as a switch for controlling selection and non-selection of the pixel and can be referred to as a selection transistor. A gate of the selection transistor is electrically connected to a gate line, and one of a source and a drain thereof is electrically connected to a source line (signal line). An OS transistor is preferably used as the selection transistor. Accordingly, the gray level of the pixel can be maintained even with an extremely low frame frequency (e.g., 1 fps or less); thus, power consumption can be reduced by stopping the driver in displaying a still image.

As described above, the display panel of one embodiment of the present invention can have all of a high aperture ratio, high resolution, high display quality, and low power consumption.

Note that the display panel of one embodiment of the present invention has a structure including the OS transistor and the light-emitting device having an MML (metal maskless) structure. With this structure, the leakage current that might flow through the transistor and the leakage current that might flow between adjacent light-emitting devices (also referred to as lateral leakage current, side leakage current, or the like) can be extremely low. With the structure, a viewer can notice any one or more of the image crispness, the image sharpness, a high chroma, and a high contrast ratio in an image displayed on the display panel. When the leakage current that might flow through the transistor and the lateral leakage current that might flow between light-emitting devices are extremely low, display with little light leakage or the like that might occur in black display can be achieved.

Figure 22B:
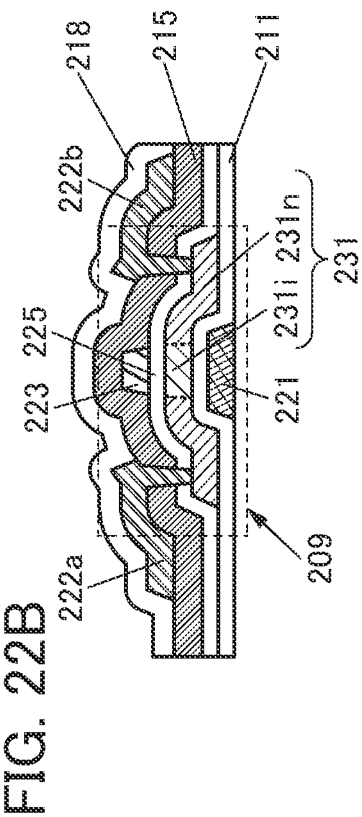
FIG. 22B and FIG. 22C are cross-sectional views illustrating examples of transistors.
Figure 22C:
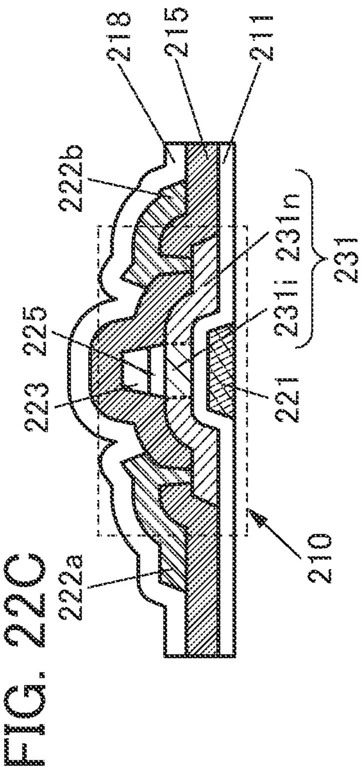

FIG. 22B and FIG. 22C illustrate other structure examples of transistors.

A transistor 209 and a transistor 210 each include the conductive layer 221 functioning as a gate, the insulating layer 211 functioning as a gate insulating layer, the semiconductor layer 231 including a channel formation region 231*i* and a pair of low-resistance regions 231*n*, the conductive layer 222*a* connected to one of the pair of low-resistance regions 231*n*, the conductive layer 222*b* connected to the other of the pair of the low-resistance regions 231*n*, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned at least between the conductive layer 223 and the channel formation region 231*i*. Furthermore, an insulating layer 218 covering the transistor may be provided.

FIG. 22B illustrates an example of the transistor 209 in which the insulating layer 225 covers the top and side surfaces of the semiconductor layer 231. The conductive layer 222*a* and the conductive layer 222*b* are connected to the low-resistance regions 231*n* through openings provided in the insulating layer 225 and the insulating layer 215. One of the conductive layer 222*a* and the conductive layer 222*b* functions as a source, and the other functions as a drain.

Meanwhile, in the transistor 210 illustrated in FIG. 22C, the insulating layer 225 overlaps with the channel formation region 231*i* of the semiconductor layer 231 and does not overlap with the low-resistance regions 231*n*. The structure illustrated in FIG. 22C can be formed by processing the insulating layer 225 using the conductive layer 223 as a mask, for example. In FIG. 22C, the insulating layer 215 is provided to cover the insulating layer 225 and the conductive layer 223, and the conductive layer 222*a* and the conductive layer 222*b* are connected to the low-resistance regions 231*n* through the openings in the insulating layer 215.

A connection portion 204 is provided in a region of the substrate 151 where the substrate 152 does not overlap. In the connection portion 204, the wiring 165 is electrically connected to the FPC 172 through a conductive layer 166 and a connection layer 242. An example is illustrated in which the conductive layer 166 has a stacked-layer structure of a conductive film obtained by processing the same conductive film as the conductive layers 112*a*, 112*b*, and 112*c*, a conductive film obtained by processing the same conductive film as the conductive layers 126*a*, 126*b*, and 126*c*, and a conductive film obtained by processing the same conductive film as the conductive layers 129*a*, 129*b*, and 129*c*. The conductive layer 166 is exposed on the top surface of the connection portion 204. Thus, the connection portion 204 and the FPC 172 can be electrically connected to each other through the connection layer 242.

A light-blocking layer 117 is preferably provided on a surface of the substrate 152 on the substrate 151 side. The light-blocking layer 117 can be provided between adjacent light-emitting devices, in the connection portion 140, and in the circuit 164, for example. A variety of optical members can be arranged on the outer surface of the substrate 152.

The material that can be used for the substrate 120 can be used for each of the substrate 151 and the substrate 152.

The material that can be used for the resin layer 122 can be used for the adhesive layer 142.

As the connection layer 242, an anisotropic conductive film (ACF), an anisotropic conductive paste (ACP), or the like can be used.

[Display Panel 100H]

Figure 23A:
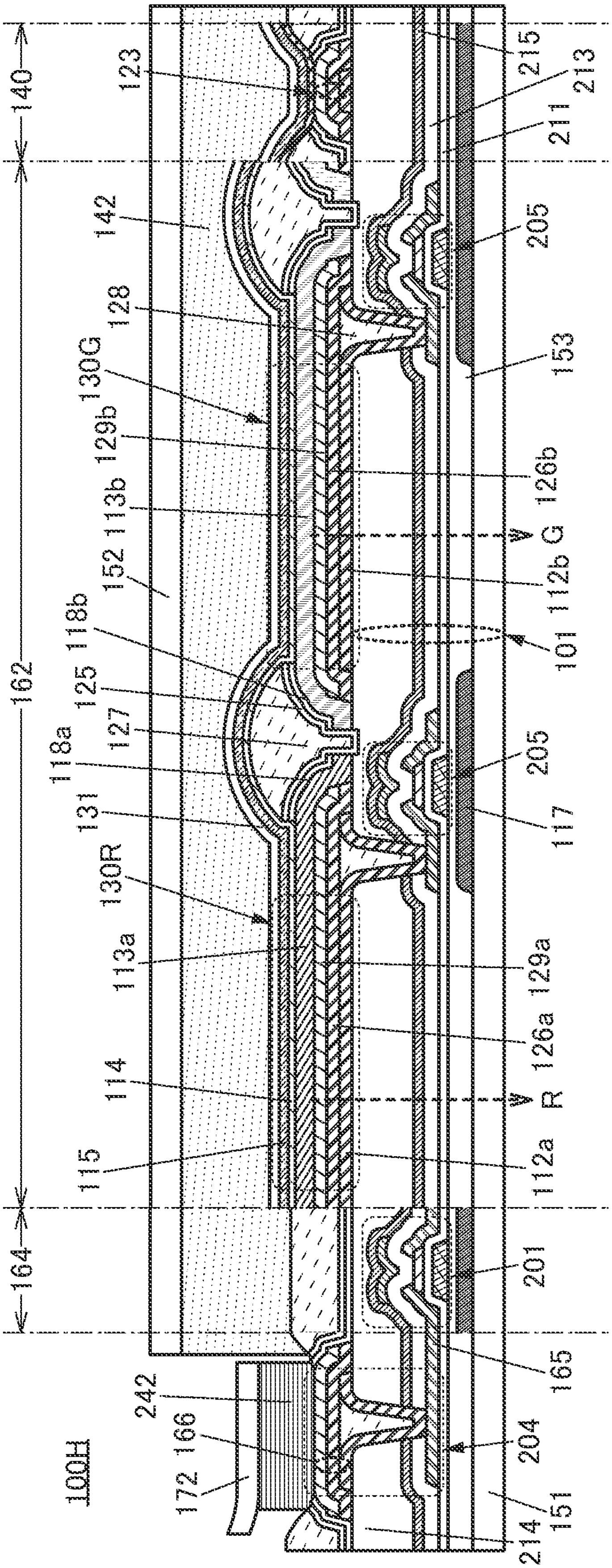
FIG. 23A to FIG. 23D are cross-sectional views illustrating examples of a display panel.

A display panel 100H illustrated in FIG. 23A differs from the display panel 100G mainly in being a bottom-emission display panel.

Light emitted by the light-emitting device is emitted toward the substrate 151 side. For the substrate 151, a material having a high property of transmitting visible light is preferably used. In contrast, there is no limitation on the light-transmitting property of a material used for the substrate 152.

The light-blocking layer 117 is preferably formed between the substrate 151 and the transistor 201 and between the substrate 151 and the transistor 205. FIG. 23A illustrates an example in which the light-blocking layer 117 is provided over the substrate 151, an insulating layer 153 is provided over the light-blocking layer 117, and the transistors 201 and 205 and the like are provided over the insulating layer 153.

The light-emitting device 130R includes the conductive layer 112*a*, the conductive layer 126*a* over the conductive layer 112*a*, and the conductive layer 129*a* over the conductive layer 126*a*. The light-emitting device 130G includes the conductive layer 112*b*, the conductive layer 126*b* over the conductive layer 112*b*, and the conductive layer 129*b* over the conductive layer 126*b*.

A material having a high property of transmitting visible light is used for each of the conductive layers 112*a*, 112*b*, 126*a*, 126*b*, 129*a* and 129*b*. A material reflecting visible light is preferably used for the common electrode 115.

Figure 23B:
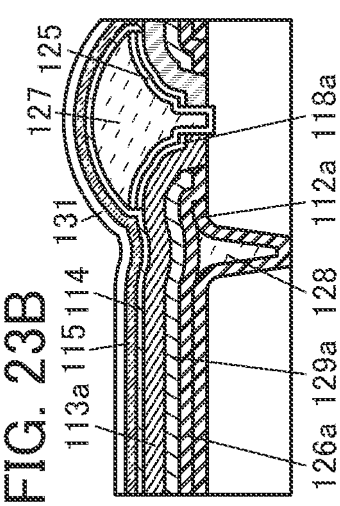
Figure 23C:
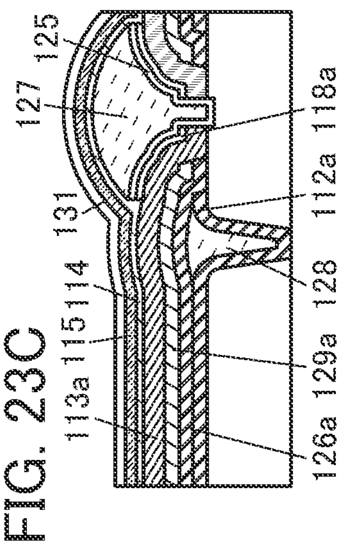
Figure 23D:
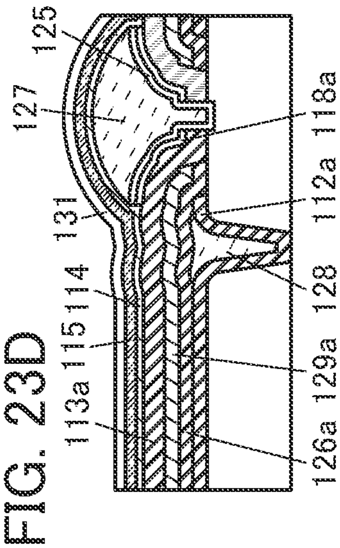

Although FIG. 22A, FIG. 23A, and the like illustrate an example where the layer 128 has a flat top surface, the shape of the layer 128 is not particularly limited. FIG. 23B to FIG. 23D illustrate variation examples of the layer 128.

As illustrated in FIG. 23B and FIG. 23D, the top surface of the layer 128 can have a shape such that its center and the vicinity thereof are depressed, i.e., a shape including a concave surface, in a cross-sectional view.

As illustrated in FIG. 23C, the top surface of the layer 128 can have a shape such that its center and the vicinity thereof bulge, i.e., a shape including a convex surface, in a cross-sectional view.

The top surface of the layer 128 may include one or both of a convex surface and a concave surface. The number of convex surfaces and the number of concave surfaces included in the top surface of the layer 128 are not limited and can each be one or more.

The level of the top surface of the layer 128 and the level of the top surface of the conductive layer 112*a* may be equal to or substantially equal to each other, or may be different from each other. For example, the level of the top surface of the layer 128 may be either lower or higher than the level of the top surface of the conductive layer 112*a*.

FIG. 23B can be regarded as illustrating an example where the layer 128 fits in the depressed portion formed in the conductive layer 112*a*. By contrast, as illustrated in FIG. 23D, the layer 128 may exist also outside the depressed portion formed in the conductive layer 112*a*, that is, the layer 128 may be formed to have a top surface wider than the depressed portion.

[Display Panel 100J]

Figure 24:
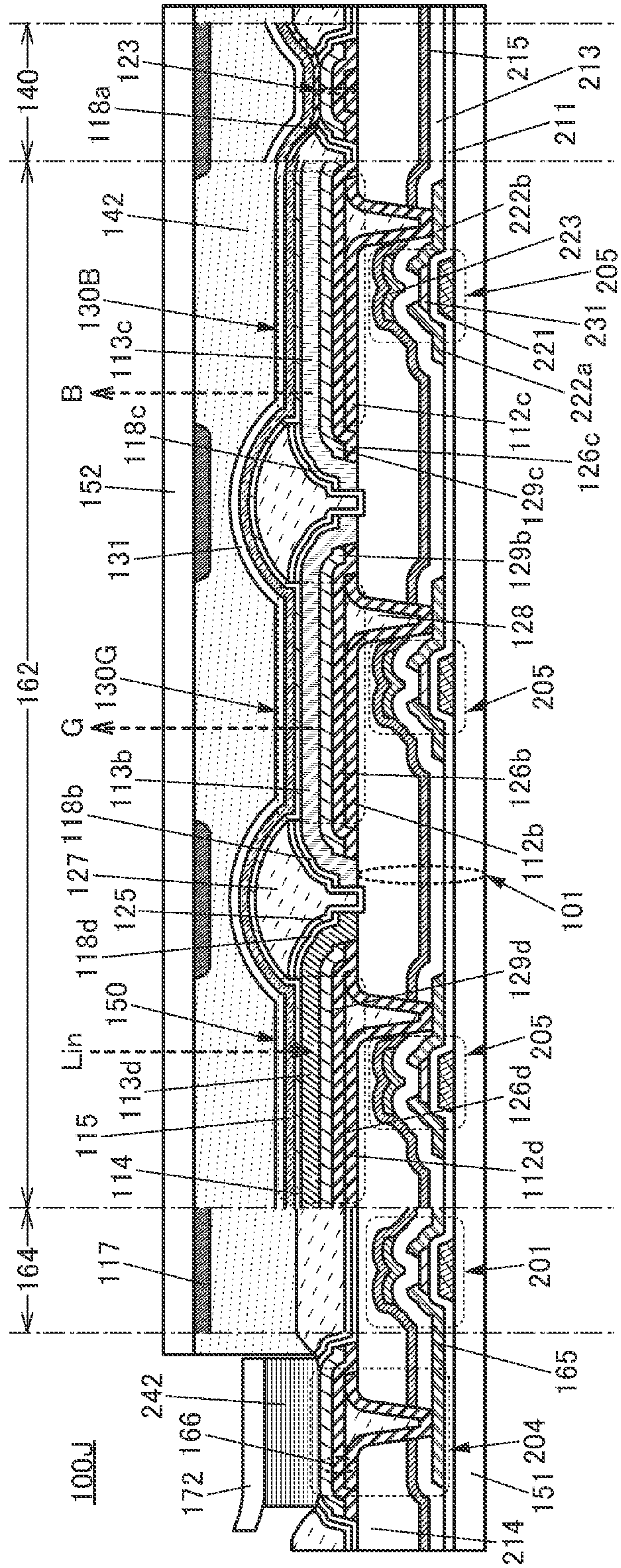
FIG. 24 is a cross-sectional view illustrating an example of a display panel.

A display panel 100J illustrated in FIG. 24 is different from the display panel 100G mainly in including the light-receiving device 150.

The light-receiving device 150 includes a conductive layer 112*d*, a conductive layer 126*d* over the conductive layer 112*d*, and a conductive layer 129*d* over the conductive layer 126*d*.

The conductive layer 112*d* is connected to the conductive layer 222*b* included in the transistor 205 through an opening provided in the insulating layer 214.

The top surface and side surface of the conductive layer 126*d* and the top surface and the side surface of the conductive layer 129*d* are covered with the fourth layer 113*d*. The fourth layer 113*d* includes at least an active layer.

The side surface of the fourth layer 113*d* is covered with the insulating layers 125 and 127. The mask layer 118*d* is positioned between the fourth layer 113*d* and the insulating layer 125. The common layer 114 is provided over the fourth layer 113*d* and the insulating layers 125 and 127, and the common electrode 115 is provided over the common layer 114. The common layer 114 is a continuous film provided to be shared by the light-receiving device and the light-emitting devices.

For example, the pixel layout described in Embodiment 1 with reference to FIG. 4A or the pixel layout described in Embodiment 2 with reference to FIG. 13A to FIG. 13D can be used for the display panel 100J. The light-receiving device 150 can be provided in at least one of the subpixel PS, the subpixel X1, the subpixel X2, and the like. Embodiment 1 can be referred to for the details of the display panel including the light-receiving device.

This embodiment can be combined with any of the other embodiments as appropriate.

Embodiment 4

In this embodiment, a structure example of a transistor that can be used in the display panel of one embodiment of the present invention will be described. Specifically, the case of using a transistor containing silicon as a semiconductor where a channel is formed will be described.

One embodiment of the present invention is a display panel including a light-emitting device and a pixel circuit. For example, three kinds of light-emitting devices emitting light of red (R), green (G), and blue (B) are included, whereby a full-color display panel can be achieved.

Transistors containing silicon in their semiconductor layers where channels are formed are preferably used as all transistors included in the pixel circuit for driving the light-emitting device. As silicon, single crystal silicon, polycrystalline silicon, amorphous silicon, and the like can be given. In particular, a transistor containing low-temperature polysilicon (LTPS) in its semiconductor layer (hereinafter also referred to as an LTPS transistor) is preferably used. The LTPS transistor has high field-effect mobility and favorable frequency characteristics.

With the use of transistors containing silicon, such as LTPS transistors, a circuit required to be driven at a high frequency (e.g., a source driver circuit) can be formed on the same substrate as the display portion. Thus, external circuits mounted on the display panel can be simplified, whereby component cost and mounting cost can be reduced.

It is preferable to use transistors including a metal oxide (hereinafter also referred to as an oxide semiconductor) in their semiconductor layers where channels are formed (such transistors are hereinafter also referred to as OS transistors) as at least one of the transistors included in the pixel circuit. An OS transistor has extremely higher field-effect mobility than a transistor containing amorphous silicon. In addition, an OS transistor has an extremely low leakage current between a source and a drain in an off state (hereinafter, also referred to as off-state current), and charge accumulated in a capacitor that is connected in series to the transistor can be retained for a long period. Furthermore, power consumption of the display panel can be reduced with the use of an OS transistor.

When an LTPS transistor is used as one or more of the transistors included in the pixel circuit and an OS transistor is used as the rest, a display panel with low power consumption and high driving capability can be achieved. In a more favorable example, it is preferable that an OS transistor be used as a transistor functioning as a switch for controlling electrical continuity between wirings and an LTPS transistor be used as a transistor for controlling current.

For example, one of the transistors included in the pixel circuit functions as a transistor for controlling current flowing through the light-emitting device and can be referred to as a driving transistor. One of a source and a drain of the driving transistor is electrically connected to the pixel electrode of the light-emitting device. An LTPS transistor is preferably used as the driving transistor. In this case, the amount of current flowing through the light-emitting device can be increased in the pixel circuit.

Another transistor included in the pixel circuit functions as a switch for controlling selection and non-selection of the pixel and can be referred to as a selection transistor. A gate of the selection transistor is electrically connected to a gate line, and one of a source and a drain thereof is electrically connected to a source line (signal line). An OS transistor is preferably used as the selection transistor. Accordingly, the gray level of the pixel can be maintained even with an extremely low frame frequency (e.g., 1 fps or less); thus, power consumption can be reduced by stopping the driver in displaying a still image.

More specific structure examples will be described below with reference to drawings.

[Structure Example of Display Panel]

Figure 25A:
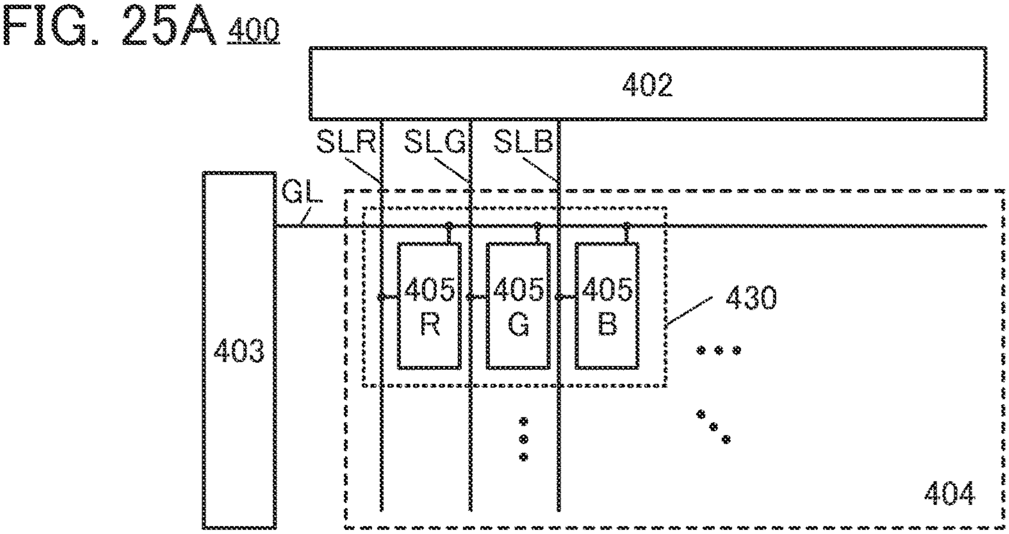
FIG. 25A is a block diagram illustrating an example of a display panel.

FIG. 25A illustrates a block diagram of a display panel 400. The display panel 400 includes a display portion 404, a driver circuit portion 402, a driver circuit portion 403, and the like.

The display portion 404 includes a plurality of pixels 430 arranged in a matrix. The pixels 430 each include a subpixel 405R, a subpixel 405G, and a subpixel 405B. The subpixel 405R, the subpixel 405G, and the subpixel 405B each include a light-emitting device functioning as a display device.

The pixel 430 is electrically connected to a wiring GL, a wiring SLR, a wiring SLG, and a wiring SLB. The wiring SLR, the wiring SLG, and the wiring SLB are electrically connected to the driver circuit portion 402. The wiring GL is electrically connected to the driver circuit portion 403. The driver circuit portion 402 functions as a source line driver circuit (also referred to as a source driver), and the driver circuit portion 403 functions as a gate line driver circuit (also referred to as a gate driver). The wiring GL functions as a gate line, and the wiring SLR, the wiring SLG, and the wiring SLB each function as a source line.

The subpixel 405R includes a light-emitting device emitting red light. The subpixel 405G includes a light-emitting device emitting green light. The subpixel 405B includes a light-emitting device emitting blue light. Thus, the display panel 400 can perform full-color display. Note that the pixel 430 may include a subpixel including a light-emitting device emitting light of another color. For example, the pixel 430 may include, in addition to the three subpixels, a subpixel including a light-emitting device emitting white light, a subpixel including a light-emitting device emitting yellow light, or the like.

The wiring GL is electrically connected to the subpixel 405R, the subpixel 405G, and the subpixel 405B arranged in a row direction (an extending direction of the wiring GL). The wiring SLR, the wiring SLG, and the wiring SLB are electrically connected to the subpixels 405R, the subpixels 405G, and the subpixels 405B (not illustrated) arranged in a column direction (an extending direction of the wiring SLR and the like), respectively.

[Structure Example of Pixel Circuit]

Figure 25B:
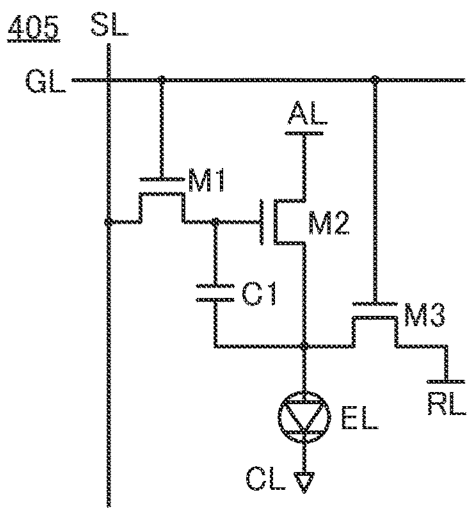
FIG. 25B to FIG. 25D are diagrams illustrating examples of a pixel circuit.

FIG. 25B illustrates an example of a circuit diagram of a pixel 405 that can be used as the subpixel 405R, the subpixel 405G, and the subpixel 405B. The pixel 405 includes a transistor M1, a transistor M2, a transistor M3, a capacitor C1, and a light-emitting device EL. The wiring GL and a wiring SL are electrically connected to the pixel 405. The wiring SL corresponds to any of the wiring SLR, the wiring SLG, and the wiring SLB illustrated in FIG. 25A.

A gate of the transistor M1 is electrically connected to the wiring GL, one of a source and a drain of the transistor M1 is electrically connected to the wiring SL, and the other thereof is electrically connected to one electrode of the capacitor C1 and a gate of the transistor M2. One of a source and a drain of the transistor M2 is electrically connected to a wiring AL, and the other of the source and the drain of the transistor M2 is electrically connected to one electrode of the light-emitting device EL, the other electrode of the capacitor C1, and one of a source and a drain of the transistor M3. A gate of the transistor M3 is electrically connected to the wiring GL, and the other of the source and the drain of the transistor M3 is electrically connected to a wiring RL. The other electrode of the light-emitting device EL is electrically connected to a wiring CL.

A data potential D is supplied to the wiring SL. A selection signal is supplied to the wiring GL. The selection signal includes a potential for bringing a transistor into a conducting state and a potential for bringing a transistor into a non-conducting state.

A reset potential is supplied to the wiring RL. An anode potential is supplied to the wiring AL. A cathode potential is supplied to the wiring CL. In the pixel 405, the anode potential is a potential higher than the cathode potential. The reset potential supplied to the wiring RL can be set such that a potential difference between the reset potential and the cathode potential is lower than the threshold voltage of the light-emitting device EL. The reset potential can be a potential higher than the cathode potential, a potential equal to the cathode potential, or a potential lower than the cathode potential.

The transistor M1 and the transistor M3 each function as a switch. The transistor M2 functions as a transistor for controlling current flowing through the light-emitting device EL. For example, it can be said that the transistor M1 functions as a selection transistor and the transistor M2 functions as a driving transistor.

Here, it is preferable to use LTPS transistors as all of the transistor M1 to the transistor M3. Alternatively, it is preferable to use OS transistors as the transistor M1 and the transistor M3 and to use an LTPS transistor as the transistor M2.

Alternatively, OS transistors may be used as all of the transistor M1 to the transistor M3. In this case, an LTPS transistor can be used as at least one of a plurality of transistors included in the driver circuit portion 402 and a plurality of transistors included in the driver circuit portion 403, and OS transistors can be used as the other transistors. For example, OS transistors can be used as the transistors provided in the display portion 404, and LTPS transistors can be used as the transistors provided in the driver circuit portion 402 and the driver circuit portion 403.

As the OS transistor, a transistor including an oxide semiconductor in its semiconductor layer where a channel is formed can be used. The semiconductor layer preferably contains indium, M (M is one or more selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more selected from aluminum, gallium, yttrium, and tin. It is particularly preferable to use an oxide containing indium, gallium, and zinc (also referred to as IGZO) for the semiconductor layer of the OS transistor. Alternatively, it is preferable to use an oxide containing indium, tin, and zinc. Further alternatively, it is preferable to use an oxide containing indium, gallium, tin, and zinc.

A transistor using an oxide semiconductor having a wider band gap and smaller carrier density than silicon can achieve an extremely low off-state current. Thus, such a low off-state current enables long-term retention of charge accumulated in a capacitor that is connected to the transistor in series. Therefore, it is particularly preferable to use a transistor including an oxide semiconductor as the transistor M1 and the transistor M3 each of which is connected to the capacitor C1 in series. The use of the transistor including an oxide semiconductor as each of the transistor M1 and the transistor M3 can prevent leakage of charge retained in the capacitor C1 through the transistor M1 or the transistor M3. Furthermore, since charge retained in the capacitor C1 can be retained for a long time, a still image can be displayed for a long time without rewriting data in the pixel 405.

Note that although the transistor is illustrated as an n-channel transistor in FIG. 25B, a p-channel transistor can also be used.

The transistors included in the pixel 405 are preferably formed to be arranged over the same substrate.

Note that transistors each including a pair of gates overlapping with each other with a semiconductor layer therebetween can be used as the transistors included in the pixel 405.

In the transistor including a pair of gates, the same potential is supplied to the pair of gates electrically connected to each other, which brings advantage that the transistor can have a higher on-state current and improved saturation characteristics. A potential for controlling the threshold voltage of the transistor may be supplied to one of the pair of gates. Furthermore, when a constant potential is supplied to one of the pair of gates, the stability of the electrical characteristics of the transistor can be improved. For example, one of the gates of the transistor may be electrically connected to a wiring to which a constant potential is supplied or may be electrically connected to a source or a drain of the transistor.

Figure 25C:
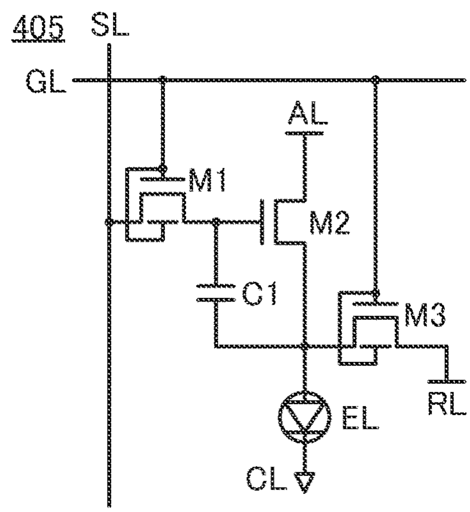

The pixel 405 illustrated in FIG. 25C is an example where a transistor including a pair of gates is used as each of the transistor M1 and the transistor M3. In each of the transistor M1 and the transistor M3, the pair of gates are electrically connected to each other. Such a structure can shorten the period in which data is written to the pixel 405.

Figure 25D:
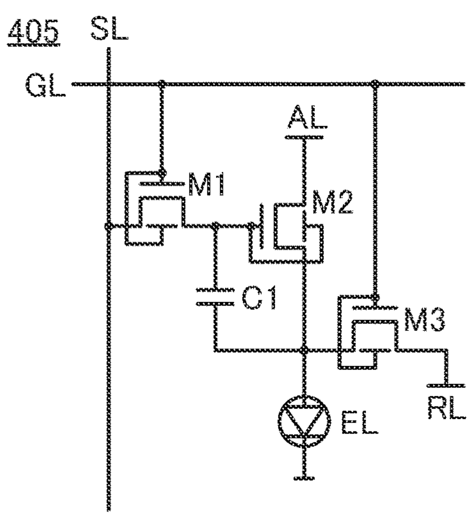

The pixel 405 illustrated in FIG. 25D is an example where a transistor including a pair of gates is used as the transistor M2 in addition to the transistor M1 and the transistor M3. A pair of gates of the transistor M2 are electrically connected to each other. When such a transistor is used as the transistor M2, the saturation characteristics are improved, whereby emission luminance of the light-emitting device EL can be controlled easily and the display quality can be increased.

[Structure Example of Transistor]

Cross-sectional structure examples of a transistor that can be used in the above display panel are described below.

Structure Example 1

Figure 26A:
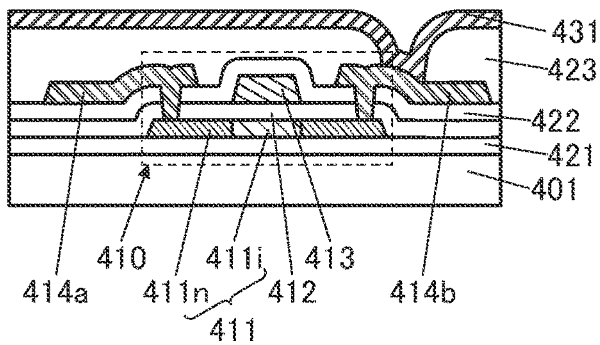
FIG. 26A to FIG. 26D are diagrams illustrating examples of transistors.

FIG. 26A is a cross-sectional view including a transistor 410.

The transistor 410 is provided over a substrate 401 and contains polycrystalline silicon in its semiconductor layer. For example, the transistor 410 corresponds to the transistor M2 in the pixel 405. In other words, FIG. 26A illustrates an example in which one of a source and a drain of the transistor 410 is electrically connected to a conductive layer 431 of the light-emitting device.

The transistor 410 includes a semiconductor layer 411, an insulating layer 412, a conductive layer 413, and the like. The semiconductor layer 411 includes a channel formation region 411*i* and low-resistance regions 411*n*. The semiconductor layer 411 contains silicon. The semiconductor layer 411 preferably contains polycrystalline silicon. Part of the insulating layer 412 functions as a gate insulating layer. Part of the conductive layer 413 functions as a gate electrode.

Note that the semiconductor layer 411 can include a metal oxide exhibiting semiconductor characteristics (also referred to as an oxide semiconductor). In this case, the transistor 410 can be referred to as an OS transistor.

The low-resistance region 411*n* is a region containing an impurity element. For example, in the case where the transistor 410 is an n-channel transistor, phosphorus, arsenic, or the like is added to the low-resistance region 411*n*. Meanwhile, in the case where the transistor 410 is a p-channel transistor, boron, aluminum, or the like is added to the low-resistance region 411*n*. In addition, in order to control the threshold voltage of the transistor 410, the above-described impurity may be added to the channel formation region 411*i*.

An insulating layer 421 is provided over the substrate 401. The semiconductor layer 411 is provided over the insulating layer 421. The insulating layer 412 is provided to cover the semiconductor layer 411 and the insulating layer 421. The conductive layer 413 is provided at a position that is over the insulating layer 412 and overlaps with the semiconductor layer 411.

An insulating layer 422 is provided to cover the conductive layer 413 and the insulating layer 412. A conductive layer 414*a* and a conductive layer 414*b* are provided over the insulating layer 422. The conductive layer 414*a* and the conductive layer 414*b* are each electrically connected to the low-resistance region 411*n* in the opening portion provided in the insulating layer 422 and the insulating layer 412. Part of the conductive layer 414*a* functions as one of a source electrode and a drain electrode and part of the conductive layer 414*b* functions as the other of the source electrode and the drain electrode. An insulating layer 423 is provided to cover the conductive layer 414*a*, and the conductive layer 414*b*, and the insulating layer 422.

The conductive layer 431 functioning as a pixel electrode is provided over the insulating layer 423. The conductive layer 431 is provided over the insulating layer 423 and is electrically connected to the conductive layer 414*b* through an opening provided in the insulating layer 423. Although not illustrated here, an EL layer and a common electrode can be stacked over the conductive layer 431.

Structure Example 2

Figure 26B:
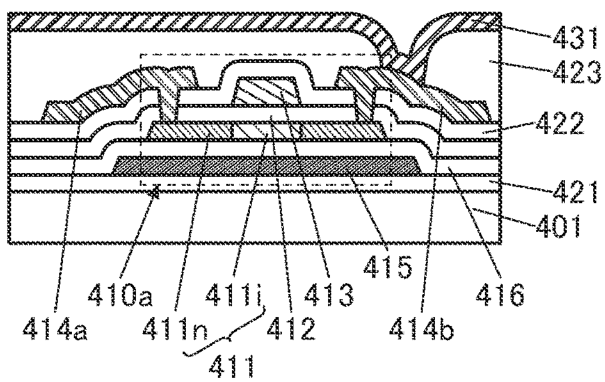

FIG. 26B illustrates a transistor 410*a* including a pair of gate electrodes. The transistor 410*a* illustrated in FIG. 26B is different from FIG. 26A mainly in including a conductive layer 415 and an insulating layer 416.

The conductive layer 415 is provided over the insulating layer 421. The insulating layer 416 is provided to cover the conductive layer 415 and the insulating layer 421. The semiconductor layer 411 is provided such that at least the channel formation region 411*i* overlaps with the conductive layer 415 with the insulating layer 416 therebetween.

In the transistor 410*a* illustrated in FIG. 26B, part of the conductive layer 413 functions as a first gate electrode, and part of the conductive layer 415 functions as a second gate electrode. At this time, part of the insulating layer 412 functions as a first gate insulating layer, and part of the insulating layer 416 functions as a second gate insulating layer.

Here, to electrically connect the first gate electrode to the second gate electrode, the conductive layer 413 is electrically connected to the conductive layer 415 through an opening portion provided in the insulating layer 412 and the insulating layer 416 in a region not illustrated. To electrically connect the second gate electrode to a source or a drain, the conductive layer 415 is electrically connected to the conductive layer 414*a* or the conductive layer 414*b* through an opening portion provided in the insulating layer 422, the insulating layer 412, and the insulating layer 416 in a region not illustrated.

In the case where LTPS transistors are used as all of the transistors included in the pixel 405, the transistor 410 illustrated in FIG. 26A as an example or the transistor 410*a* illustrated in FIG. 26B as an example can be used. In this case, the transistors 410*a* may be used as all of the transistors included in the pixels 405, the transistors 410 may be used as all of the transistors, or the transistors 410*a* and the transistors 410 may be used in combination.

Structure Example 3

Described below is an example of a structure including both a transistor containing silicon in its semiconductor layer and a transistor containing a metal oxide in its semiconductor layer.

Figure 26C:
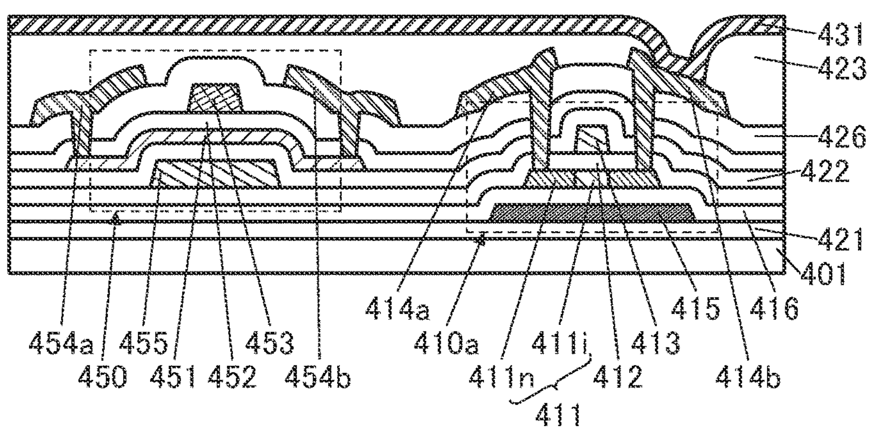

FIG. 26C is a schematic cross-sectional view including the transistor 410*a* and a transistor 450.

The structure example 1 described above can be referred to for the transistor 410*a*. Although an example using the transistor 410*a* is illustrated here, a structure including the transistor 410 and the transistor 450 or a structure including all the transistor 410, the transistor 410*a*, and the transistor 450 may alternatively be employed.

The transistor 450 is a transistor containing a metal oxide in its semiconductor layer. The structure in FIG. 26C illustrates an example in which the transistor 450 corresponds to the transistor M1 in the pixel 405 and the transistor 410*a* corresponds to the transistor M2. That is, FIG. 26C illustrates an example in which one of a source and a drain of the transistor 410*a* is electrically connected to the conductive layer 431.

Moreover, FIG. 26C illustrates an example in which the transistor 450 includes a pair of gates.

The transistor 450 includes a conductive layer 455, the insulating layer 422, a semiconductor layer 451, an insulating layer 452, a conductive layer 453, and the like. Part of the conductive layer 453 functions as a first gate of the transistor 450, and part of the conductive layer 455 functions as a second gate of the transistor 450. In this case, part of the insulating layer 452 functions as a first gate insulating layer of the transistor 450, and part of the insulating layer 422 functions as a second gate insulating layer of the transistor 450.

The conductive layer 455 is provided over the insulating layer 412. The insulating layer 422 is provided to cover the conductive layer 455. The semiconductor layer 451 is provided over the insulating layer 422. The insulating layer 452 is provided to cover the semiconductor layer 451 and the insulating layer 422. The conductive layer 453 is provided over the insulating layer 452 and includes a region overlapping with the semiconductor layer 451 and the conductive layer 455.

An insulating layer 426 is provided to cover the insulating layer 452 and the conductive layer 453. A conductive layer 454*a* and a conductive layer 454*b* are provided over the insulating layer 426. The conductive layer 454*a* and the conductive layer 454*b* are electrically connected to the semiconductor layer 451 in openings provided in the insulating layer 426 and the insulating layer 452. Part of the conductive layer 454*a* functions as one of a source electrode and a drain electrode and part of the conductive layer 454*b* functions as the other of the source electrode and the drain electrode. The insulating layer 423 is provided to cover the conductive layer 454*a*, the conductive layer 454*b*, and the insulating layer 426.

Here, the conductive layer 414*a* and the conductive layer 414*b* electrically connected to the transistor 410*a* are preferably formed by processing the same conductive film as the conductive layer 454*a* and the conductive layer 454*b*. FIG. 26C illustrates a structure where the conductive layer 414*a*, the conductive layer 414*b*, the conductive layer 454*a*, and the conductive layer 454*b* are formed on the same plane (i.e., in contact with the top surface of the insulating layer 426) and contain the same metal element. In this case, the conductive layer 414*a* and the conductive layer 414*b* are electrically connected to the low-resistance regions 411*n* through openings provided in the insulating layer 426, the insulating layer 452, the insulating layer 422, and the insulating layer 412. This is preferable because the fabrication process can be simplified.

Moreover, the conductive layer 413 functioning as the first gate electrode of the transistor 410*a* and the conductive layer 455 functioning as the second gate electrode of the transistor 450 are preferably formed by processing the same conductive film. FIG. 26C illustrates a structure where the conductive layer 413 and the conductive layer 455 are formed on the same plane (i.e., in contact with the top surface of the insulating layer 412) and contain the same metal element. This is preferable because the fabrication process can be simplified.

Figure 26D:
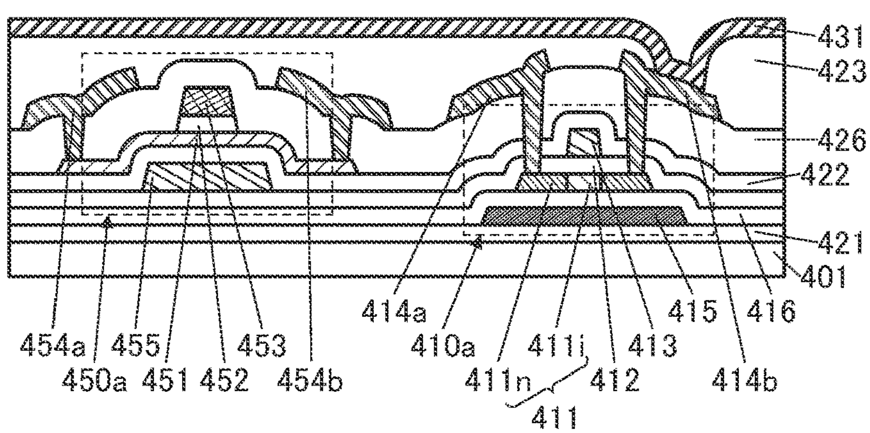

In the structure in FIG. 26C, the insulating layer 452 functioning as the first gate insulating layer of the transistor 450 covers an end portion of the semiconductor layer 451; however, the insulating layer 452 may be processed to have the same or substantially the same top surface shape as the conductive layer 453 as in a transistor 450*a* illustrated in FIG. 26D.

Note that in this specification and the like, the expression "top surface shapes are substantially the same" means that at least outlines of stacked layers partly overlap with each other. For example, the case of processing the upper layer and the lower layer using the same mask pattern or mask patterns that are partly the same is included. However, in some cases, the outlines do not completely overlap with each other and the upper layer is positioned inward from the lower layer or the upper layer is positioned outward from the lower layer; such cases are also represented by the expression "top surface shapes are substantially the same".

Although the example in which the transistor 410*a* corresponds to the transistor M2 and is electrically connected to the pixel electrode is shown here, one embodiment of the present invention is not limited thereto. For example, a structure in which the transistor 450 or the transistor 450*a* corresponds to the transistor M2 may be employed. In that case, the transistor 410*a* corresponds to the transistor M1, the transistor M3, or another transistor.

This embodiment can be combined with any of the other embodiments as appropriate.

Embodiment 5

In this embodiment, a light-emitting device that can be used in the display panel of one embodiment of the present invention will be described.

Figure 27A:
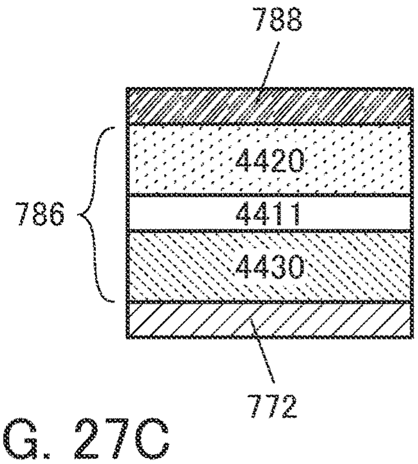
FIG. 27A to FIG. 27F are diagrams illustrating structure examples of a light-emitting device.

As illustrated in FIG. 27A, the light-emitting device includes an EL layer 786 between a pair of electrodes (a lower electrode 772 and an upper electrode 788). The EL layer 786 can be formed of a plurality of layers such as a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between a pair of electrodes, can function as a single light-emitting unit, and the structure in FIG. 27A is referred to as a single structure in this specification.

Figure 27B:
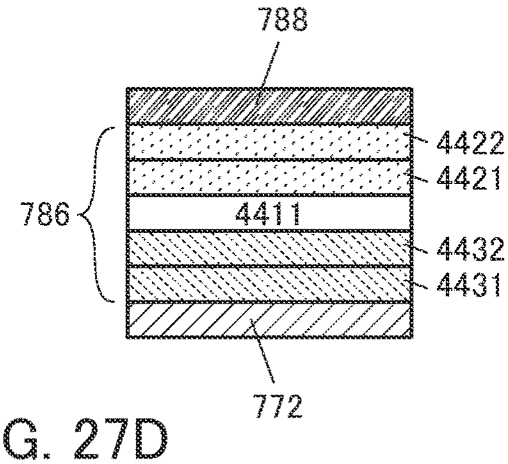

FIG. 27B is a variation example of the EL layer 786 included in the light-emitting device illustrated in FIG. 27A. Specifically, the light-emitting device illustrated in FIG. 27B includes a layer 4431 over the lower electrode 772, a layer 4432 over the layer 4431, the light-emitting layer 4411 over the layer 4432, a layer 4421 over the light-emitting layer 4411, a layer 4422 over the layer 4421, and the upper electrode 788 over the layer 4422. When the lower electrode 772 is an anode and the upper electrode 788 is a cathode, for example, the layer 4431 functions as a hole-injection layer, the layer 4432 functions as a hole-transport layer, the layer 4421 functions as an electron-transport layer, and the layer 4422 functions as an electron-injection layer. Alternatively, when the lower electrode 772 is a cathode and the upper electrode 788 is an anode, the layer 4431 functions as an electron-injection layer, the layer 4432 functions as an electron-transport layer, the layer 4421 functions as a hole-transport layer, and the layer 4422 functions as a hole-injection layer. With such a layer structure, carriers can be efficiently injected to the light-emitting layer 4411, and the efficiency of the recombination of carriers in the light-emitting layer 4411 can be enhanced.

Figure 27C:
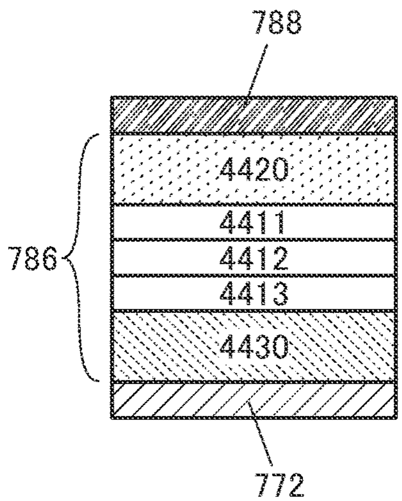
Figure 27D:
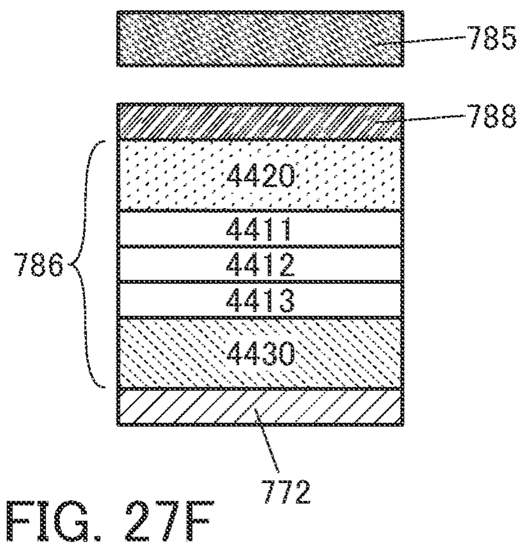

Note that the structure where a plurality of light-emitting layers (light-emitting layers 4411, 4412, and 4413) are provided between the layer 4420 and the layer 4430 as illustrated in FIG. 27C and FIG. 27D is also a variation of the single structure.

Figure 27E:
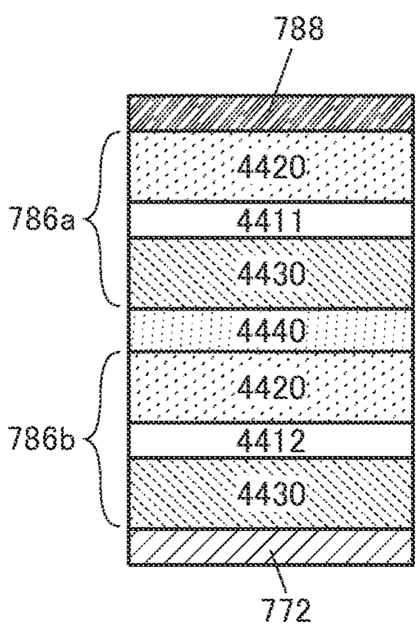
Figure 27F:
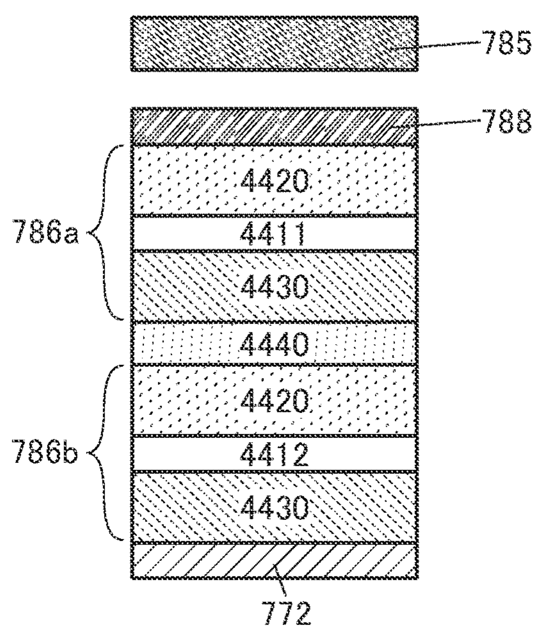

A structure in which a plurality of light-emitting units (an EL layer 786*a* and an EL layer 786*b*) are connected in series with a charge-generation layer 4440 therebetween as illustrated in FIG. 27E or FIG. 27F is referred to as a tandem structure in this specification. Note that a tandem structure may be referred to as a stack structure. The tandem structure enables a light-emitting device capable of high-luminance light emission.

In FIG. 27C and FIG. 27D, light-emitting materials that emit light of the same color, or moreover, the same light-emitting material may be used for the light-emitting layer 4411, the light-emitting layer 4412, and the light-emitting layer 4413. For example, a light-emitting material that emits blue light may be used for the light-emitting layer 4411, the light-emitting layer 4412, and the light-emitting layer 4413. A color conversion layer may be provided as a layer 785 illustrated in FIG. 27D.

Alternatively, light-emitting materials that emit light of different colors may be used for the light-emitting layer 4411, the light-emitting layer 4412, and the light-emitting layer 4413. White light emission can be obtained when the light-emitting layer 4411, the light-emitting layer 4412, and the light-emitting layer 4413 emit light of complementary colors. A color filter (also referred to as a coloring layer) may be provided as the layer 785 illustrated in FIG. 27D. When white light passes through a color filter, light of a desired color can be obtained.

In FIG. 27E and FIG. 27F, light-emitting materials that emit light of the same color, or moreover, the same light-emitting material may be used for the light-emitting layer 4411 and the light-emitting layer 4412. Alternatively, light-emitting materials that emit light of different colors may be used for the light-emitting layer 4411 and the light-emitting layer 4412. White light emission can be obtained when the light-emitting layer 4411 and the light-emitting layer 4412 emit light of complementary colors. FIG. 27F illustrates an example where the layer 785 is further provided. One or both of a color conversion layer and a color filter (coloring layer) can be used as the layer 785.

Note that also in FIG. 27C, FIG. 27D, FIG. 27E, and FIG. 27F, the layer 4420 and the layer 4430 may each have a stacked-layer structure of two or more layers as illustrated in FIG. 27B.

A structure in which light-emitting devices of different emission colors (e.g., blue (B), green (G), and red (R)) are separately formed is referred to as an SBS (Side By Side) structure in some cases.

The emission color of the light-emitting device can be red, green, blue, cyan, magenta, yellow, white, or the like depending on the material that constitutes the EL layer 786.

Furthermore, the color purity can be further increased when the light-emitting device has a microcavity structure.

The light-emitting device that emits white light preferably contains two or more kinds of light-emitting substances in the light-emitting layer. To obtain white light emission, two or more kinds of light-emitting substances are selected such that their emission colors are complementary. For example, when an emission color of a first light-emitting layer and an emission color of a second light-emitting layer are complementary colors, the light-emitting device can be configured to emit white light as a whole. The same applies to a light-emitting device including three or more light-emitting layers.

The light-emitting layer preferably contains two or more light-emitting substances that emit light of R (red), G (green), B (blue), Y (yellow), O (orange), and the like. Alternatively, a light-emitting layer preferably contains two or more light-emitting substances each of which emits light containing two or more of spectral components of R, G, and B.

This embodiment can be combined with any of the other embodiments as appropriate.

Embodiment 6

In this embodiment, electronic devices of one embodiment of the present invention are described with reference to FIG. 28 to FIG. 30.

Electronic devices of this embodiment each include the display panel of one embodiment of the present invention in a display portion. The display panel of one embodiment of the present invention can be easily increased in resolution and definition and can achieve high display quality.

Thus, the display panel of one embodiment of the present invention can be used for a display portion of a variety of electronic devices.

Examples of the electronic devices include electronic devices with a relatively large screen, such as a television device, a desktop or notebook personal computer, a monitor of a computer or the like, digital signage, and a large game machine such as a pachinko machine; a digital camera; a digital video camera; a digital photo frame; a mobile phone; a portable game machine; a portable information terminal; and an audio reproducing device.

In particular, the display panel of one embodiment of the present invention can have high resolution, and thus can be suitably used for an electronic device having a relatively small display portion. Examples of such an electronic device include a watch-type or a bracelet-type information terminal (wearable device), and a wearable device that can be worn on a head, such as a device for VR like a head-mounted display, a glasses-type device for AR, and a device for MR.

The definition of the display panel of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, a definition of 4K, 8K, or higher is preferable. The pixel density (resolution) of the display panel of one embodiment of the present invention is preferably 100 ppi or higher, further preferably 300 ppi or higher, further preferably 500 ppi or higher, further preferably 1000 ppi or higher, still further preferably 2000 ppi or higher, still further preferably 3000 ppi or higher, still further preferably 5000 ppi or higher, yet further preferably 7000 ppi or higher. With the use of such a display panel having one or both of high definition and high resolution, the electronic device can provide higher realistic sensation, sense of depth, and the like in personal use such as portable use and home use. There is no particular limitation on the screen ratio (aspect ratio) of the display panel of one embodiment of the present invention. For example, the display panel is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, odor, or infrared rays).

The electronic device in this embodiment can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Examples of a wearable device that can be worn on a head are described with reference to FIG. 28A to FIG. 28D. These wearable devices have one or both of a function of displaying AR contents and a function of displaying VR contents. Note that these wearable devices may have a function of displaying SR or MR contents, in addition to AR and VR contents. The electronic device having a function of displaying contents of at least one of AR, VR, SR, MR, and the like enables the user to reach a higher sense of immersion.

Figure 28A:
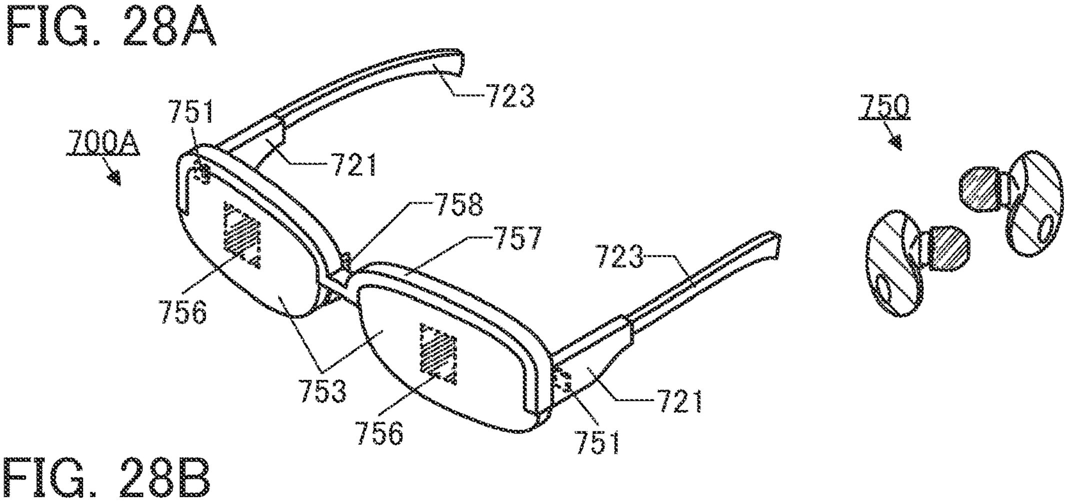
FIG. 28A to FIG. 28D are diagrams illustrating examples of electronic devices.
Figure 28B:
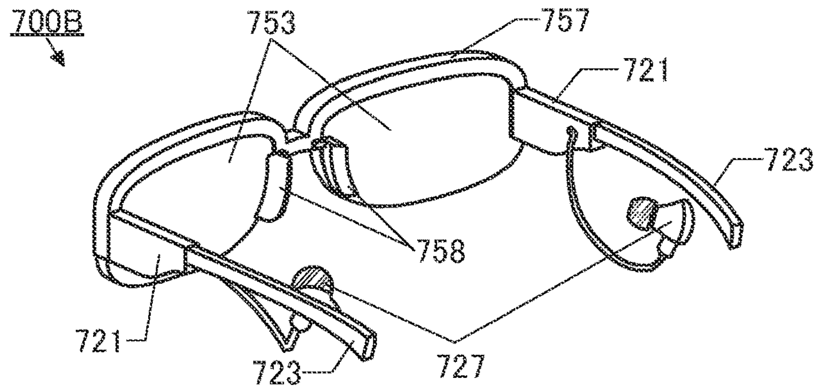

An electronic device 700A illustrated in FIG. 28A and an electronic device 700B illustrated in FIG. 28B each include a pair of display panels 751, a pair of housings 721, a communication portion (not illustrated), a pair of wearing portions 723, a control portion (not illustrated), an image capturing portion (not illustrated), a pair of optical members 753, a frame 757, and a pair of nose pads 758.

The display panel of one embodiment of the present invention can be used as the display panels 751. Thus, the electronic devices are capable of performing ultrahigh-resolution display.

The electronic device 700A and the electronic device 700B can each project images displayed on the display panels 751 onto display regions 756 of the optical members 753. Since the optical members 753 have a light-transmitting property, a user can see images displayed on the display regions, which are superimposed on transmission images seen through the optical members 753. Accordingly, the electronic device 700A and the electronic device 700B are electronic devices capable of AR display.

In the electronic device 700A and the electronic device 700B, a camera capable of capturing images of the front side may be provided as the image capturing portion. Furthermore, when the electronic device 700A and the electronic device 700B are provided with an acceleration sensor such as a gyroscope sensor, the orientation of the user's head can be sensed and an image corresponding to the orientation can be displayed on the display regions 756.

The communication portion includes a wireless communication device, and a video signal and the like can be supplied by the wireless communication device. Instead of the wireless communication device or in addition to the wireless communication device, a connector that can be connected to a cable for supplying a video signal and a power supply potential may be provided.

The electronic device 700A and the electronic device 700B are provided with a battery so that they can be charged wirelessly and/or by wire.

A touch sensor module may be provided in the housing 721. The touch sensor module has a function of detecting a touch on the outer surface of the housing 721. Detecting a tap operation, a slide operation, or the like by the user with the touch sensor module enables various types of processing. For example, processing such as pausing or restarting a video can be executed by a tap operation, and processing such as fast-forwarding or fast-rewinding can be executed by a slide operation. When the touch sensor module is provided in each of the two housings 721, the range of the operation can be widened.

Various touch sensors can be used for the touch sensor module. For example, any of touch sensors of the following types can be used: a capacitive type, a resistive type, an infrared type, an electromagnetic induction type, a surface acoustic wave type, and an optical type. In particular, a capacitive sensor or an optical sensor is preferably used for the touch sensor module.

In the case of using an optical touch sensor, a photoelectric conversion device (also referred to as a photoelectric conversion element) can be used as a light-receiving device (also referred to as a light-receiving element). One or both of an inorganic semiconductor and an organic semiconductor can be used for an active layer of the photoelectric conversion device.

Figure 28C:
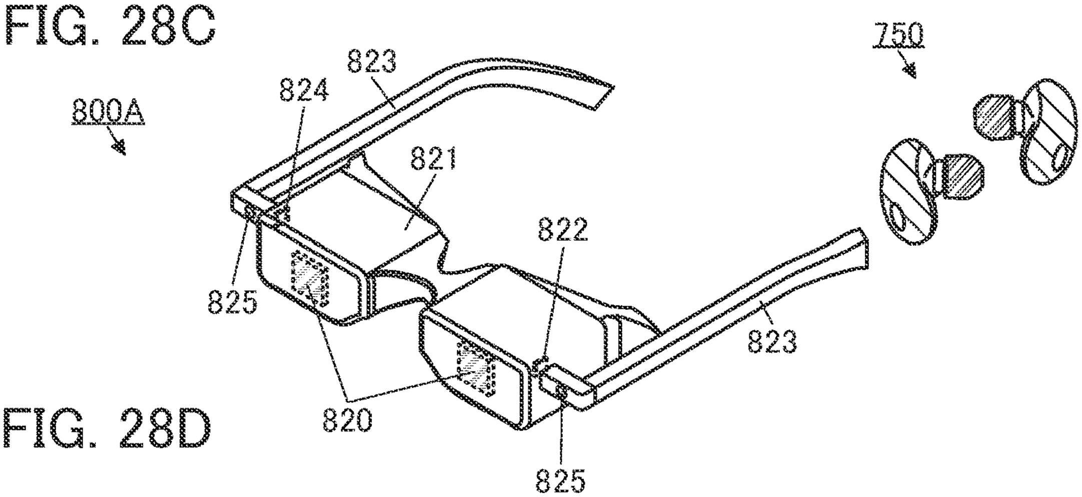
Figure 28D:
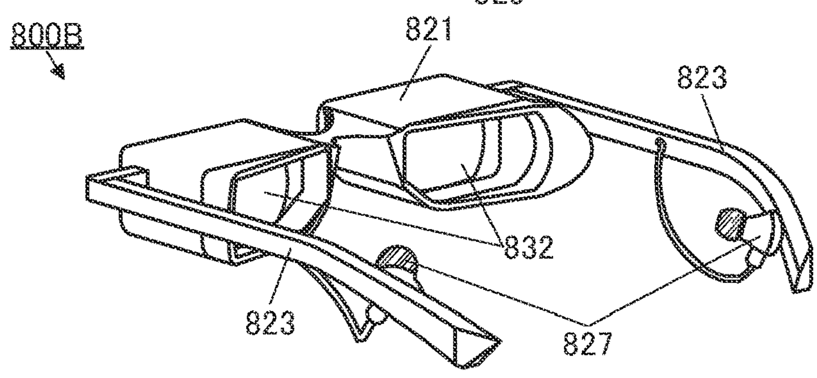

An electronic device 800A illustrated in FIG. 28C and an electronic device 800B illustrated in FIG. 28D each include a pair of display portions 820, a housing 821, a communication portion 822, a pair of wearing portions 823, a control portion 824, a pair of image capturing portions 825, and a pair of lenses 832.

The display panel of one embodiment of the present invention can be used for the display portions 820. Thus, the electronic devices are capable of performing ultrahigh-resolution display. Such electronic devices provide a high sense of immersion to the user.

The display portions 820 are positioned inside the housing 821 so as to be seen through the lenses 832. When the pair of display portions 820 display different images, three-dimensional display using parallax can be performed.

The electronic device 800A and the electronic device 800B can be regarded as electronic devices for VR. The user who wears the electronic device 800A or the electronic device 800B can see images displayed on the display portions 820 through the lenses 832.

The electronic device 800A and the electronic device 800B preferably include a mechanism for adjusting the lateral positions of the lenses 832 and the display portions 820 so that the lenses 832 and the display portions 820 are positioned optimally in accordance with the positions of the user's eyes. Moreover, the electronic device 800A and the electronic device 800B preferably include a mechanism for adjusting focus by changing the distance between the lenses 832 and the display portions 820.

The electronic device 800A or the electronic device 800B can be mounted on the user's head with the wearing portions 823. FIG. 28C or the like illustrates an example where the wearing portion 823 has a shape like a temple (also referred to as a joint or the like) of glasses; however, one embodiment of the present invention is not limited thereto. The wearing portion 823 can have any shape with which the user can wear the electronic device, for example, a shape of a helmet or a band.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to support a plurality of fields of view, such as a telescope field of view and a wide field of view.

Although an example where the image capturing portions 825 are provided is shown here, a range sensor capable of measuring a distance between the user and an object (hereinafter also referred to as a sensing portion) just needs to be provided. In other words, the image capturing portion 825 is one embodiment of the sensing portion. As the sensing portion, an image sensor or a distance image sensor such as LIDAR (Light Detection and Ranging) can be used, for example. By using images obtained by the camera and images obtained by the range image sensor, more information can be obtained and a gesture operation with higher accuracy is possible.

The electronic device 800A may include a vibration mechanism that functions as bone-conduction earphones. For example, any one or more of the display portion 820, the housing 821, and the wearing portion 823 can employ a structure including the vibration mechanism. Thus, without additionally requiring an audio device such as headphones, car phones, or a speaker, the user can enjoy video and sound only by wearing the electronic device 800A.

The electronic device 800A and the electronic device 800B may each include an input terminal. To the input terminal, a cable for supplying a video signal from a video output device or the like, power for charging the battery provided in the electronic device, and the like can be connected.

The electronic device of one embodiment of the present invention may have a function of performing wireless communication with earphones 750. The earphones 750 include a communication portion (not illustrated) and has a wireless communication function. The earphones 750 can receive information (e.g., audio data) from the electronic device with the wireless communication function. For example, the electronic device 700A illustrated in FIG. 28A has a function of transmitting information to the earphones 750 with the wireless communication function. As another example, the electronic device 800A illustrated in FIG. 28C has a function of transmitting information to the earphones 750 with the wireless communication function.

The electronic device may include an earphone portion. The electronic device 700B illustrated in FIG. 28B includes earphone portions 727. For example, the earphone portion 727 and the control portion can be connected to each other by wire. Part of a wiring that connects the earphone portion 727 and the control portion may be positioned inside the housing 721 or the wearing portion 723.

Similarly, the electronic device 800B illustrated in FIG. 28D includes earphone portions 827. For example, the earphone portion 827 and the control portion 824 are connected to each other by wire. Part of a wiring that connects the earphone portion 827 and the control portion 824 may be positioned inside the housing 821 or the wearing portion 823. Alternatively, the earphone portions 827 and the wearing portions 823 may include magnets. This is preferable because the earphone portions 827 can be fixed to the wearing portions 823 with magnetic force and thus can be easily housed.

The electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of what is called a headset by including the audio input mechanism.

As described above, both the glasses-type device (e.g., the electronic device 700A and the electronic device 700B) and the goggles-type device (e.g., the electronic device 800A and the electronic device 800B) are preferable as the electronic device of one embodiment of the present invention.

The electronic device of one embodiment of the present invention can transmit information to earphones by wire or wirelessly.

Figure 29A:
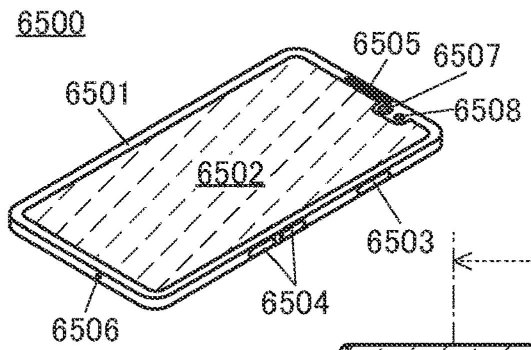
FIG. 29A to FIG. 29F are diagrams illustrating examples of electronic devices.

An electronic device 6500 illustrated in FIG. 29A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display panel of one embodiment of the present invention can be used for the display portion 6502.

Figure 29B:
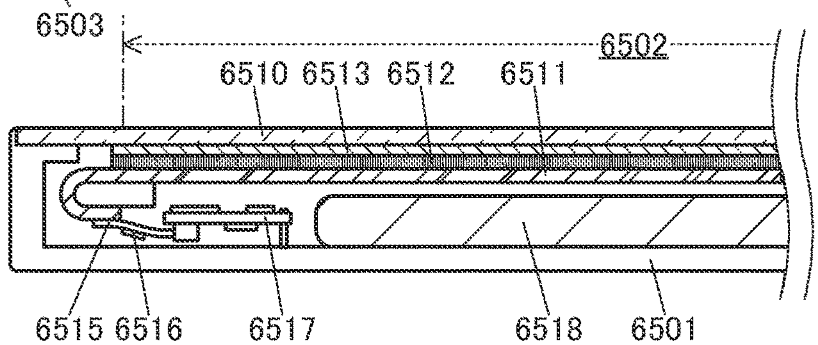

FIG. 29B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted while an increase in the thickness of the electronic device is suppressed. Moreover, part of the display panel 6511 is folded back so that a connection portion with the FPC 6515 is placed on the back side of a pixel portion, whereby an electronic device with a narrow bezel can be achieved.

Figure 29C:
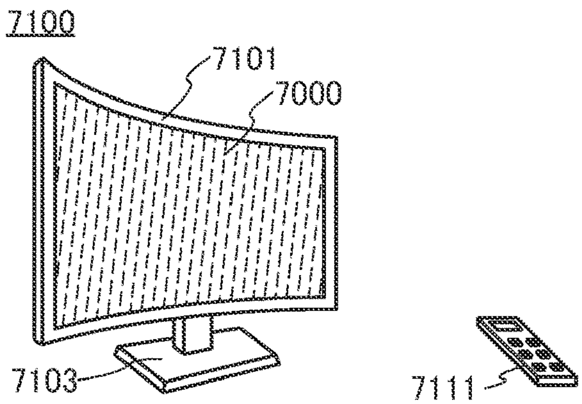

FIG. 29C illustrates an example of a television device. In a television device 7100, a display portion 7000 is incorporated in a housing 7101. Here, the housing 7101 is supported by a stand 7103.

The display panel of one embodiment of the present invention can be used for the display portion 7000.

Operation of the television device 7100 illustrated in FIG. 29C can be performed with an operation switch provided in the housing 7101 and a separate remote control 7111. Alternatively, the display portion 7000 may be provided with a touch sensor, and the television device 7100 may be operated by touch on the display portion 7000 with a finger or the like. The remote control 7111 may include a display portion for displaying information output from the remote control 7111. With operation keys or a touch panel provided in the remote control 7111, channels and volume can be controlled and videos displayed on the display portion 7000 can be operated.

Note that the television device 7100 has a structure in which a receiver, a modem, and the like are provided. A general television broadcast can be received with the receiver. When the television device is connected to a communication network by wire or wirelessly via the modem, one-way (from a transmitter to a receiver) or two-way (between a transmitter and a receiver or between receivers, for example) data communication can be performed.

Figure 29D:
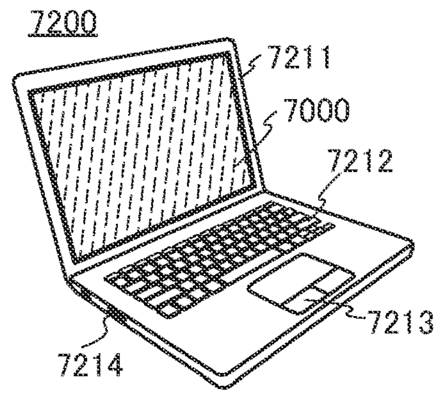

FIG. 29D illustrates an example of a notebook personal computer. A notebook personal computer 7200 includes a housing 7211, a keyboard 7212, a pointing device 7213, an external connection port 7214, and the like. In the housing 7211, the display portion 7000 is incorporated. The display panel of one embodiment of the present invention can be used for the display portion 7000.

Figure 29E:
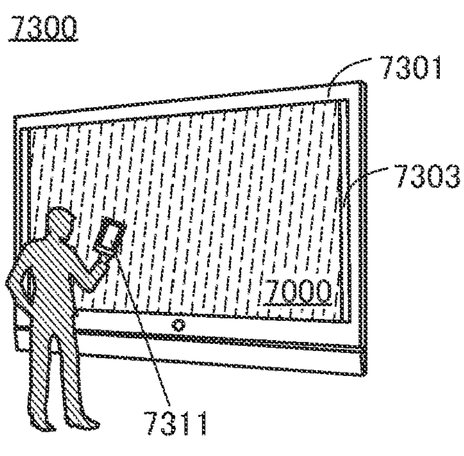
Figure 29F:
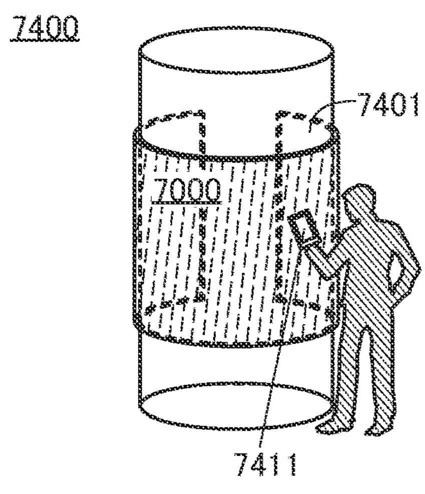

FIG. 29E and FIG. 29F illustrate examples of digital signage.

Digital signage 7300 illustrated in FIG. 29E includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 29F is digital signage 7400 attached to a cylindrical pillar 7401. The digital signage 7400 includes the display portion 7000 provided along a curved surface of the pillar 7401.

The display panel of one embodiment of the present invention can be used for the display portion 7000 illustrated in FIG. 29E and FIG. 29F.

A larger area of the display portion 7000 can increase the amount of information that can be provided at a time. The larger display portion 7000 attracts more attention, so that the effectiveness of the advertisement can be increased, for example.

The use of a touch panel for the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 29E and FIG. 29F, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Electronic devices illustrated in FIG. 30A to FIG. 30G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 30A to FIG. 30G have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. In addition, the electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 30A to FIG. 30G are described below.

Figure 30A:
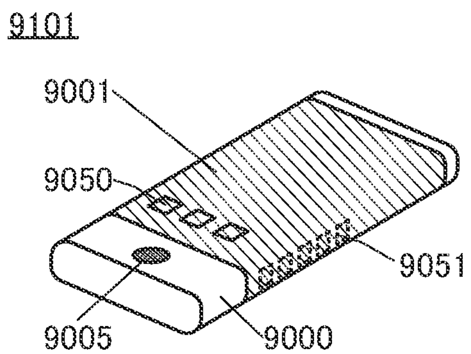
FIG. 30A to FIG. 30G are diagrams illustrating examples of electronic devices.

FIG. 30A is a perspective view illustrating a portable information terminal 9101. The portable information terminal 9101 can be used as a smartphone, for example. Note that the portable information terminal 9101 may include the speaker 9003, the connection terminal 9006, the sensor 9007, or the like. The portable information terminal 9101 can display characters and image information on its plurality of surfaces. FIG. 30A illustrates an example where three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed at the position where the information 9051 is displayed.

Figure 30B:
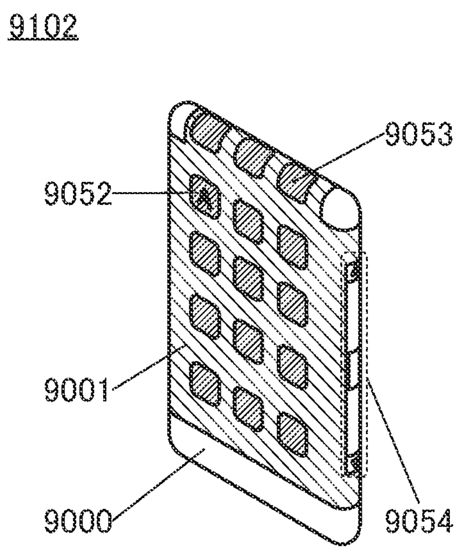

FIG. 30B is a perspective view illustrating a portable information terminal 9102. The portable information terminal 9102 has a function of displaying information on three or more surfaces of the display portion 9001. Here, an example is illustrated in which information 9052, information 9053, and information 9054 are displayed on different surfaces. For example, a user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

Figure 30C:
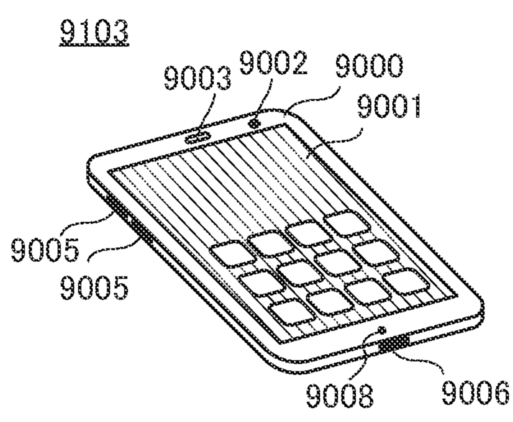

FIG. 30C is a perspective view illustrating a tablet terminal 9103. The tablet terminal 9103 is capable of executing a variety of applications such as mobile phone calls, e-mailing, viewing and editing texts, music reproduction, Internet communication, and a computer game, for example. The tablet terminal 9103 includes the display portion 9001, the camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

Figure 30D:
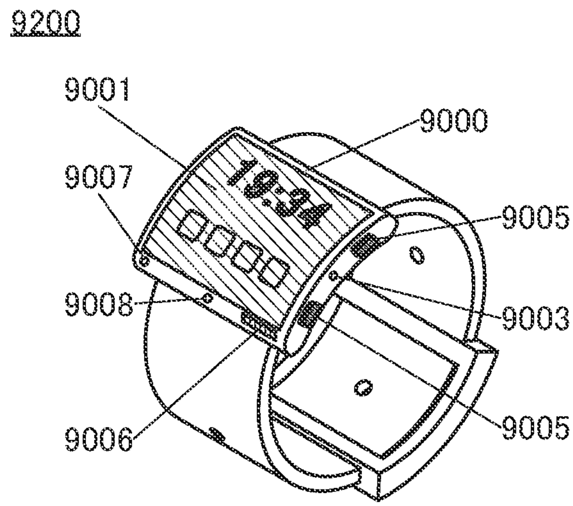

FIG. 30D is a perspective view illustrating a watch-type portable information terminal 9200. For example, the portable information terminal 9200 can be used as a Smartwatch (registered trademark). The display surface of the display portion 9001 is curved, and display can be performed on the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

Figure 30E:
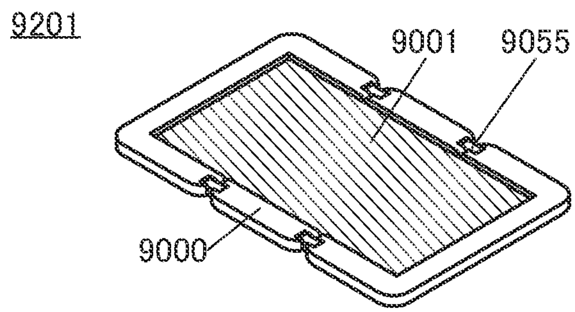
Figure 30F:
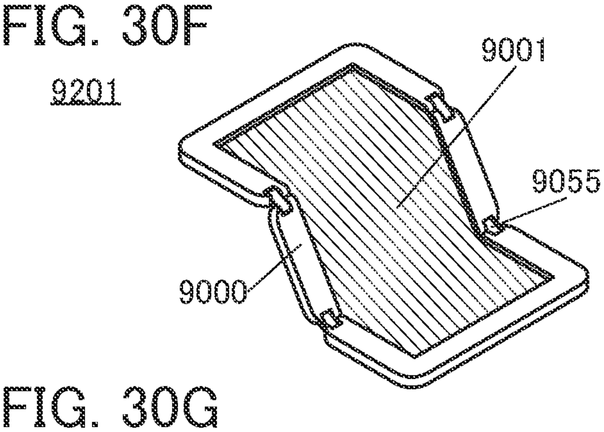
Figure 30G:
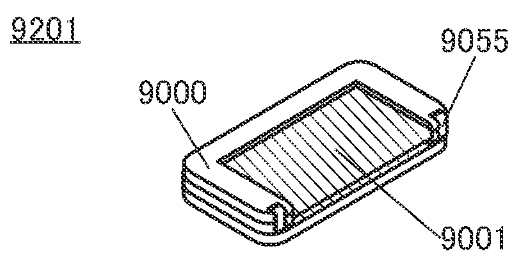

FIG. 30E to FIG. 30G are perspective views illustrating a foldable portable information terminal 9201. FIG. 30E is a perspective view of an opened state of the portable information terminal 9201, FIG. 30G is a perspective view of a folded state thereof, and FIG. 30F is a perspective view of a state in the middle of change from one of FIG. 30E and FIG. 30G to the other. The portable information terminal 9201 is highly portable in the folded state and is highly browsable in the opened state because of a seamless large display region. The display portion 9001 of the portable information terminal 9201 is supported by three housings 9000 joined together by hinges 9055. The display portion 9001 can be folded with a radius of curvature of greater than or equal to 0.1 mm and less than or equal to 150 mm, for example.

This embodiment can be combined with any of the other embodiments as appropriate.

Example 1

In this example, an effect of a mask layer protecting an organic compound will be described with reference to FIG. 31 to FIG. 34.

Figure 31:
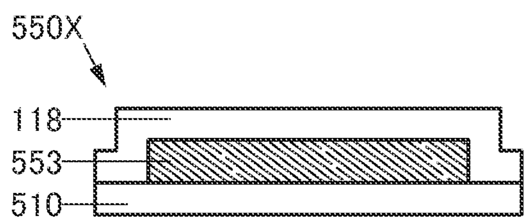
FIG. 31 illustrates the structure of a sample in an example.

FIG. 31 is a diagram illustrating the structure of a sample.

Figure 32:
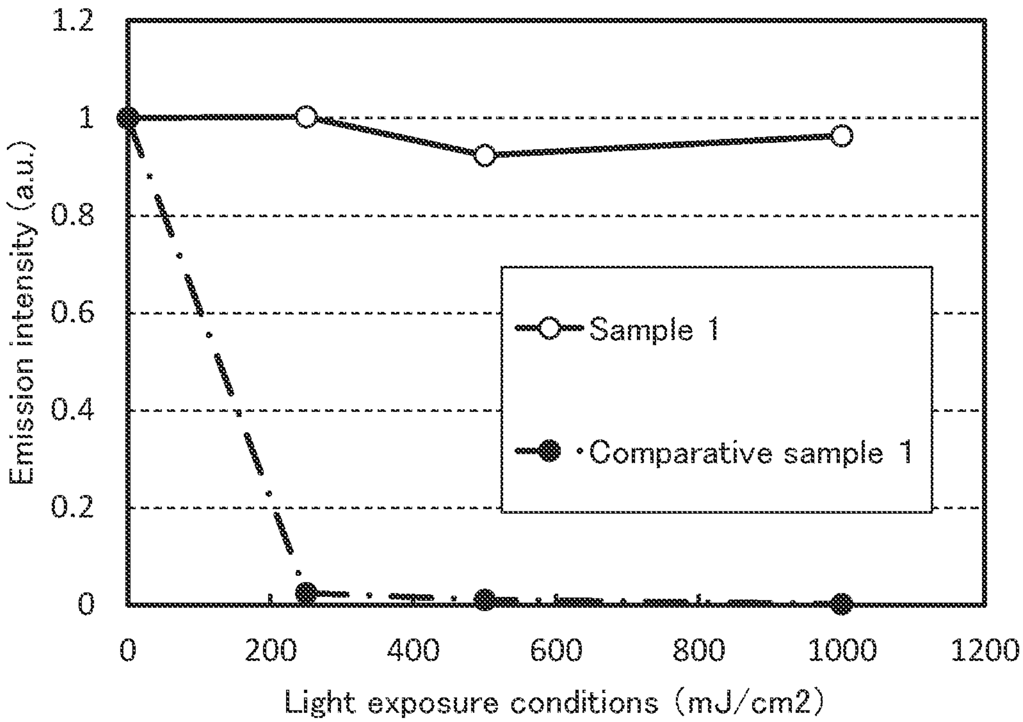
FIG. 32 is a diagram showing relative intensity of photoluminescence of samples in an example.

FIG. 32 is a diagram showing relative intensity of photoluminescence of a sample 1 and a comparative sample 1.

Figure 33:
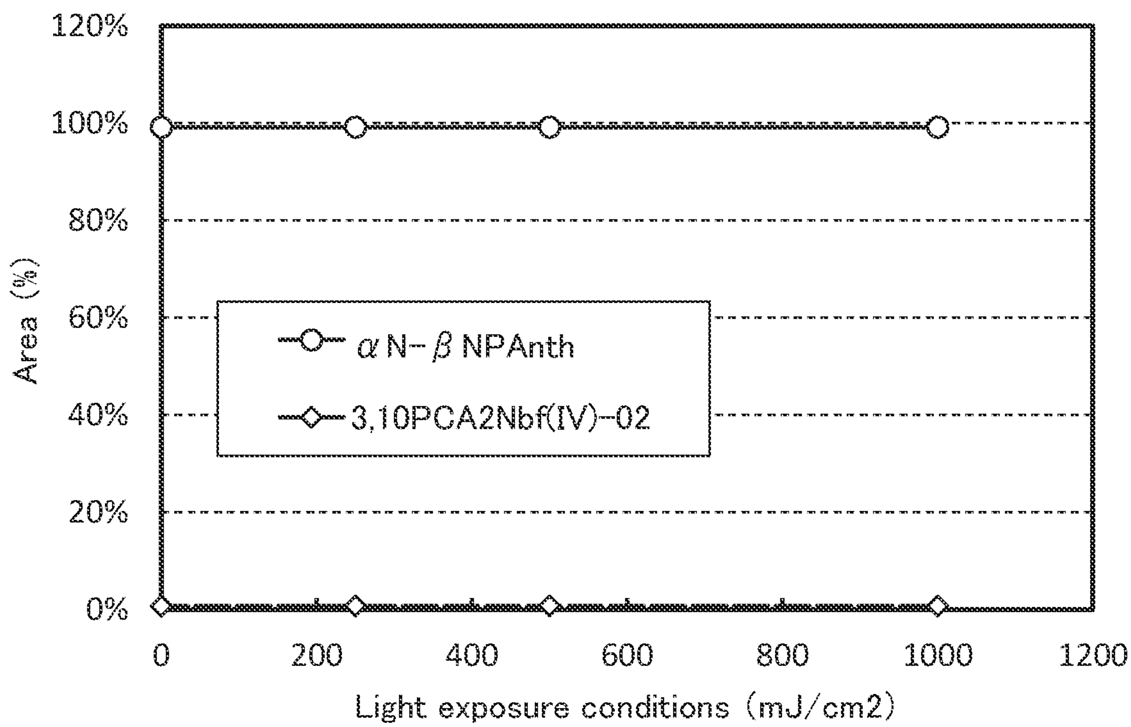
FIG. 33 is a diagram showing liquid chromatography mass spectrometry results of a sample in an example.

FIG. 33 is a diagram showing liquid chromatography mass spectrometry results of the sample 1.

Figure 34:
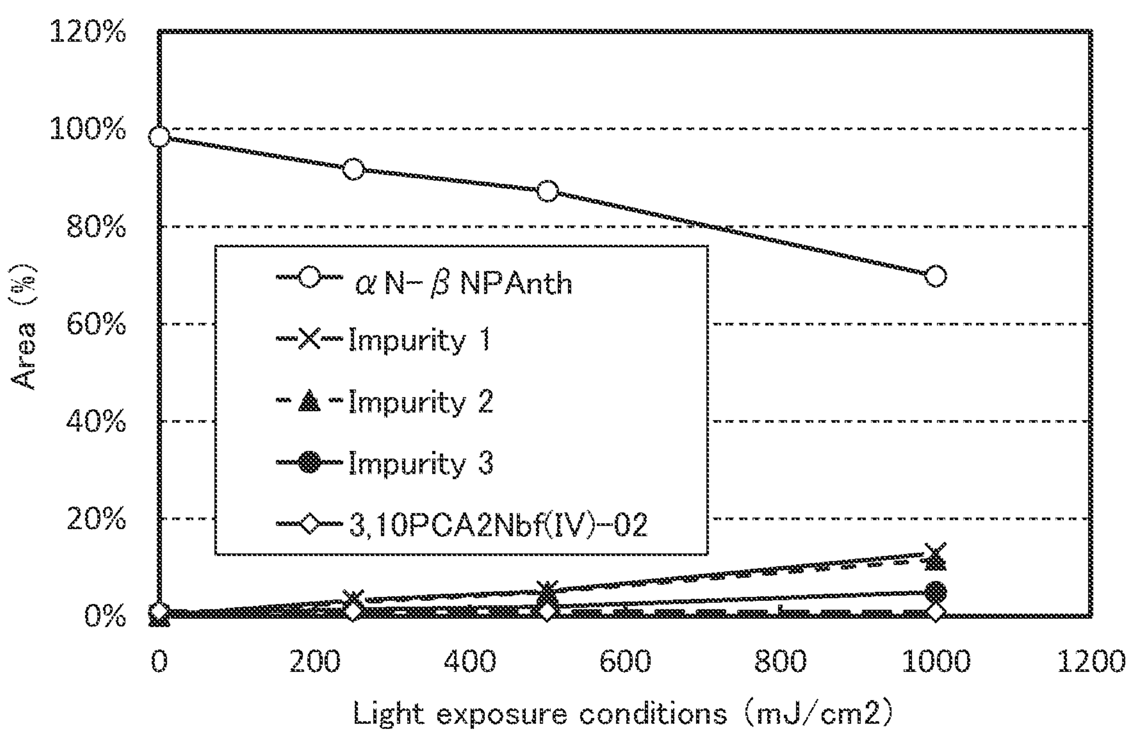
FIG. 34 is a diagram showing liquid chromatography mass spectrometry results of a sample in an example.

FIG. 34 is a diagram showing liquid chromatography mass spectrometry results of the comparative sample 1.

Figure 35:
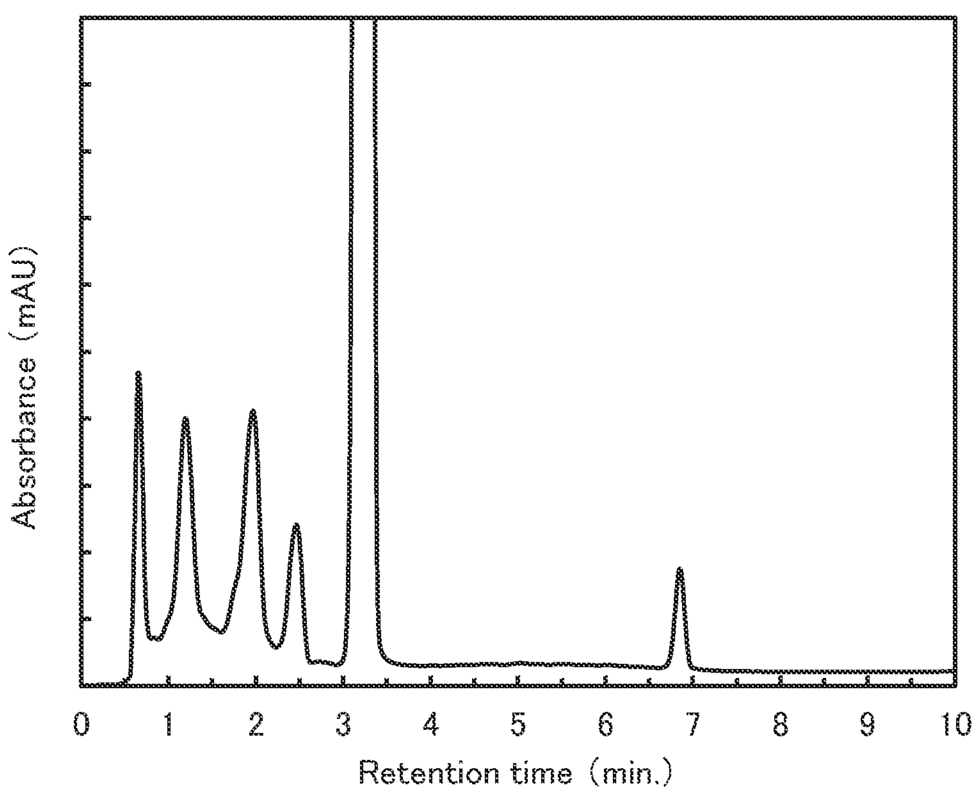
FIG. 35 shows a liquid chromatogram of a comparative sample 1.

FIG. 35 shows a liquid chromatogram of the comparative sample 1.

<Sample 1>

The fabricated sample 1 described in this example has the same structure as a sample 550× (see FIG. 31).

<<Structure of Sample 1>>

Table 1 shows the structure of the sample 1. The structural formulae of materials used in the sample described in this example are shown below. Note that in the tables in this example, subscript and superscript characters are written in ordinary size for convenience. For example, a subscript character in an abbreviation or a superscript character in a unit are written in ordinary size in the tables. The corresponding description in the specification gives an accurate reading of such notations in the tables.

TABLE 1

| Component | Reference numeral | Material | Composition ratio | Thickness/ nm |
|---|---|---|---|---|
| Layer | 118 | Al2O*x* | | 45 |
| Layer | 553 | αN-βNPAnth:3, 10PCA2Nbf(IV)-02 | 1:0.015 | 25 |

[Chemical Formula 1]

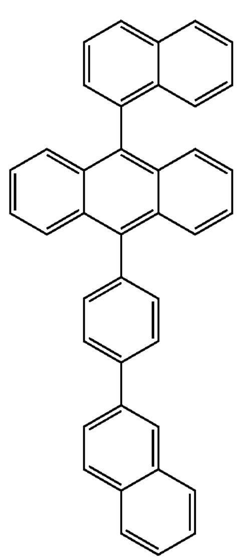

α N-β NP Anth

-continued

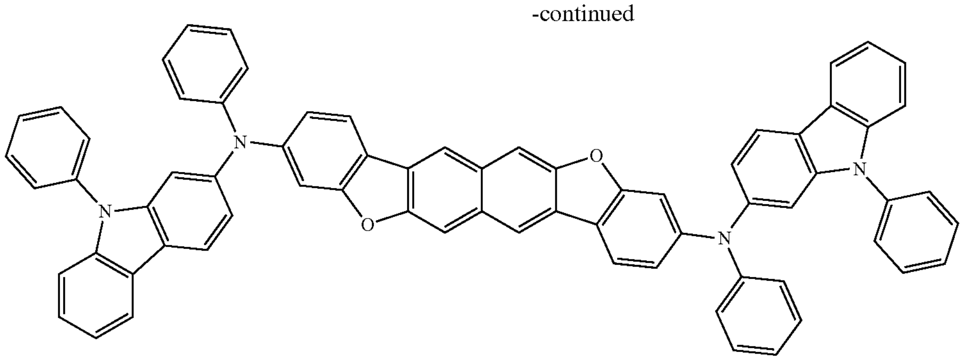

3.10PCA2Nbf(IV)-02

<<Fabrication Method of Sample 1>>

A plurality of samples 1 described in this example were fabricated by a method including the following steps.

[First Step]

In the first step, a layer 553 was formed over a quartz substrate. Specifically, the materials were deposited by co-evaporation using a resistance-heating method.

Note that the layer 553 contains 9-(1-naphthyl)-10-[4-(2-naphthyl)phenyl]anthracene (abbreviation: αN-BNPAnth) and 3,10-bis [N-(9-phenyl-9H-carbazol-2-yl)-N-phenylamino]naphtho [2,3-b;6,7-b']bisbenzofuran (abbreviation: 3,10PCA2Nbf(IV)-02) at αN-BNPAnth: 3,10PCA2Nbf(IV)-02=1:0.015 (weight ratio) and has a thickness of 25 nm. The layer 553 has an area of approximately 9 $cm^2$ (approximately 3 cm×approximately 3 cm). Note that 3,10PCA2Nbf(IV)-02 is a light-emitting material that can be used for a light-emitting layer of a light-emitting device, and αN-βNPAnth is a host material that can be used for a light-emitting layer of a light-emitting device. In addition, 3,10PCA2Nbf(IV)-02 emits blue fluorescent light.

[Second Step]

In the second step, the mask layer 118 was formed over the layer 553. Specifically, the mask layer 118 was deposited at a temperature of 80° C. by an atomic layer deposition (ALD) method.

Note that the mask layer 118 contains aluminum oxide (abbreviation: $Al_2O_x$) and has a thickness of 45 nm.

<<Light Exposure Conditions>>

The fabricated samples 1 were irradiated with light with the use of a mercury lamp. Specifically, a side where the layer 553 was formed was irradiated with light. The energy of the irradiation light was set to three levels: 250 mJ/$cm^2$, 500 mJ/$cm^2$, and 1000 mJ/$cm^2$. Note that the irradiation light includes light with a wavelength of 436 nm, a light with a wavelength of 405 nm, and light with a wavelength of 365 nm.

<<Evaluation Method 1>>

The above samples with varied light exposure conditions were subjected to photoluminescence (PL) measurement. A ratio with respect to the intensity of the PL spectrum of the sample not subjected to light exposure with a mercury lamp was used for the evaluation. Note that the measurement was performed using a spectrophotometer (FP-8600DS) produced by JASCO Corporation.

<<Evaluation Method 2>>

The above samples with varied light exposure conditions were subjected to liquid chromatography mass spectrometry (LC-MS). First, a solvent in which acetonitrile and chloroform were mixed at a volume ratio of acetonitrile:chloroform=7:3 and one of the above samples was put in a vial bottle, and the vial bottle was irradiated with ultrasonic waves for 10 minutes with a ultrasonic cleaning machine. The solution was removed from the vial bottle and filtered with a porous polytetrafluoroethylene (abbreviation: PTFE) filter having a hole diameter of 0.2 μm to give a filtrate. The filtrate was used as a measurement sample. Note that LC (liquid chromatography) separation was carried out with ACQUITY UPLC (registered trademark) produced by Waters Corporation, and MS analysis (mass spectrometry) was carried out with Xevo G2 Tof MS produced by Waters Corporation.

<<Characteristics of Sample 1>>

Table 2 shows the characteristics of the sample 1 that were obtained as a result of the evaluations. Table 2 also shows the characteristics of the comparative sample 1 described later.

TABLE 2

| | Evaluation method 1 Emission intensity | Evaluation method 2 Amount of impurities |
|---|---|---|
| Sample 1 | Not changed | Not detected |
| Comparative sample 1 | Attenuated | Increased |

As a result of the PL measurement on the sample 1, light emission derived from 3,10PCA2Nbf(IV)-02 was observed. Light emission was also observed in each of the samples with varied light exposure conditions. No significant change was observed in the intensity compared with the sample not subjected to light exposure (see FIG. 32). It was confirmed from these results that the mask layer 118 had an effect of protecting the layer 553.

Meanwhile, as a result of the PL measurement on the comparative sample 1, a significant change was observed with light exposure using a mercury lamp. As a result of irradiation with light having an energy of 250 mJ/$cm^2$, the emission intensity of the comparative sample 1 became 1/10 or less. The layer 553 in an exposed state was changed in quality by light irradiation.

As a result of the liquid chromatography mass spectrometry on the sample 1, a signal derived from αN-βNPAnth and a signal derived from 3,10PCA2Nbf(IV)-02 were observed. In addition, no significant change was observed in any of the samples with varied light exposure conditions as compared with the sample not subjected to light exposure (see FIG.

33). It was confirmed from these results that the mask layer 118 had an effect of protecting the layer 553.

Meanwhile, as a result of the liquid chromatography mass spectrometry on the comparative sample 1, a significant change was observed with light exposure using a mercury lamp (see FIG. 35). First, a signal derived from αN-βNPAnth was observed in the retention period of 3.0 minutes to 3.5 minutes, a signal derived from 3,10PCA2Nbf (IV)-02 was observed in the retention period from 6.5 minutes to 7.0 minutes, and a signal derived from the mixed solvent used for fabricating the sample was observed in the retention period from 0.5 minutes to 1.0 minute. Besides, a signal derived from an impurity 1 was observed in the retention period from 1.0 minute to 1.5 minutes, a signal derived from an impurity 2 was observed in the retention period from 1.5 minutes to 2.2 minutes, and a signal derived from an impurity 3 was observed in the retention period from 2.3 minutes to 2.6 minute. The amount of the observed impurities was increased with an increase in irradiation energy by the mercury lamp (see FIG. 34).

The layer 553 in an exposed state was changed in quality by light irradiation. From the results of the mass spectrometry on the impurity 1, the impurity 2, and the impurity 3, positive ions with a mass increased by 32 compared with αN-βNPAnth and positive ions with an increased mass of two oxygen atoms were detected. The results suggested that there was a possibility that, for example, oxygen or water contained in the air or the solution used in the process reacted with αN-βNPAnth to generate an oxide in which oxygen was bonded to an anthracene skeleton. That is, the impurity 1, the impurity 2, and the impurity 3 can be considered to be oxygen adducts of αN-βNPAnth. Since the 9-position or the 10-position of an anthracene skeleton is easily bonded to oxygen, the impurity 1, the impurity 2, and the impurity 3 can be considered to be oxygen adducts represented by the structure shown below, for example. In other words, the mask layer 118 can be considered to have an effect of inhibiting oxygen from entering the layer 553.

[Chemical Formula 2]

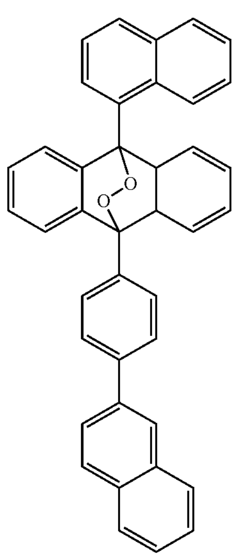

Reference Example

The fabricated comparative sample 1 described in this reference example is different from the sample 1 in not including the mask layer 118. Different portions are described in detail here, and the above description is referred to for portions formed by a similar method.

<<Structure of Comparative Sample 1>>

The comparative sample 1 is different from the sample 1 in that the mask layer 118 is not included and the layer 553 is exposed on the surface.

<<Fabrication Method of Comparative Sample 1>>

The fabrication method of the comparative sample 1 has only Step 1 of forming the layer 553.

<<Light Exposure Conditions>>

The fabricated samples were irradiated with light with the use of a mercury lamp. Specifically, a side where the layer 553 was formed was irradiated with light. The energy of the irradiation light was set to three levels: 250 $mJ/cm^2$, 500 $mJ/cm^2$, and 1000 $mJ/cm^2$. Note that since the layer 553 is exposed on the surface of the comparative sample 1, the layer 553 is exposed to light while in contact with the air.

<<Evaluation Method 1>>

The above samples with varied light exposure conditions were subjected to photoluminescence (PL) measurement. A ratio with respect to the intensity of the PL spectrum of the sample not subjected to light exposure with a mercury lamp was used for the evaluation. Note that the measurement was performed using a spectrophotometer (FP-8600DS) produced by JASCO Corporation.

<<Evaluation Method 2>>

The above samples with varied light exposure conditions were subjected to liquid chromatography mass spectrometry (LC-MS). First, a solvent in which acetonitrile and chloroform were mixed at a volume ratio of acetonitrile:chloroform=7:3 and one of the above samples was put in a vial bottle, and the vial bottle was irradiated with ultrasonic waves for 10 minutes with a ultrasonic cleaning machine. The solution was removed from the vial bottle and filtered with a porous polytetrafluoroethylene (abbreviation: PTFE) filter having a hole diameter of 0.2 μm to give a filtrate. The filtrate was used as a measurement sample. Note that LC (liquid chromatography) separation was carried out with ACQUITY UPLC (registered trademark) produced by Waters Corporation, and MS analysis (mass spectrometry) was carried out with Xevo G2 Tof MS produced by Waters Corporation.

<<Characteristics of Comparative Sample 1>>

Table 2 shows the characteristics of the comparative sample 1 that were obtained as a result of the evaluations.

Example 2

In this example, an effect of a mask layer protecting an organic compound will be described with reference to FIG. 31 and FIG. 37.

FIG. 31 is a diagram illustrating the structure of a sample.

Figure 37:
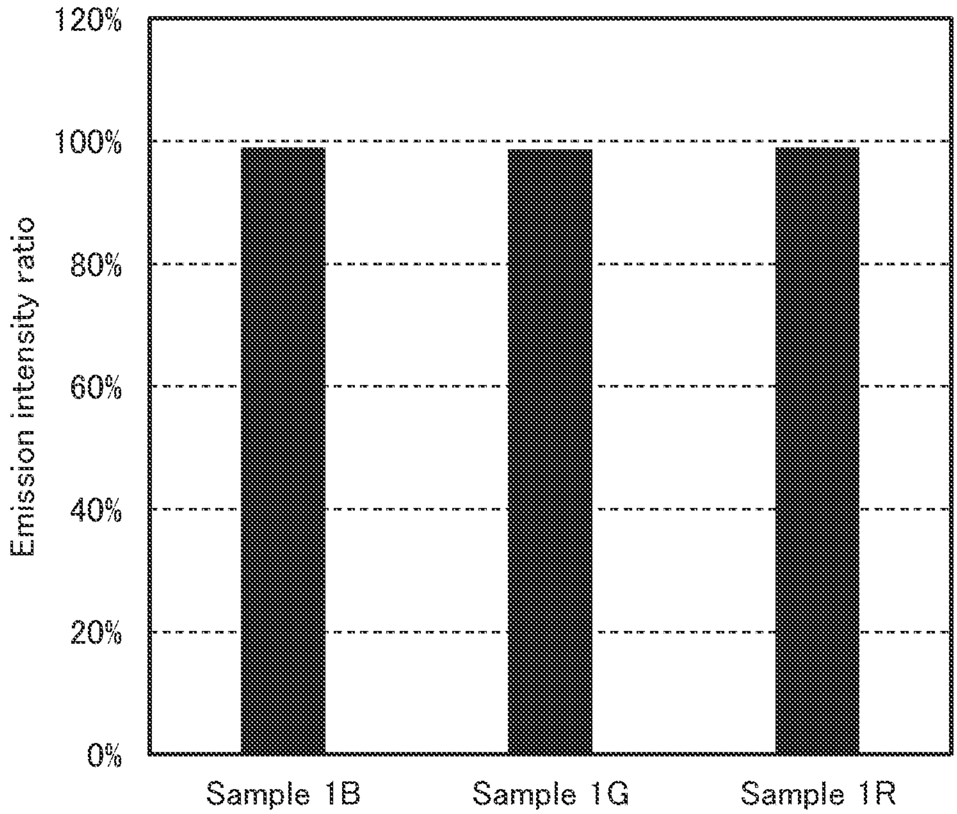
FIG. 37 is a diagram illustrating a change in emission intensity due to light exposure of samples in an example.

FIG. 37 is a diagram illustrating a comparison in emission intensity between samples after light irradiation and the samples before light irradiation.

<Sample 1B>

The fabricated sample 1 described in this example has the same structure as the sample 550× (see FIG. 31).

<<Structure of Sample 1B>>

A sample 1B has the same structure as the sample 1 described in Example 1.

<<Fabrication Method of Sample 1B>>

The sample 1B was fabricated by the same method as the sample 1 described in Example 1.

<<Light Exposure Conditions>>

The fabricated sample 1B was irradiated with light with the use of a mercury lamp. Specifically, a side where the layer 553 was formed was irradiated with light. The energy of the irradiation light was set to 500 mJ/cm$^2$. Note that the irradiation light includes light with a wavelength of 436 nm, a light with a wavelength of 405 nm, and light with a wavelength of 365 nm.

<<Evaluation Method 1>>

The above sample 1B was subjected to photoluminescence (PL) measurement. A ratio with respect to the intensity of the PL spectrum of the sample not subjected to light exposure with a mercury lamp was used for the evaluation. The sample whose intensity of the PL spectrum after light exposure was 80% or more of that of the sample not subjected to light exposure was evaluated as good "O", and the sample whose intensity of the PL spectrum was less than 80% thereof was evaluated as bad "X". Note that the measurement was performed using a spectrophotometer (FP-8600DS) produced by JASCO Corporation.

<<Characteristics of Sample 1B>>

Table 3 shows the characteristics of the sample 1B that were obtained as a result of the evaluation. Table 3 also shows the characteristics of a sample 1G, a sample 1R, a comparative sample 1B, a comparative sample 1G, and a comparative sample 1R described later. In addition, FIG. 37 shows the comparison of the emission intensity after light irradiation with the emission intensity before light irradiation.

TABLE 3

| | Evaluation results |
|---|---|
| Sample 1B | ○ |
| Sample 1G | ○ |
| Sample 1R | ○ |
| Comparative sample 1B | X |
| Comparative sample 1G | X |
| Comparative sample 1R | X |

As a result of the PL measurement on the sample 1B, light emission was observed. In addition, the intensity of the PL spectrum was greater than or equal to 80% of that of the sample not subjected to light exposure (see FIG. 37). It was confirmed from these results that the mask layer 118 had an effect of protecting the layer 553. Similarly, it was confirmed that the mask layer 118 had an effect of protecting the layer 553 in the cases of the sample 1G and the sample 1R.

Figure 38:
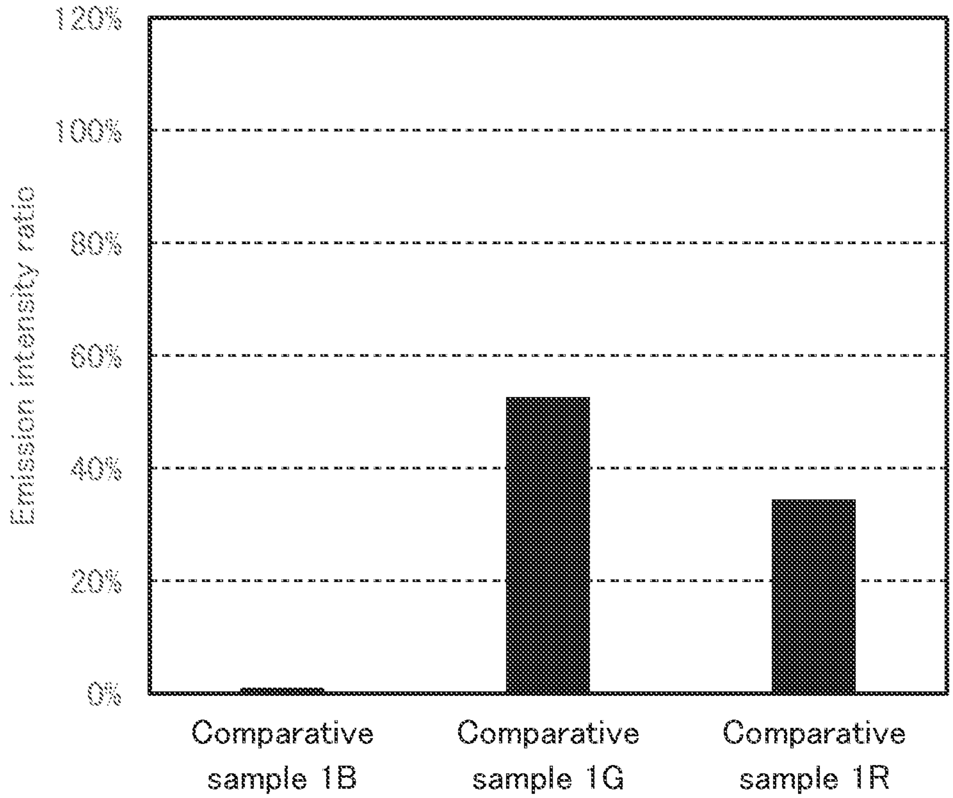
FIG. 38 is a diagram illustrating a change in emission intensity due to light exposure of comparative samples in a reference example.

Meanwhile, in the cases of the comparative sample 1B, the comparative sample 1G, and the comparative sample IR, the intensity of the PL spectrum was less than 80% of that of the sample not subjected to light exposure (see FIG. 38). The layer 553 in an exposed state was changed in quality by the light irradiation.

<Sample 1G>

The fabricated sample 1G described in this example has the same structure as the sample 550× (see FIG. 31).

<<Structure of Sample 1G>>

Table 4 shows the structure of the sample 1G. Note that in the tables in this example, subscript and superscript characters are written in ordinary size for convenience. For example, a subscript character in an abbreviation or a superscript character in a unit are written in ordinary size in the tables. The corresponding description in the specification gives an accurate reading of such notations in the tables.

TABLE 4

| Component | Reference numeral | Material | Composition ratio | Thickness/nm |
|---|---|---|---|---|
| Layer | 118 | Al2O*x* | | 45 |
| Layer | 553 | HOSTG1:HOSTG2:GUESTG | 0.6:0.4:0.05 | 40 |

<<Fabrication Method of Sample 1G>>

The sample 1G described in this example was fabricated by a method including the following steps.

Note that the fabrication method of the sample 1G is different from the fabrication method of the sample 1B in the first step. Different portions are described in detail here, and the above description is referred to for portions formed by a similar method.

[First Step]

In the first step, the layer 553 was formed over a quartz substrate. Specifically, the materials were deposited by co-evaporation using a resistance-heating method.

Note that the layer 553 contains HOSTG1, HOSTG2, and GUESTG at HOSTG1:HOSTG2:GUESTG=0.6:0.4:0.05 (weight ratio) and has a thickness of 40 nm. HOSTG1 and HOSTG2 are organic compounds having a carrier-transport property, and GUESTG is a light-emitting organic compound that emits green light.

<<Light Exposure Conditions>>

The fabricated sample 1G was irradiated with light with the use of a mercury lamp. Specifically, a side where the layer 553 was formed was irradiated with light. The energy of the irradiation light was set to three levels: 250 mJ/cm$^2$, 500 mJ/cm$^2$, and 1000 mJ/cm$^2$. Note that the irradiation light includes light with a wavelength of 436 nm, a light with a wavelength of 405 nm, and light with a wavelength of 365 nm.

<<Evaluation Method 1>>

The above sample 1G was subjected to photoluminescence (PL) measurement. A ratio with respect to the intensity of the PL spectrum of the sample not subjected to light exposure with a mercury lamp was used for the evaluation. Note that the measurement was performed using a spectrophotometer (FP-8600DS) produced by JASCO Corporation.

<<Evaluation Method 2>>

A plurality of samples 1G having the above structure were prepared and irradiated with light with a variety of energy to fabricate a plurality of samples. The samples were each subjected to liquid chromatography mass spectrometry (LC-MS).

Acetonitrile and chloroform were mixed at a volume ratio of acetonitrile:chloroform=7:3 to form a mixed solvent. One of the samples exposed to different amounts of light was selected and put in a vial bottle, the mixed solvent was added thereto, and the vial bottle was irradiated with ultrasonic waves for 10 minutes with a ultrasonic cleaning machine. The solution was removed from the vial bottle and filtered with a porous polytetrafluoroethylene (abbreviation: PTFE) filter having a hole diameter of 0.2 μm to give a filtrate. LC (liquid chromatography) separation was carried out with ACQUITY UPLC (registered trademark) produced by Waters Corporation, and MS analysis (mass spectrometry) was carried out with Xevo G2 Tof MS produced by Waters Corporation.

<<Characteristics of Sample 1G>>

Figure 44:
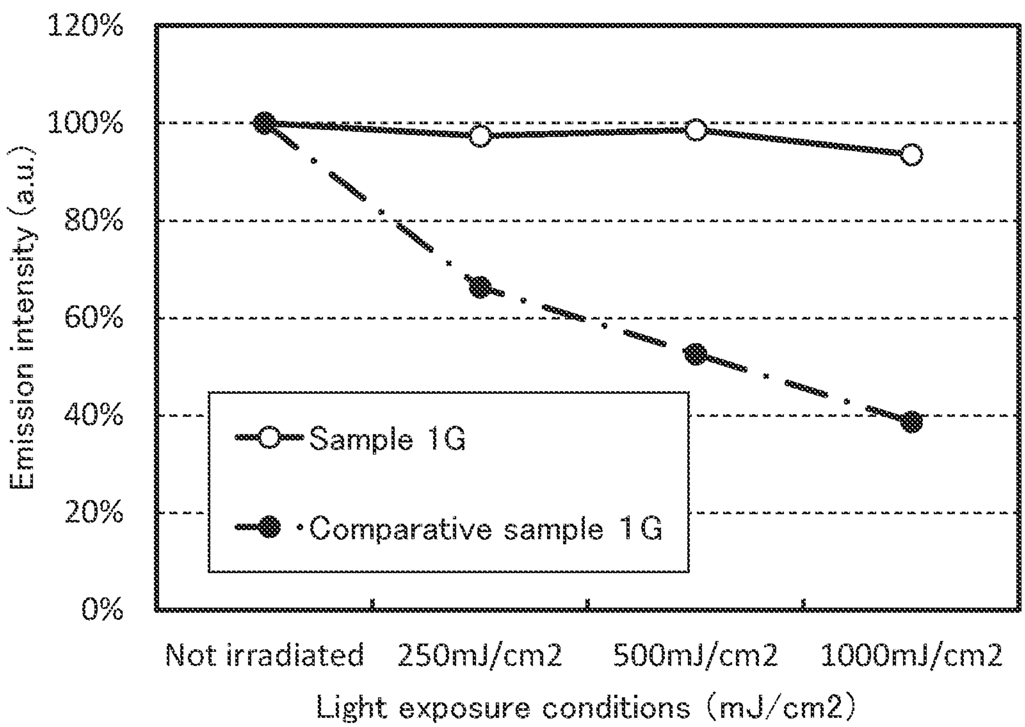
FIG. 44 is a diagram showing relative intensity of photoluminescence of samples in an example.

Table 3 shows the characteristics of the sample 1G that were obtained by the evaluation method 1. FIG. 44 shows the comparison of the emission intensity after light exposure with the emission intensity before light irradiation. Table 3 and FIG. 44 also show the characteristics of the comparative sample 1G described later.

As a result of the PL measurement on the sample 1G, green light emission derived from GUESTG was observed. Light emission was also observed in each of the samples with different light exposure conditions. No significant change was observed in the intensity compared with the sample not subjected to light exposure (see FIG. 44). It was confirmed from these results that the mask layer 118 had an effect of protecting the layer 553.

Meanwhile, as a result of the PL measurement on the comparative sample 1G, a significant change was observed with light exposure using a mercury lamp. As a result of irradiation with light having an energy of 250 mJ/cm$^2$, the emission intensity of the comparative sample 1G became 1/7 or less. The layer 553 in an exposed state was changed in quality by the light exposure.

Figure 45:
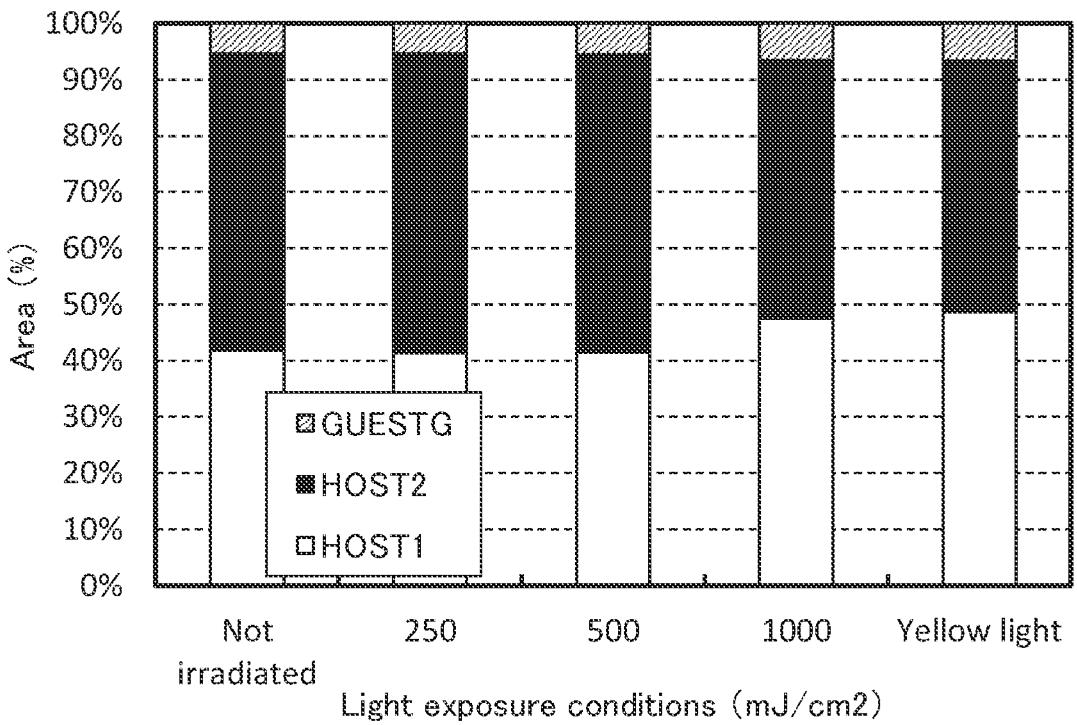
FIG. 45 is a diagram showing liquid chromatography mass spectrometry results of a sample in an example.
Figure 46:
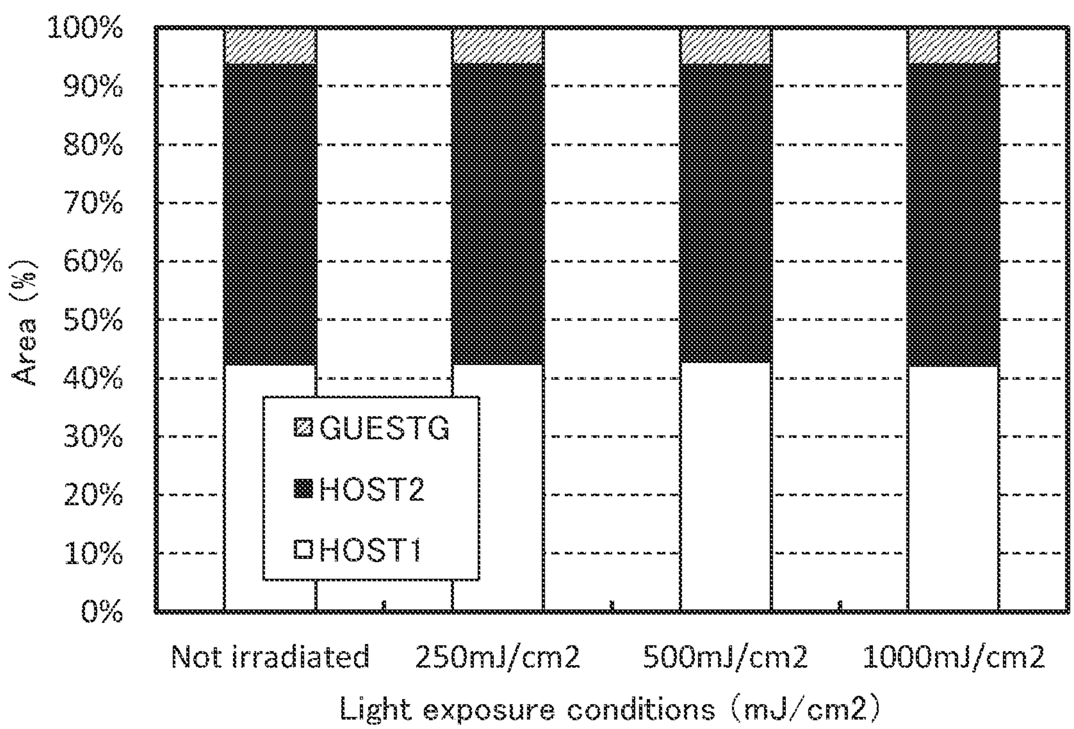
FIG. 46 is a diagram showing liquid chromatography mass spectrometry results of a sample in an example.

Table 5 shows the characteristics of the sample 1G that were obtained by the evaluation method 2. FIG. 45 shows the results of liquid chromatography mass spectrometry on the samples with different light exposure conditions. Table 5 and FIG. 46 show the characteristics of the comparative sample 1G described later.

TABLE 5

| | Evaluation method 1 Emission intensity | Evaluation method 2 Amount of impurities |
|---|---|---|
| Sample 1G | Not changed | Not detected |
| Comparative sample 1G | Attenuated | Not detected |

As a result of liquid chromatography mass spectrometry on the sample 1G, signals derived from HOSTG2, HOSTG1, and GUESTG were observed. No significant change was observed in any of the samples with different conditions as compared with the sample 1G not subjected to light exposure (see FIG. 45). It was confirmed from these results that the mask layer 118 had an effect of protecting the layer 553.

Note that as a result of liquid chromatography mass spectrometry on the comparative sample 1G, no significant change was observed even with light irradiation using a mercury lamp (see FIG. 46). A change due to light exposure was not able to be detected by liquid chromatography mass spectrometry.

<Sample 1R>

The fabricated sample 1G described in this example has the same structure as the sample 550× (see FIG. 31).

<<Structure of Sample 1R>>

Table 6 shows the structure of the sample 1R.

TABLE 6

| Component | Reference numeral | Material | Composition ratio | Thickness/ nm |
|---|---|---|---|---|
| Layer | 118 | Al2O*x* | | 45 |
| Layer | 553 | HOSTR:HTM1:GUESTR | 0.7:0.3:0.05 | 40 |

<<Fabrication Method of Sample 1R>>

The sample 1R described in this example was fabricated by a method including the following steps.

Note that the fabrication method of the sample 1R is different from the fabrication method of the sample 1B in the first step. Different portions are described in detail here, and the above description is referred to for portions formed by a similar method.

[First Step]

In the first step, the layer 553 was formed over a quartz substrate. Specifically, the materials were deposited by co-evaporation using a resistance-heating method.

Note that the layer 553 contains HOSTR, HTM1, and GUESTR at HOSTR:HTM1:GUESTR=0.7:0.3:0.05 (weight ratio) and has a thickness of 40 nm. HOSTR is an organic compound having a carrier-transport property, and GUESTR is a light-emitting organic compound that emits red light.

<<Light Exposure Conditions>>

The fabricated sample 1R was irradiated with light with the use of a mercury lamp. Specifically, a side where the layer 553 was formed was irradiated with light. The energy of the irradiation light was set to 250 mJ/cm$^2$, 500 mJ/cm$^2$, and 1000 mJ/cm$^2$. Note that the irradiation light includes light with a wavelength of 436 nm, a light with a wavelength of 405 nm, and light with a wavelength of 365 nm.

<<Evaluation Method 1>>

The above sample 1R was subjected to photoluminescence (PL) measurement. A ratio with respect to the intensity of the PL spectrum of the sample not subjected to light exposure with a mercury lamp was used for the evaluation. Note that the measurement was performed using a spectrophotometer (FP-8600DS) produced by JASCO Corporation.

<<Evaluation Method 2>>

A plurality of samples IR having the above structure were prepared and irradiated with light with a variety of energy to fabricate a plurality of samples. The samples were each subjected to liquid chromatography mass spectrometry (LC-MS).

Acetonitrile and chloroform were mixed at a volume ratio of acetonitrile:chloroform=7:3 to form a mixed solvent. One of the samples exposed to different amounts of light was selected and put in a vial bottle, the mixed solvent was added thereto, and the vial bottle was irradiated with ultrasonic waves for 10 minutes with a ultrasonic cleaning machine. The solution was removed from the vial bottle and filtered with a porous polytetrafluoroethylene (abbreviation: PTFE) filter having a hole diameter of 0.2 μm to give a filtrate. LC (liquid chromatography) separation was carried out with ACQUITY UPLC (registered trademark) produced by Waters Corporation, and MS analysis (mass spectrometry) was carried out with Xevo G2 Tof MS produced by Waters Corporation.

<<Characteristics of Sample 1R>>

Figure 47:
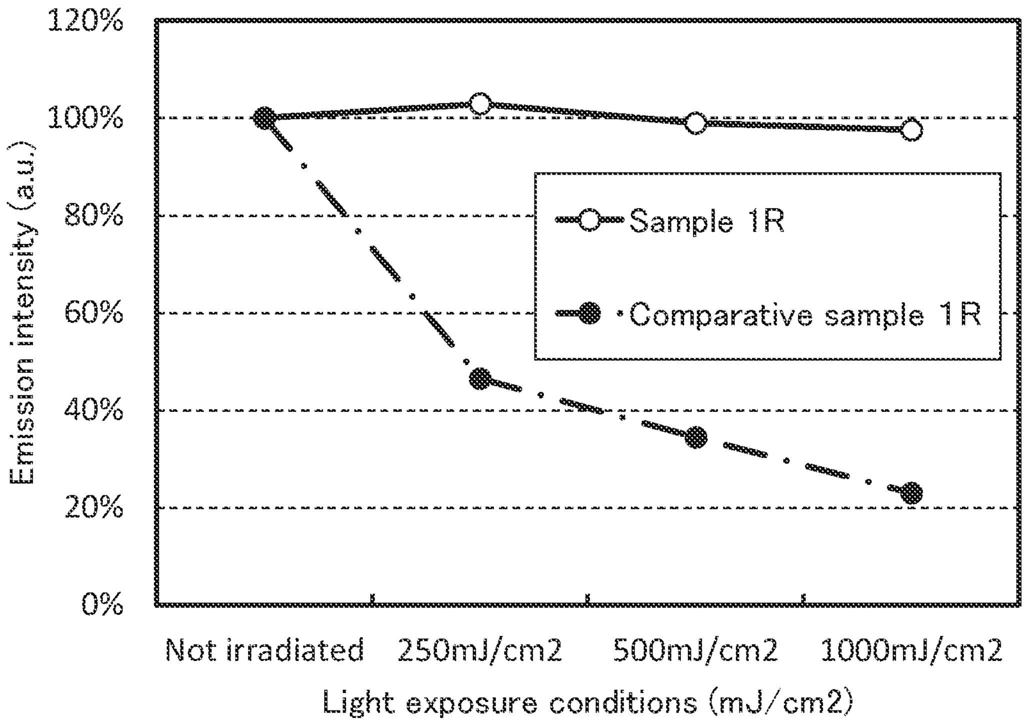
FIG. 47 is a diagram showing relative intensity of photoluminescence of samples in Example.

Table 3 shows the characteristics of the sample 1R that were obtained by the evaluation method 1. FIG. 47 shows the comparison of the emission intensity after light exposure with the emission intensity before light irradiation. Table 3 and FIG. 47 also show the characteristics of the comparative sample 1R described later.

As a result of the PL measurement on the sample IR, red light emission derived from GUESTR was observed. Light emission was also observed in each of the samples with different light exposure conditions. No significant change was observed in the intensity compared with the sample not subjected to light exposure (see FIG. 47). It was confirmed from these results that the mask layer 118 had an effect of protecting the layer 553.

Meanwhile, as a result of the PL measurement on the comparative sample IR, a significant change was observed with light exposure using a mercury lamp. As a result of irradiation with light having an energy of 250 mJ/cm$^2$, the emission intensity of the comparative sample 1R became ⅕ or less. The layer 553 in an exposed state was changed in quality by light irradiation.

Figure 48:
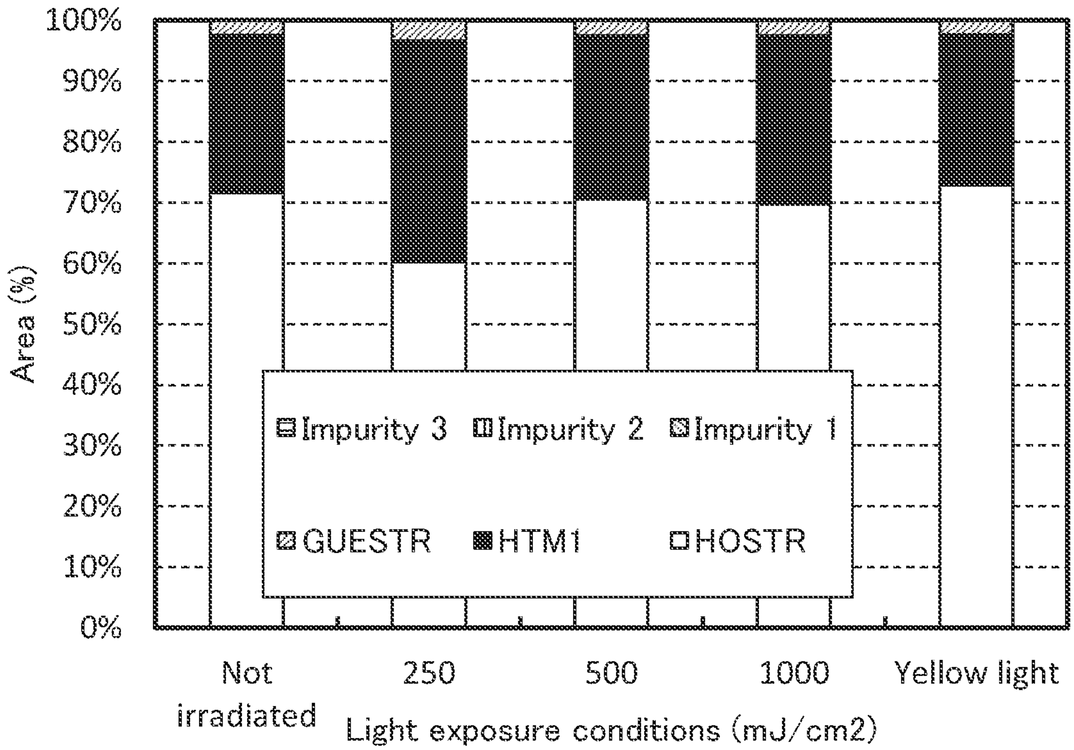
FIG. 48 is a diagram showing liquid chromatography mass spectrometry results of a sample in an example.
Figure 49:
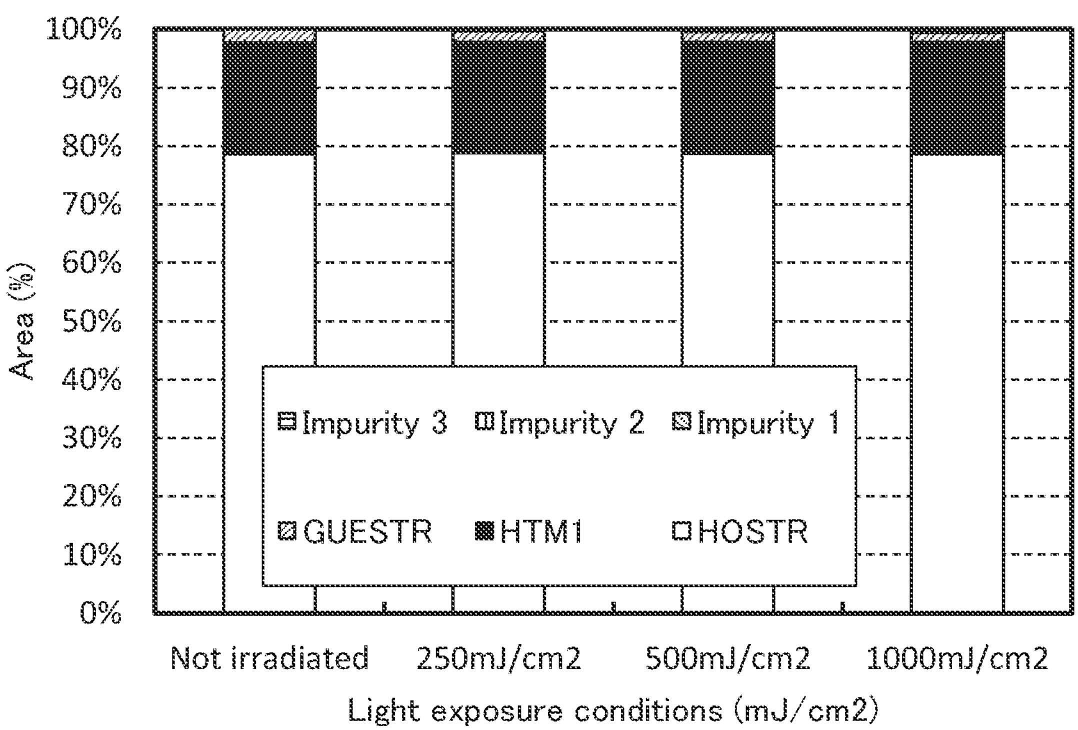
FIG. 49 is a diagram showing liquid chromatography mass spectrometry results of a sample in an example.

Table 7 shows the characteristics of the sample 1R that were obtained by the evaluation method 2. FIG. 48 shows the results of liquid chromatography mass spectrometry on the samples with different light exposure conditions. Table 7 and FIG. 49 show the characteristics of the comparative sample 1G described later.

TABLE 7

| | Evaluation method 1 Emission inensity | Evaluation method 2 Amount of impurities |
|---|---|---|
| Sample 1R | Not changed | Note detected |
| Comparative sample 1R | Attenuated | Increased |

As a result of liquid chromatography mass spectrometry on the sample 1R, signals derived from HTM1, HOSTR, and GUESTR were observed. No significant change was observed in any of the samples with different conditions as compared with the sample 1R not subjected to light exposure (see FIG. 48). It was confirmed from these results that the mask layer 118 had an effect of protecting the layer 553.

As a result of liquid chromatography mass spectrometry on the comparative sample 1R, a significant change was observed with light exposure using a mercury lamp (see FIG. 49). Specifically, the impurity 1, the impurity 2, and the impurity 3 were detected with light exposure. The molecular structures of a deterioration product 1 and a deterioration product 3 were not clear because their mass spectra were not detected, whereas positive ions with m/z of 361 were detected in a deterioration product 2.

It can be considered that the positive ion with m/z of 361 is deterioration product generated owing to cleavage of a pyrazine ring of HOSTR. It suggests a possibility that oxygen, water, or the like contained, for example, in the air or a chemical solution in the process reacted with HOSTR, and a hetero ring of the HOSTR was cleaved to generate the deterioration product 2. For example, the impurity 2 can be a deterioration product represented by the structure shown below. Accordingly, the mask layer 118 has an effect of inhibiting the air from entering the layer 553. In addition, it can be considered that the mask layer 118 has an effect of inhibiting generation of a deterioration product.

[Chemical formula 3]

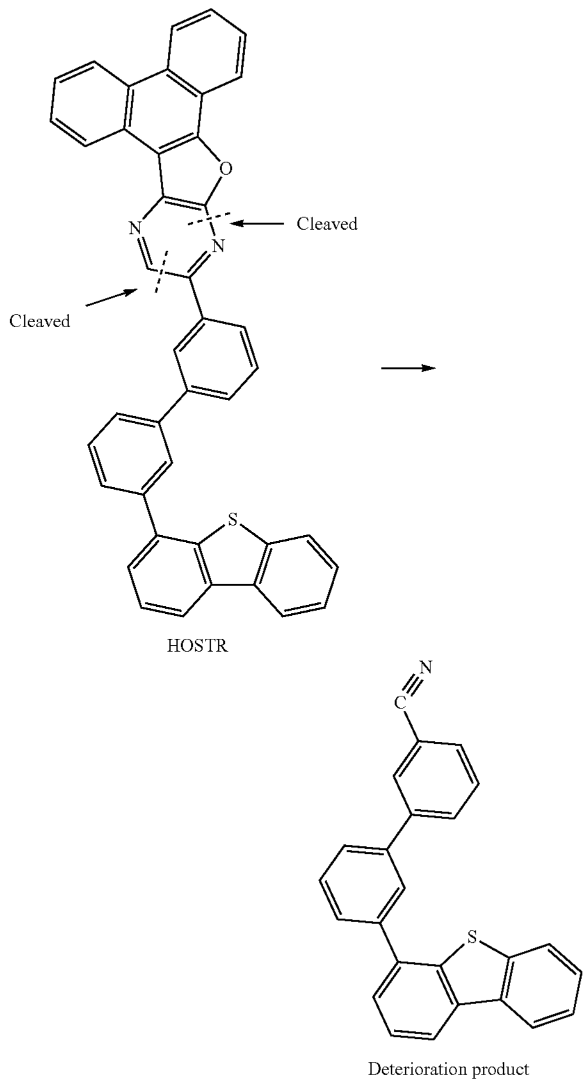

Reference Example

In this reference example, the layer 553 exposed to light in the state of being in contact with the air is described with reference to FIG. 31 and FIG. 38.

The fabricated comparative sample 1B, comparative sample 1G, and comparative sample 1R described in this reference example are different from the sample 1B, the sample 1G, or the sample 1R in not including the mask layer 118. Different portions are described in detail here, and the above description is referred to for portions formed by a similar method.

<<Structure of Comparative Sample 1B>>

The comparative sample 1B is different from the sample 1B in that the mask layer 118 is not included and the layer 553 is exposed on the surface.

<<Fabrication Method of Comparative Sample 1B>>

The fabrication method of the comparative sample 1B has only Step 1 of forming the layer 553.

<<Light Exposure Conditions>>

The fabricated sample was irradiated with light with the use of a mercury lamp. Specifically, a side where the layer 553 was formed was irradiated with light. The energy of the irradiation light was set to 500 mJ/cm$^2$. Note that since the layer 553 is exposed on the surface of the comparative sample 1, the layer 553 is exposed to light while in contact with the air.

<<Evaluation Method 1>>

The above comparative sample 1B was subjected to photoluminescence (PL) measurement. A ratio with respect to the intensity of the PL spectrum of the sample not subjected to light exposure with a mercury lamp was used for the evaluation. The sample whose intensity of the PL spectrum became 80% or more owing to the light exposure with a mercury lamp was evaluated as good "O", and the sample whose intensity of the PL spectrum became less than 80% was evaluated as bad "X". Note that the measurement was performed using a spectrophotometer (FP-8600DS) produced by JASCO Corporation.

<<Characteristics of Comparative Sample 1B>>

Table 3 shows the characteristics of the comparative sample 1B that were obtained as a result of the evaluation. FIG. 38 shows the comparison of the emission intensity after light exposure with the emission intensity before light irradiation.

<<Structure of Comparative Sample 1G>>

The comparative sample 1G is different from the sample 1G in that the mask layer 118 is not included and the layer 553 is exposed on the surface.

<<Fabrication Method of Comparative Sample 1G>>

The fabrication method of the comparative sample 1G has only Step 1 of forming the layer 553.

<<Light Exposure Conditions>>

The fabricated sample was irradiated with light with the use of a mercury lamp. Specifically, a side where the layer 553 was formed was irradiated with light. The energy of the irradiation light was set to 500 mJ/cm$^2$. Note that since the layer 553 is exposed on the surface of the comparative sample 1, the layer 553 is exposed to light while in contact with the air.

<<Evaluation Method 1>>

The above comparative sample 1G was subjected to photoluminescence (PL) measurement. A ratio with respect to the intensity of the PL spectrum of the sample not subjected to light exposure with a mercury lamp was used for the evaluation. The sample whose intensity of the PL spectrum became 80% or more owing to the light exposure with a mercury lamp was evaluated as good "O", and the sample whose intensity of the PL spectrum became less than 80% was evaluated as bad "X". Note that the measurement was performed using a spectrophotometer (FP-8600DS) produced by JASCO Corporation.

<<Characteristics of Comparative Sample 1G>>

Table 3 shows the characteristics of the comparative sample 1G that were obtained as a result of the evaluation. FIG. 38 shows the comparison of the emission intensity after light exposure with the emission intensity before light irradiation.

<<Structure of Comparative Sample 1R>>

The comparative sample 1R is different from the sample 1G in that the mask layer 118 is not included and the layer 553 is exposed on the surface.

<<Fabrication Method of Comparative Sample 1R>>

The fabrication method of the comparative sample IR has only Step 1 of forming the layer 553

<<Light Exposure Conditions>>

The fabricated sample was irradiated with light with the use of a mercury lamp. Specifically, a side where the layer 553 was formed was irradiated with light. The energy of the irradiation light was set to 500 mJ/cm$^2$. Note that since the layer 553 is exposed on the surface of the comparative sample 1, the layer 553 is exposed to light while in contact with the air.

<<Evaluation Method 1>>

The above comparative sample IR was subjected to photoluminescence (PL) measurement. A ratio with respect to the intensity of the PL spectrum of the sample not subjected to light exposure with a mercury lamp was used for the evaluation. The sample whose intensity of the PL spectrum became 80% or more owing to the light exposure with a mercury lamp was evaluated as good "O", and the sample whose intensity of the PL spectrum became less than 80% was evaluated as bad "X". Note that the measurement was performed using a spectrophotometer (FP-8600DS) produced by JASCO Corporation.

<<Characteristics of Comparative Sample 1R>>

Table 3 shows the characteristics of the comparative sample 1R that were obtained as a result of the evaluation. FIG. 38 shows the comparison of the emission intensity after light exposure with the emission intensity before light irradiation.

Example 3

In this example, an effect of a mask layer protecting an organic compound will be described with reference to FIG. 39 and FIG. 41.

Figure 39A:
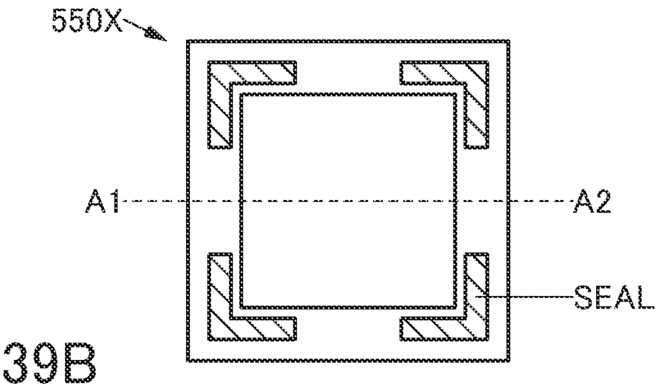
FIG. 39A and FIG. 39B are diagrams illustrating the structure of a sample in an example.
Figure 39B:
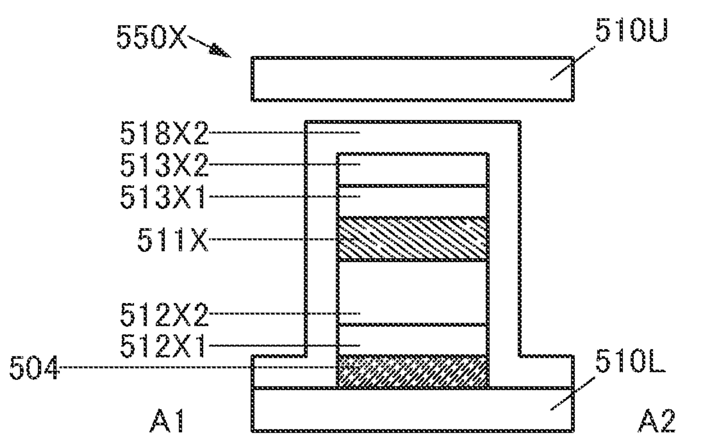

FIG. 39 illustrates the structure of a sample. FIG. 39A is a top view of the sample, and FIG. 39B is a cross-sectional view of the sample taken along the section line A1-A2 in FIG. 39A.

Figure 41:
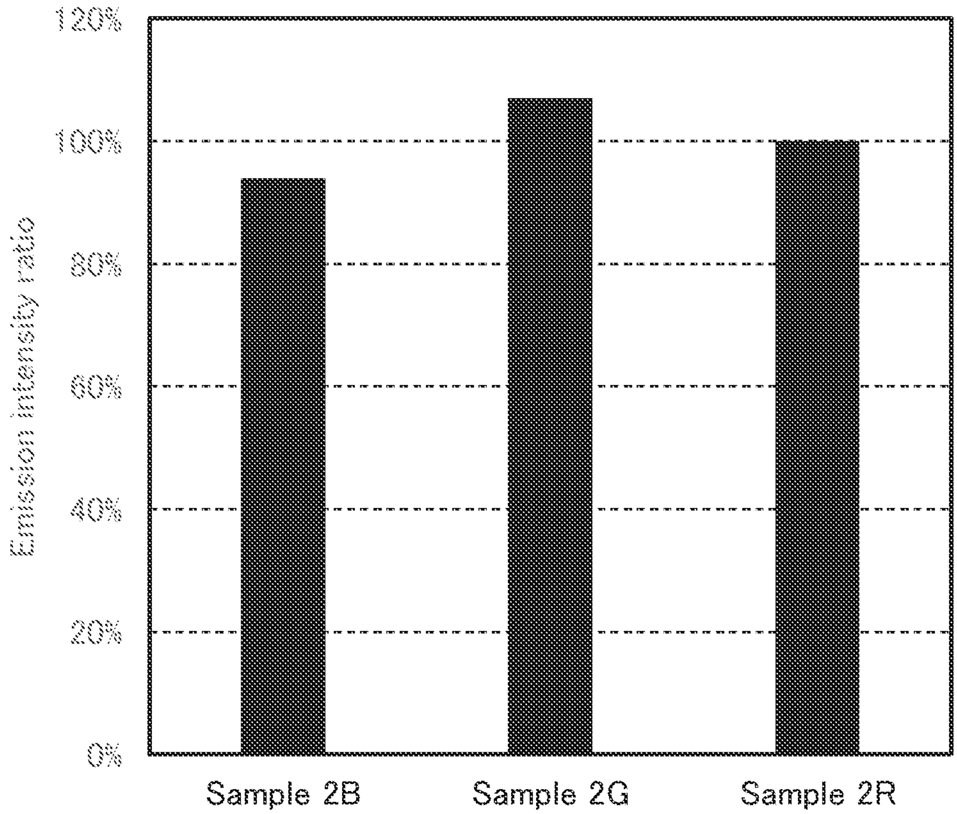
FIG. 41 is a diagram illustrating a change in emission intensity due to light exposure of samples in an example.

FIG. 41 is a diagram illustrating a comparison in emission intensity between samples after light irradiation and the samples before light irradiation.

<Sample 2B>

A fabricated sample 2B described in this example has the same structure as the sample 550× (see FIG. 39A and FIG. 39B). Note that X used in the reference numerals in the drawings is replaced with B, G, or R as appropriate and used for the description in this example.

<<Structure of Sample 2B>>

Table 8 shows the structure of the sample 2B. Note that in the tables in this example, subscript and superscript characters are written in ordinary size for convenience. For example, a subscript character in an abbreviation or a superscript character in a unit are written in ordinary size in the tables. The corresponding description in the specification gives an accurate reading of such notations in the tables.

TABLE 8

| Component | Reference numeral | Material | Composition ratio | Thickness/nm |
|---|---|---|---|---|
| Layer | 518B | Al2O*x* | | 45 |
| Layer | 513B2 | ETM2 | | 10 |
| Layer | 513B1 | ETM1 | | 20 |
| Layer | 511B | αN-βNPAnth:3, 10PCA2Nbf(IV)-02 | 1:0.015 | 25 |

TABLE 8-continued

| Component | Reference numeral | Material | Composition ratio | Thickness/ nm |
|---|---|---|---|---|
| Layer | 512B2 | HTM2 | | 10 |
| Layer | 512B1 | HTM1 | | 96 |
| Layer | 504 | HTM1:OCHD-003 | 1:0.03 | 10 |

<<Fabrication Method of Sample 2B>>

The sample 2B described in this example was fabricated by a method including the following steps.

[First Step]

In the first step, a layer 504 was formed over a substrate 510L. Specifically, the materials were deposited by co-evaporation using a resistance-heating method.

Note that the layer 504 contains HTM1 and OCHD-003 at HTM1: OCHD-003=1:0.03 (weight ratio) and has a thickness of 10 nm. HTM1 is an organic compound having a hole-transport property, and OCHD-003 is fluorine-containing electron-acceptor material with a molecular weight of 672. A 1.1-mm-thick quartz substrate was used as the substrate 510L.

[Second Step]

In the second step, a layer 512B1 was formed over the layer 504. Specifically, the material was deposited by evaporation using a resistance-heating method.

Note that the layer 512B1 contains HTM1 and has a thickness of 96 nm.

[Third Step]

In the third step, a layer 512B2 was formed over the layer 512B1. Specifically, the material was deposited by evaporation using a resistance-heating method.

Note that the layer 512B2 contains HTM2 and has a thickness of 10 nm. Note that HTM2 is an organic compound having a hole-transport property.

[Fourth Step]

In the fourth step, a layer 511B was formed over the layer 512B2. Specifically, the materials were deposited by co-evaporation using a resistance-heating method.

Note that the layer 511B contains αN-βNPAnth and 3,10PCA2Nbf(IV)-02 at αN-BNPAnth: 3,10PCA2Nbf(IV)-02=1:0.015 (weight ratio) and has a thickness of 25 nm.

[Fifth Step]

In the fifth step, a layer 513B1 was formed over the layer 511B. Specifically, the material was deposited by evaporation using a resistance-heating method.

Note that the layer 513B1 contains ETM1 and has a thickness of 20 nm. Note that ETM1 is an organic compound having an electron-transport property.

[Sixth Step]

In the sixth step, a layer 513B2 was formed over the layer 513B1. Specifically, the material was deposited by evaporation using a resistance-heating method.

Note that the layer 513B2 contains ETM2 and has a thickness of 10 nm. Note that ETM1 is an organic compound having an electron-transport property.

[Seventh Step]

In the seventh step, a mask layer 518B was formed over the layer 513B2. Specifically, an ALD method was used.

Note that the mask layer 518B contains aluminum oxide (abbreviation: $Al_2O_x$) and has a thickness of 45 nm.

[Eighth Step]

In the eighth step, the substrate 510L and a substrate 510U were bonded to each other with an adhesive SEAL. Thus, the stacked-layer structure formed by the first step to the seventh step is sandwiched between the substrate 510L and the substrate 510U. Note that an opening portion is provided in the adhesive SEAL (see FIG. 39A). The air exists between the substrate 510L and the substrate 510U. A 1.1-mm-thick quartz substrate was used as the substrate 510U.

<<Light Exposure Conditions>>

The fabricated sample 2B was irradiated with light with the use of a mercury lamp. Specifically, the substrate 510U was irradiated with light. The energy of the irradiation light was set to 500 mJ/cm$^2$. Note that the irradiation light includes light with a wavelength of 436 nm, a light with a wavelength of 405 nm, and light with a wavelength of 365 nm.

<<Evaluation Method 1>>

The above sample 2B was subjected to photoluminescence (PL) measurement. A ratio with respect to the intensity of the PL spectrum of the sample not subjected to light exposure with a mercury lamp was used for the evaluation. The sample whose intensity of the PL spectrum became 80% or more owing to the light exposure with a mercury lamp was evaluated as good "O", and the sample whose intensity of the PL spectrum became less than 80% thereof was evaluated as bad "X". Note that the measurement was performed using a spectrophotometer (FP-8600DS) produced by JASCO Corporation.

<<Characteristics of Sample 2B>>

Table 9 shows the characteristics of the sample 2B that were obtained as a result of the evaluation. Table 9 also shows the characteristics of a sample 2G and a sample 2R described later.

TABLE 9

| | Evaluation results |
|---|---|
| Sample 2B | ○ |
| Sample 2G | ○ |
| Sample 2R | ○ |

<Sample 2G>

The fabricated sample 2G described in this example has the same structure as the sample 550× except that the layer 512X is provided between the layer 511X and the layer 504 (see FIG. 39A and FIG. 39B). In other words, the layer 512X is provided instead of the layer 512X1 and the layer 512X2. Note that X used in the reference numerals in the drawings is replaced with B, G, or R as appropriate and used for the description in this example.

<<Structure of Sample 2G>> able 10 shows the structures of the sample 2G.

TABLE 10

| Component | Reference numeral | Material | Composition ratio | Thickness/ nm |
|---|---|---|---|---|
| Layer | 518G | Al2O*x* | | 45 |
| Layer | 513G2 | ETM2 | | 25 |
| Layer | 513G1 | ETM1 | | 20 |

TABLE 10-continued

| Component | Reference numeral | Material | Composition ratio | Thickness/ nm |
|---|---|---|---|---|
| Layer | 511G | HOSTG1:HOSTG2:GUESTG | 0.6:0.4:0.05 | 40 |
| Layer | 512G | HTM3 | | 145 |
| Layer | 504 | HTM1:OCHD-003 | 1:0.03 | 10 |

<<Fabrication Method of Sample 2G>>

The sample 2G described in this example was fabricated by a method including the following steps.

[First Step]

In the first step, the layer 504 was formed. Specifically, the materials were deposited by co-evaporation using a resistance-heating method. A 1.1-mm-thick quartz substrate was used as the substrate 510L.

Note that the layer 504 contains HTM1 and OCHD-003 at HTM1:OCHD-003=1:0.03 (weight ratio) and has a thickness of 10 nm.

[Second Step]

In the second step, the layer 512G was formed over the layer 504. Specifically, the material was deposited by evaporation using a resistance-heating method.

Note that the layer 512G contains HTM3 and has a thickness of 145 nm. Note that HTM3 is an organic compound having a hole-transport property.

[Third Step]

In the third step, the layer 511G was formed over the layer 512G. Specifically, the materials were deposited by co-evaporation using a resistance-heating method.

Note that the layer 511G contains HOSTG1, HOSTG2, and GUESTG at HOSTG1:HOSTG2:GUESTG=0.6:0.4:0.05 (weight ratio) and has a thickness of 40 nm. HOSTG1 and HOSTG2 are organic compounds having a carrier-transport property, and GUESTG is a light-emitting organic compound that emits green light.

[Fourth Step]

In the fourth step, the layer 513G1 was formed over the layer 511G. Specifically, the material was deposited by evaporation using a resistance-heating method.

Note that the layer 513G1 contains ETM1 and has a thickness of 20 nm.

[Fifth Step]

In the fifth step, the layer 513G2 was formed over the layer 513G1. Specifically, the material was deposited by evaporation using a resistance-heating method.

Note that the layer 513G2 contains ETM2 and has a thickness of 25 nm.

[Sixth Step]

In the sixth step, the mask layer 518G was formed over the layer 513G2. Specifically, an ALD method was used.

Note that the mask layer 518G contains $Al_2O_x$ and has a thickness of 45 nm.

[Seventh Step]

In the seventh step, the substrate 510L and the substrate 510U were bonded to each other with the adhesive SEAL. Thus, the stacked-layer structure formed by the first step to the seventh step is sandwiched between the substrate 510L and the substrate 510U. Note that an opening portion is provided in the adhesive SEAL (see FIG. 39A). The air exists between the substrate 510L and the substrate 510U. A 1.1-mm-thick quartz substrate was used as the substrate 510U.

<<Light Exposure Conditions>>

The fabricated sample 2G was irradiated with light with the use of a mercury lamp. Specifically, the substrate 510U was irradiated with light. The energy of the irradiation light was set to 500 mJ/cm$^2$. Note that the irradiation light includes light with a wavelength of 436 nm, a light with a wavelength of 405 nm, and light with a wavelength of 365 nm.

<<Evaluation Method 1>>

The above sample 2G was subjected to photoluminescence (PL) measurement. A ratio with respect to the intensity of the PL spectrum of the sample not subjected to light exposure with a mercury lamp was used for the evaluation. Note that the measurement was performed using a spectrophotometer (FP-8600DS) produced by JASCO Corporation.

<<Characteristics of Sample 2G>>

Table 9 shows the characteristics of the sample 2G that were obtained as a result of the evaluation.

<Sample 2R>

The fabricated sample 2R described in this example has the same structure as the sample 550× except that the layer 512X is provided between the layer 511X and the layer 504 (see FIG. 39A and FIG. 39B). In other words, the layer 512X is provided instead of the layer 512X1 and the layer 512X2. Note that X used in the reference numerals in the drawings is replaced with B, G, or R as appropriate and used for the description in this example.

<<Structure of Sample 2R>>

Table 11 shows the structures of the sample 2R.

TABLE 11

| Component | Reference numeral | Material | Composition ratio | Thickness/ nm |
|---|---|---|---|---|
| Layer | 518R | Al2O*x* | | 45 |
| Layer | 513R2 | ETM2 | | 20 |
| Layer | 513R1 | ETM1 | | 20 |
| Layer | 511R | HOSTR:HTM1:GUESTR | 0.7:0.3:0.05 | 40 |
| Layer | 512R | HTM1 | | 30 |
| Layer | 504 | HTM1:OCHD-003 | 1:0.03 | 10 |

<<Fabrication Method of Sample 2R>>

The sample 2R described in this example was fabricated by a method including the following steps.

[First Step]

In the first step, the layer 504 was formed. Specifically, the materials were deposited by co-evaporation using a resistance-heating method. A 1.1-mm-thick quartz substrate was used as the substrate 510L.

Note that the layer 504 contains HTM1 and OCHD-003 at HTM1:OCHD-003=1:0.03 (weight ratio) and has a thickness of 10 nm.

[Second Step]

In the second step, the layer 512R was formed over the layer 504. Specifically, the material was deposited by evaporation using a resistance-heating method.

Note that the layer 512R contains HTM1 and has a thickness of 30 nm.

[Third Step]

In the third step, the layer 511R was formed over the layer 512R. Specifically, the materials were deposited by co-evaporation using a resistance-heating method.

Note that the layer 511R contains HOSTR, HTM1, and GUESTR at HOSTR:HTM1:GUESTR=0.7:0.3:0.05 (weight ratio) and has a thickness of 40 nm. HOSTR is an organic compound having a carrier-transport property, and GUESTR is a light-emitting organic compound that emits red light.

[Fourth Step]

In the fourth step, the layer 513R1 was formed over the layer 511R. Specifically, the material was deposited by evaporation using a resistance-heating method.

Note that the layer 513R1 contains ETM1 and has a thickness of 20 nm.

[Fifth Step]

In the fifth step, the layer 513R2 was formed over the layer 513R1. Specifically, the material was deposited by evaporation using a resistance-heating method.

Note that the layer 513R2 contains ETM2 and has a thickness of 20 nm.

[Sixth Step]

In the sixth step, the mask layer 518R was formed over the layer 513R2. Specifically, an ALD method was used.

Note that the mask layer 518R contains $Al_2O$, and has a thickness of 45 nm.

[Seventh Step]

In the seventh step, the substrate 510L and the substrate 510U were bonded to each other with the adhesive SEAL. Thus, the stacked-layer structure formed by the first step to the seventh step is sandwiched between the substrate 510L and the substrate 510U. Note that an opening portion is provided in the adhesive SEAL (see FIG. 39A). The air exists between the substrate 510L and the substrate 510U. A 1.1-mm-thick quartz substrate was used as the substrate 510U.

<<Light Exposure Conditions>>

The fabricated sample 2R was irradiated with light with the use of a mercury lamp. Specifically, the substrate 510U was irradiated with light. The energy of the irradiation light was set to 500 mJ/cm$^2$. Note that the irradiation light includes light with a wavelength of 436 nm, a light with a wavelength of 405 nm, and light with a wavelength of 365 nm.

<<Evaluation method 1>>

The above sample 2R was subjected to photoluminescence (PL) measurement. A ratio with respect to the intensity of the PL spectrum of the sample not subjected to light exposure with a mercury lamp was used for the evaluation. Note that the measurement was performed using a spectrophotometer (FP-8600DS) produced by JASCO Corporation.

<<Characteristics of sample 2R>>

Table 9 shows the characteristics of the sample 2R that were obtained as a result of the evaluation.

Example 4

In this example, an effect of an inert gas protecting an organic compound will be described with reference to FIG. 40 and FIG. 42.

FIG. 40 illustrates the structure of a sample. FIG. 40A is a top view of the sample, and FIG. 40B is a cross-sectional view of the sample taken along the section line A1-A2 in FIG. 40A.

Figure 42:
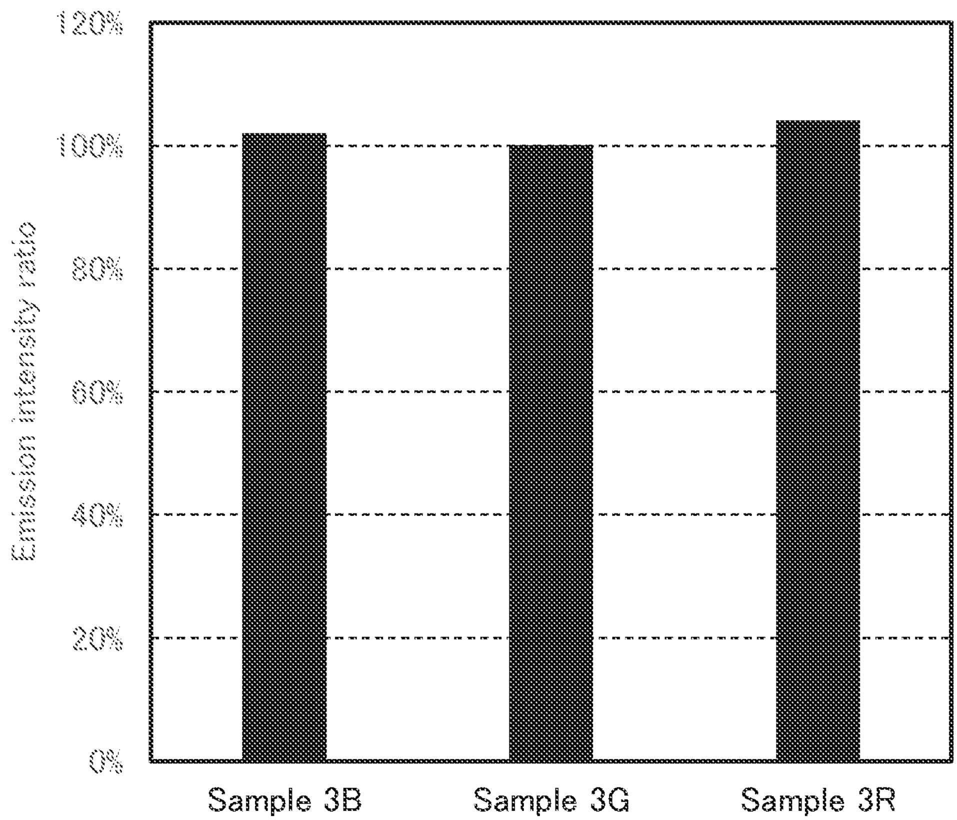
FIG. 42 is a diagram illustrating a change in emission intensity due to light exposure of samples in an example.

FIG. 42 is a diagram illustrating a comparison in emission intensity between samples after light irradiation and the samples before light irradiation.

<Sample 3B>

Figure 40A:
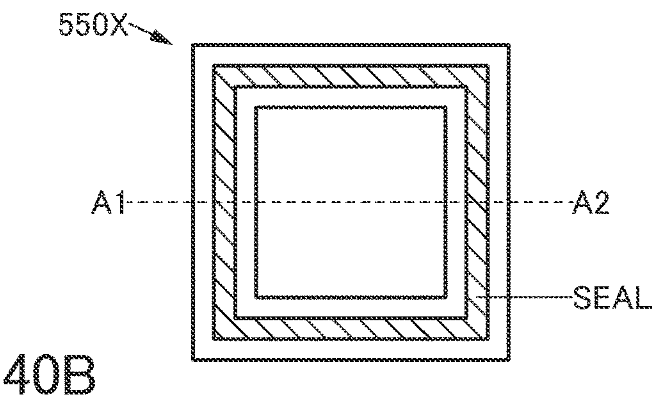
FIG. 40A to FIG. 40D are diagrams illustrating the structure of a sample in an example.
Figure 40B:
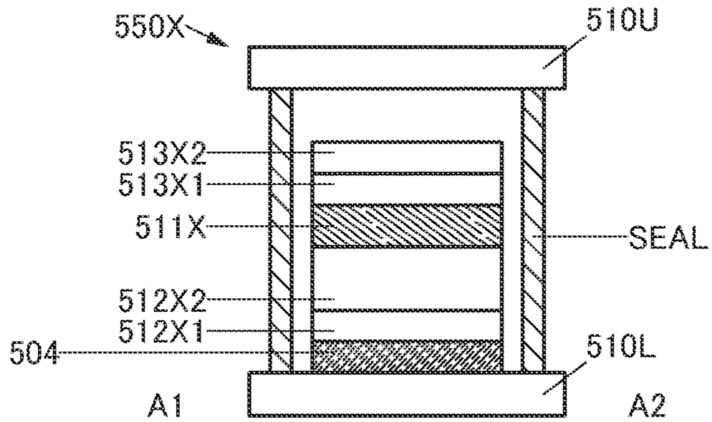

A fabricated sample 3B described in this example has the same structure as the sample 550× (see FIG. 40A and FIG. 40B). The sample 3B is different from the sample 2B in not including the mask layer 518B and in having a sealing structure filled with a nitrogen. Note that X used in the reference numerals in the drawings is replaced with B, G, or R as appropriate and used for the description in this example.

<<Fabrication Method of Sample 3B>>

The sample 3B described in this example was fabricated by a method including the following steps.

Note that the fabrication method of the sample 3B is different from the fabrication method of the sample 2B in the following points: after the sixth step of forming the layer 513B2 over the layer 513B1, the seventh step of forming the mask layer 518B is omitted and the process proceeds to the eighth step; and in the eighth step, no opening portion is provided in the adhesive SEAL that bonds the substrate 510L and the substrate 510U together. Different portions are described in detail here, and the above description is referred to for portions formed by a similar method.

[Eighth Step]

In the eighth step, the substrate 510L and the substrate 510U were bonded to each other with the adhesive SEAL in a glove box filled with nitrogen. Thus, the stacked-layer structure formed by the first step to the sixth steps is sandwiched between the substrate 510L and the substrate 510U. Note that no opening portion is provided in the adhesive SEAL (see FIG. 40A). The space between the substrate 510L and the substrate 510U is filled with nitrogen.

<<Light Exposure Conditions>>

The fabricated sample 3B was irradiated with light with the use of a mercury lamp. Specifically, the substrate 510U was irradiated with light. The energy of the irradiation light was set to 500 mJ/cm$^2$. Note that the irradiation light includes light with a wavelength of 436 nm, a light with a wavelength of 405 nm, and light with a wavelength of 365 nm.

<<Evaluation Method 1>>

The above sample 3B was subjected to photoluminescence (PL) measurement. The sample whose intensity of the PL spectrum became 80% or more owing to the light exposure with a mercury lamp was evaluated as good "O", and the sample whose intensity of the PL spectrum became less than 80% was evaluated as bad "X". Note that the measurement was performed using a spectrophotometer (FP-8600DS) produced by JASCO Corporation.

<<Characteristics of sample 3B>>

Table 12 shows the characteristics of the sample 3B that were obtained as a result of the evaluation. Table 12 also shows the characteristics of a sample 3G, a sample 3R, a comparative sample 3B, a comparative sample 3G, and a comparative sample 3R described later.

TABLE 12

| | Evaluation restuls |
|---|---|
| Sample 3B | ○ |
| Sample 3G | ○ |
| Sample 3R | ○ |
| Comparative sample 3B | X |
| Comparative sample 3G | X |
| Comparative sample 3R | X |

In the fabrication method of a display apparatus of one embodiment of the present invention, light irradiation is performed in the state where the mask layer is formed above the organic compound, or at the time of irradiating the organic compound with light, the processing is performed in an atmosphere filled with nitrogen, i.e., in an atmosphere with a reduced oxygen content, whereby the deterioration of the organic compound can be inhibited. This produces an excellent effect of inhibiting a phenomenon of reducing the emission intensity of photoluminescence (PL). As described in Example 2 to Example 4 above, the deterioration of the organic compound is inhibited in the display apparatus of one embodiment of the present invention, whereby a highly reliable display apparatus can be provided.

On the other hand, for example, as shown in the case of the organic compound of the comparative example, it is found that the organic compound deteriorates and the emission intensity of photoluminescence (PL) is reduced when the organic compound is irradiated with light in the state of being in contact with the air.

<Sample 3G>

The fabricated sample 3G described in this example has the same structure as the sample 550× (see FIG. 40A and FIG. 40B). The sample 3G is different from the sample 2G in not including the mask layer 518G and in having a sealing structure filled with a nitrogen. Note that X used in the reference numerals in the drawings is replaced with B, G, or R as appropriate and used for the description in this example.

<<Fabrication Method of Sample 3G>>

The sample 3G described in this example was fabricated by a method including the following steps.

Note that the fabrication method of the sample 3G is different from the fabrication method of the sample 2G in the following points: after the fifth step of forming the layer 513G2 over the layer 513G1, the sixth step of forming the mask layer 518B is omitted and the process proceeds to the seventh step; and in the seventh step, no opening portion is provided in the adhesive SEAL that bonds the substrate 510L and the substrate 510U together. Different portions are described in detail here, and the above description is referred to for portions formed by a similar method.

[Seventh Step]

In the seventh step, the substrate 510L and the substrate 510U were bonded to each other with the adhesive SEAL in a glove box filled with nitrogen. Thus, the stacked-layer structure formed by the first step to the fifth steps is sandwiched between the substrate 510L and the substrate 510U. Note that no opening portion is provided in the adhesive SEAL (see FIG. 40A). The space between the substrate 510L and the substrate 510U is filled with nitrogen.

<<Light Exposure Conditions>

The fabricated sample 3G was irradiated with light with the use of a mercury lamp. Specifically, the substrate 510U was irradiated with light. The energy of the irradiation light was set to 500 mJ/cm$^2$. Note that the irradiation light includes light with a wavelength of 436 nm, a light with a wavelength of 405 nm, and light with a wavelength of 365 nm.

<<Evaluation Method 1>>

The above sample 3G was subjected to photoluminescence (PL) measurement. A ratio with respect to the intensity of the PL spectrum of the sample not subjected to light exposure with a mercury lamp was used for the evaluation. Note that the measurement was performed using a spectrophotometer (FP-8600DS) produced by JASCO Corporation.

<<Characteristics of sample 3G>>

Table 12 shows the characteristics of the sample 3G that were obtained as a result of the evaluation.

<Sample 3R>

The fabricated sample 3R described in this example has the same structure as the sample 550× (see FIG. 40A and FIG. 40B). The sample 3R is different from the sample 2R in not including the mask layer 518R and in having a sealing structure filled with a nitrogen. Note that X used in the reference numerals in the drawings is replaced with B, G, or R as appropriate and used for the description in this example.

<<Fabrication Method of Sample 3R>>

The sample 3R described in this example was fabricated by a method including the following steps.

Note that the fabrication method of the sample 3R is different from the fabrication method of the sample 2R in the following points: after the fifth step of forming the layer 513R2 over the layer 513R1, the sixth step of forming the mask layer 518R is omitted and the process proceeds to the seventh step; and in the seventh step, no opening portion is provided in the adhesive SEAL that bonds the substrate 510L and the substrate 510U together. Different portions are described in detail here, and the above description is referred to for portions formed by a similar method.

[Seventh Step]

In the seventh step, the substrate 510L and the substrate 510U were bonded to each other with the adhesive SEAL in a glove box filled with nitrogen. Thus, the stacked-layer structure formed by the first step to the fifth steps is sandwiched between the substrate 510L and the substrate 510U. Note that no opening portion is provided in the adhesive SEAL (see FIG. 40A). The space between the substrate 510L and the substrate 510U is filled with nitrogen.

<<Light Exposure Conditions>>

The fabricated sample 3R was irradiated with light with the use of a mercury lamp. Specifically, the substrate 510U was irradiated with light. The energy of the irradiation light was set to 500 mJ/cm$^2$. Note that the irradiation light includes light with a wavelength of 436 nm, a light with a wavelength of 405 nm, and light with a wavelength of 365 nm.

<<Evaluation Method 1>>

The above sample 3R was subjected to photoluminescence (PL) measurement. A ratio with respect to the intensity of the PL spectrum of the sample not subjected to light exposure with a mercury lamp was used for the evaluation. Note that the measurement was performed using a spectrophotometer (FP-8600DS) produced by JASCO Corporation.

<<Characteristics of Sample 3R>>

Table 12 shows the characteristics of the sample 3R that were obtained as a result of the evaluation.

Reference Example 2

In this reference example, a phenomenon in which an organic compound irradiated with light in the state of being in contact with the air is changed in quality is described with reference to FIG. 40 and FIG. 43.

FIG. 40 illustrates the structure of a sample. FIG. 40C is a top view of a comparative sample, and FIG. 40D is a cross-sectional view of the sample taken along the section line B1-B2 in FIG. 40C.

Figure 43:
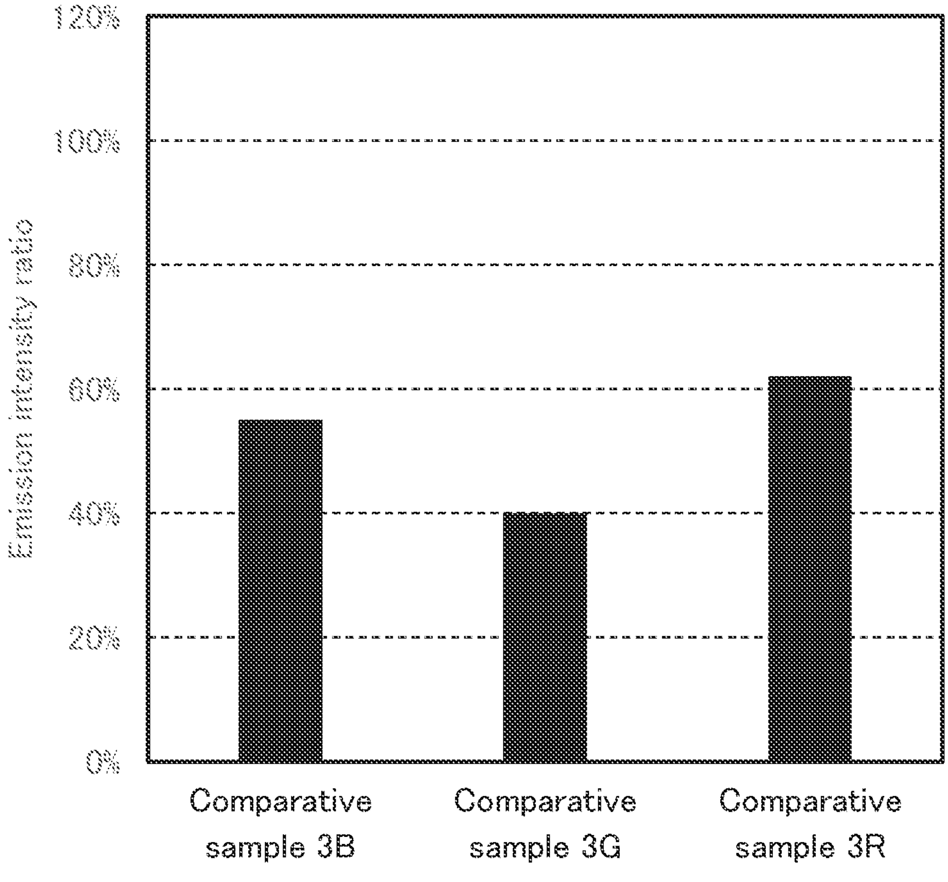
FIG. 43 is a diagram illustrating a change in emission intensity due to light exposure of comparative samples in a reference example.

FIG. 43 is a diagram illustrating a comparison in emission intensity between comparative samples after light irradiation and the comparative samples before light irradiation.

<Comparative Sample 3B>

Figure 40C:
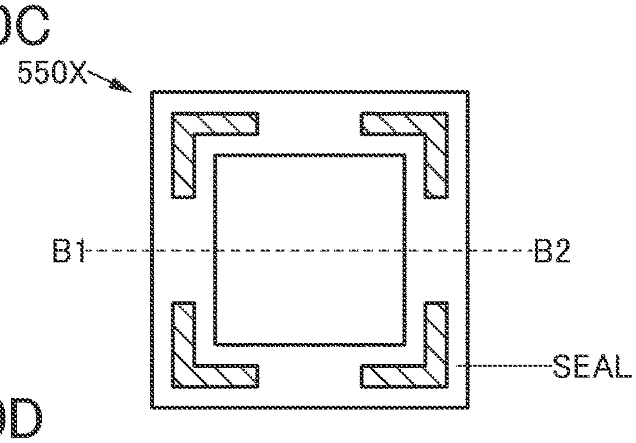
Figure 40D:
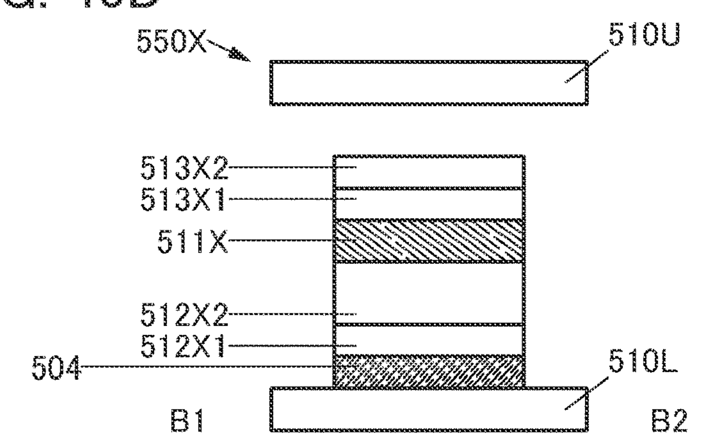

The fabricated comparative sample 3B described in this example has the same structure as the sample 550× (see FIG. 40C and FIG. 40D). The comparative sample 3B is different from the sample 3B in not having a sealing structure filled with a nitrogen. Note that X used in the reference numerals in the drawings is replaced with B, G, or R as appropriate and used for the description in this example.

<<Fabrication Method of Comparative Sample 3B>>

The comparative sample 3B described in this example was fabricated by a method including the following steps.

Note that the fabrication method of the comparative sample 3B is different from the fabrication method of the sample 3B in that an opening portion is provided in the adhesive SEAL that bonds the substrate 510L and the substrate 510U together, in the eighth step. Different portions are described in detail here, and the above description is referred to for portions formed by a similar method.

[Eighth Step]

In the eighth step, the substrate 510L and the substrate 510U were bonded to each other with the adhesive SEAL in a glove box filled with nitrogen. Thus, the stacked-layer structure formed by the first step to the sixth steps is sandwiched between the substrate 510L and the substrate 510U. Note that an opening portion is provided in the adhesive SEAL (see FIG. 40C). The air exists between the substrate 510L and the substrate 510U. A 1.1-mm-thick quartz substrate was used as the substrate 510U.

<<Light Exposure Conditions>>

The fabricated comparative sample 3B was irradiated with light with the use of a mercury lamp. Specifically, the substrate 510U was irradiated with light. The energy of the irradiation light was set to 500 mJ/cm$^2$. Note that the irradiation light includes light with a wavelength of 436 nm, a light with a wavelength of 405 nm, and light with a wavelength of 365 nm.

<<Evaluation Method 1>>

The above comparative sample 3B was subjected to photoluminescence (PL) measurement. A ratio with respect to the intensity of the PL spectrum of the sample not subjected to light exposure with a mercury lamp was used for the evaluation. Note that the measurement was performed using a spectrophotometer (FP-8600DS) produced by JASCO Corporation.

<<Characteristics of Comparative Sample 3B>>

Table 12 shows the characteristics of the comparative sample 3B that were obtained as a result of the evaluation. Table 12 also shows the characteristics of the comparative sample 3G and the comparative sample 3R described later.

<Comparative Sample 3G>

The fabricated comparative sample 3G described in this example has the same structure as the sample 550× (see FIG. 40C and FIG. 40D). The comparative sample 3G is different from the sample 3G in not having a sealing structure filled with a nitrogen. Note that X used in the reference numerals in the drawings is replaced with B, G, or R as appropriate and used for the description in this example.

<<Fabrication Method of Comparative Sample 3G>>

The comparative sample 3G described in this example was fabricated by a method including the following steps.

Note that the fabrication method of the comparative sample 3G is different from the fabrication method of the sample 3B in that an opening portion is provided in the adhesive SEAL that bonds the substrate 510L and the substrate 510U together, in the seventh step. Different portions are described in detail here, and the above description is referred to for portions formed by a similar method.

[Seventh Step]

In the seventh step, the substrate 510L and the substrate 510U were bonded to each other with the adhesive SEAL. Thus, the stacked-layer structure formed by the first step to the fifth step is sandwiched between the substrate 510L and the substrate 510U. Note that an opening portion is provided in the adhesive SEAL (see FIG. 40C). The air exists between the substrate 510L and the substrate 510U. A 1.1-mm-thick quartz substrate was used as the substrate 510U.

<<Light Exposure Conditions>>

The fabricated comparative sample 3G was irradiated with light with the use of a mercury lamp. Specifically, the substrate 510U was irradiated with light. The energy of the irradiation light was set to 500 mJ/cm$^2$. Note that the irradiation light includes light with a wavelength of 436 nm, a light with a wavelength of 405 nm, and light with a wavelength of 365 nm.

<<Evaluation Method 1>>

The above comparative sample 3G was subjected to photoluminescence (PL) measurement. A ratio with respect to the intensity of the PL spectrum of the sample not subjected to light exposure with a mercury lamp was used for the evaluation. Note that the measurement was performed using a spectrophotometer (FP-8600DS) produced by JASCO Corporation.

<<Characteristics of Comparative Sample 3G>>

Table 12 shows the characteristics of the comparative sample 3G that were obtained as a result of the evaluation.

<Comparative Sample 3R>

The fabricated comparative sample 3R described in this example has the same structure as the sample 550× (see FIG. 40C and FIG. 40D). The comparative sample 3R is different from the sample 3R in not having a sealing structure filled with a nitrogen. Note that X used in the reference numerals in the drawings is replaced with B, G, or R as appropriate and used for the description in this example.

<<Fabrication Method of Comparative Sample 3R>>

The comparative sample 3R described in this example was fabricated by a method including the following steps.

Note that the fabrication method of the comparative sample 3R is different from the fabrication method of the sample 3R in that an opening portion is provided in the adhesive SEAL that bonds the substrate 510L and the substrate 510U together, in the seventh step. Different portions are described in detail here, and the above description is referred to for portions formed by a similar method.

[Seventh Step]

In the seventh step, the substrate 510L and the substrate 510U were bonded to each other with the adhesive SEAL. Thus, the stacked-layer structure formed by the first step to the fifth step is sandwiched between the substrate 510L and the substrate 510U. Note that an opening portion is provided in the adhesive SEAL (see FIG. 40C). The air exists between the substrate 510L and the substrate 510U. A 1.1-mm-thick quartz substrate was used as the substrate 510U.

<<Light Exposure Conditions>>

The fabricated comparative sample 3R was irradiated with light with the use of a mercury lamp. Specifically, the substrate 510U was irradiated with light. The energy of the irradiation light was set to 500 mJ/cm$^2$. Note that the irradiation light includes light with a wavelength of 436 nm, a light with a wavelength of 405 nm, and light with a wavelength of 365 nm.

<<Evaluation Method 1>>

The above comparative sample 3R was subjected to photoluminescence (PL) measurement. A ratio with respect to the intensity of the PL spectrum of the sample not subjected to light exposure with a mercury lamp was used for the evaluation. Note that the measurement was performed using a spectrophotometer (FP-8600DS) produced by JASCO Corporation.

<<Characteristics of Comparative Sample 3R>>

Table 12 shows the characteristics of the comparative sample 3R that were obtained as a result of the evaluation.

REFERENCE NUMERALS

AL: wiring, C1: capacitor, CL: wiring, GL: wiring, M1: transistor, M2: transistor, M3: transistor, PS: subpixel, RL: wiring, SL: wiring, SLB: wiring, SLG: wiring, SLR: wiring, 100A: display panel, 100B: display panel, 100C: display panel, 100D: display panel, 100E: display panel, 100F: display panel, 100G: display panel, 100H: display panel, 100J: display panel, 100: display panel, 101: layer, 110*a*: subpixel, 110*b*: subpixel, 110*c*: subpixel, 110*d*: subpixel, 110: pixel, 111*a*: pixel electrode, 111*b*: pixel electrode, 111*c*: pixel electrode, 111*d*: pixel electrode, 112*a*: conductive layer, 112*b*: conductive layer, 112*c*: conductive layer, 112*d*: conductive layer, 113A: first layer, 113*a*: first layer, 113B: second layer, 113*b*: second layer, 113C: third layer, 113*c*: third layer, 113*d*: fourth layer, 114: common layer, 115: common electrode, 116: projecting portion, 117: light-blocking layer, 118*a*: mask layer, 118A: first mask layer, 118*b*: mask layer, 118B: first mask layer, 118*c*: mask layer, 118C: first mask layer, 118*d*: mask layer, 118: mask layer, 119*a*: mask layer, 119A: second mask layer, 119*b*: mask layer, 119B: second mask layer, 119*c*: mask layer, 119C: second mask layer, 120: substrate, 122: resin layer, 123: conductive layer, 124*a*: pixel, 124*b*: pixel, 125A: insulating film, 125: insulating layer, 126*a*: conductive layer, 126*b*: conductive layer, 126*c*: conductive layer, 126*d*: conductive layer, 127*a*: insulating layer, 127*b*: insulating layer, 127: insulating layer, 128: layer, 129*a*: conductive layer, 129*b*: conductive layer, 129*c*: conductive layer, 129*d*: conductive layer, 130*a*: light-emitting device, 130B: light-emitting device, 130*b*: light-emitting device, 130*c*: light-emitting device, 130G: light-emitting device, 130R: light-emitting device, 131: protective layer, 133: depression portion, 139: region, 140: connection portion, 142: adhesive layer, 150: light-receiving device, 151: substrate, 152: substrate, 153: insulating layer, 162: display portion, 164: circuit, 165: wiring, 166: conductive layer, 172: FPC, 173: IC, 190*a*: resist mask, 190*b*: resist mask, 190*c*: resist mask, 201: transistor, 204: connection portion, 205: transistor, 209: transistor, 210: transistor, 211: insulating layer, 213: insulating layer, 214: insulating layer, 215: insulating layer, 218: insulating layer, 221: conductive layer, 222*a*: conductive layer, 222*b*: conductive layer, 223: conductive layer, 225: insulating layer, 231*i*: channel formation region, 231*n*: low-resistance region, 231: semiconductor layer, 240: capacitor, 241: conductive layer, 242: connection layer, 243: insulating layer, 245: conductive layer, 251: conductive layer, 252: conductive layer, 254: insulating layer, 255*a*: insulating layer, 255*b*: insulating layer, 255*c*: insulating layer, 256: plug, 261: insulating layer, 262: insulating layer, 263: insulating layer, 264: insulating layer, 265: insulating layer, 271: plug, 274*a*: conductive layer, 274*b*: conductive layer, 274: plug, 280: display module, 281: display portion, 282: circuit portion, 283*a*: pixel circuit, 283: pixel circuit portion, 284*a*: pixel, 284: pixel portion, 285: terminal portion, 286: wiring portion, 290: FPC, 291: substrate, 292: substrate, 301A: substrate, 301B: substrate, 301: substrate, 310A: transistor, 310B: transistor, 310: transistor, 311: conductive layer, 312: low-resistance region, 313: insulating layer, 314: insulating layer, 315: element isolation layer, 320A: transistor, 320B: transistor, 320: transistor, 321: semiconductor layer, 323: insulating layer, 324: conductive layer, 325: conductive layer, 326: insulating layer, 327: conductive layer, 328: insulating layer, 329: insulating layer, 331: substrate, 332: insulating layer, 335: insulating layer, 336: insulating layer, 341: conductive layer, 342: conductive layer, 343: plug, 344: insulating layer, 345: insulating layer, 346: insulating layer, 347: bump, 348: adhesive layer, 351: substrate, 352: finger, 353: layer, 355: functional layer, 357: layer, 359: substrate, 400: display panel, 401: substrate, 402: driver circuit portion, 403: driver circuit portion, 404: display portion, 405B: subpixel, 405G: subpixel, 405R: subpixel, 405: pixel, 410*a*: transistor, 410: transistor, 411*i*: channel formation region, 411*n*: low-resistance region, 411: semiconductor layer, 412: insulating layer, 413: conductive layer, 414*a*: conductive layer, 414*b*: conductive layer, 415: conductive layer, 416: insulating layer, 421: insulating layer, 422: insulating layer, 423: insulating layer, 426: insulating layer, 430: pixel, 431: conductive layer, 450*a*: transistor, 450: transistor, 451: semiconductor layer, 452: insulating layer, 453: conductive layer, 454*a*: conductive layer, 454*b*: conductive layer, 455: conductive layer, 553: layer, 700A: electronic device, 700B: electronic device, 721: housing, 723: wearing portion, 727: earphone portion, 750: earphone, 751: display panel, 753: optical member, 756: display region, 757: frame, 758: nose pad, 772: lower electrode, 785: layer, 786*a*: EL layer, 786*b*: EL layer, 786: EL layer, 788: upper electrode, 800A: electronic device, 800B: electronic device, 820: display portion, 821: housing, 822: communication portion, 823: wearing portion, 824: control portion, 825: image capturing portion, 827: earphone portion, 832: lens, 4411: light-emitting layer, 4412: light-emitting layer, 4413: light-emitting layer, 4420: layer, 4421: layer, 4422: layer, 4430: layer, 4431: layer, 4432: layer, 4440: charge-generation layer, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote control, 7200: notebook personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9002: camera, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9103: tablet terminal, 9200: portable information terminal, 9201: portable information terminal

The invention claimed is:

1. A display apparatus comprising:

a first pixel;

a second pixel adjacent to the first pixel;

a first insulating layer; and a second insulating layer over the first insulating layer, wherein the first pixel comprises:

a first pixel electrode;

a first EL layer covering the first pixel electrode;

a third insulating layer in contact with a first part of a top surface of the first EL layer; and a common electrode over the first EL layer and the third insulating layer, wherein the common electrode is in contact with a second part of the top surface of the first EL layer, wherein the first EL layer is sandwiched between the first pixel electrode and the common electrode, wherein the first EL layer comprises a first organic compound, wherein an amount of an organic compound that comprises an oxide of the first organic compound or a partial structure of the first organic compound and is contained in the first EL layer is greater than 0 and less than or equal to 1/10 of an amount of the first organic compound contained in the first EL layer, wherein the second pixel comprises:

a second pixel electrode;

a second EL layer covering the second pixel electrode;

a fourth insulating layer in contact with a first part of a top surface of the second EL layer; and the common electrode over the second EL layer and the fourth insulating layer, wherein the first insulating layer is in contact with a top surface and a side surface of the third insulating layer, a top surface and a side surface of the fourth insulating layer, a side surface of the first EL layer, and a side surface of the second EL layer, wherein the first insulating layer, the third insulating layer, and the fourth insulating layer each comprise an inorganic material, wherein the second insulating layer comprises an organic material, wherein a first part of the second insulating layer overlaps with the first pixel electrode, wherein a second part of the second insulating layer overlaps with the second pixel electrode, wherein, in a cross-sectional view, a side surface of the second insulating layer has a tapered shape and a top surface of the second insulating layer has a convex shape, wherein a taper angle of the tapered shape of the side surface of the second insulating layer is less than 90°, and wherein the common electrode overlaps with the second insulating layer.

2. The display apparatus according to claim 1, wherein, in the cross-sectional view, a side surface of the first pixel electrode and a side surface of the second pixel electrode each have a tapered shape, and wherein a taper angle of the tapered shape of the side surface of the first pixel electrode and a taper angle of the tapered shape of the side surface of the second pixel electrode are smaller than 90°.

3. The display apparatus according to claim 1, wherein the first insulating layer, the third insulating layer, and the fourth insulating layer each comprise aluminum oxide.

4. The display apparatus according to claim 1, wherein the second insulating layer comprises a photosensitive acrylic resin.

5. The display apparatus according to claim 1, wherein the top surface of the first EL layer, the top surface of the second EL layer, and the top surface of the second insulating layer each comprise a region in contact with the common electrode.

6. The display apparatus according to claim 1, wherein the first pixel comprises a common layer between the first EL layer and the common electrode, wherein the second pixel comprises the common layer between the second EL layer and the common electrode, and wherein the top surface of the first EL layer, the top surface of the second EL layer, and the top surface of the second insulating layer each comprise a region in contact with the common layer.

7. A method for fabricating a display apparatus, comprising the steps of:

forming a first pixel electrode;

forming a first EL layer covering the first pixel electrode;

forming a first insulating layer in contact with a top surface of the first EL layer;

forming a second pixel electrode;

forming a second EL layer covering the second pixel electrode;

forming a second insulating layer in contact with a top surface of the second EL layer;

forming a third insulating layer to cover the first EL layer, the first insulating layer, the second EL layer, and the second insulating layer;

applying a photosensitive organic resin onto the third insulating layer;

performing a first light exposure to expose part of the photosensitive organic resin to visible rays or ultraviolet rays;

performing development to remove the part of the photosensitive organic resin and form a fourth insulating layer;

performing a first heat treatment to make a side surface of the fourth insulating layer have a tapered shape and make a top surface of the fourth insulating layer have a convex shape;

removing parts of the first insulating layer, the second insulating layer, and the third insulating layer to expose the top surface of the first EL layer and the top surface of the second EL layer; and forming a common electrode to cover the first EL layer, the second EL layer, and the fourth insulating layer;

wherein, during a period from a time when the top surface of the first EL layer and the top surface of the second EL layer are exposed to a time when the common electrode is formed, an amount of ultraviolet rays to which the first EL layer and the second EL layer are exposed is controlled to be greater than 0 $mJ/cm^2$ and less than or equal to 1000 $mJ/cm^2$.

8. The method for fabricating a display apparatus, according to claim 7, wherein the first EL layer and the second EL layer are formed by a photolithography method, and wherein a distance between the first EL layer and the second EL layer is less than or equal to 8 μm in a region.

9. The method for fabricating a display apparatus, according to claim 7, wherein aluminum oxide is deposited as the third insulating layer by an ALD method.

10. The method for fabricating a display apparatus, according to claim 7, wherein the photosensitive organic resin is formed using a photosensitive acrylic resin.

11. The method for fabricating a display apparatus, according to claim 7, wherein viscosity of the photosensitive organic resin is greater than or equal to 1 cP and less than or equal to 1500 cP.

12. The method for fabricating a display apparatus, according to claim 7, wherein part of the photosensitive organic resin is positioned over a region overlapping with the first pixel electrode or the second pixel electrode.

13. The method for fabricating a display apparatus, according to claim 7, further comprising the step of:

performing a second heat treatment before the first light exposure, wherein the second heat treatment is performed at a temperature of higher than or equal to 70° C. and lower than or equal to 120° C.

14. The method for fabricating a display apparatus, according to claim 7, further comprising the step of:

performing a second light exposure before the first heat treatment, wherein the second light exposure is performed by irradiation with visible rays or ultraviolet rays at an energy density of greater than 0 $mJ/cm^2$ and less than or equal to 500 $mJ/cm^2$.

15. The method for fabricating a display apparatus, according to claim 7, wherein the first heat treatment is performed at a temperature of higher than or equal to 70° C. and lower than or equal to 130° C.

16. The method for fabricating a display apparatus, according to claim 7, further comprising the step of:

performing a second heat treatment after the first heat treatment, wherein the second heat treatment is performed at a temperature of higher than or equal to 80° C. and lower than or equal to 100° C.

* * * * *